United States Patent
Kataoka et al.

(10) Patent No.: US 10,389,378 B2
(45) Date of Patent: Aug. 20, 2019

(54) COMPUTER PRODUCT, INFORMATION PROCESSING APPARATUS, AND INFORMATION SEARCH APPARATUS

(75) Inventors: Masahiro Kataoka, Kawasaki (JP); Keishiro Tanaka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 1192 days.

(21) Appl. No.: 12/973,017

(22) Filed: Dec. 20, 2010

(65) Prior Publication Data
US 2011/0161357 A1 Jun. 30, 2011

(30) Foreign Application Priority Data
Dec. 25, 2009 (JP) ................................. 2009-296410

(51) Int. Cl.
*H03M 7/40* (2006.01)
*G06F 16/33* (2019.01)

(52) U.S. Cl.
CPC .......... *H03M 7/40* (2013.01); *G06F 16/3337* (2019.01)

(58) Field of Classification Search
CPC .. G06F 17/3066; G06F 17/276; G06F 17/564; G06F 17/27; G06F 17/289; G06F 3/0482; G06F 16/9535; G06F 16/951; G06F 16/93; G06F 16/22; G06F 3/04842; G06F 3/0481; G06F 16/3337; H04L 67/02
USPC ........................................ 707/706, 745, 770
See application file for complete search history.

(56) References Cited

U.S. PATENT DOCUMENTS

| | | | | |
|---|---|---|---|---|
| 5,469,354 | A | * | 11/1995 | Hatakeyama ..... G06F 17/30011 |
| 5,680,612 | A | * | 10/1997 | Asada ............... G06F 17/30985 |
| 5,706,365 | A | * | 1/1998 | Rangarajan et al. ......... 707/728 |
| 6,473,754 | B1 | * | 10/2002 | Matsubayashi et al. |
| 6,834,283 | B1 | * | 12/2004 | Satoh |
| 2001/0009009 | A1 | * | 7/2001 | Iizuka .......................... 707/539 |
| 2003/0177116 | A1 | * | 9/2003 | Ogawa ............................ 707/4 |
| 2008/0098024 | A1 | * | 4/2008 | Kataoka ........... G06F 17/30979 |

(Continued)

FOREIGN PATENT DOCUMENTS

| | | |
|---|---|---|
| JP | 03-174652 | 7/1991 |
| JP | 05-174064 | 7/1993 |

(Continued)

*Primary Examiner* — James Trujillo
*Assistant Examiner* — Fatima P Mina
(74) *Attorney, Agent, or Firm* — Staas & Halsey LLP

(57) ABSTRACT

A recording medium stores an information processing program that causes a computer having a storage unit storing therein a file group in which character code strings are described, to execute generating combined identification information by dividing into two portions, at least one among identification information for a preceding character code and identification information for a succeeding character code and respectively combining the portions with the identification information that is not divided, the preceding and succeeding character codes constituting a character code string for two-consecutive grams in a file among the file group; storing to the storage unit, various consecutive-gram divided maps obtained by allocating to each type of combined identification information generated, a string of bits corresponding to the quantity of files in the file group; and updating in the consecutive-gram divided maps, a bit indicating whether the character code string for the two-consecutive grams is present in the file.

9 Claims, 142 Drawing Sheets

(56) References Cited

U.S. PATENT DOCUMENTS

2008/0186220 A1* 8/2008 Shimbayashi ......... G08C 17/02
  341/176
2008/0208821 A1* 8/2008 Chang et al. .................... 707/3

FOREIGN PATENT DOCUMENTS

| JP | 07-319920 | 12/1995 |
| JP | 08-329116 | 12/1996 |

* cited by examiner

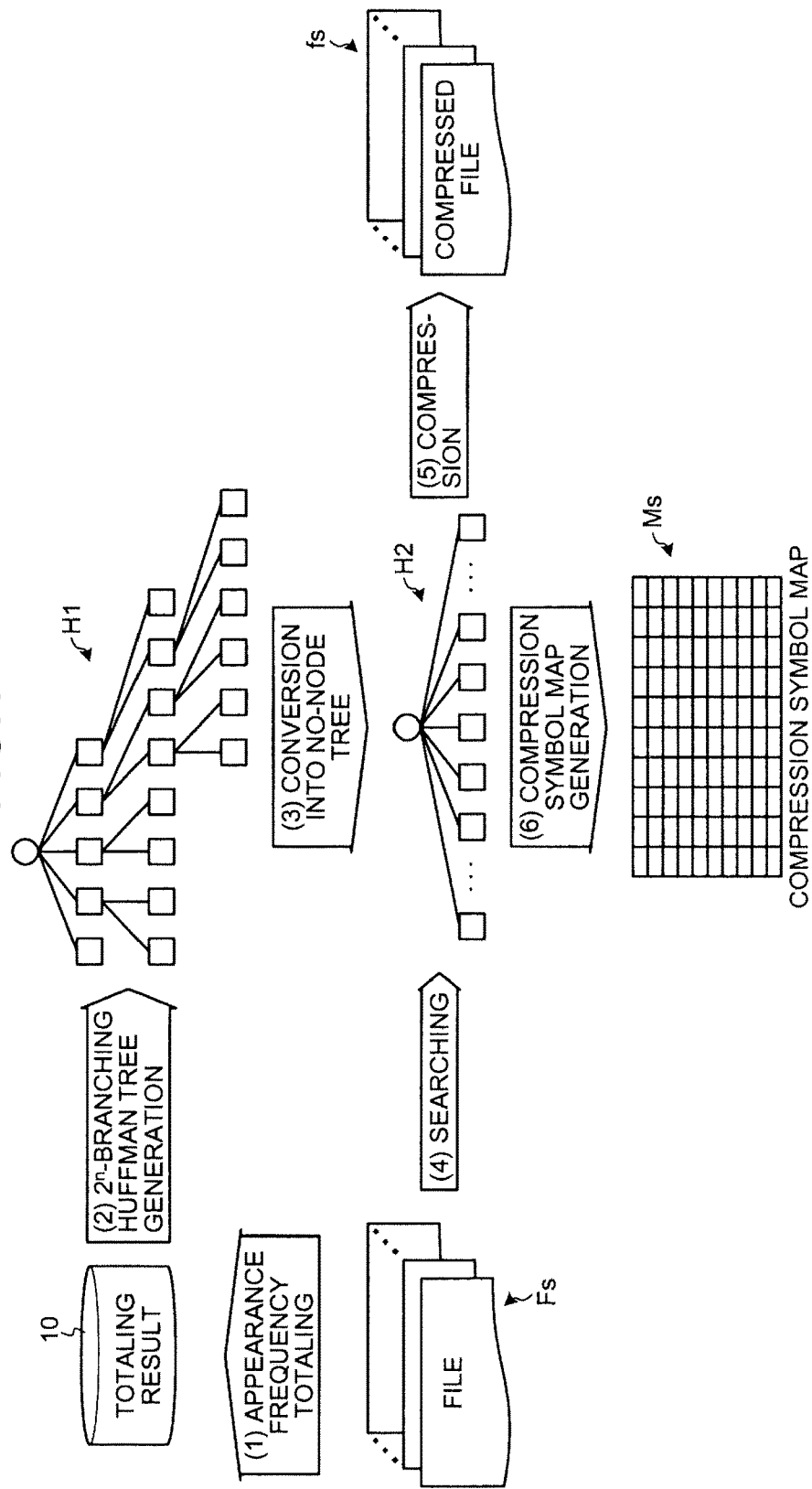

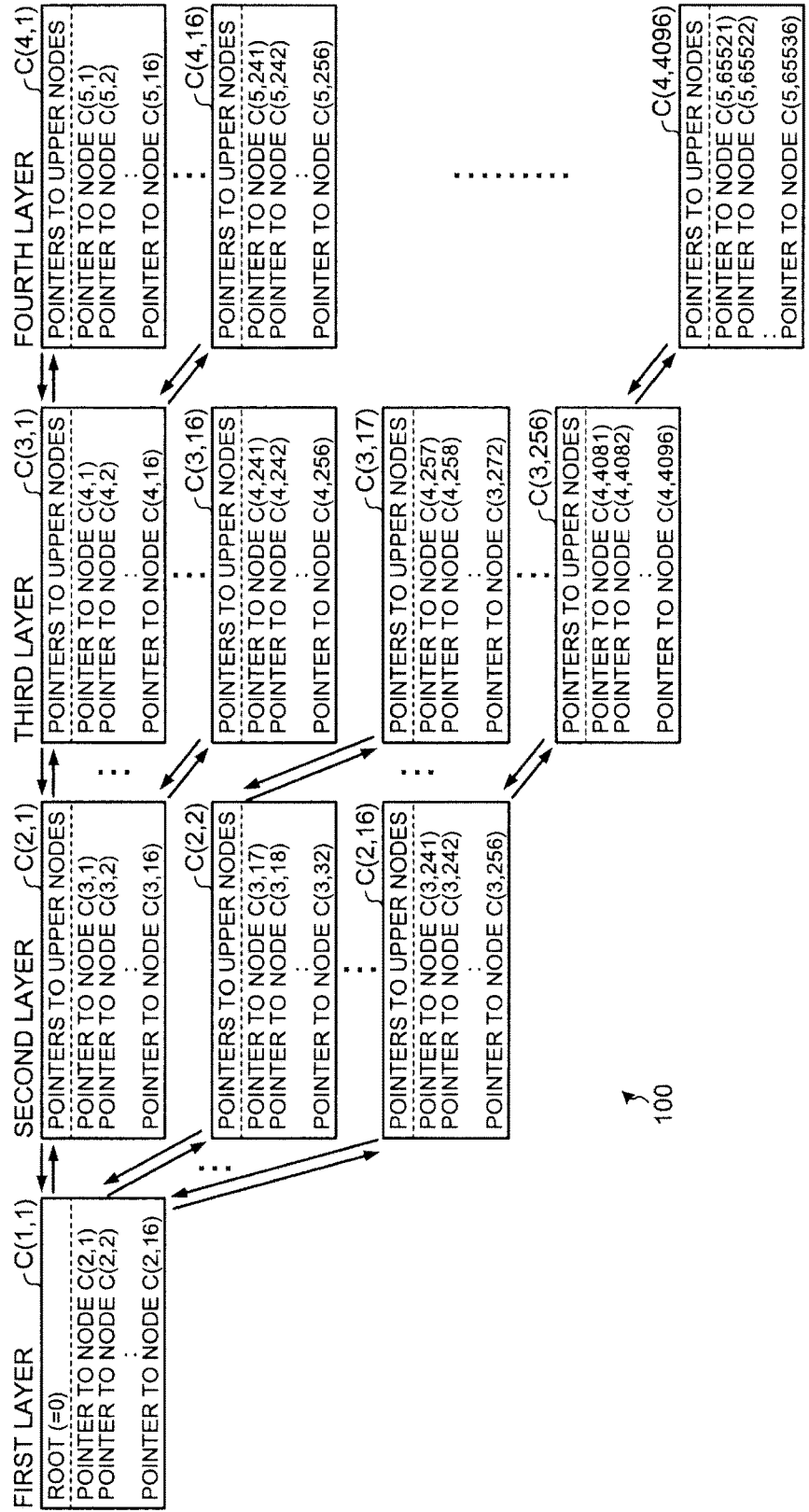

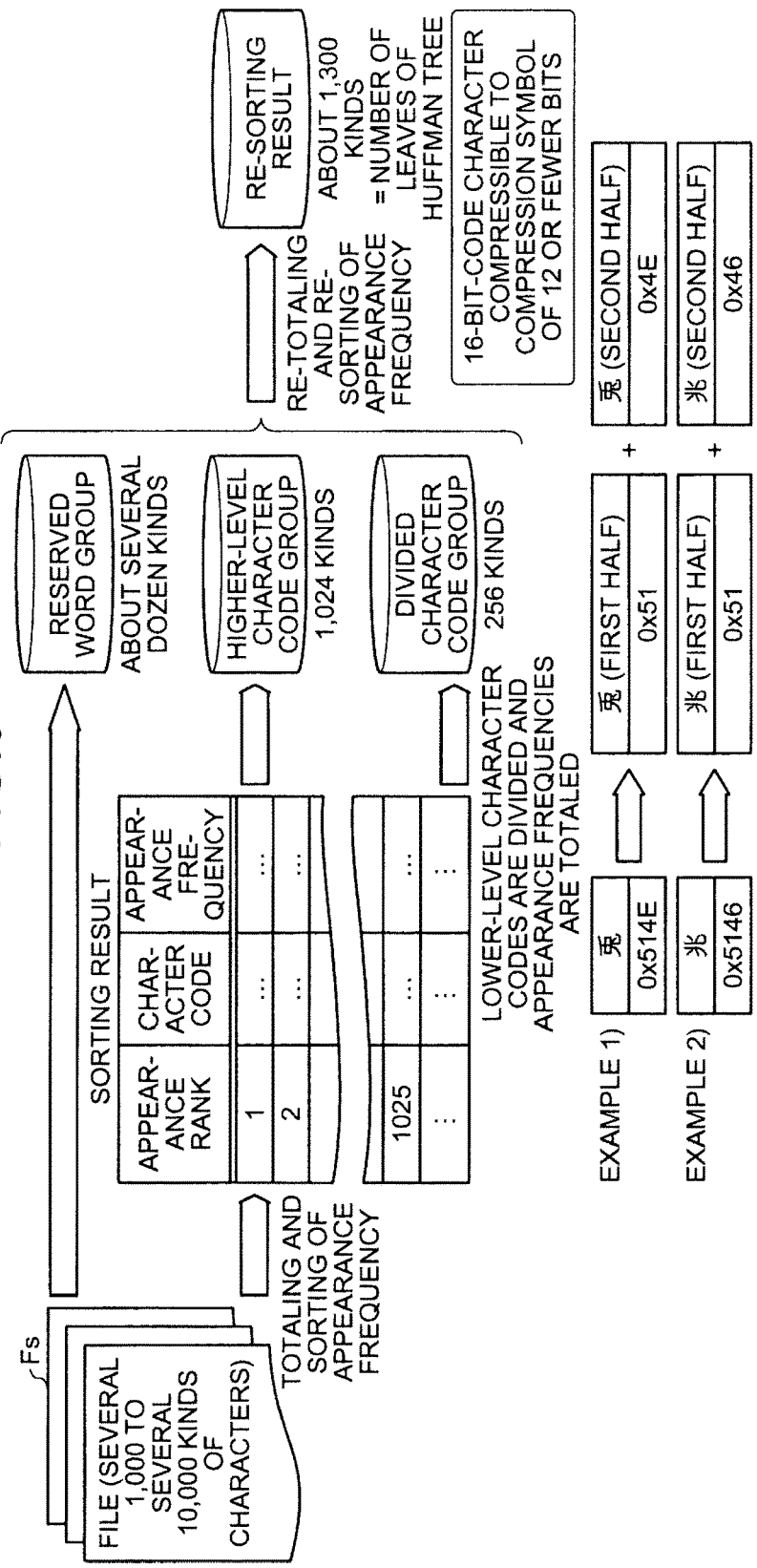

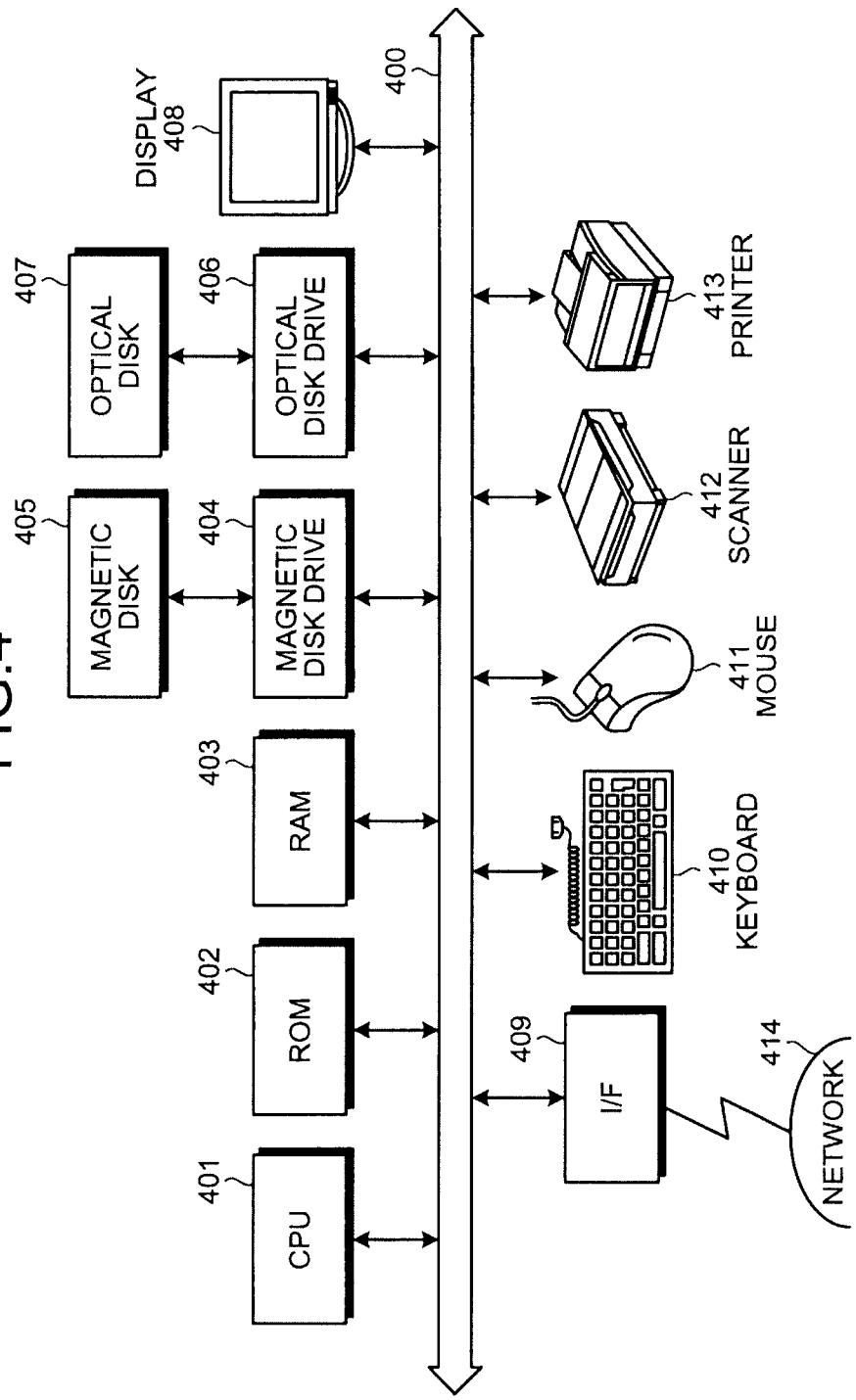

FIG.6

| CHARACTER APPEARANCE FREQUENCY TOTALING TABLE | | ⟵ 600 |
|---|---|---|
| CHARACTER | COUNTER VALUE | |
| 0 | ... | |
| ⋮ | ⋮ | |
| 9 | ... | |
| A | ... | |
| ⋮ | ⋮ | |
| Z | ... | |
| a | ... | |
| ⋮ | ⋮ | |
| z | ... | |
| あ | ... | |
| ⋮ | ⋮ | |
| ん | ... | |
| ア | ... | |
| ⋮ | ⋮ | |
| ン | ... | |
| 足 | ... | |
| ⋮ | ⋮ | |
| 我 | ... | |

FIG.7

| RESERVED WORD APPEARANCE FREQUENCY TOTALING TABLE | | ⟵ 700 |
|---|---|---|
| RESERVED WORD | COUNTER VALUE | |
| <br> | ... | |
| </a> | ... | |
| <a name=" | ... | |
| ⋮ | ⋮ | |

FIG.8

TOTALING RESULT TABLE (800)

| RANK | CHARACTER CODE OR RESERVED WORD | COUNTER VALUE | APPEARANCE RATE [%] | APPEARANCE RATE AREA |
|---|---|---|---|---|
| 1 | 0 | ... | ... | ... |
| 2 | > | ... | ... | ... |
| 3 | \<br\> | ... | ... | ... |
| ⋮ | ⋮ | ⋮ | ⋮ | ⋮ |

FIG.9A

DIVIDED CHARACTER CODE APPEARANCE FREQUENCY TOTALING TABLE (901)

| DIVIDED CHARACTER CODE | APPEARANCE FREQUENCY |
|---|---|
| 00 | ... |
| 01 | ... |
| 02 | ... |
| ⋮ | ⋮ |
| FF | ... |

FIG.9B

UPPER DIVIDED CHARACTER CODE APPEARANCE FREQUENCY TOTALING TABLE (902)

| UPPER DIVIDED CHARACTER CODE | APPEARANCE FREQUENCY |
|---|---|
| 00 | ... |
| 01 | ... |
| 02 | ... |
| ⋮ | ⋮ |
| FF | ... |

FIG.9C

| LOWER DIVIDED CHARACTER CODE APPEARANCE FREQUENCY TOTALING TABLE | | ←903 |
|---|---|---|
| LOWER DIVIDED CHARACTER CODE | APPEARANCE FREQUENCY | |
| 00 | ... | |
| 01 | ... | |
| 02 | ... | |
| ⋮ | ⋮ | |
| FF | ... | |

| ITEM | FIRST LAYER | SECOND LAYER | THIRD LAYER | FOURTH LAYER |
|---|---|---|---|---|
| NUMBER OF STRUCTURE CELLS N(i) | 1 | 16 | 256 | 4096 |
| NUMBER OF LEAVES Nl(i) | 3 | 54 | 353 | 885 |
| NUMBER OF POINTERS TO LEAVES Nlp(i) | 3 | 54 | 353 | 885 |
| NUMBER OF POINTERS TO LOWER NODES Nnp(i) | 5 | 26 | 56 | 0 |
| NUMBER OF USED STRUCTURE CELLS Ncu(i) | 1 | 5 | 26 | 56 |
| ACCUMULATED VALUE OF NUMBERS OF POINTERS TO LEAVES ΣNlp(i) | 3 | 57 | 410 | 1295 |
| NUMBER OF BLANK CELLS FROM HEAD Ncst(i) | 0 | 3 | 57 | 410 |
| NUMBER OF BLANK POINTERS TO TAIL Npse(i) | 9 | 131 | 2775 | 58091 |
| NUMBER OF BLANK CELLS TO TAIL Ncse(i) | 0 | 8 | 173 | 3630 |

| ITEM | FIRST LAYER | SECOND LAYER | THIRD LAYER | FOURTH LAYER |
|---|---|---|---|---|
| NUMBER OF LEAVES TO ADD OR DELETE | | | 885 | -885 |
| NUMBER OF STRUCTURE CELLS N(i) | 1 | 16 | 256 | 4096 |
| NUMBER OF LEAVES Nl(i) | 3 | 54 | 353 | 885 |
| NUMBER OF POINTERS TO LEAVES Nlp(i) | 3 | 54 | 1238 | 0 |
| NUMBER OF POINTERS TO LOWER NODES Nnp(i) | 5 | 78 | 1 | 0 |
| NUMBER OF USED STRUCTURE CELLS Ncu(i) | 1 | 9 | 78 | 1 |
| ACCUMULATED VALUE OF NUMBERS OF POINTERS TO LEAVES ΣNlp(i) | 3 | 57 | 1295 | 1295 |
| NUMBER OF BLANK CELLS FROM HEAD Ncst(i) | 0 | 3 | 57 | 1295 |
| NUMBER OF BLANK POINTERS TO TAIL Npse(i) | 9 | 76 | 1945 | 44816 |
| NUMBER OF BLANK CELLS TO TAIL Ncse(i) | 0 | 4 | 121 | 2801 |

FIG.13B

| ITEM | FIRST LAYER | SECOND LAYER | THIRD LAYER | FOURTH LAYER |
|---|---|---|---|---|
| NUMBER OF LEAVES TO ADD OR DELETE | | 76 | 809 | -885 |
| NUMBER OF STRUCTURE CELLS N(i) | 1 | 16 | 256 | 4096 |
| NUMBER OF LEAVES Nl(i) | 3 | 54 | 353 | 885 |
| NUMBER OF POINTERS TO LEAVES Nlp(i) | 3 | 130 | 1162 | 0 |
| NUMBER OF POINTERS TO LOWER NODES Nnp(i) | 9 | 73 | 1 | 0 |
| NUMBER OF USED STRUCTURE CELLS Ncu(i) | 1 | 13 | 73 | 1 |
| ACCUMULATED VALUE OF NUMBERS OF POINTERS TO LEAVES ΣNlp(i) | 3 | 133 | 1295 | 1295 |
| NUMBER OF BLANK CELLS FROM HEAD Ncst(i) | 0 | 3 | 133 | 1295 |
| NUMBER OF BLANK POINTERS TO TAIL Npse(i) | 4 | 5 | 805 | 44816 |
| NUMBER OF BLANK CELLS TO TAIL Ncse(i) | 0 | 0 | 50 | 2801 |

| ITEM | FIRST LAYER | SECOND LAYER | THIRD LAYER | FOURTH LAYER |
|---|---|---|---|---|
| NUMBER OF LEAVES TO ADD OR DELETE | 0 | 76 | 809 | -885 |
| NUMBER OF STRUCTURE CELLS N(i) | 1 | 16 | 256 | 4096 |
| NUMBER OF LEAVES Nl(i) | 3 | 54 | 353 | 885 |
| NUMBER OF POINTERS TO LEAVES Nlp(i) | 3 | 130 | 1162 | 0 |
| NUMBER OF POINTERS TO LOWER NODES Nnp(i) | 9 | 73 | 1 | 0 |
| NUMBER OF USED STRUCTURE CELLS Ncu(i) | 1 | 13 | 73 | 1 |
| ACCUMULATED VALUE OF NUMBERS OF POINTERS TO LEAVES ΣNlp(i) | 3 | 133 | 1295 | 1295 |
| NUMBER OF BLANK CELLS FROM HEAD Ncst(i) | 0 | 3 | 133 | 1295 |
| NUMBER OF BLANK POINTERS TO TAIL Npse(i) | 4 | 5 | 805 | 44816 |
| NUMBER OF BLANK CELLS TO TAIL Ncse(i) | 0 | 0 | 50 | 2801 |

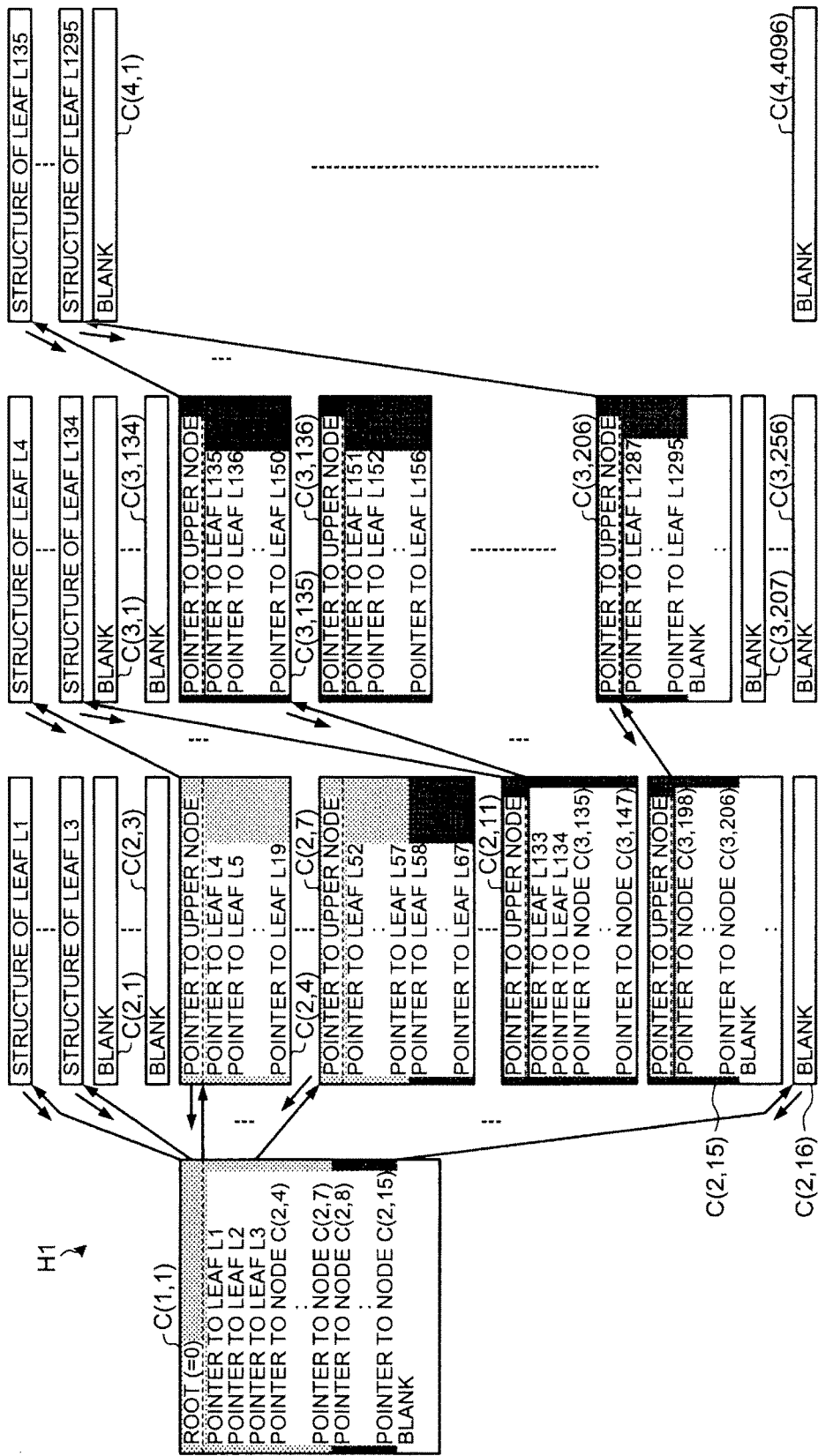

FIG.15

| LEAF NUMBER | COMPRESSION SYMBOL LENGTH | COMPRESSION SYMBOL | CHARACTER CODE | CHARACTER CODE LENGTH |
|---|---|---|---|---|
| 1 | 4 | 0000 | e1 | 16 |
| 2 | 4 | 0001 | e2 | 16 |
| 3 | 4 | 0010 | e3 | 16 |
| 4 | 8 | 00110000 | e4 | 16 |
| ⋮ | ⋮ | ⋮ | ⋮ | ⋮ |
| 19 | 8 | 00111111 | e19 | 16 |
| ⋮ | ⋮ | ⋮ | ⋮ | ⋮ |
| 24 | 8 | 01000100 | e24(0x625F) | 16 |
| ⋮ | ⋮ | ⋮ | ⋮ | ⋮ |
| 79 | 8 | 01111011 | e79(0x455C) | 16 |
| ⋮ | ⋮ | ⋮ | ⋮ | ⋮ |
| 117 | 8 | 10010000 | e117 | 16 |
| ⋮ | ⋮ | ⋮ | ⋮ | ⋮ |
| 132 | 8 | 10011111 | e132 | 16 |
| 133 | 8 | 10100000 | e133 | 16 |
| 134 | 8 | 10100001 | e134 | 16 |
| 135 | 12 | 101000100000 | e135 | 16 |
| ⋮ | ⋮ | ⋮ | ⋮ | ⋮ |
| 150 | 12 | 101000101111 | e150 | 16 |
| ⋮ | ⋮ | ⋮ | ⋮ | ⋮ |
| 156 | 12 | 101000110101 | e156(0x82) | 8 |
| ⋮ | ⋮ | ⋮ | ⋮ | ⋮ |
| 167 | 12 | 101001000000 | e167(0x9D) | 8 |
| ⋮ | ⋮ | ⋮ | ⋮ | ⋮ |
| 691 | 12 | 110001001100 | e691(0xBA4E) | 16 |
| ⋮ | ⋮ | ⋮ | ⋮ | ⋮ |
| 1295 | 12 | 101111110100 | e1295 | 16 |

| STRUCTURE OF RESERVED WORD ||
|---|---|
| TOTAL NUMBER OF RESERVED WORDS | 15 |
| LONGEST BIT LENGTH OF RESERVED WORDS | Lrmax |
| BIT LENGTH OF RESERVED WORD r1 | Lr1 (=64) |
| RESERVED WORD r1(<br>) ||
| POINTER TO LEAF OF RESERVED WORD r1 ||
| BIT LENGTH OF RESERVED WORD r2 | Lr2(=64) |
| RESERVED WORD r2(</a>) ||
| POINTER TO LEAF OF RESERVED WORD r2 ||
| ⋮ ||
| BIT LENGTH OF RESERVED WORD r15 | Lr15 |
| RESERVED WORD r15 ||
| POINTER TO LEAF OF RESERVED WORD r15 ||
| EOT(0xFFFF) ||

| STRUCTURE OF HIGHER-LEVEL CHARACTER CODE ||
|---|---|
| CHARACTER CODE | POINTER TO LEAF |
| ⋮ | ⋮ |
| e691(0xBA4E: 人) | POINTER TO LEAF OF e691 |
| ⋮ | ⋮ |
| e24(0x625F: 形) | POINTER TO LEAF OF e24 |
| ⋮ | ⋮ |
| e79(0x455C: 居) | POINTER TO LEAF OF e79 |
| ⋮ | ⋮ |

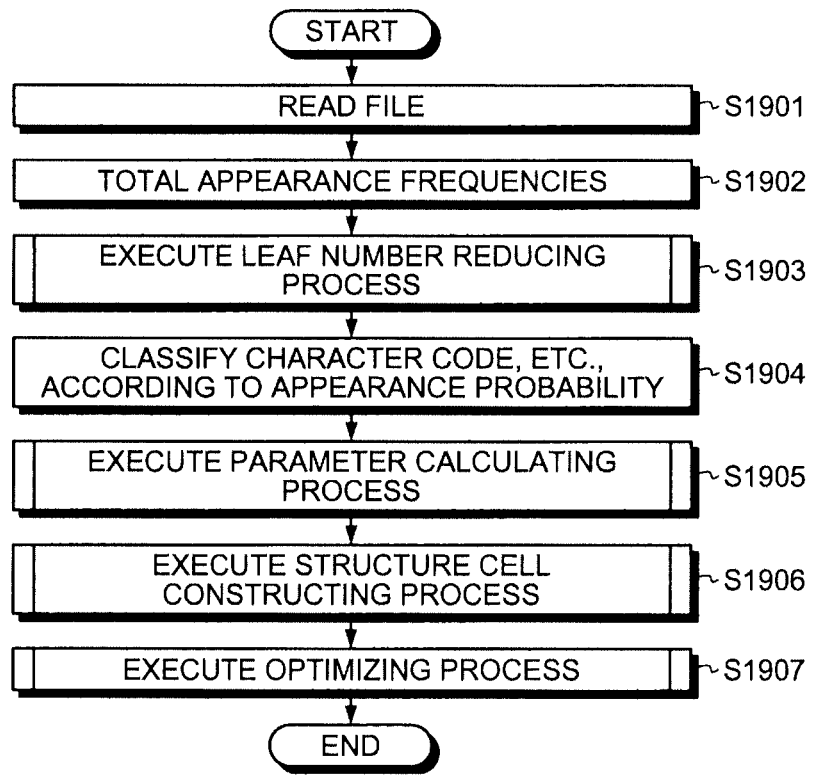

FIG.29

| LEAF NUMBER | COMPRESSION SYMBOL | COMPRES-SION SYMBOL LENGTH | EXPANSION TYPE | CHARACTER CODES, ETC. | POINTER TO COMPRESSION SYMBOL MAP | |
|---|---|---|---|---|---|---|
| | | | | | SYMBOL CATEGORY | ADDRESS VALUE |
| 1 | 0000 | 4 | ⋮ | e1 | 1 | adr1 |
| 2 | 0001 | 4 | ⋮ | e2 | 1 | adr2 |
| 3 | 0010 | 4 | ⋮ | e3 | 1 | adr3 |
| 4 | 00110000 | 8 | ⋮ | e4 | 1 | adr4 |
| ⋮ | | | | | ⋮ | ⋮ |
| 24 | 01000100 | 8 | 16 BITS | e24(0x625F) | 0 | adr24 |
| ⋮ | | | | | ⋮ | ⋮ |
| 79 | 01111011 | 8 | 16 BITS | e79(0x455C) | 0 | adr79 |
| ⋮ | | | | | ⋮ | ⋮ |
| 134 | 10100001 | 8 | ⋮ | e134 | 1 | adr134 |
| 135 | 101000100000 | 12 | ⋮ | e135 | 1 | adr135 |
| ⋮ | | | | | ⋮ | ⋮ |
| 156 | 101000110101 | 12 | 8 BITS | e156(0x82) | 0 | adr156 |
| ⋮ | | | | | ⋮ | ⋮ |
| 167 | 101001000000 | 12 | 8 BITS | e167(0x9D) | 0 | adr167 |
| ⋮ | | | | | ⋮ | ⋮ |
| 691 | 110001001100 | 12 | 16 BITS | e691(0xBA4E) | 1 | adr691 |
| ⋮ | | | | | ⋮ | ⋮ |
| 1295 | 101111110100 | 12 | ⋮ | e1295 | 1 | adr1295 |
| ⋮ | ⋮ | ⋮ | ⋮ | ⋮ | ⋮ | ⋮ |

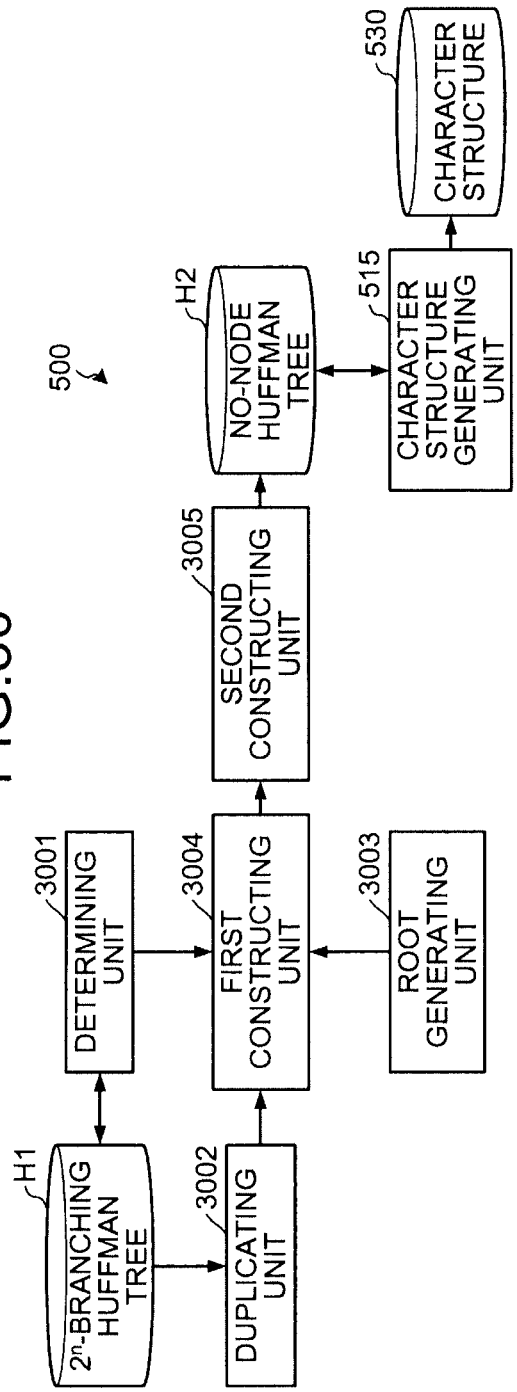

FIG.33A

| CHARACTER STRING | 人 | | 形 | | | 芝 | | | 居 | | |
|---|---|---|---|---|---|---|---|---|---|---|---|
| CHARACTER CODE STRING (HEXADECIMAL) | B | A | 4 | E | 6 | 2 | 5 | F | 9 | D | 8 | 2 | 4 | 5 | 5 | C |
| CHARACTER CODE STRING (BINARY) | 1011 | 1010 | 0100 | 1110 | 0110 | 0010 | 0101 | 1111 | 1001 | 1101 | 1000 | 0010 | 0100 | 0101 | 0101 | 1100 |

FIG.33B

| CHARACTER STRING | 人 | 形 | 査 | | 居 |
|---|---|---|---|---|---|
| | | | UPPER | LOWER | |
| COMPRESSION SYMBOL STRING | 110001001100 | 01000100 | 101001000000 | 101000110101 | 01111011 |

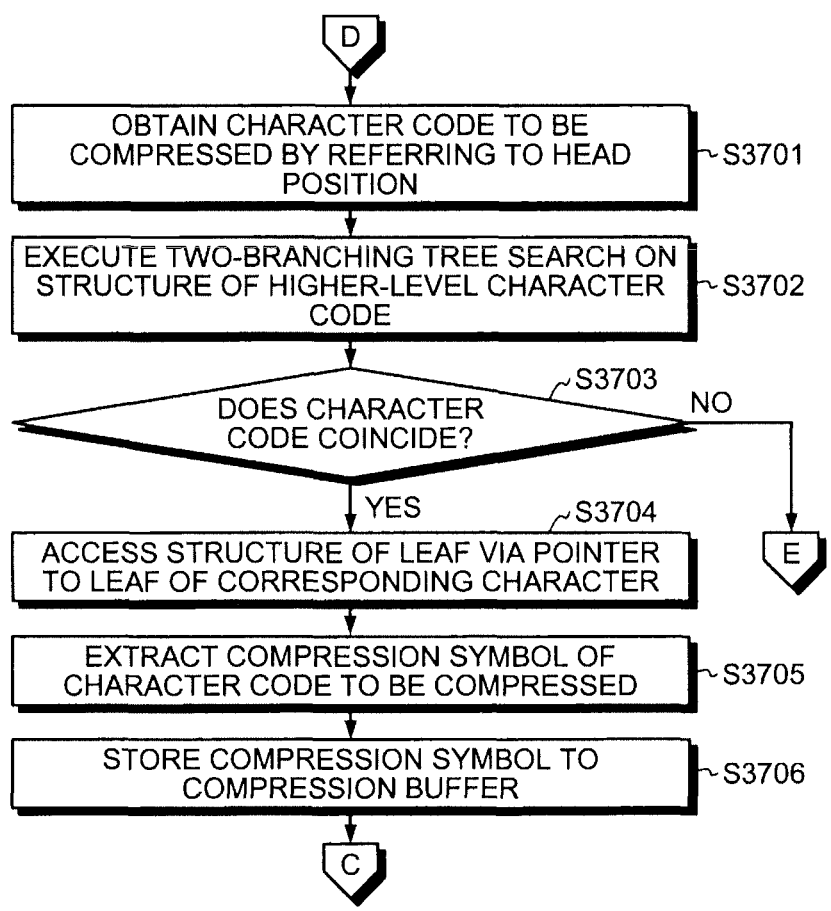

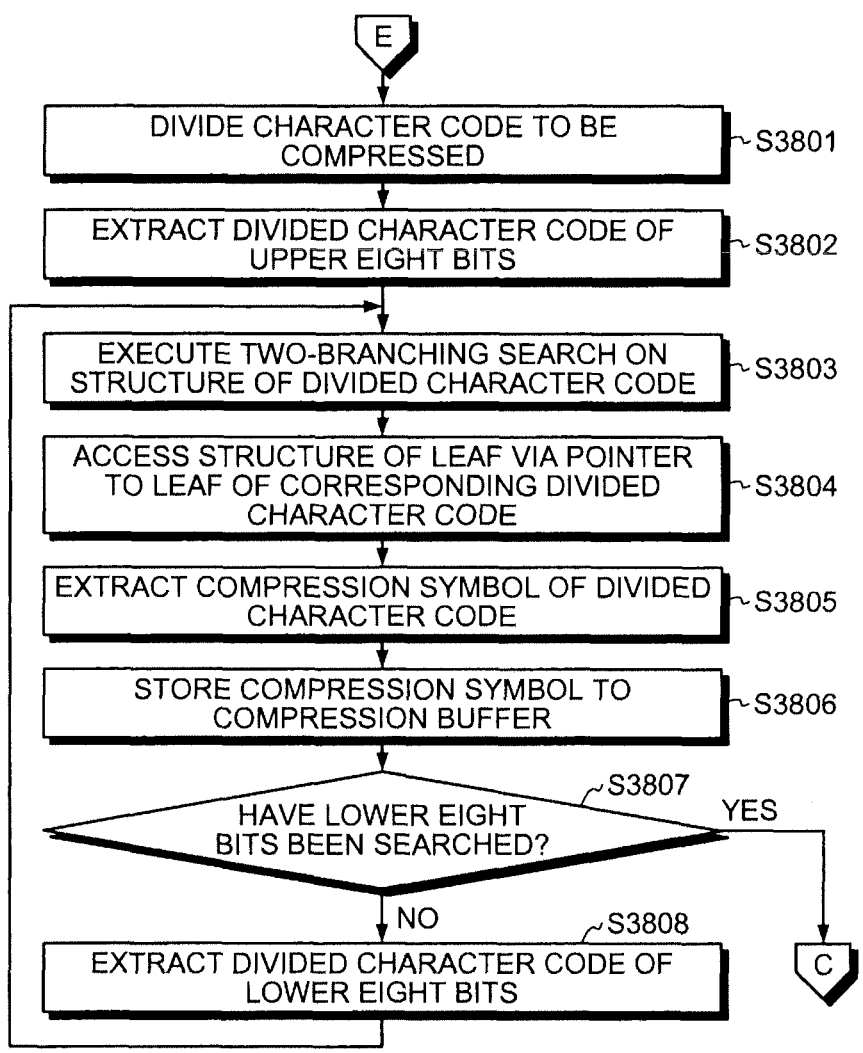

FIG.39A

INITIAL STATE

| ADDRESS | | FILE NUMBER | | | | | | | Ms |
|---|---|---|---|---|---|---|---|---|---|
| CATEGORY | ADDRESS PORTION | α | α-1 | ... | 4 | 3 | 2 | 1 | |
| 1 | 0001 | 0 | 0 | ... | 0 | 0 | 0 | 0 | |
| 1 | 0002 | 0 | 0 | ... | 0 | 0 | 0 | 0 | |
| 1 | 0003 | 0 | 0 | ... | 0 | 0 | 0 | 0 | |
| ⋮ | ⋮ | ⋮ | ⋮ | ⋮ | ⋮ | ⋮ | ⋮ | ⋮ | |
| 1 | 1024 | 0 | 0 | ... | 0 | 0 | 0 | 0 | |
| 1 | 1025 | 0 | 0 | ... | 0 | 0 | 0 | 0 | |
| ⋮ | ⋮ | ⋮ | ⋮ | ⋮ | ⋮ | ⋮ | ⋮ | ⋮ | |
| 1 | 1039 | 0 | 0 | ... | 0 | 0 | 0 | 0 | |
| 0 | 0001 | 0 | 0 | ... | 0 | 0 | 0 | 0 | |
| 0 | 0002 | 0 | 0 | ... | 0 | 0 | 0 | 0 | |
| 0 | 0003 | 0 | 0 | ... | 0 | 0 | 0 | 0 | |
| ⋮ | ⋮ | ⋮ | ⋮ | ⋮ | ⋮ | ⋮ | ⋮ | ⋮ | |
| 0 | 0256 | 0 | 0 | ... | 0 | 0 | 0 | 0 | |
| 0 | 0257 | 0 | 0 | ... | 0 | 0 | 0 | 0 | |
| ⋮ | ⋮ | ⋮ | ⋮ | ⋮ | ⋮ | ⋮ | ⋮ | ⋮ | |
| 0 | 0512 | 0 | 0 | ... | 0 | 0 | 0 | 0 | |

FIG.39B

AFTER UPDATING OF MAP

| ADDRESS | | FILE NUMBER | | | | | | | Ms |
|---|---|---|---|---|---|---|---|---|---|
| CATEGORY | ADDRESS PORTION | α | α-1 | ... | 4 | 3 | 2 | 1 | |
| 1 | 0001 | 1 | 0 | ... | 0 | 0 | 0 | 0 | |
| 1 | 0002 | 0 | 1 | ... | 1 | 0 | 1 | 0 | |
| 1 | 0003 | 0 | 0 | ... | 0 | 0 | 0 | 1 | |
| ⋮ | ⋮ | ⋮ | ⋮ | ⋮ | ⋮ | ⋮ | ⋮ | ⋮ | |
| 1 | 1024 | 0 | 0 | ... | 1 | 1 | 1 | 1 | |
| 1 | 1025 | 0 | 1 | ... | 1 | 0 | 0 | 0 | |
| ⋮ | ⋮ | ⋮ | ⋮ | ⋮ | ⋮ | ⋮ | ⋮ | ⋮ | |
| 1 | 1039 | 0 | 0 | ... | 0 | 0 | 0 | 0 | |
| 0 | 0001 | 0 | 0 | ... | 0 | 1 | 0 | 0 | |
| 0 | 0002 | 0 | 0 | ... | 0 | 1 | 1 | 0 | |
| 0 | 0003 | 0 | 0 | ... | 0 | 1 | 0 | 1 | |
| ⋮ | ⋮ | ⋮ | ⋮ | ⋮ | ⋮ | ⋮ | ⋮ | ⋮ | |
| 0 | 0256 | 0 | 0 | ... | 0 | 1 | 0 | 0 | |
| 0 | 0257 | 0 | 0 | ... | 1 | 0 | 0 | 1 | |
| ⋮ | ⋮ | ⋮ | ⋮ | ⋮ | ⋮ | ⋮ | ⋮ | ⋮ | |
| 0 | 0512 | 0 | 0 | ... | 0 | 0 | 1 | 0 | |

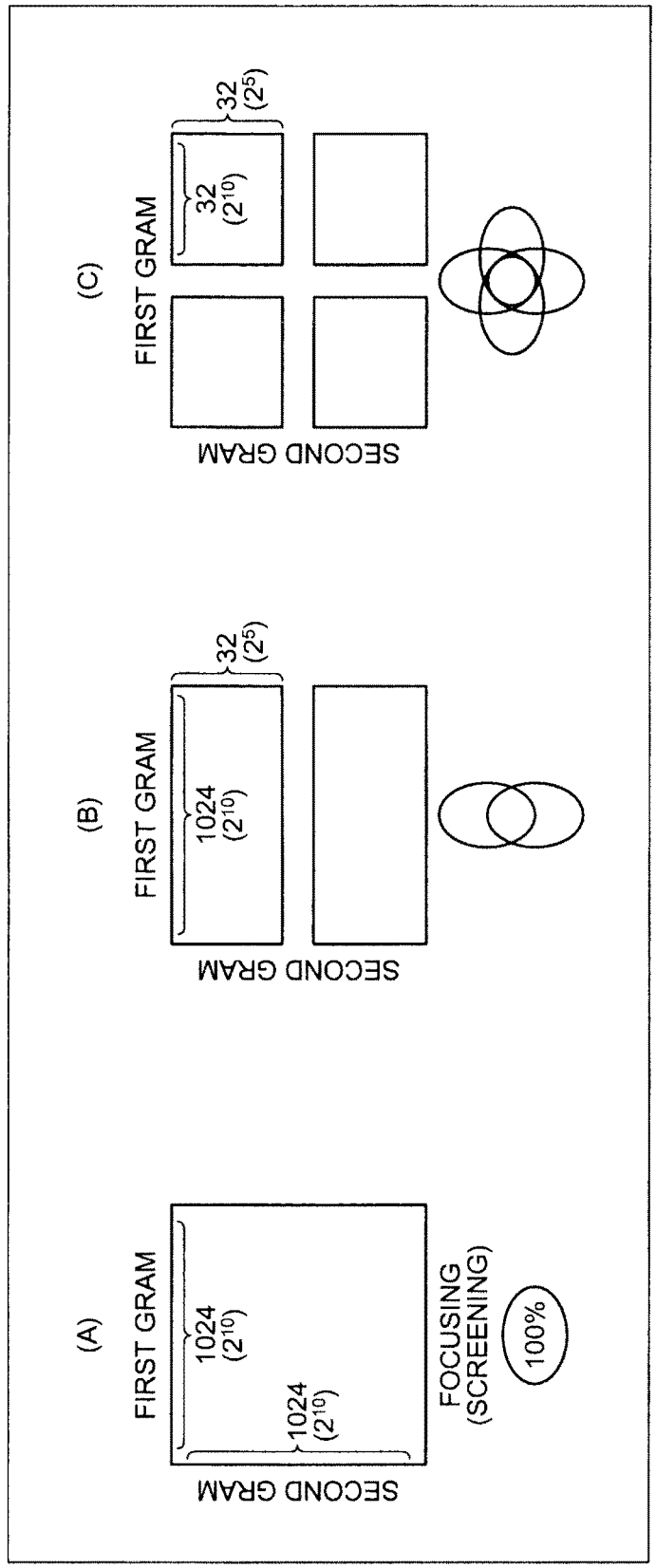

FIG.41

| COMBINATION OF TWO-GRAM SECTIONS | (A) SIZE OF NON-DIVIDED SECTION | (B) SIZE OF SECTIONS DIVIDED IN TWO | (C) SIZE OF SECTIONS DIVIDED IN FOUR |
|---|---|---|---|
| HIGHER-LEVEL CHARACTER CODES | 1024×1024=1M | 1024×32×2=64K | 32×32×4=4K |
| HIGHER-LEVEL CHARACTER CODE×UPPER DIVIDED CHARACTER CODE | 1024×256=256K | 1024×16×2=32K | 32×16×4=2K |
| UPPER DIVIDED CHARACTER CODE×LOWER DIVIDED CHARACTER CODE | 256×256=64K | 256×16×2=8K | 16×16×4=1K |
| LOWER DIVIDED CHARACTER CODE×UPPER DIVIDED CHARACTER CODE | 256×256=64K | 256×16×2=8K | 16×16×4=1K |
| LOWER DIVIDED CHARACTER CODE×HIGHER-LEVEL CHARACTER CODE | 1024×256=256K | 1024×16×2=32K | 32×16×4=2K |
| TOTAL | 1.64M | 144K | 10K |

FIG.43A

| FIRST GRAM | | SECOND GRAM | | FILE NUMBER | | | | | |
|---|---|---|---|---|---|---|---|---|---|
| SYM-BOL CATE-GORY | UPPER 5 BITS OF ADDRESS VALUE OF POINTER TO COMPRESSION SYMBOL MAP OF HIGHER-LEVEL CHARACTER CODE | SYM-BOL CATE-GORY | UPPER 5 BITS OF ADDRESS VALUE OF POINTER TO COMPRESSION SYMBOL MAP OF HIGHER-LEVEL CHARACTER CODE | α | α-1 | ... | 3 | 2 | 1 |
| 1 | 00000 | 1 | 00000 | 0 | 0 | ... | 0 | 0 | 0 |
| 1 | 00000 | 1 | 00001 | 0 | 0 | ... | 0 | 0 | 0 |
| : | : | : | : | : | : | : | : | : | : |
| 1 | 00000 | 1 | 11111 | 0 | 0 | ... | 0 | 0 | 0 |
| : | : | : | : | : | : | : | : | : | : |
| 1 | UPPER 5 BITS OF ADDRESS VALUE OF POINTER TO COMPRESSION SYMBOL MAP OF "人" | 1 | UPPER 5 BITS OF ADDRESS VALUE OF POINTER TO COMPRESSION SYMBOL MAP OF "形" | 0 | 0 | ... | 0 | 0 | 0 |
| : | : | : | : | : | : | : | : | : | : |
| 1 | 11111 | 1 | 00000 | 0 | 0 | ... | 0 | 0 | 0 |
| 1 | 11111 | 1 | 00001 | 0 | 0 | ... | 0 | 0 | 0 |
| : | : | : | : | : | : | : | : | : | : |
| 1 | 11111 | 1 | 11111 | 0 | 0 | ... | 0 | 0 | 0 |

FIG.43B

| FIRST GRAM | | SECOND GRAM | | FILE NUMBER | | | | | |
|---|---|---|---|---|---|---|---|---|---|
| SYM-BOL CATE-GORY | UPPER 5 BITS OF ADDRESS VALUE OF POINTER TO COMPRESSION SYMBOL MAP OF HIGHER-LEVEL CHARACTER CODE | SYM-BOL CATE-GORY | LOWER 5 BITS OF ADDRESS VALUE OF POINTER TO COMPRESSION SYMBOL MAP OF HIGHER-LEVEL CHARACTER CODE | α | α-1 | ... | 3 | 2 | 1 |
| 1 | 00000 | 1 | 00000 | 0 | 0 | ... | 0 | 0 | 0 |
| 1 | 00000 | 1 | 00001 | 0 | 0 | ... | 0 | 0 | 0 |
| : | : | : | : | : | : | : | : | : | : |
| 1 | 00000 | 1 | 11111 | 0 | 0 | ... | 0 | 0 | 0 |
| : | : | : | : | : | : | : | : | : | : |
| 1 | UPPER 5 BITS OF ADDRESS VALUE OF POINTER TO COMPRESSION SYMBOL MAP OF "人" | 1 | LOWER 5 BITS OF ADDRESS VALUE OF POINTER TO COMPRESSION SYMBOL MAP OF "形" | 0 | 0 | ... | 0 | 0 | 0 |
| : | : | : | : | : | : | : | : | : | : |
| 1 | 11111 | 1 | 00000 | 0 | 0 | ... | 0 | 0 | 0 |
| 1 | 11111 | 1 | 00001 | 0 | 0 | ... | 0 | 0 | 0 |
| : | : | : | : | : | : | : | : | : | : |
| 1 | 11111 | 1 | 11111 | 0 | 0 | ... | 0 | 0 | 0 |

FIG.43C

| FIRST GRAM | | SECOND GRAM | | FILE NUMBER | | | | | |
|---|---|---|---|---|---|---|---|---|---|
| SYM-BOL CATE-GORY | LOWER 5 BITS OF ADDRESS VALUE OF POINTER TO COMPRESSION SYMBOL MAP OF HIGHER-LEVEL CHARACTER CODE | SYM-BOL CATE-GORY | UPPER 5 BITS OF ADDRESS VALUE OF POINTER TO COMPRESSION SYMBOL MAP OF HIGHER-LEVEL CHARACTER CODE | α | α-1 | ... | 3 | 2 | 1 |
| 1 | 00000 | 1 | 00000 | 0 | 0 | ... | 0 | 0 | 0 |
| 1 | 00000 | 1 | 00001 | 0 | 0 | ... | 0 | 0 | 0 |
| : | : | : | : | : | : | : | : | : | : |
| 1 | 00000 | 1 | 11111 | 0 | 0 | ... | 0 | 0 | 0 |
| : | : | : | : | : | : | : | : | : | : |
| 1 | LOWER 5 BITS OF ADDRESS VALUE OF POINTER TO COMPRESSION SYMBOL MAP OF "人" | 1 | UPPER 5 BITS OF ADDRESS VALUE OF POINTER TO COMPRESSION SYMBOL MAP OF "形" | 0 | 0 | ... | 0 | 0 | 0 |
| : | : | : | : | : | : | : | : | : | : |
| 1 | 11111 | 1 | 00000 | 0 | 0 | ... | 0 | 0 | 0 |
| 1 | 11111 | 1 | 00001 | 0 | 0 | ... | 0 | 0 | 0 |
| : | : | : | : | : | : | : | : | : | : |
| 1 | 11111 | 1 | 11111 | 0 | 0 | ... | 0 | 0 | 0 |

FIG.43D

| FIRST GRAM | | SECOND GRAM | | FILE NUMBER | | | | | |
|---|---|---|---|---|---|---|---|---|---|
| SYM-BOL CATE-GORY | LOWER 5 BITS OF ADDRESS VALUE OF POINTER TO COMPRESSION SYMBOL MAP OF HIGHER-LEVEL CHARACTER CODE | SYM-BOL CATE-GORY | LOWER 5 BITS OF ADDRESS VALUE OF POINTER TO COMPRESSION SYMBOL MAP OF HIGHER-LEVEL CHARACTER CODE | α | α-1 | ... | 3 | 2 | 1 |
| 1 | 00000 | 1 | 00000 | 0 | 0 | ... | 0 | 0 | 0 |
| 1 | 00000 | 1 | 00001 | 0 | 0 | ... | 0 | 0 | 0 |
| : | : | : | : | : | : | : | : | : | : |
| 1 | 00000 | 1 | 11111 | 0 | 0 | ... | 0 | 0 | 0 |
| : | : | : | : | : | : | : | : | : | : |
| 1 | LOWER 5 BITS OF ADDRESS VALUE OF POINTER TO COMPRESSION SYMBOL MAP OF "人" | 1 | LOWER 5 BITS OF ADDRESS VALUE OF POINTER TO COMPRESSION SYMBOL MAP OF "形" | 0 | 0 | ... | 0 | 0 | 0 |
| : | : | : | : | : | : | : | : | : | : |
| 1 | 11111 | 1 | 00000 | 0 | 0 | ... | 0 | 0 | 0 |
| 1 | 11111 | 1 | 00001 | 0 | 0 | ... | 0 | 0 | 0 |
| : | : | : | : | : | : | : | : | : | : |
| 1 | 11111 | 1 | 11111 | 0 | 0 | ... | 0 | 0 | 0 |

FIG.43E

| FIRST GRAM | | SECOND GRAM | | | FILE NUMBER | | | | | |
|---|---|---|---|---|---|---|---|---|---|---|
| SYM-BOL CATE-GORY | UPPER 5 BITS OF ADDRESS VALUE OF POINTER TO COMPRESSION SYMBOL MAP OF HIGHER-LEVEL CHARACTER CODE | SYM-BOL CATE-GORY | ADDRESS VALUE OF POINTER TO COMPRESSION SYMBOL MAP OF UPPER DIVIDED CHARACTER CODE | | α | α-1 | ... | 3 | 2 | 1 |
| | | | UPPER CATE-GORY | UPPER 4 BITS OF REMAINING BITS | | | | | | |
| 1 | 00000 | 0 | 00 | 0000 | 0 | 0 | ... | 0 | 0 | 0 |
| 1 | 00000 | 0 | 00 | 0001 | 0 | 0 | ... | 0 | 0 | 0 |
| : | : | : | : | : | : | : | : | : | : | : |
| 1 | 00000 | 0 | 00 | 1111 | 0 | 0 | ... | 0 | 0 | 0 |
| : | : | : | : | : | : | : | : | : | : | : |
| 1 | UPPER 5 BITS OF ADDRESS VALUE OF POINTER TO COMPRESSION SYMBOL MAP OF "形" | 0 | 00 | UPPER 4 BITS OF REMAINING BITS OF ADDRESS VALUE OF POINTER TO COMPRESSION SYMBOL MAP OF UPPER DIVIDED CHARACTER CODE "0x9D" OF "芝" | 0 | 0 | ... | 0 | 0 | 0 |
| : | : | : | : | : | : | : | : | : | : | : |
| 1 | 11111 | 0 | 00 | 0000 | 0 | 0 | ... | 0 | 0 | 0 |
| 1 | 11111 | 0 | 00 | 0001 | 0 | 0 | ... | 0 | 0 | 0 |
| : | : | : | : | : | : | : | : | : | : | : |
| 1 | 11111 | 0 | 00 | 1111 | 0 | 0 | ... | 0 | 0 | 0 |

FIG.43F

| FIRST GRAM | | SECOND GRAM | | | FILE NUMBER | | | | | |
|---|---|---|---|---|---|---|---|---|---|---|
| SYM-BOL CATE-GORY | UPPER 5 BITS OF ADDRESS VALUE OF POINTER TO COMPRESSION SYMBOL MAP OF HIGHER-LEVEL CHARACTER CODE | SYM-BOL CATE-GORY | ADDRESS VALUE OF POINTER TO COMPRESSION SYMBOL MAP OF UPPER DIVIDED CHARACTER CODE | | | | | | | |
| | | | UPPER CATE-GORY | LOWER 4 BITS OF REMAINING BITS | α | α-1 | ... | 3 | 2 | 1 |
| 1 | 00000 | 0 | 00 | 0000 | 0 | 0 | ... | 0 | 0 | 0 |
| 1 | 00000 | 0 | 00 | 0001 | 0 | 0 | ... | 0 | 0 | 0 |
| : | : | : | : | : | : | : | : | : | : | : |
| 1 | 00000 | 0 | 00 | 1111 | 0 | 0 | ... | 0 | 0 | 0 |
| : | : | : | : | : | : | : | : | : | : | : |
| 1 | UPPER 5 BITS OF ADDRESS VALUE OF POINTER TO COMPRESSION SYMBOL MAP OF "形" | 0 | 00 | LOWER 4 BITS OF REMAINING BITS OF ADDRESS VALUE OF POINTER TO COMPRESSION SYMBOL MAP OF UPPER DIVIDED CHARACTER CODE "0x9D" OF "芝" | 0 | 0 | ... | 0 | 0 | 0 |
| : | : | : | : | : | : | : | : | : | : | : |
| 1 | 11111 | 0 | 00 | 0000 | 0 | 0 | ... | 0 | 0 | 0 |
| 1 | 11111 | 0 | 00 | 0001 | 0 | 0 | ... | 0 | 0 | 0 |
| : | : | : | : | : | : | : | : | : | : | : |
| 1 | 11111 | 0 | 00 | 1111 | 0 | 0 | ... | 0 | 0 | 0 |

FIG.43G

| FIRST GRAM | | SECOND GRAM | | | FILE NUMBER | | | | | |
|---|---|---|---|---|---|---|---|---|---|---|
| SYM-BOL CATE-GORY | LOWER 5 BITS OF ADDRESS VALUE OF POINTER TO COMPRESSION SYMBOL MAP OF HIGHER-LEVEL CHARACTER CODE | SYM-BOL CATE-GORY | ADDRESS VALUE OF POINTER TO COMPRESSION SYMBOL MAP OF UPPER DIVIDED CHARACTER CODE | | | | | | | |
| | | | UPPER CATE-GORY | UPPER 4 BITS OF REMAINING BITS | α | α-1 | ... | 3 | 2 | 1 |
| 1 | 00000 | 0 | 00 | 0000 | 0 | 0 | ... | 0 | 0 | 0 |
| 1 | 00000 | 0 | 00 | 0001 | 0 | 0 | ... | 0 | 0 | 0 |
| : | : | : | : | : | : | : | : | : | : | : |
| 1 | 00000 | 0 | 00 | 1111 | 0 | 0 | ... | 0 | 0 | 0 |
| : | : | : | : | : | : | : | : | : | : | : |
| 1 | LOWER 5 BITS OF ADDRESS VALUE OF POINTER TO COMPRESSION SYMBOL MAP OF "形" | 0 | 00 | UPPER 4 BITS OF REMAINING BITS OF ADDRESS VALUE OF POINTER TO COMPRESSION SYMBOL MAP OF UPPER DIVIDED CHARACTER CODE "0x9D" OF "芝" | 0 | 0 | ... | 0 | 0 | 0 |
| : | : | : | : | : | : | : | : | : | : | : |
| 1 | 11111 | 0 | 00 | 0000 | 0 | 0 | ... | 0 | 0 | 0 |
| 1 | 11111 | 0 | 00 | 0001 | 0 | 0 | ... | 0 | 0 | 0 |
| : | : | : | : | : | : | : | : | : | : | : |
| 1 | 11111 | 0 | 00 | 1111 | 0 | 0 | ... | 0 | 0 | 0 |

FIG.43H

| FIRST GRAM | | SECOND GRAM | | | FILE NUMBER | | | | | |
|---|---|---|---|---|---|---|---|---|---|---|
| SYM-BOL CATE-GORY | LOWER 5 BITS OF ADDRESS VALUE OF POINTER TO COMPRESSION SYMBOL MAP OF HIGHER-LEVEL CHARACTER CODE | SYM-BOL CATE-GORY | ADDRESS VALUE OF POINTER TO COMPRESSION SYMBOL MAP OF UPPER DIVIDED CHARACTER CODE | | | | | | | |
| | | | UPPER CATE-GORY | LOWER 4 BITS OF REMAINING BITS | α | α-1 | ... | 3 | 2 | 1 |
| 1 | 00000 | 0 | 00 | 0000 | 0 | 0 | ... | 0 | 0 | 0 |
| 1 | 00000 | 0 | 00 | 0001 | 0 | 0 | ... | 0 | 0 | 0 |
| : | : | : | : | : | : | : | : | : | : | : |
| 1 | 00000 | 0 | 00 | 1111 | 0 | 0 | ... | 0 | 0 | 0 |
| : | : | : | : | : | : | : | : | : | : | : |
| 1 | LOWER 5 BITS OF ADDRESS VALUE OF POINTER TO COMPRESSION SYMBOL MAP OF "形" | 0 | 00 | LOWER 4 BITS OF REMAINING BITS OF ADDRESS VALUE OF POINTER TO COMPRESSION SYMBOL MAP OF UPPER DIVIDED CHARACTER CODE "0x9D" OF "芝" | 0 | 0 | ... | 0 | 0 | 0 |
| : | : | : | : | : | : | : | : | : | : | : |
| 1 | 11111 | 0 | 00 | 0000 | 0 | 0 | ... | 0 | 0 | 0 |
| 1 | 11111 | 0 | 00 | 0001 | 0 | 0 | ... | 0 | 0 | 0 |
| : | : | : | : | : | : | : | : | : | : | : |
| 1 | 11111 | 0 | 00 | 1111 | 0 | 0 | ... | 0 | 0 | 0 |

FIG.43I

| SYM-BOL CATE-GORY | FIRST GRAM | | | SYM-BOL CATE-GORY | SECOND GRAM | | | FILE NUMBER | | | | | |
|---|---|---|---|---|---|---|---|---|---|---|---|---|---|
| | ADDRESS VALUE OF POINTER TO COMPRESSION SYMBOL MAP OF UPPER DIVIDED CHARACTER CODE | | | | ADDRESS VALUE OF POINTER TO COMPRESSION SYMBOL MAP OF LOWER DIVIDED CHARACTER CODE | | | | | | | | |
| | UPPER 2 BITS | UPPER 4 BITS OF REMAINING BITS | | | UPPER CATE-GORY | UPPER 4 BITS OF REMAINING BITS | | α | α-1 | ... | 3 | 2 | 1 |
| 0 | 00 | 0000 | | 0 | 01 | 0000 | | 0 | 0 | ... | 0 | 0 | 0 |
| 0 | 00 | 0001 | | 0 | 01 | 0000 | | 0 | 0 | ... | 0 | 0 | 0 |
| ... | ... | ... | | ... | ... | ... | | ... | ... | | ... | ... | ... |
| 0 | 00 | 1111 | | 0 | 01 | 1111 | | 0 | 0 | ... | 0 | 0 | 0 |
| ... | ... | ... | | ... | ... | ... | | ... | ... | | ... | ... | ... |
| 0 | 00 | UPPER 4 BITS OF REMAINING BITS OF ADDRESS VALUE OF POINTER TO COMPRESSION SYMBOL MAP OF UPPER DIVIDED CHARACTER CODE "0x9D" OF "芝" | | 0 | 01 | UPPER 4 BITS OF REMAINING BITS OF ADDRESS VALUE OF POINTER TO COMPRESSION SYMBOL MAP OF LOWER DIVIDED CHARACTER CODE "0x82" OF "芝" | | 0 | 0 | ... | 0 | 0 | 0 |
| ... | ... | | | ... | ... | | | ... | ... | | ... | ... | ... |
| 0 | 00 | 0000 | | 0 | 01 | 0000 | | 0 | 0 | ... | 0 | 0 | 0 |
| 0 | 00 | 0001 | | 0 | 01 | 0000 | | 0 | 0 | ... | 0 | 0 | 0 |
| ... | ... | ... | | ... | ... | ... | | ... | ... | | ... | ... | ... |
| 0 | 00 | 1111 | | 0 | 01 | 1111 | | 0 | 0 | ... | 0 | 0 | 0 |

FIG. 43J

| FIRST GRAM | | | SYMBOL CATEGORY | SECOND GRAM | | | FILE NUMBER | | | | | |
|---|---|---|---|---|---|---|---|---|---|---|---|---|
| SYMBOL CATEGORY | ADDRESS VALUE OF POINTER TO COMPRESSION SYMBOL MAP OF UPPER DIVIDED CHARACTER CODE | | | ADDRESS VALUE OF POINTER TO COMPRESSION SYMBOL MAP OF LOWER DIVIDED CHARACTER CODE | | | α | α-1 | ... | 3 | 2 | 1 |
| | UPPER 2 BITS | UPPER 4 BITS OF REMAINING BITS | | UPPER CATE-GORY | LOWER 4 BITS OF REMAINING BITS | | | | | | | |
| 0 | 00 | 0000 | 0 | 01 | 0000 | | 0 | 0 | ... | 0 | 0 | 0 |
| 0 | 00 | 0001 | 0 | 01 | 0000 | | 0 | 0 | ... | 0 | 0 | 0 |
| .. | .. | .. | .. | .. | .. | | .. | .. | .. | .. | .. | .. |
| 0 | 00 | 1111 | 0 | 01 | 1111 | | 0 | 0 | ... | 0 | 0 | 0 |
| .. | .. | .. | .. | .. | .. | | .. | .. | .. | .. | .. | .. |
| 0 | 00 | UPPER 4 BITS OF REMAINING BITS OF ADDRESS VALUE OF POINTER TO COMPRESSION SYMBOL MAP OF UPPER DIVIDED CHARACTER CODE "0x9D" OF "芝" | 0 | 01 | LOWER 4 BITS OF REMAINING BITS OF ADDRESS VALUE OF POINTER TO COMPRESSION SYMBOL MAP OF LOWER DIVIDED CHARACTER CODE "0x82" OF "芝" | | 0 | 0 | ... | 0 | 0 | 0 |
| .. | .. | .. | .. | .. | .. | | .. | .. | .. | .. | .. | .. |
| 0 | 00 | 0000 | 0 | 01 | 0000 | | 0 | 0 | ... | 0 | 0 | 0 |
| 0 | 00 | 0001 | 0 | 01 | 0000 | | 0 | 0 | ... | 0 | 0 | 0 |
| .. | .. | .. | .. | .. | .. | | .. | .. | .. | .. | .. | .. |
| 0 | 00 | 1111 | 0 | 01 | 1111 | | 0 | 0 | ... | 0 | 0 | 0 |

FIG.43K

| FIRST GRAM | | | SECOND GRAM | | | FILE NUMBER | | | | | |
|---|---|---|---|---|---|---|---|---|---|---|---|
| SYMBOL CATEGORY | ADDRESS VALUE OF POINTER TO COMPRESSION SYMBOL MAP OF UPPER DIVIDED CHARACTER CODE | | SYMBOL CATEGORY | ADDRESS VALUE OF POINTER TO COMPRESSION SYMBOL MAP OF LOWER DIVIDED CHARACTER CODE | | | | | | | |
| | UPPER 2 BITS | LOWER 4 BITS OF REMAINING BITS | | UPPER CATEGORY | UPPER 4 BITS OF REMAINING BITS | α | α-1 | ... | 3 | 2 | 1 |
| 0 | 00 | 0000 | 0 | 01 | 0000 | 0 | 0 | ... | 0 | 0 | 0 |
| 0 | 00 | 0001 | 0 | 01 | 0000 | 0 | 0 | ... | 0 | 0 | 0 |
| ... | ... | ... | ... | ... | ... | ... | ... | ... | ... | ... | ... |
| 0 | 00 | 1111 | 0 | 01 | 1111 | 0 | 0 | ... | 0 | 0 | 0 |
| 0 | 00 | LOWER 4 BITS OF REMAINING BITS OF ADDRESS VALUE OF POINTER TO COMPRESSION SYMBOL MAP OF UPPER DIVIDED CHARACTER CODE "0x9D" OF "芝" | 0 | 01 | UPPER 4 BITS OF REMAINING BITS OF ADDRESS VALUE OF POINTER TO COMPRESSION SYMBOL MAP OF LOWER DIVIDED CHARACTER CODE "0x82" OF "芝" | 0 | 0 | ... | 0 | 0 | 0 |
| ... | ... | ... | ... | ... | ... | ... | ... | ... | ... | ... | ... |
| 0 | 00 | 0000 | 0 | 01 | 0000 | 0 | 0 | ... | 0 | 0 | 0 |
| 0 | 00 | 0001 | 0 | 01 | 0000 | 0 | 0 | ... | 0 | 0 | 0 |
| 0 | 00 | 1111 | 0 | 01 | 1111 | 0 | 0 | ... | 0 | 0 | 0 |

FIG. 43L

| SYMBOL CATE-GORY | FIRST GRAM – ADDRESS VALUE OF POINTER TO COMPRESSION SYMBOL MAP OF UPPER DIVIDED CHARACTER CODE | | SYMBOL CATE-GORY | SECOND GRAM – ADDRESS VALUE OF POINTER TO COMPRESSION SYMBOL MAP OF LOWER DIVIDED CHARACTER CODE | | FILE NUMBER | | | | | | |
|---|---|---|---|---|---|---|---|---|---|---|---|---|
| | UPPER 2 BITS | LOWER 4 BITS OF REMAINING BITS | | UPPER 2 BITS | LOWER 4 BITS OF REMAINING BITS | α | α-1 | ... | 3 | 2 | 1 | |
| 0 | 00 | 0000 | 0 | 01 | 0000 | 0 | 0 | ... | 0 | 0 | 0 | |
| 0 | 00 | 0001 | 0 | 01 | 0000 | 0 | 0 | ... | 0 | 0 | 0 | |
| ... | ... | ... | ... | ... | ... | ... | ... | | ... | ... | ... | |
| 0 | 00 | 1111 | 0 | 01 | 1111 | 0 | 0 | ... | 0 | 0 | 0 | |
| ... | ... | ... | ... | ... | ... | ... | ... | | ... | ... | ... | |
| 0 | 00 | LOWER 4 BITS OF REMAINING BITS OF ADDRESS VALUE OF POINTER TO COMPRESSION SYMBOL MAP OF UPPER DIVIDED CHARACTER CODE "0x9D" OF "芝" | 0 | 01 | LOWER 4 BITS OF REMAINING BITS OF ADDRESS VALUE OF POINTER TO COMPRESSION SYMBOL MAP OF LOWER DIVIDED CHARACTER CODE "0x82" OF "芝" | 0 | 0 | ... | 0 | 0 | 0 | |
| ... | ... | ... | ... | ... | ... | ... | ... | | ... | ... | ... | |
| 0 | 00 | 0000 | 0 | 01 | 0000 | 0 | 0 | ... | 0 | 0 | 0 | |
| 0 | 00 | 0001 | 0 | 01 | 0000 | 0 | 0 | ... | 0 | 0 | 0 | |
| ... | ... | ... | ... | ... | ... | ... | ... | | ... | ... | ... | |
| 0 | 00 | 1111 | 0 | 01 | 1111 | 0 | 0 | ... | 0 | 0 | 0 | |

FIG.43M

| FIRST GRAM | | | SECOND GRAM | | FILE NUMBER | | | | | |
|---|---|---|---|---|---|---|---|---|---|---|
| SYM-BOL CATE-GORY | ADDRESS VALUE OF POINTER TO COMPRESSION SYMBOL MAP OF LOWER DIVIDED CHARACTER CODE | | SYM-BOL CATE-GORY | UPPER 5 BITS OF ADDRESS VALUE OF POINTER TO COMPRESSION SYMBOL MAP OF HIGHER-LEVEL CHARACTER CODE | | | | | | |
| | UPPER CATE-GORY | UPPER 4 BITS OF REMAINING BITS | | | α | α-1 | ... | 3 | 2 | 1 |
| 0 | 01 | 0000 | 1 | 00000 | 0 | 0 | ... | 0 | 0 | 0 |
| 0 | 01 | 0000 | 1 | 00001 | 0 | 0 | ... | 0 | 0 | 0 |
| : | : | : | : | : | : | : | : | : | : | : |
| 0 | 01 | 1111 | 1 | 11111 | 0 | 0 | ... | 0 | 0 | 0 |
| : | : | : | : | : | : | : | : | : | : | : |
| 0 | 01 | UPPER 4 BITS OF REMAINING BITS OF ADDRESS VALUE OF POINTER TO COMPRESSION SYMBOL MAP OF LOWER DIVIDED CHARACTER CODE "0x82" OF "芝" | 1 | UPPER 5 BITS OF ADDRESS VALUE OF POINTER TO COMPRESSION SYMBOL MAP OF "居" | 0 | 0 | ... | 0 | 0 | 0 |
| : | : | : | : | : | : | : | : | : | : | : |
| 0 | 01 | 0000 | 1 | 00000 | 0 | 0 | ... | 0 | 0 | 0 |
| 0 | 01 | 0000 | 1 | 00001 | 0 | 0 | ... | 0 | 0 | 0 |
| : | : | : | : | : | : | : | : | : | : | : |
| 0 | 01 | 1111 | 1 | 11111 | 0 | 0 | ... | 0 | 0 | 0 |

FIG.43N

| FIRST GRAM | | | SECOND GRAM | | FILE NUMBER | | | | | |
|---|---|---|---|---|---|---|---|---|---|---|
| SYM-BOL CATE-GORY | ADDRESS VALUE OF POINTER TO COMPRESSION SYMBOL MAP OF LOWER DIVIDED CHARACTER CODE | | SYM-BOL CATE-GORY | LOWER 5 BITS OF ADDRESS VALUE OF POINTER TO COMPRESSION SYMBOL MAP OF HIGHER-LEVEL CHARACTER CODE | | | | | | |
| | UPPER CATE-GORY | UPPER 4 BITS OF REMAINING BITS | | | α | α-1 | ... | 3 | 2 | 1 |
| 0 | 01 | 0000 | 1 | 00000 | 0 | 0 | ... | 0 | 0 | 0 |
| 0 | 01 | 0000 | 1 | 00001 | 0 | 0 | ... | 0 | 0 | 0 |
| : | : | : | : | : | : | : | : | : | : | : |
| 0 | 01 | 1111 | 1 | 11111 | 0 | 0 | ... | 0 | 0 | 0 |
| : | : | : | : | : | : | : | : | : | : | : |
| 0 | 01 | UPPER 4 BITS OF REMAINING BITS OF ADDRESS VALUE OF POINTER TO COMPRESSION SYMBOL MAP OF LOWER DIVIDED CHARACTER CODE "0x82" OF "芝" | 1 | LOWER 5 BITS OF ADDRESS VALUE OF POINTER TO COMPRESSION SYMBOL MAP OF "居" | 0 | 0 | ... | 0 | 0 | 0 |
| : | : | : | : | : | : | : | : | : | : | : |
| 0 | 01 | 0000 | 1 | 00000 | 0 | 0 | ... | 0 | 0 | 0 |
| 0 | 01 | 0000 | 1 | 00001 | 0 | 0 | ... | 0 | 0 | 0 |
| : | : | : | : | : | : | : | : | : | : | : |
| 0 | 01 | 1111 | 1 | 11111 | 0 | 0 | ... | 0 | 0 | 0 |

FIG.43O

| FIRST GRAM | | | SECOND GRAM | | FILE NUMBER | | | | | |
|---|---|---|---|---|---|---|---|---|---|---|
| SYM-BOL CATE-GORY | ADDRESS VALUE OF POINTER TO COMPRESSION SYMBOL MAP OF LOWER DIVIDED CHARACTER CODE | | SYM-BOL CATE-GORY | UPPER 5 BITS OF ADDRESS VALUE OF POINTER TO COMPRESSION SYMBOL MAP OF HIGHER-LEVEL CHARACTER CODE | | | | | | |
| | UPPER CATE-GORY | LOWER 4 BITS OF REMAINING BITS | | | α | α-1 | ... | 3 | 2 | 1 |
| 0 | 01 | 0000 | 1 | 00000 | 0 | 0 | ... | 0 | 0 | 0 |
| 0 | 01 | 0000 | 1 | 00001 | 0 | 0 | ... | 0 | 0 | 0 |
| : | : | : | : | : | : | : | : | : | : | : |
| 0 | 01 | 1111 | 1 | 11111 | 0 | 0 | ... | 0 | 0 | 0 |
| : | : | : | : | : | : | : | : | : | : | : |
| 0 | 01 | LOWER 4 BITS OF REMAINING BITS OF ADDRESS VALUE OF POINTER TO COMPRESSION SYMBOL MAP OF LOWER DIVIDED CHARACTER CODE "0x82" OF "芝" | 1 | UPPER 5 BITS OF ADDRESS VALUE OF POINTER TO COMPRESSION SYMBOL MAP OF "居" | 0 | 0 | ... | 0 | 0 | 0 |
| : | : | : | : | : | : | : | : | : | : | : |
| 0 | 01 | 0000 | 1 | 00000 | 0 | 0 | ... | 0 | 0 | 0 |
| 0 | 01 | 0000 | 1 | 00001 | 0 | 0 | ... | 0 | 0 | 0 |
| : | : | : | : | : | : | : | : | : | : | : |
| 0 | 01 | 1111 | 1 | 11111 | 0 | 0 | ... | 0 | 0 | 0 |

FIG.43P

| FIRST GRAM | | | SECOND GRAM | | FILE NUMBER | | | | | |
|---|---|---|---|---|---|---|---|---|---|---|
| SYM-BOL CATE-GORY | ADDRESS VALUE OF POINTER TO COMPRESSION SYMBOL MAP OF LOWER DIVIDED CHARACTER CODE | | SYM-BOL CATE-GORY | LOWER 5 BITS OF ADDRESS VALUE OF POINTER TO COMPRESSION SYMBOL MAP OF HIGHER-LEVEL CHARACTER CODE | | | | | | |
| | UPPER CATE-GORY | LOWER 4 BITS OF REMAINING BITS | | | α | α-1 | ... | 3 | 2 | 1 |
| 0 | 01 | 0000 | 1 | 00000 | 0 | 0 | ... | 0 | 0 | 0 |
| 0 | 01 | 0000 | 1 | 00001 | 0 | 0 | ... | 0 | 0 | 0 |
| : | : | : | : | : | : | : | : | : | : | : |
| 0 | 01 | 1111 | 1 | 11111 | 0 | 0 | ... | 0 | 0 | 0 |
| : | : | : | : | : | : | : | : | : | : | : |
| 0 | 01 | LOWER 4 BITS OF REMAINING BITS OF ADDRESS VALUE OF POINTER TO COMPRESSION SYMBOL MAP OF LOWER DIVIDED CHARACTER CODE "0x82" OF "芝" | 1 | LOWER 5 BITS OF ADDRESS VALUE OF POINTER TO COMPRESSION SYMBOL MAP OF "居" | 0 | 0 | ... | 0 | 0 | 0 |
| : | : | : | : | : | : | : | : | : | : | : |
| 0 | 01 | 0000 | 1 | 00000 | 0 | 0 | ... | 0 | 0 | 0 |
| 0 | 01 | 0000 | 1 | 00001 | 0 | 0 | ... | 0 | 0 | 0 |
| : | : | : | : | : | : | : | : | : | : | : |
| 0 | 01 | 1111 | 1 | 11111 | 0 | 0 | ... | 0 | 0 | 0 |

FIG.43Q

| FIRST GRAM | | SECOND GRAM | | FILE NUMBER | | | | | |
|---|---|---|---|---|---|---|---|---|---|
| SYM-BOL CATE-GORY | UPPER 5 BITS OF ADDRESS VALUE OF POINTER TO COMPRESSION SYMBOL MAP OF HIGHER-LEVEL CHARACTER CODE OF SPECIAL CHARACTER | SYM-BOL CATE-GORY | UPPER 5 BITS OF ADDRESS VALUE OF POINTER TO COMPRESSION SYMBOL MAP OF HIGHER-LEVEL CHARACTER CODE | α | α-1 | ... | 3 | 2 | 1 |
| 1 | UPPER 5 BITS OF ADDRESS VALUE OF POINTER TO COMPRESSION SYMBOL MAP OF "," | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |
| 1 | UPPER 5 BITS OF ADDRESS VALUE OF POINTER TO COMPRESSION SYMBOL MAP OF " " | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |
| 1 | UPPER 5 BITS OF ADDRESS VALUE OF POINTER TO COMPRESSION SYMBOL MAP OF ")" | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |

FIG.43R

| FIRST GRAM | | SECOND GRAM | | FILE NUMBER | | | | | |
|---|---|---|---|---|---|---|---|---|---|
| SYM-BOL CATE-GORY | UPPER 5 BITS OF ADDRESS VALUE OF POINTER TO COMPRESSION SYMBOL MAP OF HIGHER-LEVEL CHARACTER CODE OF SPECIAL CHARACTER | SYM-BOL CATE-GORY | LOWER 5 BITS OF ADDRESS VALUE OF POINTER TO COMPRESSION SYMBOL MAP OF HIGHER-LEVEL CHARACTER CODE | α | α-1 | ... | 3 | 2 | 1 |
| 1 | UPPER 5 BITS OF ADDRESS VALUE OF POINTER TO COMPRESSION SYMBOL MAP OF "," | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |
| 1 | UPPER 5 BITS OF ADDRESS VALUE OF POINTER TO COMPRESSION SYMBOL MAP OF " " | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |
| 1 | UPPER 5 BITS OF ADDRESS VALUE OF POINTER TO COMPRESSION SYMBOL MAP OF ")" | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |

FIG.43S

| FIRST GRAM | | SECOND GRAM | | FILE NUMBER | | | | | |
|---|---|---|---|---|---|---|---|---|---|
| SYM-BOL CATE-GORY | LOWER 5 BITS OF ADDRESS VALUE OF POINTER TO COMPRESSION SYMBOL MAP OF HIGHER-LEVEL CHARACTER CODE OF SPECIAL CHARACTER | SYM-BOL CATE-GORY | UPPER 5 BITS OF ADDRESS VALUE OF POINTER TO COMPRESSION SYMBOL MAP OF HIGHER-LEVEL CHARACTER CODE | α | α-1 | ... | 3 | 2 | 1 |
| 1 | UPPER 5 BITS OF ADDRESS VALUE OF POINTER TO COMPRESSION SYMBOL MAP OF "," | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |
| 1 | UPPER 5 BITS OF ADDRESS VALUE OF POINTER TO COMPRESSION SYMBOL MAP OF " " | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |
| 1 | UPPER 5 BITS OF ADDRESS VALUE OF POINTER TO COMPRESSION SYMBOL MAP OF ")" | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |

FIG.43T

| FIRST GRAM | | SECOND GRAM | | FILE NUMBER | | | | | |
|---|---|---|---|---|---|---|---|---|---|
| SYM-BOL CATE-GORY | LOWER 5 BITS OF ADDRESS VALUE OF POINTER TO COMPRESSION SYMBOL MAP OF HIGHER-LEVEL CHARACTER CODE OF SPECIAL CHARACTER | SYM-BOL CATE-GORY | LOWER 5 BITS OF ADDRESS VALUE OF POINTER TO COMPRESSION SYMBOL MAP OF HIGHER-LEVEL CHARACTER CODE | α | α-1 | ... | 3 | 2 | 1 |
| 1 | UPPER 5 BITS OF ADDRESS VALUE OF POINTER TO COMPRESSION SYMBOL MAP OF "," | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |
| 1 | UPPER 5 BITS OF ADDRESS VALUE OF POINTER TO COMPRESSION SYMBOL MAP OF " " | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |
| 1 | UPPER 5 BITS OF ADDRESS VALUE OF POINTER TO COMPRESSION SYMBOL MAP OF ")" | 1 | 00000 | 0 | 0 | ... | 0 | 0 | 0 |
| 1 | | 1 | 00001 | 0 | 0 | ... | 0 | 0 | 0 |
| : | | : | : | : | : | : | : | : | : |
| 1 | | 1 | 11111 | 0 | 0 | ... | 0 | 0 | 0 |

FIG.43U

| FIRST GRAM | | SECOND GRAM | | | FILE NUMBER | | | | | |
|---|---|---|---|---|---|---|---|---|---|---|
| SYM-BOL CATE-GORY | UPPER 5 BITS OF ADDRESS VALUE OF POINTER TO COMPRESSION SYMBOL MAP OF HIGHER-LEVEL CHARACTER CODE OF SPECIAL CHARACTER | SYM-BOL CATE-GORY | ADDRESS VALUE OF POINTER TO COMPRESSION SYMBOL MAP OF UPPER DIVIDED CHARACTER CODE | | | | | | | |
| | | | UPPER CATE-GORY | UPPER 4 BITS OF REMAINING BITS | α | α-1 | ... | 3 | 2 | 1 |
| 1 | UPPER 5 BITS OF ADDRESS VALUE OF POINTER TO COMPRESSION SYMBOL MAP OF "," | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |
| 1 | UPPER 5 BITS OF ADDRESS VALUE OF POINTER TO COMPRESSION SYMBOL MAP OF " " | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |
| 1 | UPPER 5 BITS OF ADDRESS VALUE OF POINTER TO COMPRESSION SYMBOL MAP OF ")" | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |

FIG.43V

| FIRST GRAM | | SECOND GRAM | | | FILE NUMBER | | | | | |
|---|---|---|---|---|---|---|---|---|---|---|
| SYM-BOL CATE-GORY | UPPER 5 BITS OF ADDRESS VALUE OF POINTER TO COMPRESSION SYMBOL MAP OF HIGHER-LEVEL CHARACTER CODE OF SPECIAL CHARACTER | SYM-BOL CATE-GORY | ADDRESS VALUE OF POINTER TO COMPRESSION SYMBOL MAP OF UPPER DIVIDED CHARACTER CODE | | α | α-1 | ... | 3 | 2 | 1 |
| | | | UPPER CATE-GORY | LOWER 4 BITS OF REMAINING BITS | | | | | | |
| 1 | UPPER 5 BITS OF ADDRESS VALUE OF POINTER TO COMPRESSION SYMBOL MAP OF "," | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |
| 1 | UPPER 5 BITS OF ADDRESS VALUE OF POINTER TO COMPRESSION SYMBOL MAP OF " " | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |
| 1 | UPPER 5 BITS OF ADDRESS VALUE OF POINTER TO COMPRESSION SYMBOL MAP OF ")" | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |

FIG.43W

| FIRST GRAM | | SECOND GRAM | | | FILE NUMBER | | | | | |
|---|---|---|---|---|---|---|---|---|---|---|
| SYM-BOL CATE-GORY | LOWER 5 BITS OF ADDRESS VALUE OF POINTER TO COMPRESSION SYMBOL MAP OF HIGHER-LEVEL CHARACTER CODE OF SPECIAL CHARACTER | SYM-BOL CATE-GORY | ADDRESS VALUE OF POINTER TO COMPRESSION SYMBOL MAP OF UPPER DIVIDED CHARACTER CODE | | | | | | | |
| | | | UPPER CATE-GORY | UPPER 4 BITS OF REMAINING BITS | α | α-1 | ... | 3 | 2 | 1 |
| 1 | LOWER 5 BITS OF ADDRESS VALUE OF POINTER TO COMPRESSION SYMBOL MAP OF ","  | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |
| 1 | LOWER 5 BITS OF ADDRESS VALUE OF POINTER TO COMPRESSION SYMBOL MAP OF " " | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |
| 1 | LOWER 5 BITS OF ADDRESS VALUE OF POINTER TO COMPRESSION SYMBOL MAP OF ")" | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |

FIG.43X

| FIRST GRAM | | SECOND GRAM | | | FILE NUMBER | | | | | |
|---|---|---|---|---|---|---|---|---|---|---|
| SYM-BOL CATE-GORY | LOWER 5 BITS OF ADDRESS VALUE OF POINTER TO COMPRESSION SYMBOL MAP OF HIGHER-LEVEL CHARACTER CODE OF SPECIAL CHARACTER | SYM-BOL CATE-GORY | ADDRESS VALUE OF POINTER TO COMPRESSION SYMBOL MAP OF UPPER DIVIDED CHARACTER CODE | | | | | | | |
| | | | UPPER CATE-GORY | LOWER 4 BITS OF REMAINING BITS | α | α-1 | ... | 3 | 2 | 1 |
| 1 | LOWER 5 BITS OF ADDRESS VALUE OF POINTER TO COMPRESSION SYMBOL MAP OF "," | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |
| 1 | LOWER 5 BITS OF ADDRESS VALUE OF POINTER TO COMPRESSION SYMBOL MAP OF " " | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |
| 1 | LOWER 5 BITS OF ADDRESS VALUE OF POINTER TO COMPRESSION SYMBOL MAP OF ")" | 0 | 00 | 0000 | 0 | 0 | ... | 0 | 0 | 0 |
| 1 | | 0 | 00 | 0001 | 0 | 0 | ... | 0 | 0 | 0 |
| : | | : | : | : | : | : | : | : | : | : |
| 1 | | 0 | 00 | 1111 | 0 | 0 | ... | 0 | 0 | 0 |

FIG.43Y

| FIRST GRAM | | SECOND GRAM | | FILE NUMBER | | | | | |
|---|---|---|---|---|---|---|---|---|---|
| SYM-BOL CATE-GORY | UPPER 5 BITS OF ADDRESS VALUE OF POINTER TO COMPRESSION SYMBOL MAP OF HIGHER-LEVEL CHARACTER CODE | SYM-BOL CATE-GORY | UPPER 5 BITS OF ADDRESS VALUE OF POINTER TO COMPRESSION SYMBOL MAP OF HIGHER-LEVEL CHARACTER CODE OF SPECIAL CHARACTER | α | α-1 | ... | 3 | 2 | 1 |
| 1 | 00000 | 1 | UPPER 5 BITS OF ADDRESS VALUE OF POINTER TO COMPRESSION SYMBOL MAP OF "," | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |
| 1 | 00000 | 1 | UPPER 5 BITS OF ADDRESS VALUE OF POINTER TO COMPRESSION SYMBOL MAP OF " " | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |
| 1 | 00000 | 1 | UPPER 5 BITS OF ADDRESS VALUE OF POINTER TO COMPRESSION SYMBOL MAP OF ")" | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |

FIG.43Z

| FIRST GRAM | | SECOND GRAM | | FILE NUMBER | | | | | |
|---|---|---|---|---|---|---|---|---|---|
| SYMBOL CATEGORY | UPPER 5 BITS OF ADDRESS VALUE OF POINTER TO COMPRESSION SYMBOL MAP OF HIGHER-LEVEL CHARACTER CODE | SYMBOL CATEGORY | LOWER 5 BITS OF ADDRESS VALUE OF POINTER TO COMPRESSION SYMBOL MAP OF HIGHER-LEVEL CHARACTER CODE OF SPECIAL CHARACTER | α | α-1 | ... | 3 | 2 | 1 |
| 1 | 00000 | 1 | LOWER 5 BITS OF ADDRESS VALUE OF POINTER TO COMPRESSION SYMBOL MAP OF "," | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |
| 1 | 00000 | 1 | LOWER 5 BITS OF ADDRESS VALUE OF POINTER TO COMPRESSION SYMBOL MAP OF " " | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |
| 1 | 00000 | 1 | LOWER 5 BITS OF ADDRESS VALUE OF POINTER TO COMPRESSION SYMBOL MAP OF ")" | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |

FIG.43AA

| FIRST GRAM | | SECOND GRAM | | FILE NUMBER | | | | | |
|---|---|---|---|---|---|---|---|---|---|
| SYM-BOL CATE-GORY | LOWER 5 BITS OF ADDRESS VALUE OF POINTER TO COMPRESSION SYMBOL MAP OF HIGHER-LEVEL CHARACTER CODE | SYM-BOL CATE-GORY | UPPER 5 BITS OF ADDRESS VALUE OF POINTER TO COMPRESSION SYMBOL MAP OF HIGHER-LEVEL CHARACTER CODE OF SPECIAL CHARACTER | α | α-1 | ... | 3 | 2 | 1 |
| 1 | 00000 | 1 | UPPER 5 BITS OF ADDRESS VALUE OF POINTER TO COMPRESSION SYMBOL MAP OF "," | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |
| 1 | 00000 | 1 | UPPER 5 BITS OF ADDRESS VALUE OF POINTER TO COMPRESSION SYMBOL MAP OF " " | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |
| 1 | 00000 | 1 | UPPER 5 BITS OF ADDRESS VALUE OF POINTER TO COMPRESSION SYMBOL MAP OF ")" | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |

FIG.43AB

| FIRST GRAM | | SECOND GRAM | | FILE NUMBER | | | | | |
|---|---|---|---|---|---|---|---|---|---|
| SYM-BOL CATE-GORY | LOWER 5 BITS OF ADDRESS VALUE OF POINTER TO COMPRESSION SYMBOL MAP OF HIGHER-LEVEL CHARACTER CODE | SYM-BOL CATE-GORY | LOWER 5 BITS OF ADDRESS VALUE OF POINTER TO COMPRESSION SYMBOL MAP OF HIGHER-LEVEL CHARACTER CODE OF SPECIAL CHARACTER | α | α-1 | ... | 3 | 2 | 1 |
| 1 | 00000 | 1 | LOWER 5 BITS OF ADDRESS VALUE OF POINTER TO COMPRESSION SYMBOL MAP OF "," | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |
| 1 | 00000 | 1 | LOWER 5 BITS OF ADDRESS VALUE OF POINTER TO COMPRESSION SYMBOL MAP OF " " | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |
| 1 | 00000 | 1 | LOWER 5 BITS OF ADDRESS VALUE OF POINTER TO COMPRESSION SYMBOL MAP OF ")" | 0 | 0 | ... | 0 | 0 | 0 |
| 1 | 00001 | 1 | | 0 | 0 | ... | 0 | 0 | 0 |
| : | : | : | | : | : | : | : | : | : |
| 1 | 11111 | 1 | | 0 | 0 | ... | 0 | 0 | 0 |

FIG.43AC

| FIRST GRAM | | | SECOND GRAM | | FILE NUMBER | | | | | |
|---|---|---|---|---|---|---|---|---|---|---|
| SYM-BOL CATE-GORY | ADDRESS VALUE OF POINTER TO COMPRESSION SYMBOL MAP OF LOWER DIVIDED CHARACTER CODE | | SYM-BOL CATE-GORY | UPPER 5 BITS OF ADDRESS VALUE OF POINTER TO COMPRESSION SYMBOL MAP OF HIGHER-LEVEL CHARACTER CODE OF SPECIAL CHARACTER | | | | | | |
| | UPPER CATE-GORY | UPPER 4 BITS OF REMAINING BITS | | | α | α-1 | ... | 3 | 2 | 1 |
| 0 | 01 | 0000 | 1 | UPPER 5 BITS OF ADDRESS VALUE OF POINTER TO COMPRESSION SYMBOL MAP OF "," | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |
| 0 | 01 | 0000 | 1 | UPPER 5 BITS OF ADDRESS VALUE OF POINTER TO COMPRESSION SYMBOL MAP OF " " | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |
| 0 | 01 | 0000 | 1 | UPPER 5 BITS OF ADDRESS VALUE OF POINTER TO COMPRESSION SYMBOL MAP OF ")" | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |

FIG.43AD

| FIRST GRAM | | | SECOND GRAM | | FILE NUMBER | | | | | |
|---|---|---|---|---|---|---|---|---|---|---|
| SYM-BOL CATE-GORY | ADDRESS VALUE OF POINTER TO COMPRESSION SYMBOL MAP OF LOWER DIVIDED CHARACTER CODE | | SYM-BOL CATE-GORY | LOWER 5 BITS OF ADDRESS VALUE OF POINTER TO COMPRESSION SYMBOL MAP OF HIGHER-LEVEL CHARACTER CODE OF SPECIAL CHARACTER | | | | | | |
| | UPPER CATE-GORY | UPPER 4 BITS OF REMAINING BITS | | | α | α-1 | ... | 3 | 2 | 1 |
| 0 | 01 | 0000 | 1 | LOWER 5 BITS OF ADDRESS VALUE OF POINTER TO COMPRESSION SYMBOL MAP OF "," | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |
| 0 | 01 | 0000 | 1 | LOWER 5 BITS OF ADDRESS VALUE OF POINTER TO COMPRESSION SYMBOL MAP OF " " | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |
| 0 | 01 | 0000 | 1 | LOWER 5 BITS OF ADDRESS VALUE OF POINTER TO COMPRESSION SYMBOL MAP OF ")" | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |

FIG.43AE

| FIRST GRAM | | | SECOND GRAM | | FILE NUMBER | | | | | |
|---|---|---|---|---|---|---|---|---|---|---|
| SYM-BOL CATE-GORY | ADDRESS VALUE OF POINTER TO COMPRESSION SYMBOL MAP OF LOWER DIVIDED CHARACTER CODE | | SYM-BOL CATE-GORY | UPPER 5 BITS OF ADDRESS VALUE OF POINTER TO COMPRESSION SYMBOL MAP OF HIGHER-LEVEL CHARACTER CODE OF SPECIAL CHARACTER | | | | | | |
| | UPPER CATE-GORY | LOWER 4 BITS OF REMAINING BITS | | | α | α-1 | ... | 3 | 2 | 1 |
| 0 | 01 | 0000 | 1 | UPPER 5 BITS OF ADDRESS VALUE OF POINTER TO COMPRESSION SYMBOL MAP OF "," | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |
| 0 | 01 | 0000 | 1 | UPPER 5 BITS OF ADDRESS VALUE OF POINTER TO COMPRESSION SYMBOL MAP OF " " | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |
| 0 | 01 | 0000 | 1 | UPPER 5 BITS OF ADDRESS VALUE OF POINTER TO COMPRESSION SYMBOL MAP OF ")" | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |

FIG.43AF

| FIRST GRAM | | | SECOND GRAM | | FILE NUMBER | | | | | |
|---|---|---|---|---|---|---|---|---|---|---|
| SYM-BOL CATE-GORY | ADDRESS VALUE OF POINTER TO COMPRESSION SYMBOL MAP OF LOWER DIVIDED CHARACTER CODE | | SYM-BOL CATE-GORY | LOWER 5 BITS OF ADDRESS VALUE OF POINTER TO COMPRESSION SYMBOL MAP OF HIGHER-LEVEL CHARACTER CODE OF SPECIAL CHARACTER | | | | | | |
| | UPPER CATE-GORY | LOWER 4 BITS OF REMAINING BITS | | | α | α-1 | ... | 3 | 2 | 1 |
| 0 | 01 | 0000 | 1 | LOWER 5 BITS OF ADDRESS VALUE OF POINTER TO COMPRESSION SYMBOL MAP OF "," | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |
| 0 | 01 | 0000 | 1 | LOWER 5 BITS OF ADDRESS VALUE OF POINTER TO COMPRESSION SYMBOL MAP OF " " | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |
| 0 | 01 | 0000 | 1 | LOWER 5 BITS OF ADDRESS VALUE OF POINTER TO COMPRESSION SYMBOL MAP OF ")" | 0 | 0 | ... | 0 | 0 | 0 |
| 0 | 01 | 0001 | 1 | | 0 | 0 | ... | 0 | 0 | 0 |
| : | : | : | : | | : | : | : | : | : | : |
| 0 | 01 | 1111 | 1 | | 0 | 0 | ... | 0 | 0 | 0 |

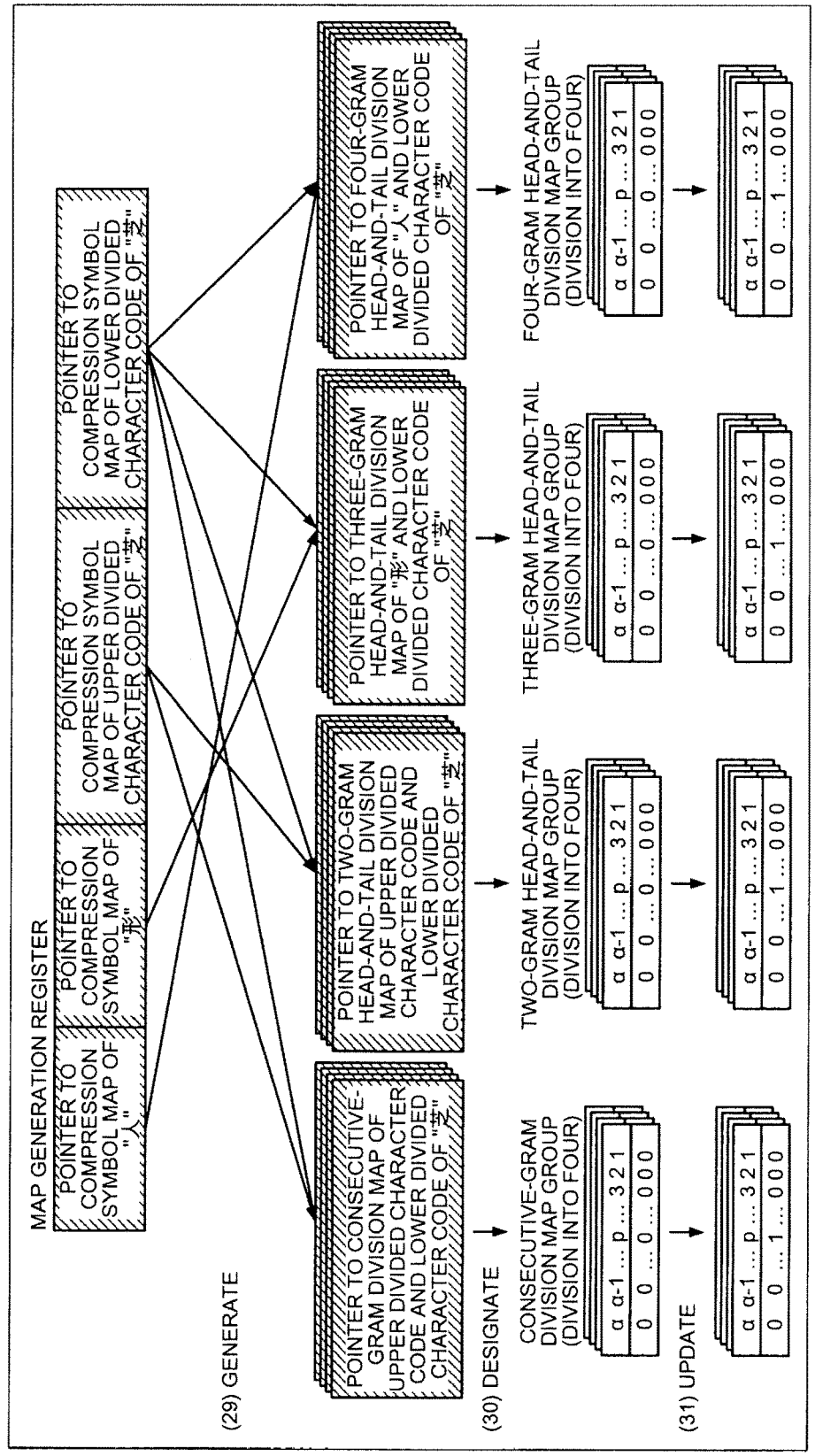

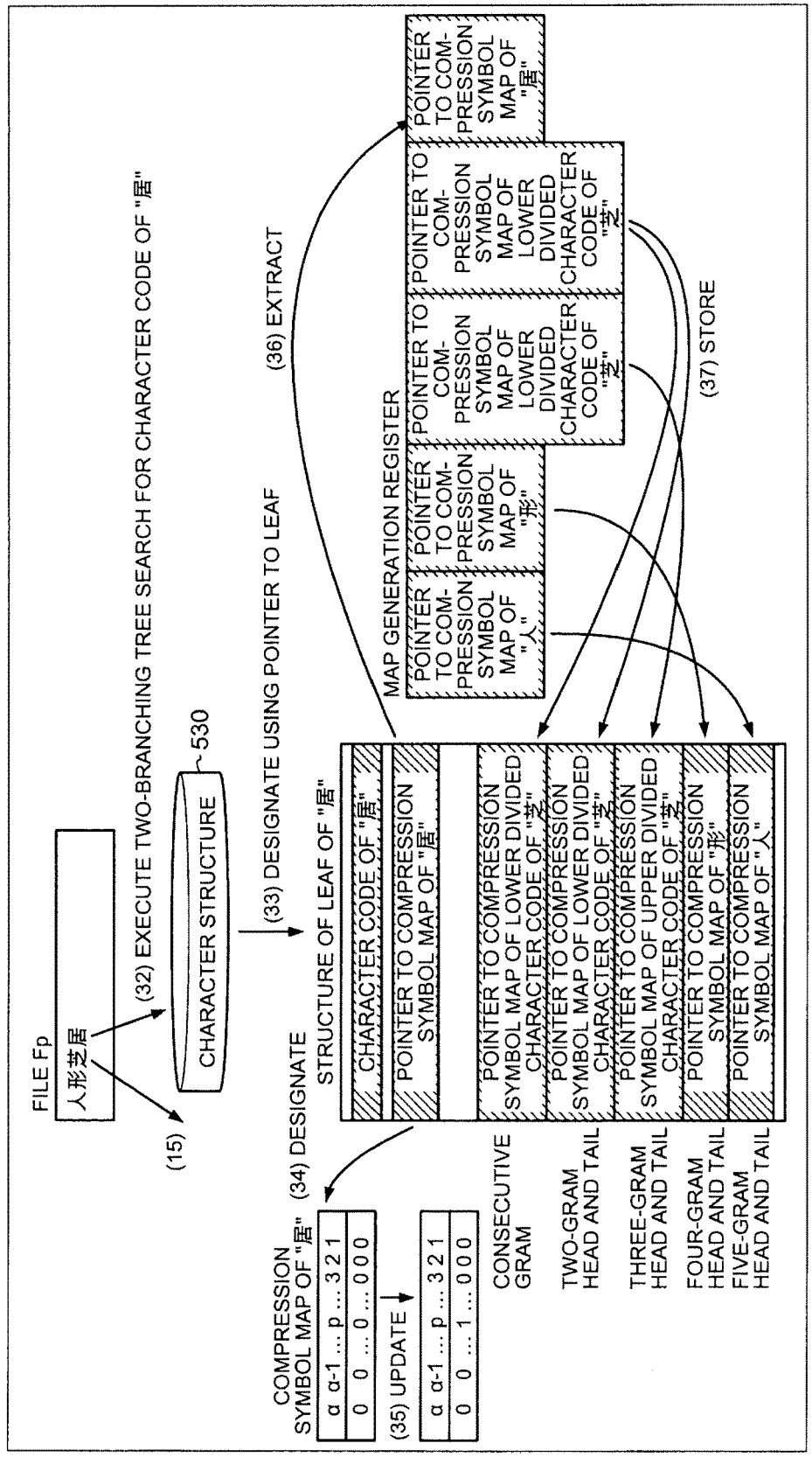

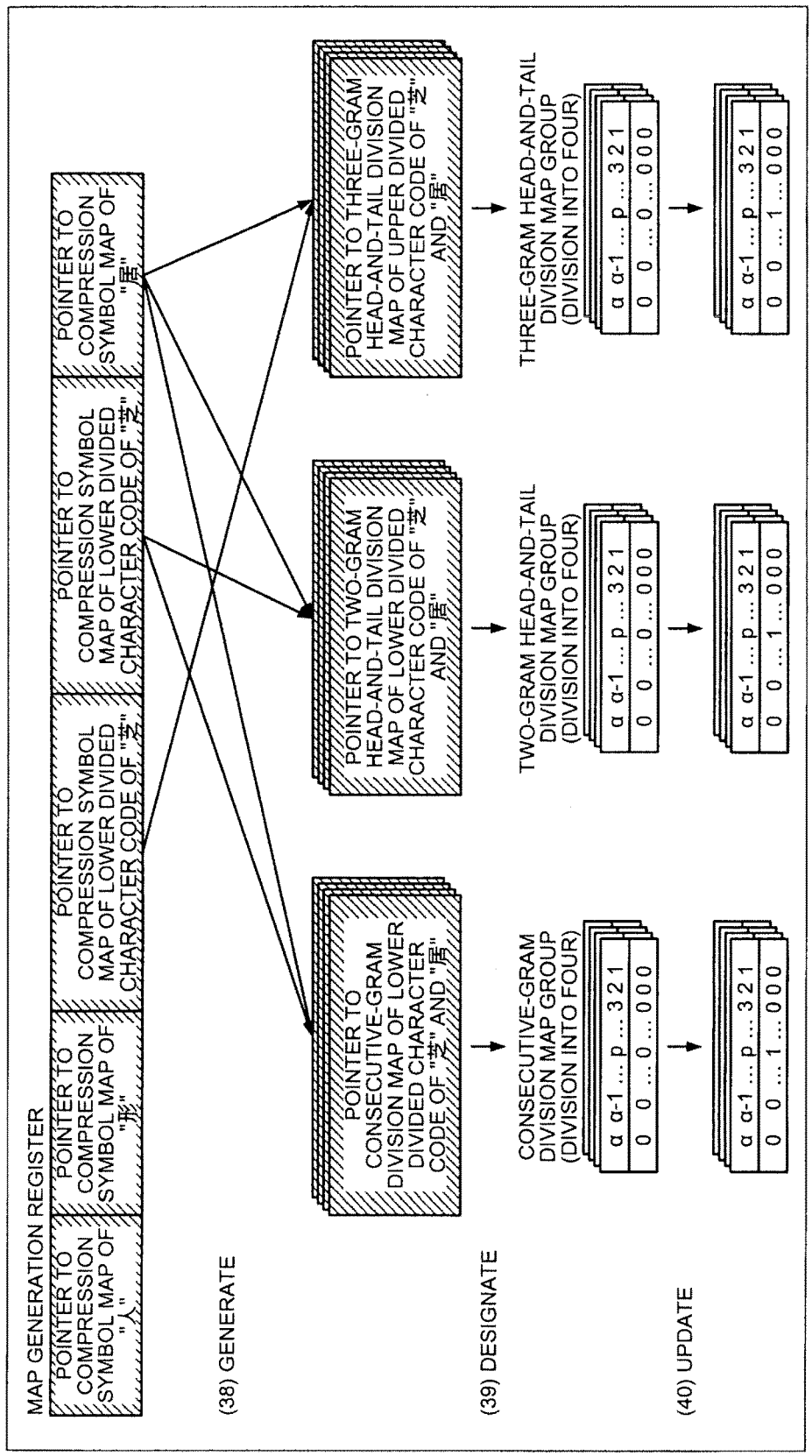

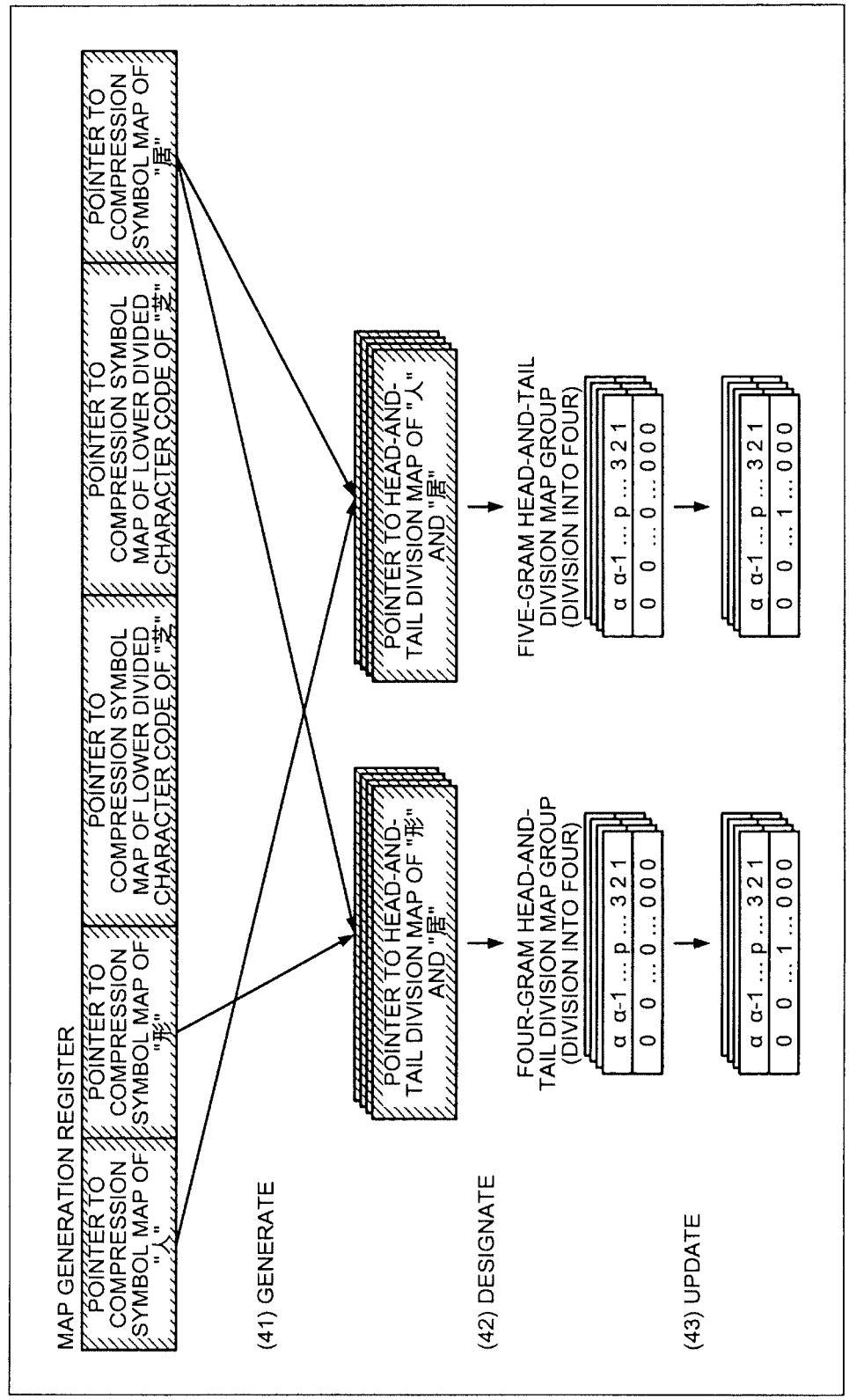

FIG.45A (A)

| POINTER TO COMPRESSION SYMBOL MAP OF "人" | | | POINTER TO COMPRESSION SYMBOL MAP OF "形" | | |
|---|---|---|---|---|---|
| SYMBOL CATE-GORY | ADDRESS VALUE | | SYMBOL CATE-GORY | ADDRESS VALUE | |
| | UPPER 5 BITS | LOWER 5 BITS | | UPPER 5 BITS | LOWER 5 BITS |
| 1 | 10101 | 01010 | 1 | 11011 | 01101 |

(B)

| POINTER TO CONSECUTIVE-GRAM DIVISION MAP OF "人" | | POINTER TO CONSECUTIVE-GRAM DIVISION MAP OF "形" | |
|---|---|---|---|
| SYMBOL CATE-GORY | ADDRESS VALUE | SYMBOL CATE-GORY | ADDRESS VALUE |
| | UPPER 5 BITS | | UPPER 5 BITS |
| 1 | 10101 | 1 | 11011 |

(B)

| POINTER TO CONSECUTIVE-GRAM DIVISION MAP OF "人" | | POINTER TO CONSECUTIVE-GRAM DIVISION MAP OF "形" | |
|---|---|---|---|
| SYMBOL CATE-GORY | ADDRESS VALUE | SYMBOL CATE-GORY | ADDRESS VALUE |
| | UPPER 5 BITS | | LOWER 5 BITS |
| 1 | 10101 | 1 | 01101 |

(B)

| POINTER TO CONSECUTIVE-GRAM DIVISION MAP OF "人" | | POINTER TO CONSECUTIVE-GRAM DIVISION MAP OF "形" | |
|---|---|---|---|
| SYMBOL CATE-GORY | ADDRESS VALUE | SYMBOL CATE-GORY | ADDRESS VALUE |
| | LOWER 5 BITS | | UPPER 5 BITS |
| 1 | 01010 | 1 | 11011 |

(B)

| POINTER TO CONSECUTIVE-GRAM DIVISION MAP OF "人" | | POINTER TO CONSECUTIVE-GRAM DIVISION MAP OF "形" | |
|---|---|---|---|
| SYMBOL CATE-GORY | ADDRESS VALUE | SYMBOL CATE-GORY | ADDRESS VALUE |
| | LOWER 5 BITS | | LOWER 5 BITS |
| 1 | 01010 | 1 | 01101 |

FIG.45B (A)

| POINTER TO COMPRESSION SYMBOL MAP OF "形" | | | POINTER TO COMPRESSION SYMBOL MAP OF UPPER DIVIDED CHARACTER CODE OF "芝" | | | |
|---|---|---|---|---|---|---|
| SYM-BOL CATE-GORY | ADDRESS VALUE | | SYM-BOL CATE-GORY | ADDRESS VALUE | | |
| | UPPER 5 BITS | LOWER 5 BITS | | UPPER/LOWER CATEGORY (UPPER 2 BITS) | REMAINING BITS | |
| | | | | | UPPER 4 BITS | LOWER 4 BITS |
| 1 | 11011 | 01101 | 0 | 00 | 1001 | 1101 |

(B)

| POINTER TO CONSECUTIVE-GRAM DIVISION MAP OF "形" | | POINTER TO CONSECUTIVE-GRAM DIVISION MAP OF UPPER DIVIDED CHARACTER CODE OF "芝" | | |
|---|---|---|---|---|
| SYM-BOL CATE-GORY | ADDRESS VALUE | SYM-BOL CATE-GORY | ADDRESS VALUE | |
| | UPPER 5 BITS | | UPPER/LOWER CATEGORY (UPPER 2 BITS) | REMAINING BITS |
| | | | | UPPER 4 BITS |
| 1 | 11011 | 0 | 00 | 1001 |

(C)

| POINTER TO CONSECUTIVE-GRAM DIVISION MAP OF "形" | | POINTER TO CONSECUTIVE-GRAM DIVISION MAP OF UPPER DIVIDED CHARACTER CODE OF "芝" | | |
|---|---|---|---|---|
| SYM-BOL CATE-GORY | ADDRESS VALUE | SYM-BOL CATE-GORY | ADDRESS VALUE | |
| | UPPER 5 BITS | | UPPER/LOWER CATEGORY (UPPER 2 BITS) | REMAINING BITS |
| | | | | LOWER 4 BITS |
| 1 | 11011 | 0 | 00 | 1101 |

(D)

| POINTER TO CONSECUTIVE-GRAM DIVISION MAP OF "形" | | POINTER TO CONSECUTIVE-GRAM DIVISION MAP OF UPPER DIVIDED CHARACTER CODE OF "芝" | | |
|---|---|---|---|---|
| SYM-BOL CATE-GORY | ADDRESS VALUE | SYM-BOL CATE-GORY | ADDRESS VALUE | |
| | LOWER 5 BITS | | UPPER/LOWER CATEGORY (UPPER 2 BITS) | REMAINING BITS |
| | | | | UPPER 4 BITS |
| 1 | 01101 | 0 | 00 | 1001 |

(E)

| POINTER TO CONSECUTIVE-GRAM DIVISION MAP OF "形" | | POINTER TO CONSECUTIVE-GRAM DIVISION MAP OF UPPER DIVIDED CHARACTER CODE OF "芝" | | |
|---|---|---|---|---|
| SYM-BOL CATE-GORY | ADDRESS VALUE | SYM-BOL CATE-GORY | ADDRESS VALUE | |
| | LOWER 5 BITS | | UPPER/LOWER CATEGORY (UPPER 2 BITS) | REMAINING BITS |
| | | | | LOWER 4 BITS |
| 1 | 01101 | 0 | 00 | 1101 |

FIG.45C

| | POINTER TO COMPRESSION SYMBOL MAP OF UPPER DIVIDED CHARACTER CODE OF "芝" ||| POINTER TO COMPRESSION SYMBOL MAP OF LOWER DIVIDED CHARACTER CODE OF "芝" |||
|---|---|---|---|---|---|---|
| | SYMBOL CATEGORY | ADDRESS VALUE || SYMBOL CATEGORY | ADDRESS VALUE ||
| | | UPPER/LOWER CATEGORY (UPPER 2 BITS) | REMAINING BITS || | UPPER/LOWER CATEGORY (UPPER 2 BITS) | REMAINING BITS |
| | | | UPPER 4 BITS / LOWER 4 BITS || | | UPPER 4 BITS / LOWER 4 BITS |
| (A) | 0 | 00 | 1001  1101 | 0 | 01 | 1000  0001 |

| | POINTER TO CONSECUTIVE-GRAM DIVISION MAP OF UPPER DIVIDED CHARACTER CODE OF "芝" ||| POINTER TO CONSECUTIVE-GRAM DIVISION MAP OF LOWER DIVIDED CHARACTER CODE OF "芝" |||
|---|---|---|---|---|---|---|
| | SYMBOL CATEGORY | ADDRESS VALUE || SYMBOL CATEGORY | ADDRESS VALUE ||
| | | UPPER/LOWER CATEGORY (UPPER 2 BITS) | REMAINING BITS (UPPER 4 BITS) | | UPPER/LOWER CATEGORY (UPPER 2 BITS) | REMAINING BITS (UPPER 4 BITS) |
| (B) | 0 | 00 | 1001 | 0 | 01 | 1000 |

| | POINTER TO CONSECUTIVE-GRAM DIVISION MAP OF UPPER DIVIDED CHARACTER CODE OF "芝" ||| POINTER TO CONSECUTIVE-GRAM DIVISION MAP OF LOWER DIVIDED CHARACTER CODE OF "芝" |||
|---|---|---|---|---|---|---|
| | SYMBOL CATEGORY | UPPER/LOWER CATEGORY (UPPER 2 BITS) | REMAINING BITS (UPPER 4 BITS) | SYMBOL CATEGORY | UPPER/LOWER CATEGORY (UPPER 2 BITS) | REMAINING BITS (LOWER 4 BITS) |
| (C) | 0 | 00 | 1001 | 0 | 01 | 0001 |

| | POINTER TO CONSECUTIVE-GRAM DIVISION MAP OF UPPER DIVIDED CHARACTER CODE OF "芝" ||| POINTER TO CONSECUTIVE-GRAM DIVISION MAP OF LOWER DIVIDED CHARACTER CODE OF "芝" |||
|---|---|---|---|---|---|---|
| | SYMBOL CATEGORY | UPPER/LOWER CATEGORY (UPPER 2 BITS) | REMAINING BITS (LOWER 4 BITS) | SYMBOL CATEGORY | UPPER/LOWER CATEGORY (UPPER 2 BITS) | REMAINING BITS (UPPER 4 BITS) |
| (D) | 0 | 00 | 1101 | 0 | 01 | 1000 |

| | POINTER TO CONSECUTIVE-GRAM DIVISION MAP OF UPPER DIVIDED CHARACTER CODE OF "芝" ||| POINTER TO CONSECUTIVE-GRAM DIVISION MAP OF LOWER DIVIDED CHARACTER CODE OF "芝" |||
|---|---|---|---|---|---|---|
| | SYMBOL CATEGORY | UPPER/LOWER CATEGORY (UPPER 2 BITS) | REMAINING BITS (LOWER 4 BITS) | SYMBOL CATEGORY | UPPER/LOWER CATEGORY (UPPER 2 BITS) | REMAINING BITS (LOWER 4 BITS) |
| (E) | 0 | 00 | 1101 | 0 | 01 | 0001 |

FIG.45D (A)

| POINTER TO COMPRESSION SYMBOL MAP OF LOWER DIVIDED CHARACTER CODE OF "芝" | | | | POINTER TO COMPRESSION SYMBOL MAP OF "居" | | |
|---|---|---|---|---|---|---|
| SYMBOL CATEGORY | ADDRESS VALUE | | | SYMBOL CATEGORY | ADDRESS VALUE | |
| | UPPER/LOWER CATEGORY (UPPER 2 BITS) | REMAINING BITS | | | UPPER 5 BITS | LOWER 5 BITS |
| | | UPPER 4 BITS | LOWER 4 BITS | | | |
| 0 | 01 | 1000 | 0001 | 1 | 00011 | 11101 |

(B)

| POINTER TO CONSECUTIVE-GRAM DIVISION MAP OF LOWER DIVIDED CHARACTER CODE OF "芝" | | | POINTER TO CONSECUTIVE-GRAM DIVISION MAP OF "居" | |
|---|---|---|---|---|
| SYMBOL CATEGORY | ADDRESS VALUE | | SYMBOL CATEGORY | ADDRESS VALUE |
| | UPPER/LOWER CATEGORY (UPPER 2 BITS) | REMAINING BITS UPPER 4 BITS | | UPPER 5 BITS |
| 0 | 01 | 1000 | 1 | 00011 |

(C)

| POINTER TO CONSECUTIVE-GRAM DIVISION MAP OF LOWER DIVIDED CHARACTER CODE OF "芝" | | | POINTER TO CONSECUTIVE-GRAM DIVISION MAP OF "居" | |
|---|---|---|---|---|
| SYMBOL CATEGORY | ADDRESS VALUE | | SYMBOL CATEGORY | ADDRESS VALUE |
| | UPPER/LOWER CATEGORY (UPPER 2 BITS) | REMAINING BITS UPPER 4 BITS | | LOWER 5 BITS |
| 0 | 01 | 1000 | 1 | 11101 |

(D)

| POINTER TO CONSECUTIVE-GRAM DIVISION MAP OF LOWER DIVIDED CHARACTER CODE OF "芝" | | | POINTER TO CONSECUTIVE-GRAM DIVISION MAP OF "居" | |
|---|---|---|---|---|
| SYMBOL CATEGORY | ADDRESS VALUE | | SYMBOL CATEGORY | ADDRESS VALUE |
| | UPPER/LOWER CATEGORY (UPPER 2 BITS) | REMAINING BITS LOWER 4 BITS | | UPPER 5 BITS |
| 0 | 01 | 0001 | 1 | 00011 |

(E)

| POINTER TO CONSECUTIVE-GRAM DIVISION MAP OF LOWER DIVIDED CHARACTER CODE OF "芝" | | | POINTER TO CONSECUTIVE-GRAM DIVISION MAP OF "居" | |
|---|---|---|---|---|
| SYMBOL CATEGORY | ADDRESS VALUE | | SYMBOL CATEGORY | ADDRESS VALUE |
| | UPPER/LOWER CATEGORY (UPPER 2 BITS) | REMAINING BITS LOWER 4 BITS | | LOWER 5 BITS |
| 0 | 01 | 0001 | 1 | 11101 |

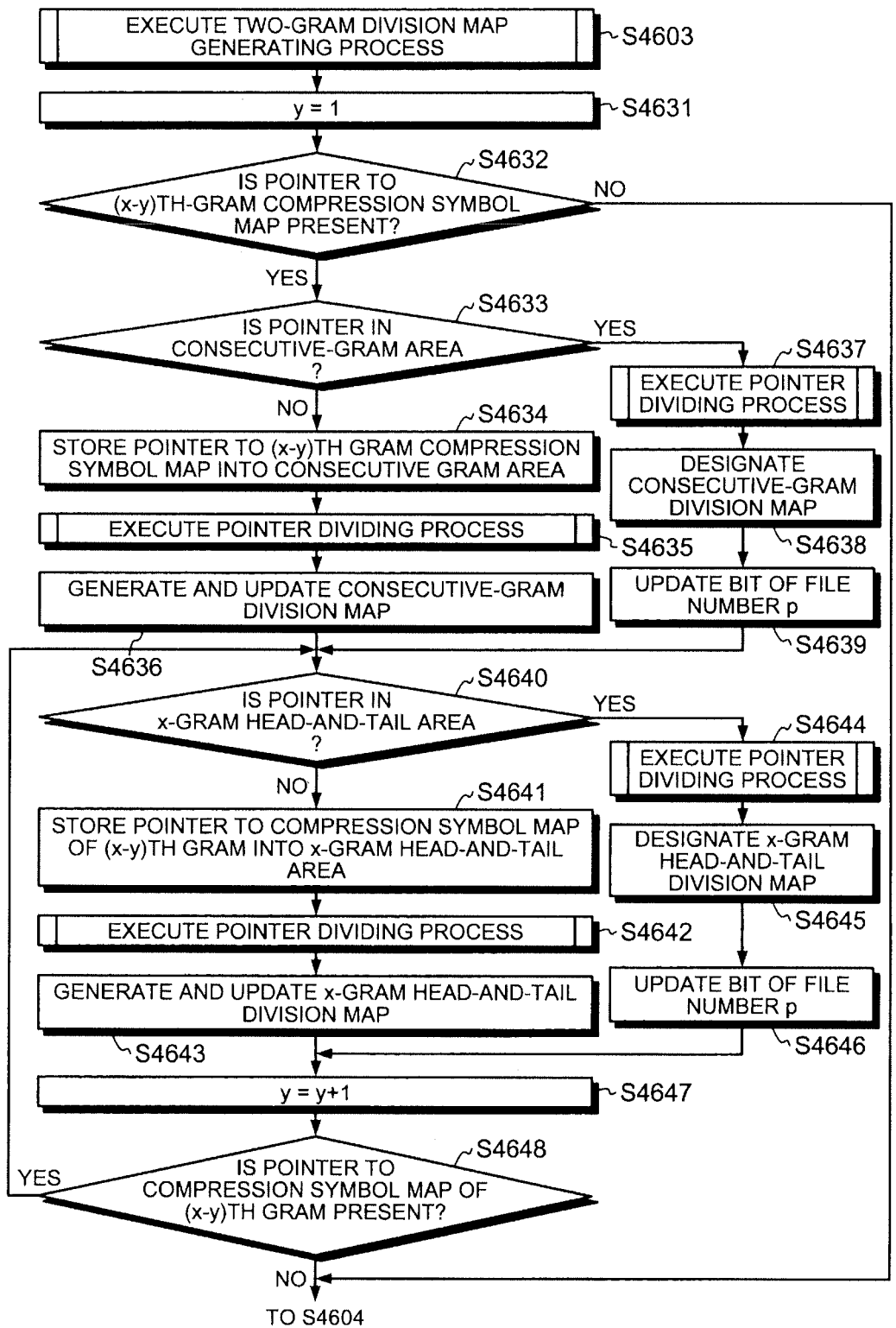

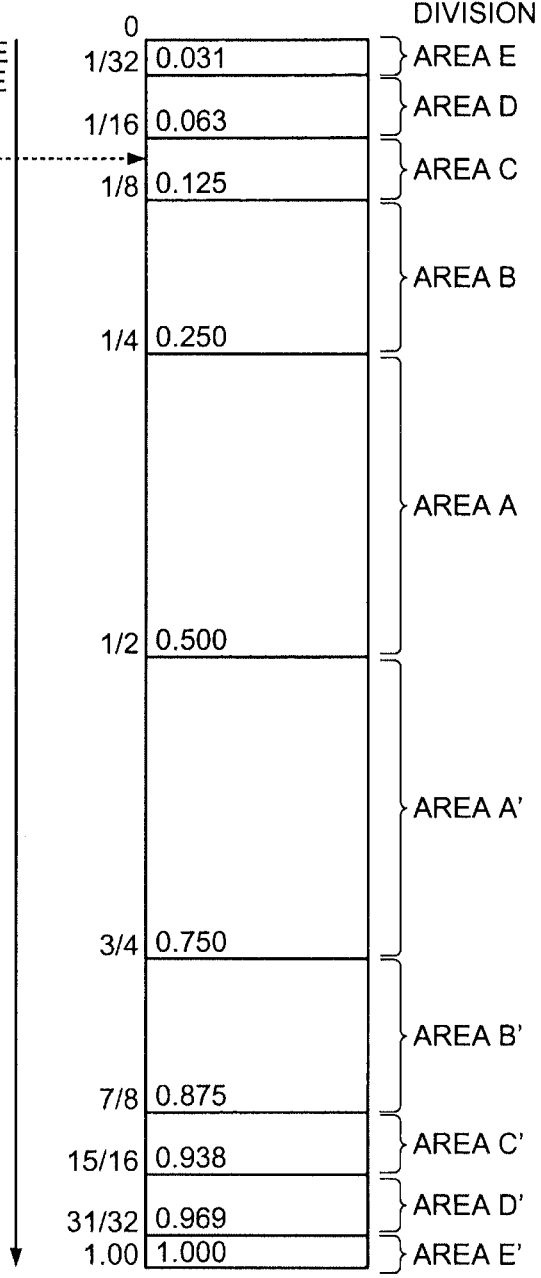

FIG.47B

| APPEARANCE RATE AREA | COMPRESSION PATTERN | COMPRESSION RATE |
|---|---|---|
| E | 16+1 (64 BITS) KINDS OF HUFFMAN TREES | 7% |
| D | 16+1 (32 BITS) KINDS OF HUFFMAN TREES | 14% |
| C | 16+1 (16 BITS) KINDS OF HUFFMAN TREES | 28% |
| B | 16 KINDS OF HUFFMAN TREES | 64% |
| A | NOT COMPRESSED | 100% |
| A' | | |
| B' | 16 KINDS OF HUFFMAN TREES | 64% |
| C' | 16+1 (16 BITS) KINDS OF HUFFMAN TREES | 28% |
| D' | 16+1 (32 BITS) KINDS OF HUFFMAN TREES | 14% |
| E' | 16+1 (64 BITS) KINDS OF HUFFMAN TREES | 7% |

FIG.48A

| MARK STRING | SYMBOL WORD |
|---|---|
| 0000 | 01 |
| 0010 | 100 |
| 0100 | 101 |
| 1000 | 110 |
| 0001 | 1110 |
| 0111 | 111100 |
| 1011 | 111101 |
| 1101 | 1111100 |
| 1110 | 1111101 |
| 0011 | 11111100 |
| 0101 | 111111010 |
| 0110 | 111111011 |
| 1001 | 111111100 |
| 1010 | 1111111101 |
| 1100 | 1111111110 |
| 1111 | 1111111111 |

| MARK STRING | SYMBOL WORD |
|---|---|
| 0000000000000000 | 00 |
| 0000 | 01 |
| 0010 | 100 |
| 0100 | 101 |
| 1000 | 110 |
| 0001 | 1110 |
| 0111 | 111100 |
| 1011 | 111101 |
| 1101 | 1111100 |
| 1110 | 1111101 |
| 0011 | 11111100 |
| 0101 | 111111010 |
| 0110 | 111111011 |
| 1001 | 111111100 |
| 1010 | 1111111101 |
| 1100 | 1111111110 |
| 1111 | 1111111111 |

| MARK STRING | SYMBOL WORD |
|---|---|
| 0000...0000 (32 BITS) | 00 |
| 0000 | 01 |
| 0010 | 100 |
| 0100 | 101 |
| 1000 | 110 |
| 0001 | 1110 |
| 0111 | 111100 |
| 1011 | 111101 |
| 1101 | 1111100 |
| 1110 | 1111101 |
| 0011 | 11111100 |
| 0101 | 111111010 |
| 0110 | 111111011 |
| 1001 | 111111100 |
| 1010 | 1111111101 |
| 1100 | 1111111110 |
| 1111 | 1111111111 |

| MARK STRING | SYMBOL WORD | |
|---|---|---|
| 0000...0000 (64 BITS) | 00 | ⤪4204 |
| 0000 | 01 | |
| 0010 | 100 | |
| 0100 | 101 | |
| 1000 | 110 | |
| 0001 | 1110 | |
| 0111 | 111100 | |
| 1011 | 111101 | |
| 1101 | 1111100 | |
| 1110 | 1111101 | |
| 0011 | 11111100 | |
| 0101 | 111111010 | |
| 0110 | 111111011 | |
| 1001 | 111111100 | |
| 1010 | 1111111101 | |
| 1100 | 1111111110 | |
| 1111 | 1111111111 | |

FIG.50 ms

| ADDRESS | | NON-COMPRESSION AREA | | | COMPRESSION AREA |
|---|---|---|---|---|---|
| CATE-GORY | ADDRESS PORTION | FILE NUMBER OF ADDED FILE | | | COMPRESSION SYMBOL STRING OF COMPRESSION SYMBOL MAP OF FILE NUMBERS 1 TO α |
| | | β | ... | α+1 | |
| 1 | 0001 | 1 | ... | 0 | ... 00 |
| 1 | 0002 | 0 | ... | 0 | ... 1111111110 |
| 1 | 0003 | 0 | ... | 1 | ... 1110 |
| ⋮ | ⋮ | ⋮ | ⋮ | ⋮ | ⋮ |
| 1 | 1024 | 0 | ... | 1 | ... 1111111111 |
| 1 | 1025 | 0 | ... | 0 | ... 1000 |
| ⋮ | ⋮ | ⋮ | ⋮ | ⋮ | ⋮ |
| 1 | 1039 | 0 | ... | 0 | ... 01 |
| 0 | 0001 | 0 | ... | 0 | ... 101 |
| 0 | 0002 | 0 | ... | 0 | ... 111111011 |
| 0 | 0003 | 0 | ... | 1 | ... 111111010 |
| ⋮ | ⋮ | ⋮ | ⋮ | ⋮ | ⋮ |
| 0 | 0256 | 0 | ... | 0 | ... 101 |
| 0 | 0257 | 0 | ... | 1 | ... 111111100 |
| ⋮ | ⋮ | ⋮ | ⋮ | ⋮ | ⋮ |
| 0 | 0512 | 0 | ... | 0 | ... 100 |

| FILE NUMBER OF ADDED FILE | | | FILE NUMBER | | | | | | |
|---|---|---|---|---|---|---|---|---|---|
| β | ... | α+1 | α | α-1 | ... | 4 | 3 | 2 | 1 |
| 1 | ... | 1 | 1 | 1 | ... | 1 | 1 | 1 | 1 |

⇩

Md

| FILE NUMBER OF ADDED FILE | | | FILE NUMBER | | | | | | |
|---|---|---|---|---|---|---|---|---|---|
| β | ... | α+1 | α | α-1 | ... | 4 | 3 | 2 | 1 |
| 1 | ... | 1 | 1 | 1 | ... | 1 | 0 | 1 | 1 |

FIG.57

(A) 国際通貨基金、こくさいつうかききん、IMF、/、国際通貨基金〔国際通貨基金〕、ファイルID、アンカー<<CR>
...

(B) アイ-エム-エフ〔IMF〕
(International Monetary Fund) 国際通貨基金。1944年のブレトン・ウッズ会議で調印されたIMF協定に基づき、加盟国の出資によって創設された国際金融機関の一つ。国連専門機関のーつ。本部はワシントン。為替管理の撤廃、為替相場の安定、国際収支難に陥っている加盟国への短期資金の融資などを目的とする。日本は52年加盟。

")" IS NONCONTINUOUS SPECIAL CHARACTER

"。" IS NONCONTINUOUS SPECIAL CHARACTER

| CHARACTER STRING | , (COMMA) | | | 人 | | | 形 | | | 芝 | | | 居 | | |
|---|---|---|---|---|---|---|---|---|---|---|---|---|---|---|---|
| CHARACTER CODE STRING (HEXADECIMAL) | 2 | C | 0 | B | A | 4 | E | 6 | 2 | 5 | F | 9 | D | 8 | 2 | 4 | 5 | C |
| CHARACTER CODE STRING (BINARY) | 0010 | 1100 | 0000 | 1011 | 1010 | 0100 | 1110 | 0110 | 0010 | 0101 | 1111 | 1001 | 1101 | 1000 | 0010 | 0100 | 0101 | 1100 |

(B)

| CHARACTER STRING | 人 | | | 形 | | | 芝 | | | 居 | | | , (COMMA) | | |
|---|---|---|---|---|---|---|---|---|---|---|---|---|---|---|---|
| CHARACTER CODE STRING (HEXADECIMAL) | B | A | 4 | E | 6 | 2 | 5 | F | 9 | D | 8 | 2 | 4 | 5 | C | 2 | C | 0 |
| CHARACTER CODE STRING (BINARY) | 1011 | 1010 | 0100 | 1110 | 0110 | 0010 | 0101 | 1111 | 1001 | 1101 | 1000 | 0010 | 0100 | 0101 | 1100 | 0010 | 1100 | 0000 |

FIG.59

| | SEARCH KEYWORD "人形芝居" | FILE NUMBER | | | |
|---|---|---|---|---|---|
| | | 4 | 3 | 2 | 1 |
| M1 | COMPRESSION SYMBOL MAP OF "人" | 1 | 1 | 1 | 0 |
| M2 | COMPRESSION SYMBOL MAP OF "形" | 0 | 1 | 1 | 0 |
| M3 | COMPRESSION SYMBOL MAP OF "芝" | 0 | 1 | 1 | 0 |
| M4 | COMPRESSION SYMBOL MAP OF "居" | 0 | 1 | 1 | 0 |
| M5 | DELETION MAP | 1 | 1 | 0 | 1 |
| | AND-COMPUTATION RESULT | 0 | 1 | 0 | 0 |

FIG.60A

| MAP NAME | FIRST GRAM | SECOND GRAM | FILE NUMBER | | | |
|---|---|---|---|---|---|---|
| | | | 4 | 3 | 2 | 1 |
| CONSECUTIVE-GRAM DIVISION MAP OF "人" AND "形" | UPPER 5 BITS | UPPER 5 BITS | 1 | 1 | 1 | 1 |
| | | LOWER 5 BITS | 1 | 1 | 1 | 0 |
| | LOWER 5 BITS | UPPER 5 BITS | 1 | 1 | 1 | 1 |
| | | LOWER 5 BITS | 1 | 1 | 1 | 0 |
| CONSECUTIVE-GRAM DIVISION MAP OF "形" AND UPPER DIVIDED CHARACTER CODE OF "芝" | UPPER 5 BITS | UPPER 4 BITS | 0 | 1 | 1 | 0 |
| | | LOWER 4 BITS | 0 | 1 | 1 | 0 |
| | LOWER 5 BITS | UPPER 4 BITS | 0 | 1 | 1 | 0 |
| | | LOWER 4 BITS | 1 | 1 | 1 | 0 |
| CONSECUTIVE-GRAM DIVISION MAP OF UPPER DIVIDED CHARACTER CODE AND LOWER DIVIDED CHARACTER CODE OF "芝" | UPPER 4 BITS | UPPER 4 BITS | 0 | 1 | 1 | 0 |
| | | LOWER 4 BITS | 0 | 1 | 1 | 0 |
| | LOWER 4 BITS | UPPER 4 BITS | 1 | 1 | 1 | 0 |
| | | LOWER 4 BITS | 0 | 1 | 1 | 0 |
| CONSECUTIVE-GRAM DIVISION MAP OF LOWER DIVIDED CHARACTER CODE OF "芝" AND "居" | UPPER 4 BITS | UPPER 5 BITS | 1 | 1 | 1 | 1 |
| | | LOWER 5 BITS | 1 | 1 | 1 | 0 |
| | LOWER 4 BITS | UPPER 5 BITS | 1 | 1 | 1 | 1 |
| | | LOWER 5 BITS | 1 | 1 | 1 | 1 |
| FIVE-GRAM HEAD-AND-TAIL DIVISION MAP OF "人" AND "居" | UPPER 5 BITS | UPPER 5 BITS | 1 | 1 | 1 | 0 |
| | | LOWER 5 BITS | 1 | 1 | 1 | 0 |
| | LOWER 5 BITS | UPPER 5 BITS | 1 | 1 | 1 | 0 |
| | | LOWER 5 BITS | 1 | 1 | 1 | 0 |
| DELETION MAP | | | 1 | 1 | 0 | 1 |
| AND-COMPUTATION RESULT | | | 0 | 1 | 0 | 0 |

FIG.60B

| MAP NAME | FIRST GRAM | SECOND GRAM | FILE NUMBER | | | |
|---|---|---|---|---|---|---|
| | | | 4 | 3 | 2 | 1 |
| CONSECUTIVE-GRAM DIVISION MAP OF "," AND "人" | UPPER 5 BITS | UPPER 5 BITS | 0 | 1 | 1 | 0 |
| | | LOWER 5 BITS | 1 | 1 | 1 | 0 |
| | LOWER 5 BITS | UPPER 5 BITS | 1 | 1 | 1 | 0 |
| | | LOWER 5 BITS | 0 | 1 | 1 | 0 |
| CONSECUTIVE-GRAM DIVISION MAP OF "人" AND "形" | UPPER 5 BITS | UPPER 5 BITS | 1 | 1 | 1 | 1 |
| | | LOWER 5 BITS | 1 | 1 | 1 | 0 |
| | LOWER 5 BITS | UPPER 5 BITS | 1 | 1 | 1 | 1 |
| | | LOWER 5 BITS | 1 | 1 | 1 | 0 |
| CONSECUTIVE-GRAM DIVISION MAP OF "形" AND UPPER DIVIDED CHARACTER CODE OF "芝" | UPPER 5 BITS | UPPER 4 BITS | 0 | 1 | 1 | 0 |
| | | LOWER 4 BITS | 0 | 1 | 1 | 0 |
| | LOWER 5 BITS | UPPER 4 BITS | 0 | 1 | 1 | 0 |
| | | LOWER 4 BITS | 1 | 1 | 1 | 0 |
| CONSECUTIVE-GRAM DIVISION MAP OF UPPER DIVIDED CHARACTER CODE AND LOWER DIVIDED CHARACTER CODE OF "芝" | UPPER 4 BITS | UPPER 4 BITS | 0 | 1 | 1 | 0 |
| | | LOWER 4 BITS | 0 | 1 | 1 | 0 |
| | LOWER 4 BITS | UPPER 4 BITS | 1 | 1 | 1 | 0 |
| | | LOWER 4 BITS | 0 | 1 | 1 | 0 |
| CONSECUTIVE-GRAM DIVISION MAP OF LOWER DIVIDED CHARACTER CODE OF "芝" AND "居" | UPPER 4 BITS | UPPER 5 BITS | 1 | 1 | 1 | 1 |
| | | LOWER 5 BITS | 1 | 1 | 1 | 0 |
| | LOWER 4 BITS | UPPER 5 BITS | 1 | 1 | 1 | 1 |
| | | LOWER 5 BITS | 1 | 1 | 1 | 1 |
| SIX-GRAM HEAD-AND-TAIL DIVISION MAP OF "," AND "居" | UPPER 5 BITS | UPPER 5 BITS | 1 | 1 | 1 | 0 |
| | | LOWER 5 BITS | 1 | 1 | 1 | 0 |
| | LOWER 5 BITS | UPPER 5 BITS | 1 | 1 | 1 | 0 |
| | | LOWER 5 BITS | 1 | 1 | 1 | 0 |
| DELETION MAP | | | 1 | 1 | 0 | 1 |
| AND-COMPUTATION RESULT | | | 0 | 1 | 0 | 0 |

FIG.60C

| MAP NAME | FIRST GRAM | SECOND GRAM | FILE NUMBER 4 | 3 | 2 | 1 |
|---|---|---|---|---|---|---|
| CONSECUTIVE-GRAM DIVISION MAP OF "人" AND "形" | UPPER 5 BITS | UPPER 5 BITS | 1 | 1 | 1 | 1 |
| | | LOWER 5 BITS | 1 | 1 | 1 | 0 |
| | LOWER 5 BITS | UPPER 5 BITS | 1 | 1 | 1 | 1 |
| | | LOWER 5 BITS | 1 | 1 | 1 | 0 |
| CONSECUTIVE-GRAM DIVISION MAP OF "形" AND UPPER DIVIDED CHARACTER CODE OF "芝" | UPPER 5 BITS | UPPER 4 BITS | 0 | 1 | 1 | 0 |
| | | LOWER 4 BITS | 0 | 1 | 1 | 0 |
| | LOWER 5 BITS | UPPER 4 BITS | 0 | 1 | 1 | 0 |
| | | LOWER 4 BITS | 1 | 1 | 1 | 0 |
| CONSECUTIVE-GRAM DIVISION MAP OF UPPER DIVIDED CHARACTER CODE AND LOWER DIVIDED CHARACTER CODE OF "芝" | UPPER 4 BITS | UPPER 4 BITS | 0 | 1 | 1 | 0 |
| | | LOWER 4 BITS | 0 | 1 | 1 | 0 |
| | LOWER 4 BITS | UPPER 4 BITS | 1 | 1 | 1 | 0 |
| | | LOWER 4 BITS | 0 | 1 | 1 | 0 |
| CONSECUTIVE-GRAM DIVISION MAP OF LOWER DIVIDED CHARACTER CODE OF "芝" AND "居" | UPPER 4 BITS | UPPER 5 BITS | 1 | 1 | 1 | 1 |
| | | LOWER 5 BITS | 1 | 1 | 1 | 0 |
| | LOWER 4 BITS | UPPER 5 BITS | 1 | 1 | 1 | 1 |
| | | LOWER 5 BITS | 1 | 1 | 1 | 1 |
| CONSECUTIVE-GRAM DIVISION MAP OF "居" AND "," | UPPER 5 BITS | UPPER 5 BITS | 1 | 1 | 1 | 0 |
| | | LOWER 5 BITS | 1 | 1 | 1 | 0 |
| | LOWER 5 BITS | UPPER 5 BITS | 1 | 1 | 1 | 0 |
| | | LOWER 5 BITS | 1 | 1 | 1 | 0 |
| SIX-GRAM HEAD-AND-TAIL DIVISION MAP OF "人" AND "," | UPPER 5 BITS | UPPER 5 BITS | 0 | 1 | 1 | 0 |
| | | LOWER 5 BITS | 0 | 1 | 1 | 0 |
| | LOWER 5 BITS | UPPER 5 BITS | 0 | 1 | 1 | 0 |
| | | LOWER 5 BITS | 0 | 1 | 1 | 0 |
| DELETION MAP | | | 1 | 1 | 0 | 1 |
| AND-COMPUTATION RESULT | | | 0 | 1 | 0 | 0 |

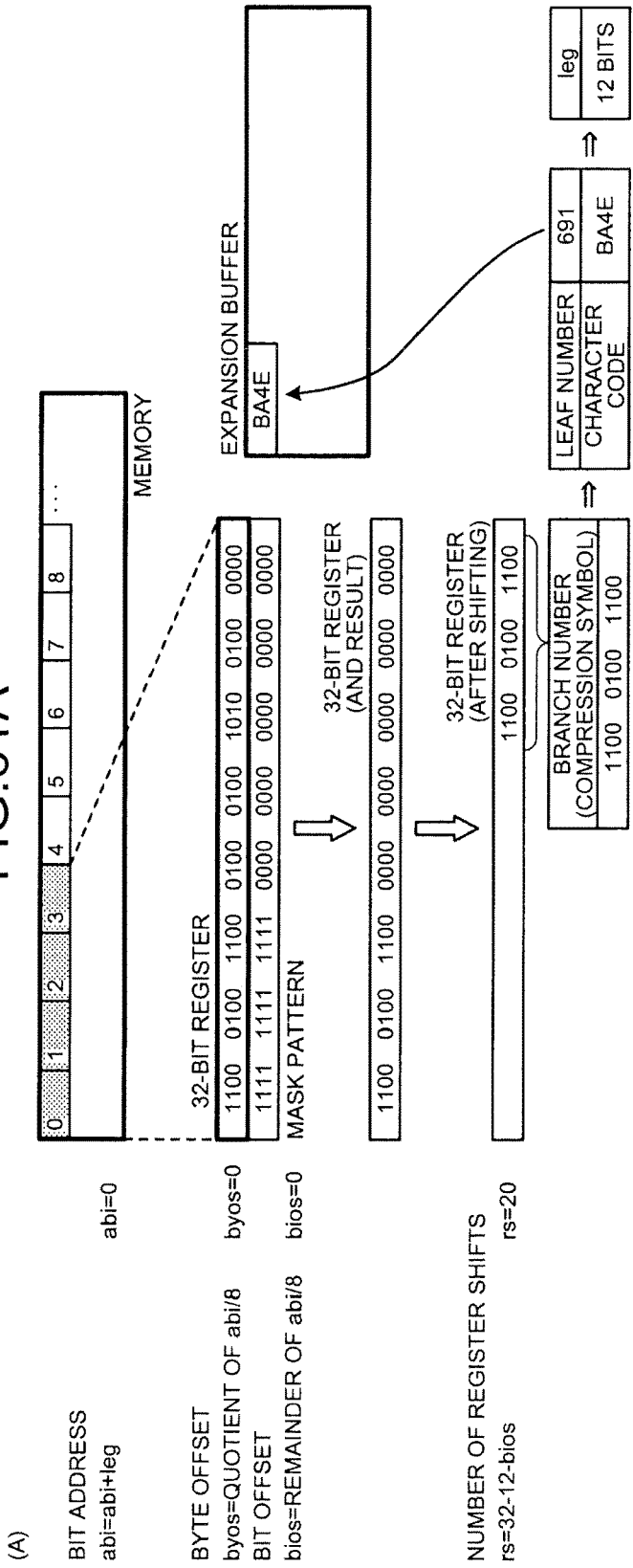

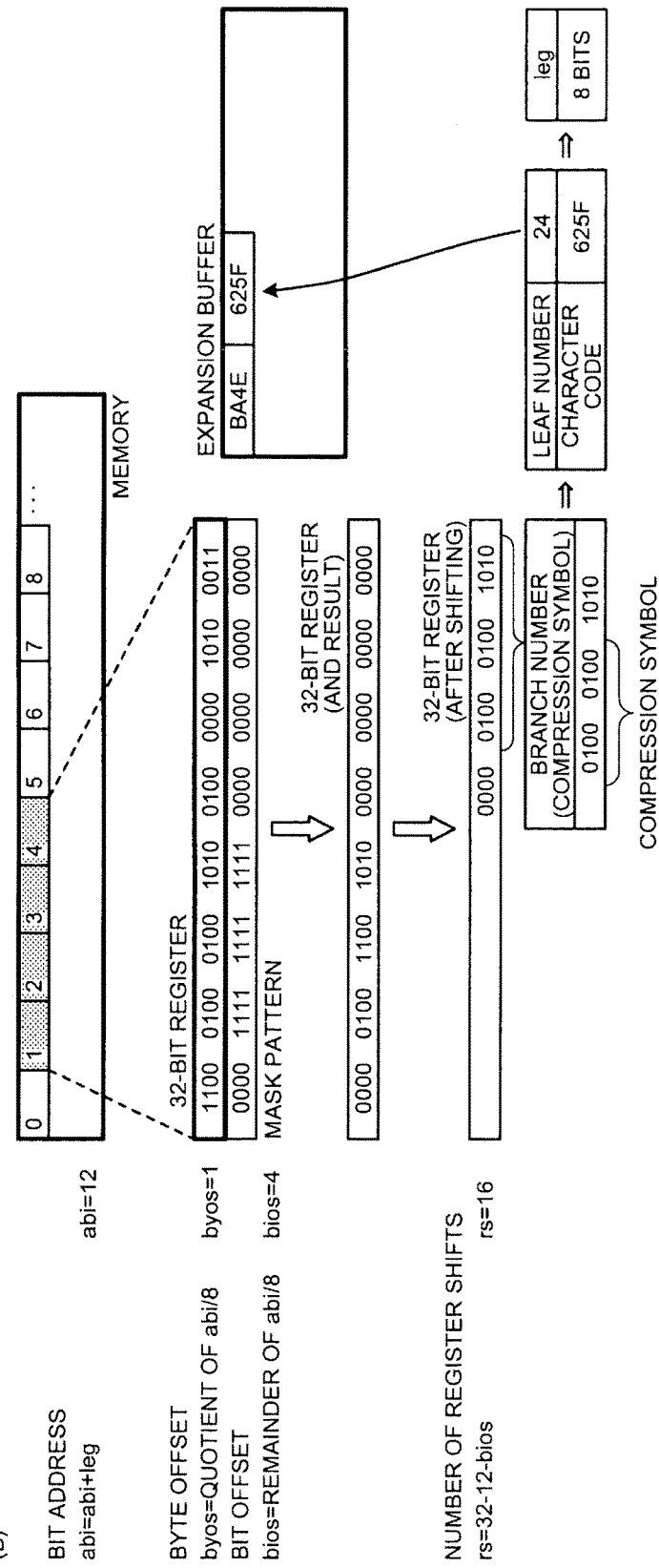

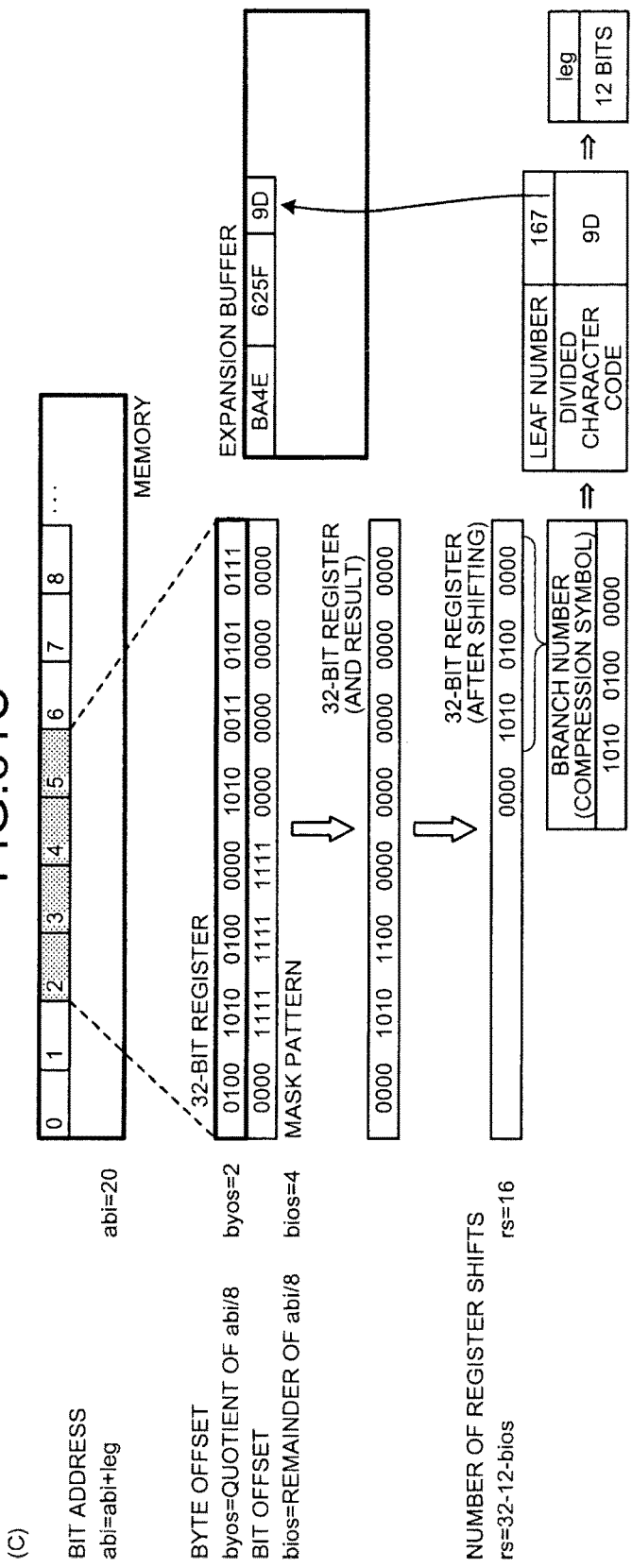

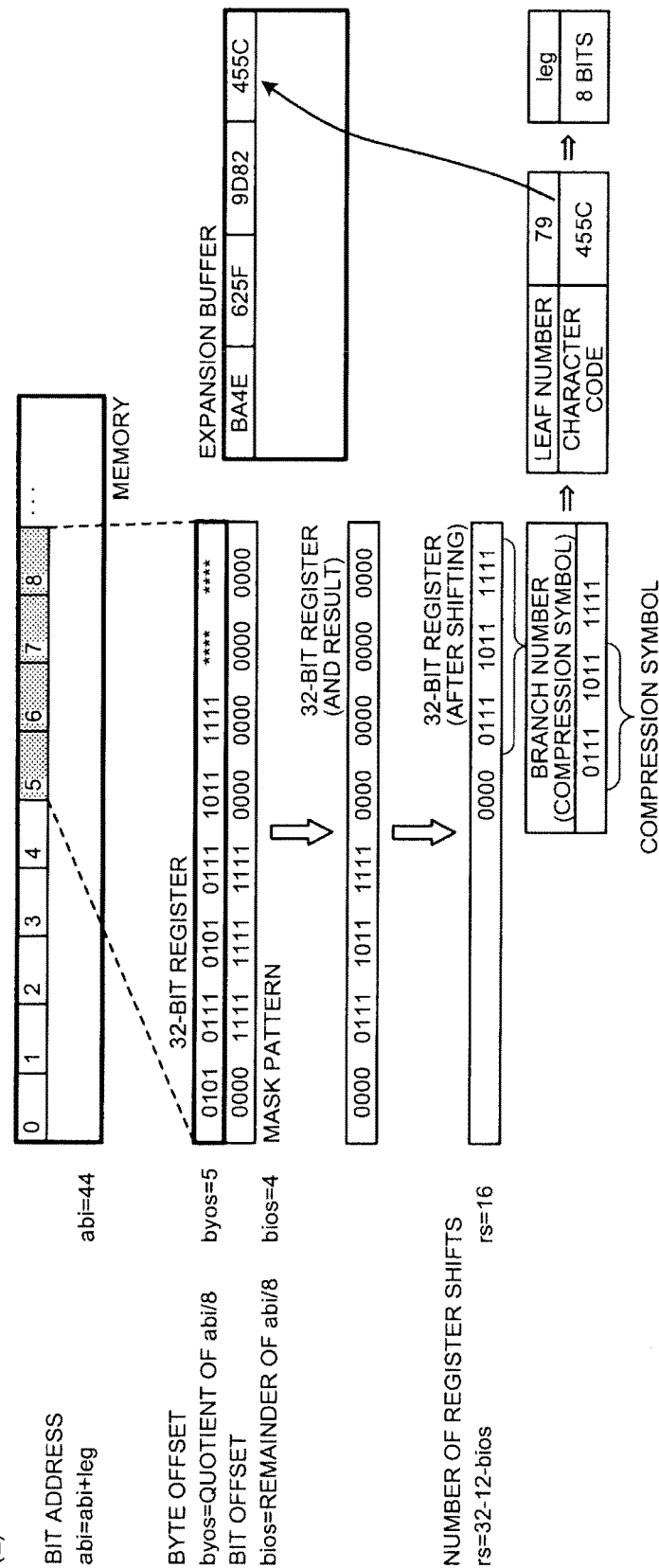

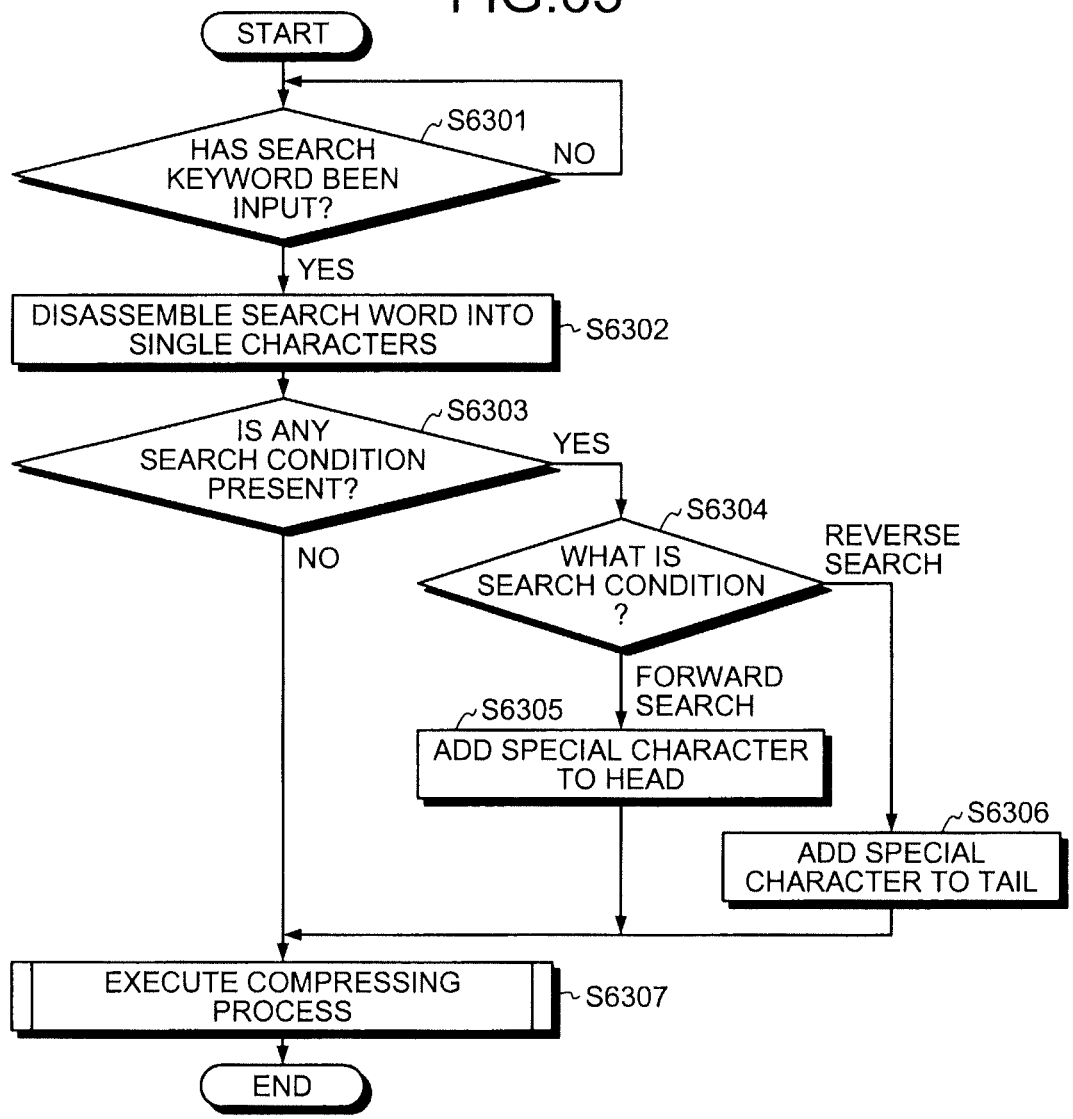

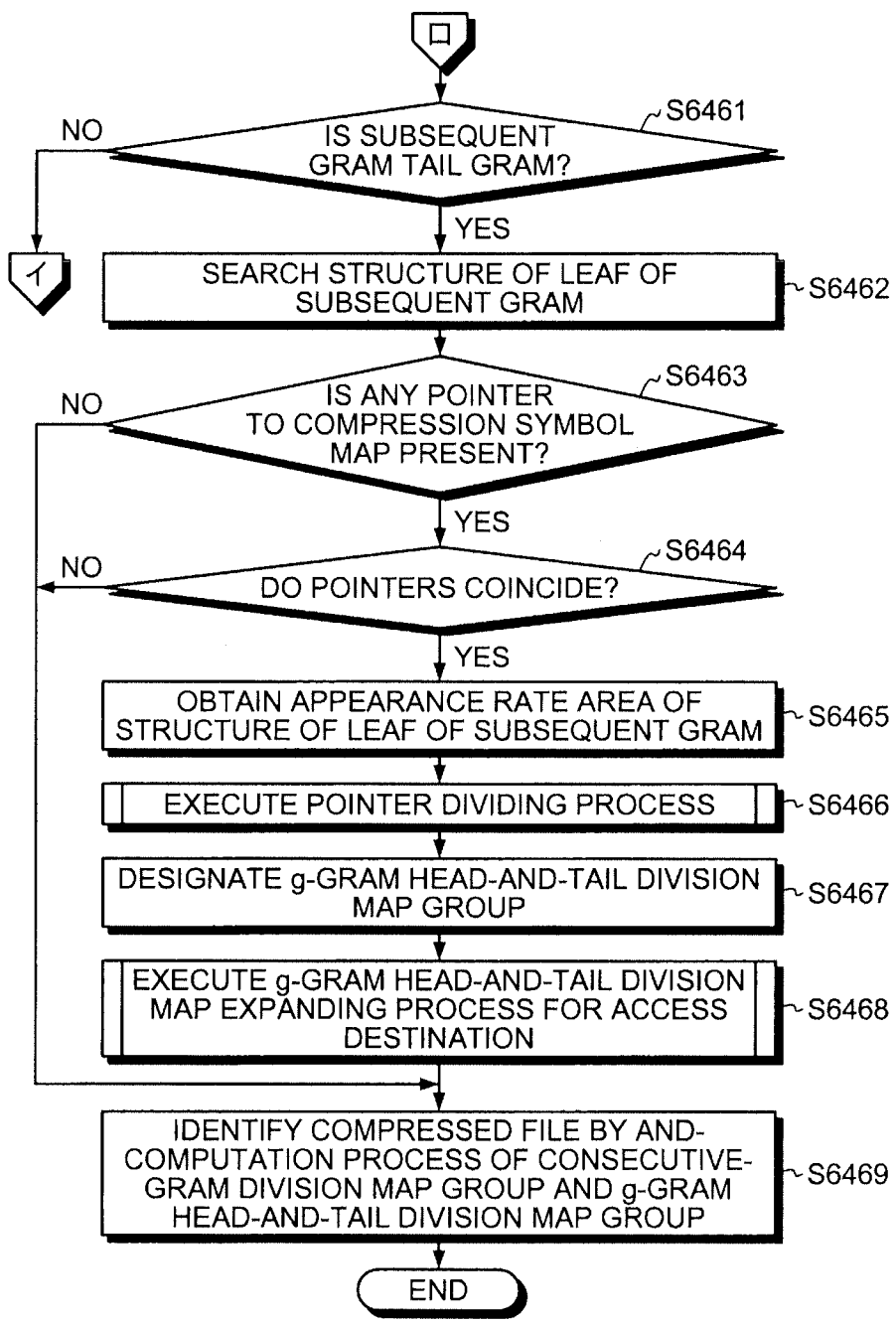

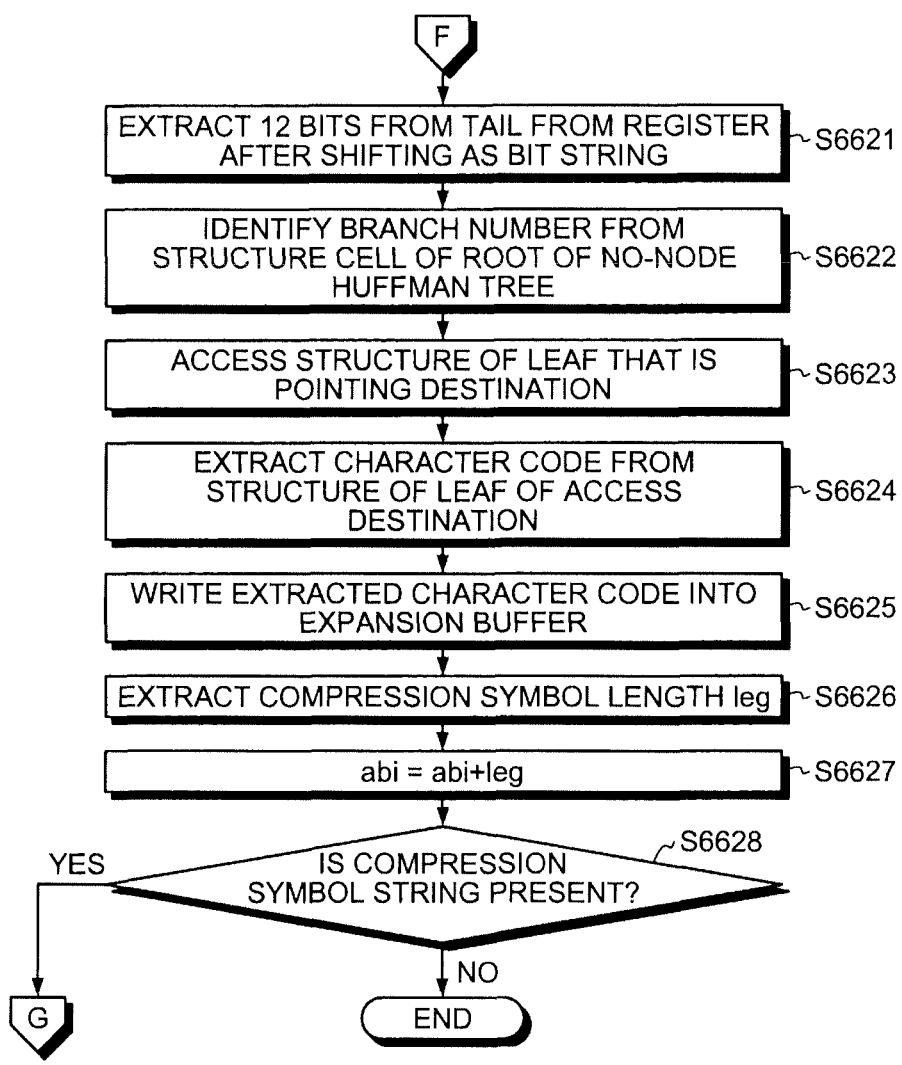

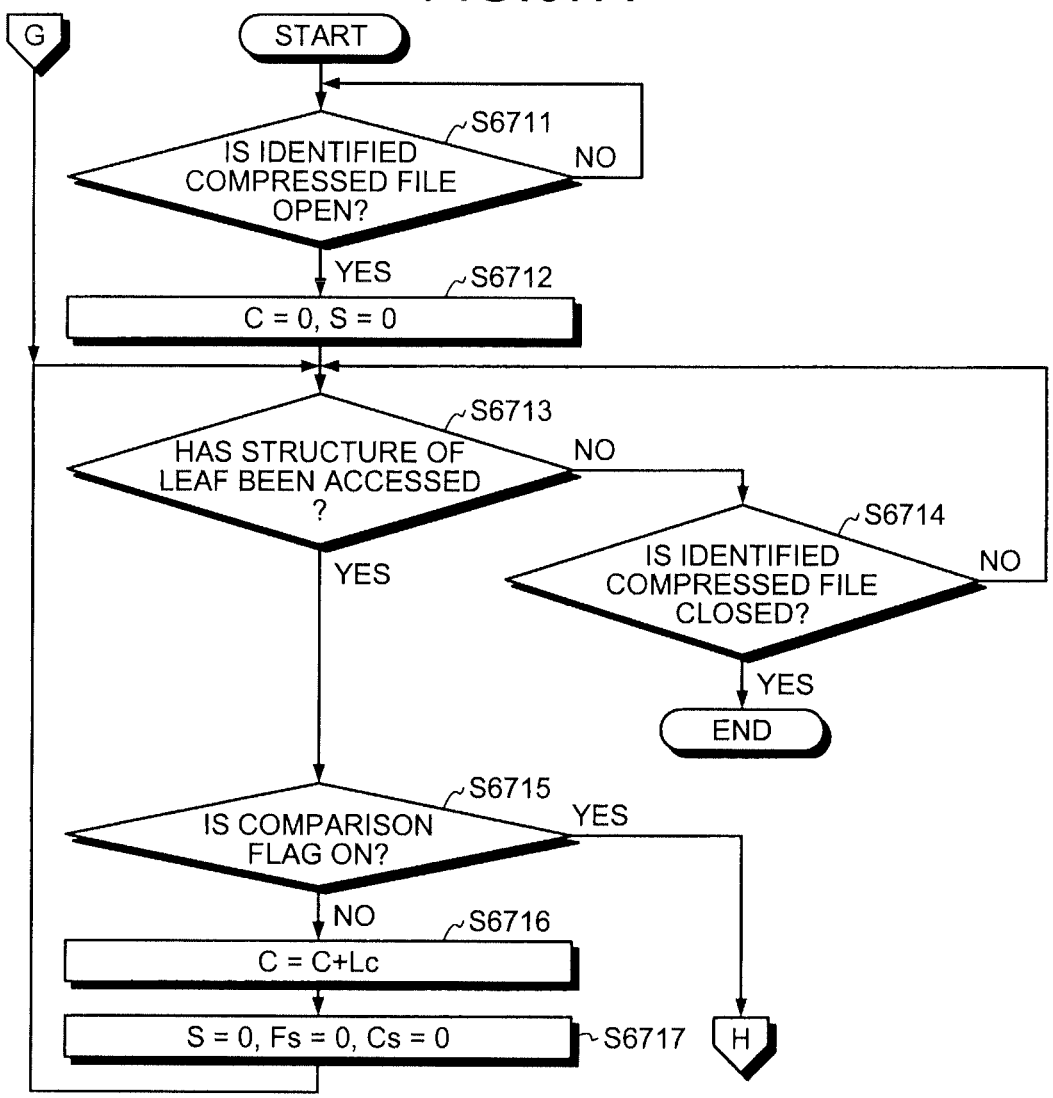

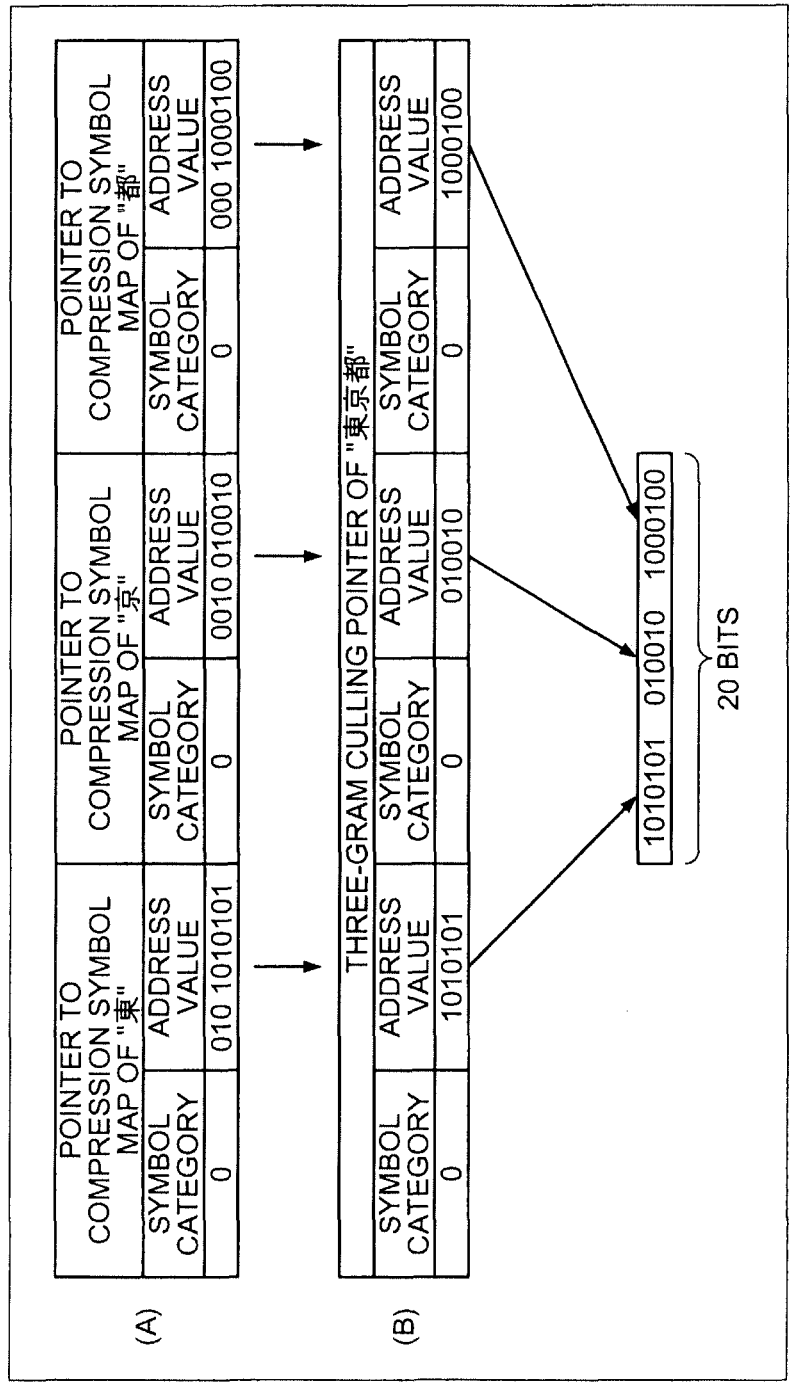

FIG.69

| MAP NAME | FIRST GRAM | SECOND GRAM | FILE NUMBER | | | |
|---|---|---|---|---|---|---|
| | | | 4 | 3 | 2 | 1 |
| CONSECUTIVE-GRAM DIVISION MAP OF "東" AND "京" | UPPER 5 BITS | UPPER 5 BITS | 1 | 1 | 1 | 1 |
| | | LOWER 5 BITS | 1 | 1 | 1 | 0 |
| | LOWER 5 BITS | UPPER 5 BITS | 1 | 1 | 1 | 1 |
| | | LOWER 5 BITS | 1 | 1 | 1 | 0 |
| CONSECUTIVE-GRAM DIVISION MAP OF "京" AND "都" | UPPER 5 BITS | UPPER 5 BITS | 0 | 1 | 1 | 0 |
| | | LOWER 5 BITS | 0 | 1 | 1 | 0 |
| | LOWER 5 BITS | UPPER 5 BITS | 0 | 1 | 1 | 0 |
| | | LOWER 5 BITS | 1 | 1 | 1 | 0 |
| HEAD-AND-TAIL DIVISION MAP OF "東" AND "都" | UPPER 5 BITS | UPPER 5 BITS | 1 | 1 | 1 | 0 |
| | | LOWER 5 BITS | 1 | 1 | 1 | 0 |
| | LOWER 5 BITS | UPPER 5 BITS | 1 | 1 | 1 | 0 |
| | | LOWER 5 BITS | 1 | 1 | 1 | 0 |
| DELETION MAP | | | 1 | 1 | 0 | 1 |
| CULLING DIVISION MAP OF "東", "京", AND "都" | UPPER 5 BITS | UPPER 5 BITS | 1 | 1 | 1 | 0 |
| | | LOWER 5 BITS | 0 | 1 | 1 | 0 |
| | LOWER 5 BITS | UPPER 5 BITS | 0 | 1 | 0 | 0 |
| | | LOWER 5 BITS | 1 | 1 | 0 | 0 |
| AND-COMPUTATION RESULT | | | 0 | 1 | 0 | 0 |

COMPUTER PRODUCT, INFORMATION PROCESSING APPARATUS, AND INFORMATION SEARCH APPARATUS

CROSS REFERENCE TO RELATED APPLICATIONS

This application is based upon and claims the benefit of priority of the prior Japanese Patent Application No. 2009-296410, filed on Dec. 25, 2009, the entire contents of which are incorporated herein by reference.

FIELD

The embodiments discussed herein are related to information processing, searching, compression, and expansion using a Huffman tree.

BACKGROUND

Conventionally, a search technique is present that includes a character component table indicating the correlation between a character and a document that includes the character, and a condensed text file storing therein and correlating condensed text obtained by removing ancillary words from a document and the document. According to the searching technique, the character component table is referred to; a document that corresponds to the character included in a search keyword is identified; and based on the result of referring to the character component table, the document that includes the search keyword is identified from the condensed text in the condensed text file (see, e.g., Japanese Patent No. 2986865).

Another disclosed technique involves reading text data into character strings each having a length of "n"; recording information that indicates that one of the character strings is present in an entry of a character component table corresponding to the character string; dividing a search term into character strings each having a length of "n"; outputting a document whose presence information is recorded in all entries of a concatenated character component table corresponding to each of the character strings; screening objects to be searched by executing stepwise character component table searches before searching for the text itself; and thereby, executing a full-text search at a high speed (see, e.g., Japanese Patent No. 3263963).

A technique is disclosed that realizes high-speed full-text searching, equivalent to when a document is searched for that is constituted of a language having few types of phonograms such as the English language, by a concatenated character component table search unit that can fully narrow down candidates from a given search term (see, e.g., Japanese Patent No. 3497243).

Another disclosed technique involves generating a character component table describing an appearance state of a character in text data for each document to be registered; recognizing the document structure according to a predetermined document structure name; dividing the text data for each structure; for each character that appears, setting "1" at the position of a specific bit that corresponds to the document structure in which the character appears; storing a structure bit string having described therein an appearing document structure position for each character; when a user designates "critical work" as a character string to be searched for and "name of the invention", "claims", or "effect of the invention" as the document structure, executing a character component table search using "critical work" and obtaining documents 1, 7, 15, 38, . . . as the result; taking the bit AND of a designated document structure bit string "100100001" based on the designated document structure and a structure bit string of the document retrieved; and obtaining the documents 1, 7, 38, . . . as the search result (see, e.g., Japanese Patent No. 3518933).

However, in the conventional techniques, the character component table is generated using 64,000 types of character codes each of which is a 16-bit character code for content constituted of a tremendous number (for example, 10,000) of document files. When the character component table is increased by adding those for two sequential characters, three sequential characters, four sequential characters, . . . to that for single characters to reduce search noise, a size explosion is caused and the file size of the data is drastically increased. Therefore, a problem arises in that the processing becomes difficult in the hardware environment in terms of resource-saving. On the other hand, if the file size is reduced using a hash function, etc., a problem arises in that search noise increases and the search speed is slowed. A further problem arises in that the processing time to create the character component tables for two sequential characters, three sequential characters, four sequential characters, . . . increases.

SUMMARY

According to an aspect of an embodiment, a non-transitory computer-readable recording medium storing therein an information processing program that, with respect to a computer comprising a storage unit storing therein a file group in which character code strings are described, causes the computer to execute generating plural types of combined identification information by dividing into two portions, at least one among identification information for a preceding character code and identification information for a succeeding character code and by respectively combining the portions of the divided identification information with the identification information that is not divided, the preceding and the succeeding character codes constituting a character code string for two-consecutive grams in a file selected from the file group; storing to the storage unit, plural types of consecutive-gram divided maps obtained by allocating to each type of combined identification information generated, a string of bits of a quantity corresponding to the quantity of files in the file group; and updating in the consecutive-gram divided maps, a bit that indicates whether the character code string for the two-consecutive grams is present in the selected file.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is an explanatory diagram depicting the flow of processing to compress files.

FIG. 2A is an explanatory diagram of a node aggregate that is the generation origin of a $2^n$-branching Huffman tree.

FIG. 3 is an explanatory diagram of a compression pre-process.

FIG. 4 is a block diagram of a hardware configuration of an information processing apparatus according to an embodiment.

FIG. 6 is an explanatory diagram of a character appearance frequency totaling table.

FIG. 7 is an explanatory diagram of a reserved word appearance frequency totaling table.

FIG. 8 is an explanatory diagram of a totaling result table that integrates the appearance frequencies of character codes and reserved words.

FIG. 9A is an explanatory diagram of a divided character appearance frequency totaling table.

FIG. 9B is an explanatory diagram of a divided character appearance frequency totaling table concerning an upper eight bits.

FIG. 9C is an explanatory diagram of a divided character appearance frequency totaling table concerning a lower eight bits.

FIG. 10 is an explanatory diagram of a calculation result table obtained by a calculating unit 507.

FIG. 13A is an explanatory diagram of exemplary updating of a calculation result table executed when optimization from the fourth layer to the third layer is executed.

FIG. 13B is an explanatory diagram of exemplary updating of the calculation result table executed when optimization from the third layer to the second layer is executed.

FIG. 13C is an explanatory diagram of exemplary updating of the calculation result table executed when optimization from the second layer to the first layer is executed.

FIG. 14 is an explanatory diagram of the structures of a $2^n$-branching Huffman tree after optimization.

FIG. 15 is an explanatory diagram of information that is stored by the structures of leaves L# in the $2^n$-branching Huffman tree after optimization.

FIG. 16 is an explanatory diagram of a reserved word structure.

FIG. 17 is an explanatory diagram of a higher-level character code structure.

FIG. 18 is an explanatory diagram of a divided character code structure.

FIG. 19 is a flowchart of a procedure of a $2^n$-branching Huffman tree generating process automatically executed by the information processing apparatus.

FIG. 29 is an explanatory diagram of information stored in a structure of a leaf L#.

FIG. 30 is a block diagram of a second functional configuration of the information processing apparatus according to the embodiment.

FIG. 33A is an explanatory diagram of an example of a character code string to be compressed.

FIG. 33B is an explanatory diagram of an example of a compression symbol string.

FIG. 37 is another flowchart of the compressing process (step S3503) depicted in FIG. 35.

FIG. 38 is yet another flowchart of the compressing process (step S3503) depicted in FIG. 35.

FIG. 39A is an explanatory diagram of the initial state of a compression symbol map group.

FIG. 39B is an explanatory diagram of the compression symbol map group after updating by a compression symbol map updating unit.

FIG. 40 is an explanatory diagram of downsizing of a two-gram compression symbol map.

FIG. 41 is a chart of the sizes of the two-gram compression symbol map obtained when the symbol map is divided.

FIGS. 43A to 43AF are explanatory diagrams of specific examples of the consecutive-gram divided map.

FIGS. 44A to 44I are explanatory diagrams of exemplary generation of a consecutive-gram divided map and an x-gram head-and-tail divided map.

FIG. 45A is an explanatory diagram of exemplary generation of a pointer to a consecutive-gram divided map that includes higher-level character codes.

FIG. 45B is an explanatory diagram of exemplary generation of a pointer to a consecutive-gram divided map of a higher-level character code and an upper divided character code.

FIG. 45C is an explanatory diagram of exemplary generation of a pointer to a consecutive-gram divided map of an upper divided character code and a lower divided character code.

FIG. 45D is an explanatory diagram of exemplary generation of a pointer to a consecutive-gram divided map of a lower divided character code and a higher-level character code.

FIG. 46C is a flowchart of the two-gram divided map generating process (step S4603) depicted in FIG. 46A.

FIG. 47A is an explanatory diagram of the relation between appearance rate and appearance rate area.

FIG. 47B is an explanatory diagram of a compression pattern table having compression patterns by appearance rate area.

FIG. 48A is an explanatory diagram of a compression pattern for B and B' areas.

FIG. 48B is an explanatory diagram of a compression pattern for C and C' areas.

FIG. 48C is an explanatory diagram of a compression pattern for D and D' areas.

FIG. 48D is an explanatory diagram of a compression pattern for E and E' areas.

FIG. 50 is an explanatory diagram of the addition of a bit string to the compression symbol map group ms compressed.

FIG. 51 is an explanatory diagram of a deletion map.

FIG. 57 is an explanatory diagram of exemplary description in the file Fp.

FIG. 58 is an explanatory diagram of the result of an automatic insertion of a special character to a search keyword when search conditions are designated.

FIG. 59 is an explanatory diagram of exemplary identification by a compressed file identifying unit.

FIGS. 60A to 60C are explanatory diagrams of exemplary identification of the compressed file f using a consecutive-gram divided map group and a five-gram head-and-tail divided map group for the five-gram search keyword "人形芝居".

FIGS. 61A to 61E are explanatory diagrams of the specific example of an expanding process by an extracting unit, a leaf identifying unit, and an expansion code storing unit executed using the $2^m$-branching no-node Huffman tree.

FIG. 63 is a flowchart of a procedure of a search keyword compressing process.

FIGS. 64D to 64F are flowcharts of a file screening process for plural grams (step S6413) depicted in FIG. 64A.

FIGS. 66A and 66B are flowcharts of a procedure of the expanding process using the no-node Huffman tree.

FIGS. 67A and 67B are flowcharts of a procedure of the comparing process.

FIG. 68 is an explanatory diagram of a culling process.

FIG. 69 is an explanatory diagram of exemplary identification of a compressed file using the culled divided map group.

DESCRIPTION OF EMBODIMENTS

Figure 2B:
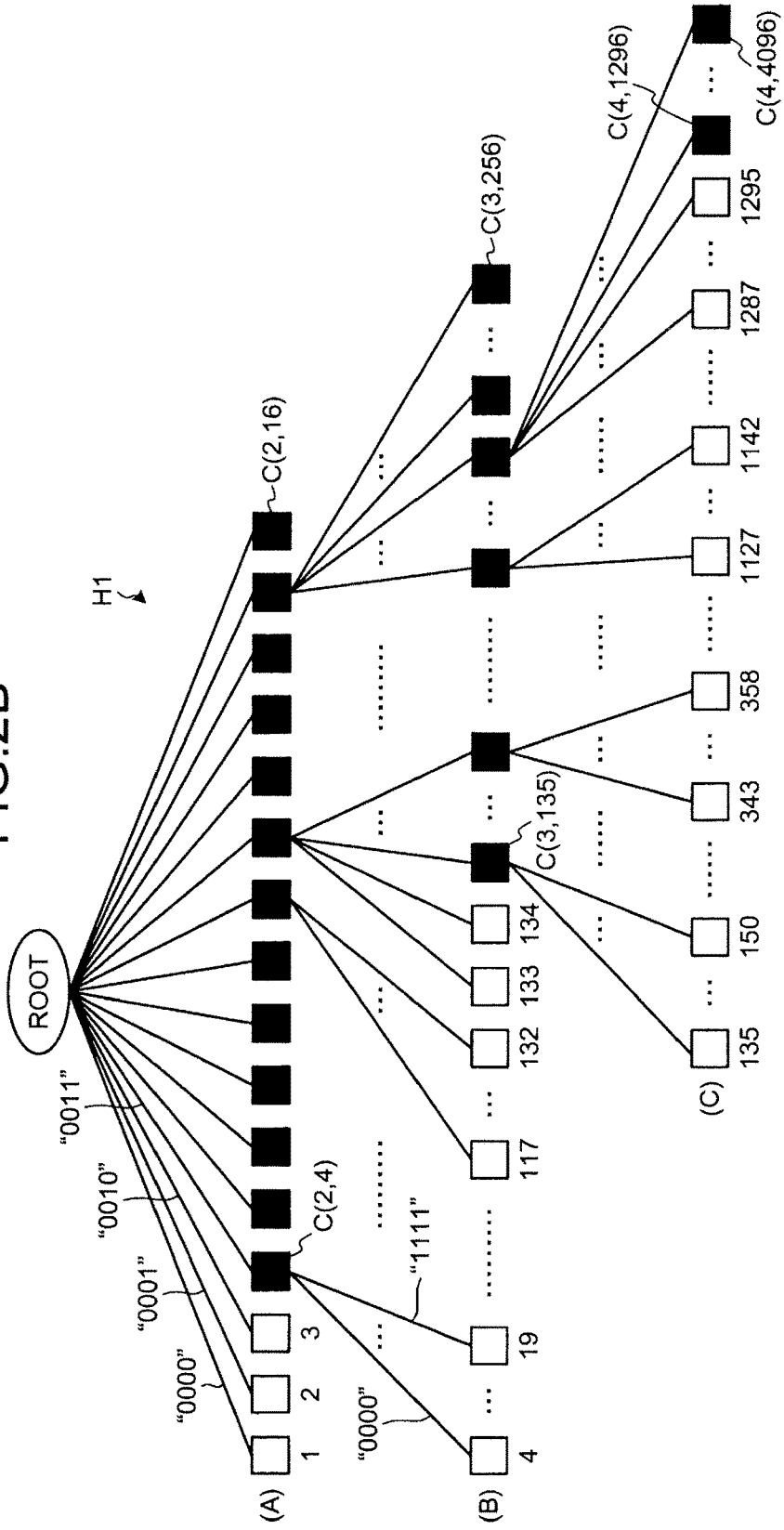
FIG. 2B is an explanatory diagram of the $2^n$-branching Huffman tree.

Preferred embodiments of the present invention will be explained with reference to the accompanying drawings.

FIG. 1 is an explanatory diagram depicting the flow of processing to compress files. In the present embodiment, (1) the information processing apparatus reads a file group Fs and totals the appearance frequency of each character that appears in the file group Fs. The file group Fs is an electronic document having described therein several 1,000 to several 10,000 kinds of characters (strictly, character codes).

If the file group Fs includes character codes, the file group Fs may be in a text format or may be described in HyperText Markup Language (HTML) or eXtensible Markup Language (XML). For example, dictionary data such as a Japanese language dictionary, a foreign language dictionary (such as an English-Japanese dictionary or a Japanese-English dictionary), and a technical term dictionary, as well as a webpage is applicable as the file group Fs.

"Appearance frequency" is the number of times that a character appears. For example, if the file group Fs includes three files (F1 to F3) and the number of times a character "X" appears is two in the file F1, is three in the file F2, and is zero in the file F3, the appearance frequency of the character "X" is five. The appearance frequency totaled for a character is referred to as a "totaling result 10".

(2) The information processing apparatus generates a $2^n$-branching Huffman tree H1 using the totaling result 10. The $2^n$-branching Huffman tree H1 is a Huffman tree whose number of branches from a node thereof to its lower nodes is $2^n$, where "n" is a natural number and is n≥2. The number of layers of nodes is k (where "k" is a natural number and is k≥2). The number of nodes in the i-th layer (where "i" is a natural number and is 1≤i≤k) is $2^{n(i-1)}$. Each node stores therein pointers to upper nodes.

Each node can have stored therein $2^n$ leaves or $2^n$ pointers to its lower nodes. In the embodiment, because Chinese characters used in the Japanese language, etc., are each represented by a 16-bit code, when 16-bit character codes are to be compressed or expanded, the description will be made assuming that n is n=4 and k is k=4. The details of the $2^n$-branching Huffman tree H1 will be described later with reference to FIGS. 2A and 2E.

(3) The information processing apparatus converts the $2^n$-branching Huffman tree H1 into a $2^m$-branching no-node Huffman tree H2. The "no-node Huffman tree H2" is a Huffman tree that has only a root and leaves and that has no internal node. The no-node Huffman tree H2 is a Huffman tree that has an increased number of branches while each leaf thereof is accessible from its root through one path. The details of the no-node Huffman tree H2 will be described with reference to FIG. 26.

Thereafter, (4) the information processing apparatus reads the file group Fs, file by file and searches for compression symbols using the no-node Huffman tree. (5) The information processing apparatus compresses the file group Fs by lining up the retrieved compression symbols and forming files of the compression symbols. Thereby, a compressed file group fs is obtained.

(6) A compression symbol map group Ms is generated in parallel with the process of (5). The "compression symbol map group Ms" is a set of compression symbol maps M. A "compression symbol map M" is a table indicating, for each character, the presence or absence of the character in the file group Fs. By using the compression symbol map group Ms, each compressed file fs that includes the characters constituting a search keyword can be screened out without being expanded. More specifically, the compression symbol map group Ms is stored in a storage medium such as, for example, a RAM, a magnetic disk, and an optical disk and can be accessed by a CPU.

More specifically, the compression symbol map group Ms is configured by bit strings of a quantity corresponding to the quantity of the files respectively corresponding to each character. For example, if the value of a bit that corresponds to a file number # for the character X is "1", this indicates that the character X is present in a file F#. On the other hand, if the value of the bit that corresponds to the file number # for the character X is "0", this indicates that the character X is not present in the file F#. The details of the compression symbol map group Ms will be described later with reference to FIGS. 39A and 39B.

FIG. 2A is an explanatory diagram of a node aggregate that is the generation origin of the $2^n$-branching Huffman tree (where n=4 and therefore, $2^n$=16). In a node aggregate 100 depicted in FIG. 2A, a first layer has one node structure cell; a second layer has 16 node structure cells; a third layer has 256 node structure cells; and a fourth layer has 4,096 node structure cells. Each of the structure cells C(i, j) stores therein pointers to upper nodes that are each a link origin. The node structure cell C(1, 1) in the first layer that is the highest level is a root structure and therefore, has no pointer to any upper node.

FIG. 2B is an explanatory diagram of the $2^n$-branching Huffman tree. In FIG. 2B, "n" is n=4, that is, this Huffman tree is a 16-branching Huffman tree. More specifically, for example, the $2^n$-branching Huffman tree is stored in a storage medium such as a RAM, a magnetic disk, and an optical disk and can be accessed by a CPU.

In the $2^n$-branching Huffman tree H1, the root corresponds to the node structure cell C(1, 1) in the first layer of FIG. 2A. (A) to (C) represent nodes or leaves. In FIG. 2B, each □ represents a leaf and each ■ represents a node. Each ■ that has no branch to a lower node or leaf is an unused node. A digit immediately beneath a leaf represents the leaf number. Hereinafter, a leaf is denoted by L# (where # is a leaf number).

□ in (A) are leaves L1 to L3 that are linked to the root in the first layer. ■ are nodes in the second layer that are linked to the root, and correspond to node structure cells C(2, 4) to C(2, 16). □ in (B) are leaves L4 to L134 that are linked to the nodes in the second layer. ■ are nodes in the third layer that are linked to the root, and correspond to the node structure cells C(3, 135) to C(3, 256). □ in (C) are leaves L135 to L1295 that are linked to the nodes in the third layer. ■ are nodes in the fourth layer that are linked to the root, and correspond to the node structure cells C(4, 1296) to C(4, 4096). A pre-process of the compression will be described.

FIG. 3 is an explanatory diagram of the compression pre-process. The file group Fs has described therein the several 1,000 to several 10,000 kinds of characters and, by the present program, the appearance frequencies of the character codes in the file group Fs are totaled and are sorted in descending order of appearance frequency. The character codes are divided into character codes at higher levels (for example, the first to a 1,024th level) and character codes at lower levels (a 1,025th and lower).

The appearance frequencies of the character codes at the higher levels are high and therefore, compression symbols are allocated as 16-bit codes. Each of the lower-level character codes is divided into an upper eight bits and a lower eight bits. Up to 65,536 (256×256) kinds of characters can be handled using 16-bit codes. However, by dividing each of the lower-level character codes into eight-bit sections, the 60,000 or more kinds of lower-level character codes can be suppressed to 256 kinds of divided character codes.

For example, the 16-bit character code of a Chinese character "兎" is "0x514E" and therefore, is divided into an upper eight bits "0x51" and a lower eight bits "0x4E". Similarly, the 16-bit character code of a Chinese character "兆" is "0x5146" and therefore, is divided into an upper eight bits "0x51" and a lower eight bits "0x46". The appearance frequencies of the eight-bit character codes are totaled. In the examples of "兎" and "兆", the appearance frequency of the divided character code "0x51" is two and the appearance frequency of each of the divided character codes "0x4E" and "0x46" is one.

A tag such as <p> or <p/>, etc., is referred to as a reserved word. Several dozen kinds of reserved words are determined in advance. A higher-level character code group, a divided character code group, and a reserved word group are mixed and from this mixture, the appearance frequencies are again totaled and the appearance frequencies are sorted in descending order of appearance frequency. Thereby, about 1,300 kinds of character codes are obtained that are sorted in descending order of appearance frequency. By suppressing the number of kinds of character codes to this extent, 16-bit character codes can be compressed to compression symbols of 12 bits or fewer and the compression symbols can be expanded to 16-bit character codes.

FIG. 4 is a block diagram of a hardware configuration of an information processing apparatus according to the embodiment. As depicted in FIG. 4, the information processing apparatus includes a central processing unit (CPU) 401, a read-only memory (ROM) 402, a random access memory (RAM) 403, a magnetic disk drive 404, a magnetic disk 405, an optical disk drive 406, an optical disk 407, a display 408, an interface (I/F) 409, a keyboard 410, a mouse 411, a scanner 412, and a printer 413, respectively connected by a bus 400.

The CPU 401 governs overall control of the information processing apparatus. The ROM 402 stores therein programs such as a boot program. The RAM 403 is used as a work area of the CPU 401. The magnetic disk drive 404, under the control of the CPU 401, controls the reading and writing of data with respect to the magnetic disk 405. The magnetic disk 405 stores therein data written under control of the magnetic disk drive 404.

The optical disk drive 406, under the control of the CPU 401, controls the reading and writing of data with respect to the optical disk 407. The optical disk 407 stores therein data written under control of the optical disk drive 406, the data being read by a computer.

The display 408 displays, for example, data such as text, images, functional information, etc., in addition to a cursor, icons, and/or tool boxes. A cathode ray tube (CRT), a thin-film-transistor (TFT) liquid crystal display, a plasma display, etc., may be employed as the display 408.

The I/F 409 is connected to a network 414 such as a local area network (LAN), a wide area network (WAN), and the Internet through a communication line and is connected to other apparatuses through the network 414. The I/F 409 administers an internal interface with the network 414 and controls the input/output of data from/to external apparatuses. For example, a modem or a LAN adaptor may be employed as the I/F 409.

The keyboard 410 includes, for example, keys for inputting letters, numerals, and various instructions and performs the input of data. Alternatively, a touch-panel-type input pad or numeric keypad, etc. may be adopted. The mouse 411 is used to move the cursor, select a region, or move and change the size of windows. A track ball or a joy stick may be adopted provided each respectively has a function similar to a pointing device.

The scanner 412 optically reads an image and takes in the image data into the information processing apparatus. The scanner 412 may have an optical character reader (OCR) function as well. The printer 413 prints image data and text data. The printer 413 may be, for example, a laser printer or an ink jet printer.

Figure 5:
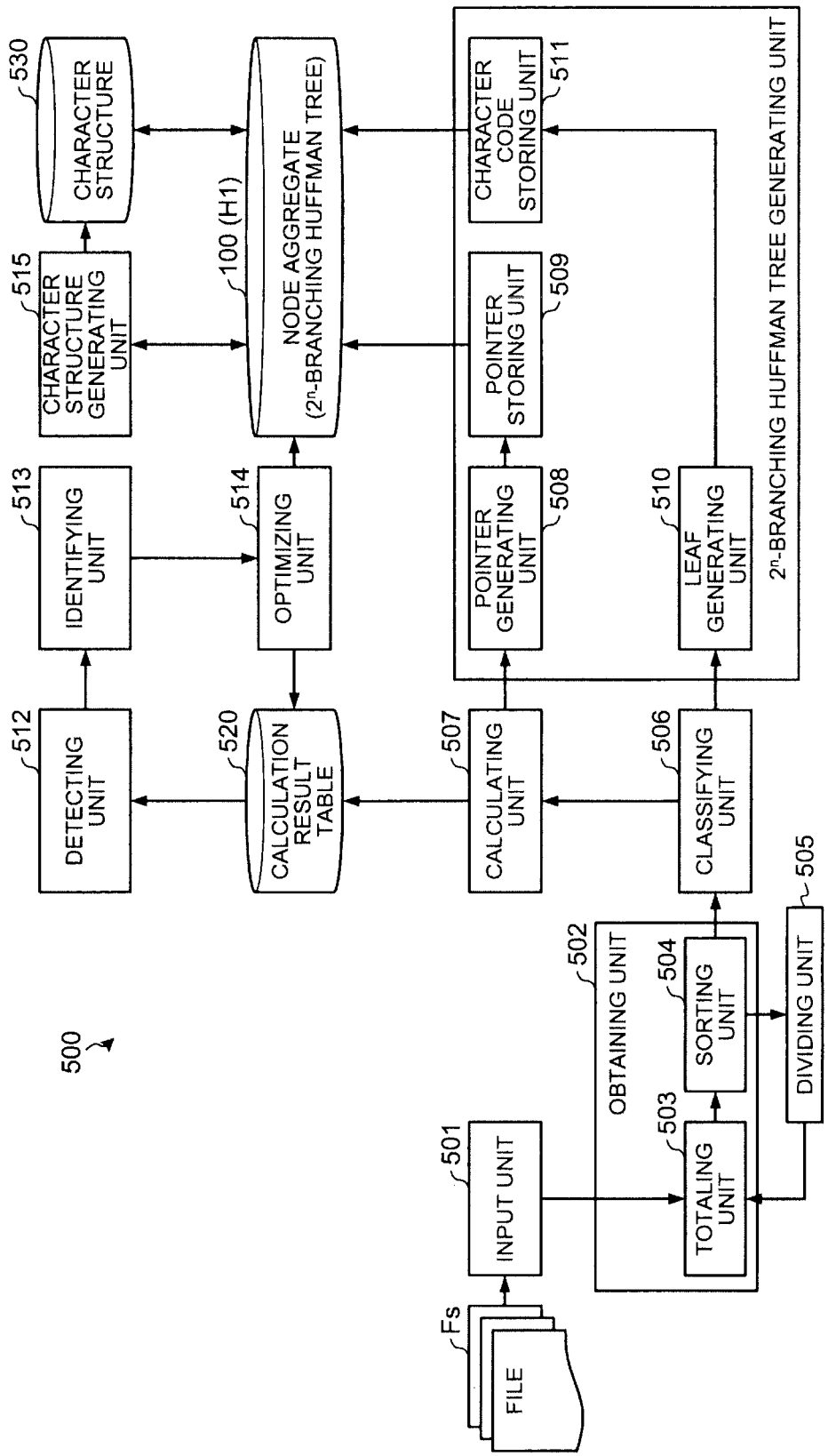
FIG. 5 is a block diagram of a first functional configuration of the information processing apparatus according to the embodiment.

FIG. 5 is a block diagram of a first functional configuration of the information processing apparatus according to the embodiment. FIG. 5 depicts a functional configuration to execute processes of (1) and (2) among the flow of processes (1) to (6) depicted in FIG. 1. As depicted in FIG. 5, the information processing apparatus 500 includes an input unit 501, an obtaining unit 502, a classifying unit 506, a calculating unit 507, a $2^n$-branching Huffman tree generating unit (a pointer generating unit 508, a pointer storing unit 509, a leaf generating unit 510, and a character code storing unit 511), a detecting unit 512, an identifying unit 513, an optimizing unit 514, and a character structure generating unit 515.

Respective functions of the units from the input unit 501 to the character structure generating unit 515 are implemented by causing the CPU 401 to execute a program stored in a storage medium such as the RAM 403, the magnetic disk 405, and the optical disk 407 depicted in FIG. 4, or via the I/F 409.

The input unit 501 has a function of inputting character codes from the file group Fs. More specifically, for example, the CPU 401 scans the file group Fs and thereby, sequentially reads the $2^n$-bit character codes from the file group Fs. The character codes read are retained in a register in the CPU 401.

The obtaining unit 502 has a function of obtaining the totaling result of the appearance frequencies of the $2^n$-bit character codes described in the file group Fs. If only the totaling result can be obtained, the totaling result itself may directly be read, or character codes set in the register by the input unit 501 may sequentially be totaled. In the latter case, more specifically, the obtaining unit 502 has, for example, a totaling unit 503 and a sorting unit 504. The totaling unit 503 totals the number of character codes set in the register. For example, the CPU 401 increments a counter value in a character appearance frequency totaling table for a character code that coincides with a character code set in the register.

FIG. 6 is an explanatory diagram of the character appearance frequency totaling table. A character appearance frequency totaling table 600 is stored in a storage medium such as the RAM 403, the magnetic disk 405, and the optical disk 407 depicted in FIG. 4 and can be accessed by the CPU 401. The character appearance frequency totaling table 600 stores therein a counter value for each character. "Character" items are allocated with various characters for convenience of description. However, the character items are actually allocated with character codes to be compared with the character codes input. The CPU 401 scans the character items for the character codes input and thereby, detects character codes that coincide with the character codes input. When a character code that coincides with a character code input is detected, the CPU 401 increments the corresponding counter value by one point.

FIG. 7 is an explanatory diagram of the reserved word appearance frequency totaling table. The reserved word appearance frequency totaling table 700 is stored in a storage medium such as the RAM 403, the magnetic disk 405, and the optical disk 407 depicted in FIG. 4 and can be accessed by the CPU 401. The reserved word appearance frequency totaling table 700 stores therein a counter value for each character. "Character" items are allocated with various characters for convenience of description. However, the character items are actually allocated with character code strings to be compared with the character codes input. In other words, prior to the check against the character appearance frequency totaling table 600, the CPU 401 scans the reserved word items for the character codes input and thereby, detects character codes that coincide with the character codes input.

If a character code input coincides with a reserved word, the CPU 401 scans the reserved word items for the next character code input. This is repeated and if a character code string that coincides with a character code input is detected, the CPU 401 increments the counter value of the character code string of the reserved word by one point. If a character code appears that does not coincide with any of the character codes input, the CPU 401 accesses the character appearance frequency totaling table 600 and increments by one point the counter value of each of the character codes of the character code strings that so far coincide with the character codes input. The character codes that do not coincide with the character codes input are totaled using the character appearance frequency totaling table 600 as above.

Referring back to FIG. 5, the sorting unit 504 has a function of sorting the totaling results. More specifically, for example, the CPU 401 sorts in descending order of counter value, the characters (character codes) in the character appearance frequency totaling table 600 and the reserved words in the reserved word appearance frequency totaling table 700.

FIG. 8 is an explanatory diagram of a totaling result table that integrates the appearance frequencies of the character codes and the reserved words. In a totaling result table 800, the character codes or the reserved words are sorted in descending order of appearance frequency (counter value). The totaling result table 800 is also stored in a storage medium such as the RAM 403, the magnetic disk 405, and the optical disk 407 depicted in FIG. 4, and can be accessed by the CPU 401.

The obtaining unit 502 further calculates an appearance rate for each of the character codes or reserved words, and identifies an appearance rate area that corresponds to the appearance rate. The "appearance rate" is a value obtained by using the number of all files in the file group Fs as the population (denominator) and the number of files each having present therein the character codes or the reserved words, as the numerator. The "appearance rate area" is information indicating the range of the appearance rate, and identifies a Huffman tree used to compress the compression symbol map group Ms (hereinafter, "compression symbol map Huffman tree"). The appearance rate area and the compression symbol map Huffman tree will be described later (see FIGS. 42A to 42D).

The dividing unit 505 divides the result obtained through the sorting by the sorting unit 504, into character codes having high levels of appearance frequency and character codes having low levels of appearance frequency, and divides each of the lower-level character codes into an upper bit code and a lower bit code. More specifically, for example, as a result of the sorting of the characters (codes) in the character appearance frequency totaling table 600 in descending order of counter value, for example, the character codes at the first to the 1,024th levels are determined as higher-level character codes and the character codes at the 1,025th and latter levels are determined as lower-level character codes. The CPU 401 divides each of the lower-level character codes into an upper eight-bit code and a lower eight-bit code as depicted in Example 1) or 2) of FIG. 3.

The number of kinds of the divided character codes such as the upper eight-bit codes and the lower eight-bit codes is up to 256. Although, up to 60,000 or more kinds of characters are allocated to 16-bit codes and the same number of leaves are necessary, by dividing each of the lower-level character codes each having a low appearance frequency, up to about 60,000 kinds of character codes that are at 1,025th and latter levels can be represented by only 256 kinds of divided character codes. Therefore, the number of leaves to be allocated to the character codes can be significantly reduced (1,024+256+several dozen kinds of reserved words). In this case, the totaling unit 503 again totals the appearance frequencies of the divided character codes. The totaling unit 503 again totals the appearance frequencies dividing these into the appearance frequencies at which the divided character codes appear in the upper eight bits and the appearance frequencies at which the divided character codes appear in the lower eight bits.

FIG. 9A is an explanatory diagram of a divided character appearance frequency totaling table. The divided character appearance frequency totaling table 901 is also stored in a storage medium such as the RAM 403, the magnetic disk 405, and the optical disk 407 depicted in FIG. 4, and can be accessed by the CPU 401. The sorting unit 504 integrates the 16-bit higher-level character codes, the reserved words, and the divided character codes (hereinafter, "character codes, etc."), and updates the totaling result table 800 depicted in FIG. 8.

FIG. 9B is an explanatory diagram of a divided character appearance frequency totaling table concerning the upper eight bits. The divided character appearance frequency totaling table 902 is also stored in a storage medium such as the RAM 403, the magnetic disk 405, and the optical disk 407 depicted in FIG. 4, and can be accessed by the CPU 401. The divided character appearance frequency totaling table 902 is used to generate the compression symbol map group Ms.

FIG. 9C is an explanatory diagram of a divided character appearance frequency totaling table concerning the lower eight bits. The divided character appearance frequency totaling table 903 is also stored in a storage medium such as the RAM 403, the magnetic disk 405, and the optical disk 407 depicted in FIG. 4, and can be accessed by the CPU 401. The divided character appearance frequency totaling table 903 is used to generate the compression symbol map group Ms.

The classifying unit 506 has a function of classifying the character codes, etc., by layer, according to appearance probabilities P thereof based on the totaling result obtained by the obtaining unit 502. More specifically, for example, the classifying unit 506 refers to the character appearance frequency totaling table 600 and classifies the character codes, etc., by layer according to the respective appearance probabilities P.

The "appearance probability P" is a value obtained by dividing the total number of the character codes, etc., by the number of times that a character code, etc. to be classified appears (the counter value in the character appearance frequency totaling table 600). The CPU 401 calculates the appearance probability P for each of the character codes, etc., and classifies the calculated appearance probabilities P by layer. For example, in the i-th layer, each of the character codes for which $1/2^{ni} \leq P < 1/2^{n(i-1)}$ are grouped. However, character codes for which $1/2^{ni} \leq P < 1$ are grouped in the first layer (i=1), and character codes for which $P < 1/2^{n(i-1)}$ are grouped in the n-th layer (i=n).

For example, when n is n=4, the character codes, etc., in the first layer are character codes whose appearance probabilities P are $1/16 \leq P < 1$. The character codes, etc., in the second layer are character codes having appearance probabilities P of $1/32 \leq P < 1/16$. The character codes, etc., in the third layer are character codes having appearance probabilities P of $1/4,096 \leq P < 1/32$. The character codes, etc., in the fourth layer are character codes having appearance probabilities P of $P < 1/4,096$. The layer number i and the rank in the totaling result table 800 that are the classification results are given to each of the character codes, etc. The rank in the totaling result table 800 is the leaf number of the character code, etc.

The calculating unit 507 has a function of calculating the number of pointers to leaves in the i-th layer based on the number of character codes in the i-th layer classified by the classifying unit 506. The calculating unit 507 also has a function of calculating the number of pointers to lower-level nodes in the i-th layer each having nodes in the (i+1) layer as link destinations and the number of used nodes in the i-th layer, based on the number of pointers to the leaves in the i-th layer.

For example, from the node aggregate 100 and the classification result, the CPU 401 calculates, for the i-th layer, the number of structure cells N(i), the number of leaves Nl(i), the number of pointers to leaves Nlp(i), the number of pointers to lower nodes Nnp(i), the number of used structure cells Ncu(i), an cumulative value of the numbers of pointers to leaves ΣNlp(i), the number of blank cells from the head Ncst(i), the number of blank pointers up to the tail Npse(i), and the number of blank cells up to the tail Ncse(i).

FIG. 10 is an explanatory diagram of a calculation result table obtained by the calculating unit 507. The calculation result table 520 is also stored in a storage medium such as the RAM 403, the magnetic disk 405, and the optical disk 407 depicted in FIG. 4, and can be accessed by the CPU 401. Values of the items calculated for each layer are written into the calculation result table 520 by the CPU 401. FIG. 10 depicts the calculation result for n, where n=4.

The number of structure cells N(i) is the number of node structure cells C(i, j) in the i-th layer. The number of structure cells N(i) is obtained by counting the number of the node structure cells C(i, j) in each of the layers of the node aggregate 100 by the CPU 401. If n is n=4, the number of structure cells N(i) is one (root) in the first layer, is 16 in the second layer, is 256 in the third layer, and is 4,096 in the fourth layer.

The number of leaves Nl(i) is the number of leaf structures in the i-th layer. The number of leaves Nl(i) is the number of character codes in each of the layers that is the classification result. In the example depicted in FIG. 10, the number of leaves Nl(i) is three in the first layer, is 54 in the second layer, is 353 in the third layer, and is 885 in the fourth layer.

The number of pointers to leaves Nlp(i) is the total number of pointers that point to leaves and are stored in the node structure cell C(i, j) in the i-th layer. The number of pointers to leaves Nlp(i) is equal to the number of leaves Nl(i).

The number of pointers to lower nodes Nnp(i) is the total number of pointers that point to lower nodes and are stored in the node structure cell C(i, j) in the i-th layer. Because these pointers point lower nodes, the number of pointers to lower nodes Nnp(i) is dependent on the number of pointers to leaves in the (i+1)th layer Nlp(i+1) and the number of pointers to lower nodes in the (i+1)th layer Nnp(i+1). For example, the CPU 401 calculates the number of pointers to lower nodes Nnp(i) according to Equation (1).

$$Nnp(i)=\{Nlp(i+1)+Nnp(i+1)\}/2^n+1 \quad (1)$$

Where, fractions are rounded off and when i is i=n, no lower node is present and therefore, Nnp(i) is Nnp(i)=0.

The number of used structure cells Ncu(i) is the total number of structure cells C(i, j) that have stored therein the pointers to leaves and the pointers to the lower nodes, of the structure cells C(i, j) in the i-th layer. For example, the CPU 401 calculates the number of used structure cells Ncu(i) according to Equation (2).

$$Ncu(i)=\{Nlp(i)+Nnp(i)\}/2^n+1 \quad (2)$$

Where, fractions are rounded off.

The cumulative value of the numbers of pointers to leaves $\Sigma Nlp(i)$ is the total sum of the numbers of pointers to leaves Nlp(i) from the first layer to the i-th layer.

The number of blank cells from the head Ncst(i) is the number of unused cells from the structure cell C(i, j) that is the head in the i-th layer. Originally, each of the structure cells C(i, j) that constitute the node aggregate 100 stores therein the pointers to upper nodes of the cell. However, when the structure cell C(i–1, j) of an upper node is linked to a structure of a leaf Lj, the structure of the leaf Lj stores therein pointers to the same upper nodes as those of the structure cell C(i, j).

Because these pointers overlap, the number of blank cells from the head Ncst(i) is calculated to prioritize the pointers that point to the upper nodes and are stored in the structure of the leaf Lj. More specifically, for example, the CPU 401 calculates the number of blank cells from the head Ncst(i) according to Equation (3).

$$Ncst(i)=\Sigma Nlp(i-1) \quad (3)$$

Where, if i is i=1, Ncst(i) is Ncst(i)=0.

Therefore, in the example depicted in FIG. 10, in the second layer, the structure cells C(2, 1) to C(2, 3) are blank cells (unused cells) from the head. In the third layer, the structure cells C(3, 1) to C(3, 57) are blank cells (unused cells) from the head. Similarly, in the fourth layer, the structure cells C(4, 1) to C(4, 410) are blank cells (unused cells) from the head.

The number of blank pointers up to the tail Npse(i) is the total number of blank pointers obtained when, in the i-th layer, pointers from the structure cell C(i, j) next to the blank cells from the head to leaves, and pointers therefrom to the lower nodes are stored. Blank pointers of the blank cells from the head are excluded. More specifically, for example, the CPU 401 calculates the number of blank pointers up to the tail Npse(i) according to Equation (4).

$$Npse(i)=N(i)\times 2^n-Nlp(i)-Nnp(i)-Ncst(i)\times 2^n \quad (4)$$

The number of blank cells up to the tail Ncse(i) is the number of structure cells C(i, j) that are left after removing, from the structure cell group in the i-th layer, the blank cells from the head and the structure cells C(i, j) that have stored therein the pointers to the leaves and the pointers to the lower nodes. More specifically, for example, the CPU 401 calculates the number of blank cells up to the tail Ncse(i) according to Equation (5).

$$Ncse(i)=N(i)-Ncu(i)-Ncst(i) \quad (5)$$

The pointer generating unit 508 has a function of generating a pointer to a leaf in the i-th layer and a pointer to a lower node in the i-th layer, based on the calculation result obtained by the calculating unit 507. More specifically, for example, the CPU 401 accesses the calculation result table 520 and obtains the number of pointers to the leaves in the i-th layer and the number of pointers to the lower nodes in the i-th layer.

The number of branches from a node is $2^n$ in the $2^n$-branching Huffman tree H1 and therefore, when n is n=4, the pointer to a lower node that is the branch number is a four-bit code. For example, in the root C(1, 1) in the first layer, the pointer to the leaf L1 is "0000"; the pointer to the leaf L2 is "0001"; the pointer to the leaf L3 is "0010"; the pointer to the lower node C(2, 4) is "0011"; the pointer to the lower node C(2, 5) is "0100"; . . . ; and the pointer to the lower node C(2, 8) is "0111". The pointers generated are temporarily retained in a storage medium such as the RAM 403, the magnetic disk 405, and the optical disk 407 depicted in FIG. 4.

The pointer storing unit 509 has a function of storing, to nodes of a quantity necessary for use in the i-th layer, the generated pointers to the leaves in the i-th layer and the generated pointers to the lower nodes in the i-th layer. More specifically, for example, the CPU 401 identifies among the structure cells C(i, j) in the i-th layer, a structure cell that is at the head and capable of storing therein pointers.

For example, the CPU 401 accesses the calculation result table 520, obtains the number of blank cells from the head Ncst(i), and determines the structure cell C(i, j) at the head that is capable storing therein the pointers as the structure cell C(i, Ncst(i)+1). The CPU 401 first stores to this structure cell C(i, Ncst(i)+1), the pointers to the leaves in order of leaf number and the structure cells thereafter, and also stores thereto the pointers to the lower nodes. The total number of the structure cells storing therein the pointers to the leaves and the pointers to the lower nodes coincides with the number of used structure cells Ncu(i) in the calculation result table 520.

The leaf generating unit 510 has a function of generating for each character code and based on the pointers to the leaves that are stored in the nodes in the i-th layer by the pointer storing unit 509, a leaf for each character in the i-th layer classified by the classifying unit 506, each leaf being a link destination the nodes in the i-th layer. More specifically, for example, for each layer, the leaf generating unit 510 generates structures of the leaves L# of a quantity corresponding to the number of the leaves Nl(i). The structures of the leaves L# are stored in a storage medium such as the RAM 403, the magnetic disk 405, and the optical disk 407 depicted in FIG. 4.

Figure 11:
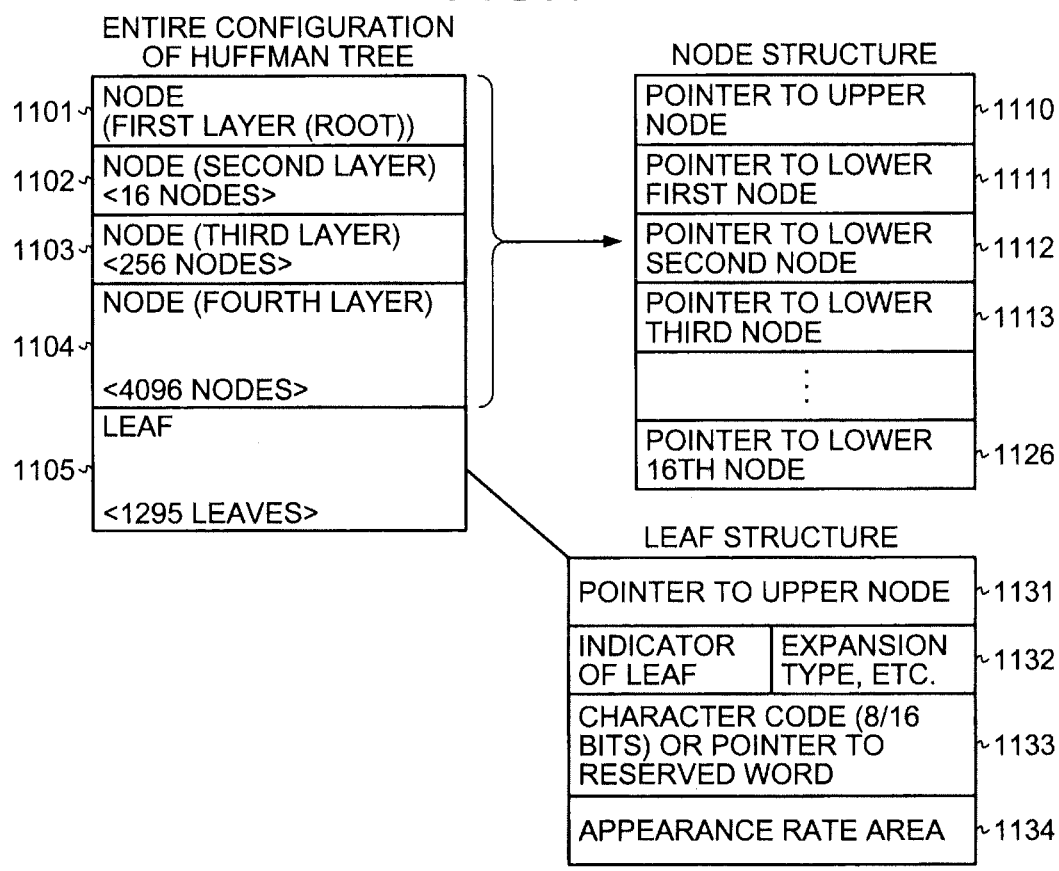
FIG. 11 is an explanatory diagram of structures of a $2^n$ (16)-branching Huffman tree.

FIG. 11 is an explanatory diagram of the structures of a $2^n$ (16)-branching Huffman tree. In the case of 16 branches for n that is n=4, the Huffman tree is configured by one node (root) structure 1101 in the first layer, 16 node structures 1102 in the second layer, 256 node structures 1103 in the third layer, 4,096 node structures 1104 in the fourth layer, and 1,295 leaf L# structures 1105.

The node structure is configured by 17 kinds of pointers that include a pointer 1110 to an upper node and pointers 1111 to 1126 to a lower first node to a lower 16th node. The leaf L# structure has first to fourth areas 1131 to 1134. The first area 1131 stores therein the pointers to the upper nodes. More specifically, for example, when a pointer of a j-th node structure in the i-th layer to a lower 12th node points a first leaf L# structure, the first area 1131 stores therein a head address (pointer) to the j-th node structure in the i-th layer.

The second area 1132 stores therein an indicator and an expansion type of a leaf. The "indicator of a leaf" is a flag to be referred to for compression or expansion. When the indicator indicates "0" (indicating "OFF"), this means an ordinary node. When the indicator indicates "1" (indicating "ON"), this means a leaf. The expansion type is an identifier representing whether the appearance frequency of the object to be expanded is a higher-level 16-bit character code, an upper eight-bit divided character code divided from a lower-level character code, a lower eight-bit divided character code divided from a lower-level character code, or a reserved word. The third area 1133 stores therein pointers to a higher-level 16-bit character code, an eight-bit divided character code, or a reserved word, depending on the expansion type. The fourth area 1134 stores therein the appearance rate area depicted in FIG. 8.

The character code storing unit 511 has a function of generating the $2^n$-branching Huffman tree H1 by storing to a leaf generated by the leaf generating unit 510, a character code that is correlated with the leaf number of the leaf. More specifically, for example, the character code storing unit 511 stores the character code to the third area 1133 of the structure of the leaf L# having stored therein the number # of the leaf L# that coincides with the rank (see FIG. 8) of the appearance frequency of the character code. For a reserved word, the pointer to the reserved word is stored. A character code string of the reserved word may be stored depending on the size of the third area 1133. Concurrently with the storage of the character codes, the character code storing unit 511 also reads the appearance rate area of the character codes to be stored from the totaling result table 800 and stores the appearance rate area to the fourth area 1134.

As described, the structure of the leaf L# generated by the leaf generating unit 510 is linked to the corresponding node structure cell C(i, j) of the node aggregate 100 depicted in FIG. 1; the pointer storing unit 509 stores to the structure cell C(i, j) of the node aggregate 100, the pointer to the leaf L#; the character code storing unit 511 stores to the structure of the leaf L#, the pointers of the character codes and the reserved words; and thereby, the $2^n$-branching Huffman tree H1 is generated from the node aggregate 100.

Figure 12:
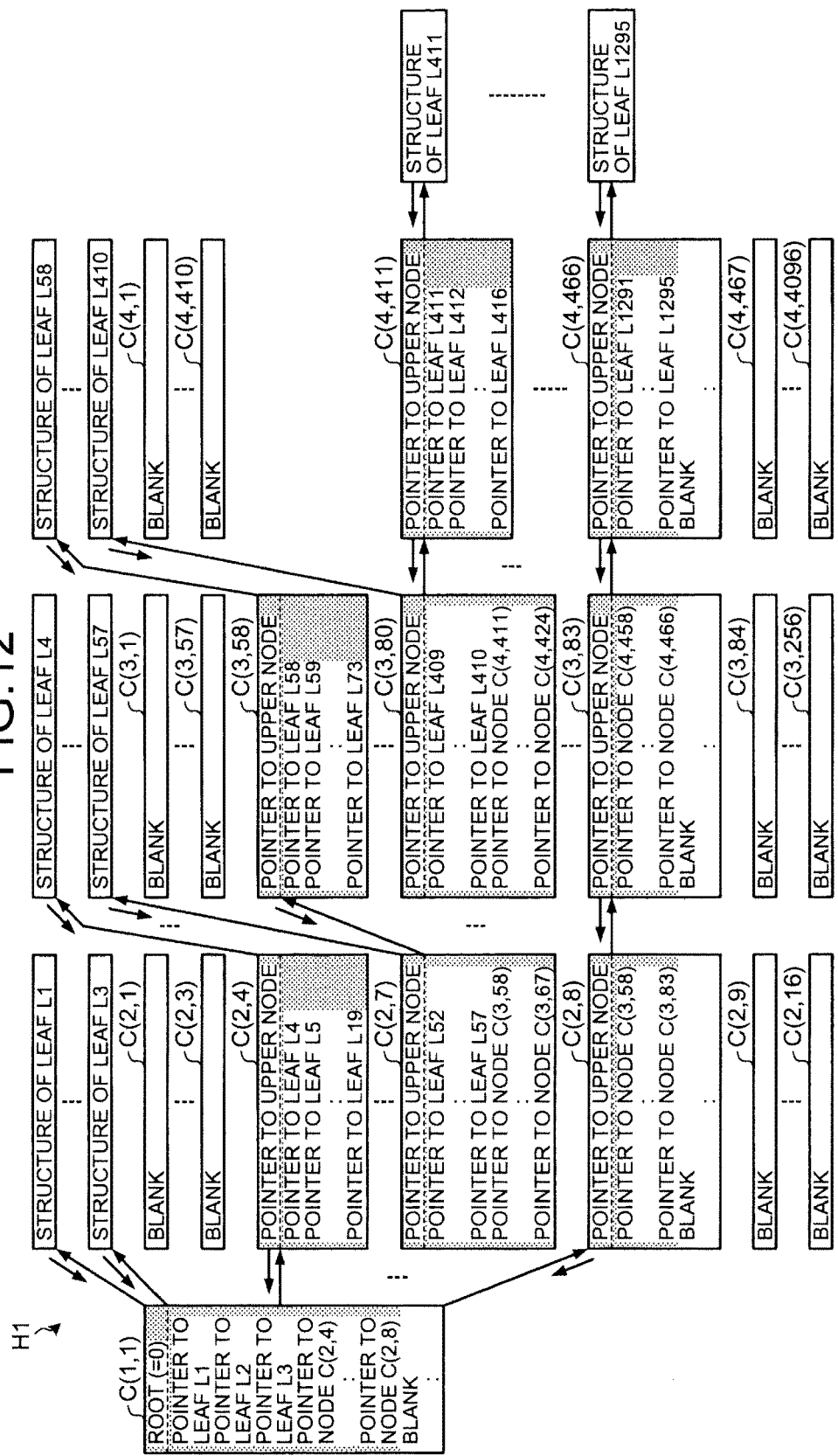
FIG. 12 is an explanatory diagram of the structures of the $2^n$-branching Huffman tree H1.

FIG. 12 is an explanatory diagram of the structures of the $2^n$-branching Huffman tree H1. The $2^n$-branching Huffman tree H1 is stored to a storage medium such as the RAM 403, the magnetic disk 405, and the optical disk 407 depicted in FIG. 4. FIG. 12 depicts a case where n=4, that is, a 16-branching Huffman tree.

The detecting unit 512 has a function of detecting the number of pointers to the leaves in the i-th layer and the number of blank pointers in the blank nodes in the (i−1)th layer. More specifically, for example, the CPU 401 reads from the calculation result table 520, the number of pointers to leaves in the i-th layer Nlp(i) and the number of blank pointers up to the tail in the (i−1)th layer Npse(i−1).

The identifying unit 513 has a function of identifying a pointer to the leaf L# that is in the i-th layer and is to be moved from a blank node in the i-th layer to that in the (i−1)th layer (hereinafter, "pointer to be moved") based on the number of pointers to the leaves in the i-th layer and the number of blank pointers in the blank nodes in the (i−1)th layer detected by the detecting unit 512. More specifically, for example, the CPU 401 determines according to Equation (6) using the number of pointers to the leaves in the i-th layer Nlp(i), the number of blank pointers up to the tail in the (i−1)th layer Npse(i−1) and the number of pointers to the lower nodes in the (i−1)th layer Nnp(i−1) that are read.

$$Npse(i-1)+Nnp(i-1)>Nlp(i) \quad (6)$$

If Equation (6) is satisfied, all the pointers to the leaves L# in the i-th layer are movable to the (i+1)th layer. If Equation (6) is not satisfied, the same number of pointers to the leaves in the i-th layer as the number of blank pointers up to the tail in the (i−1)th layer Npse(i−1) are determined as the pointers to be moved. For example, when the $2^n$-branching Huffman tree H1 depicted in FIG. 11 is optimized, referring to the calculation result table 520, for i that is i=4, the number of pointers to the leaves in the fourth layer Nlp(4) is Nlp(4)=885, the number of blank pointers up to the tail in the third layer Npse(3) is Npse(3)=2,775, and the number of pointers to the lower nodes in the third layer Nnp(3) is Nnp(3)=56. Therefore, Equation (6) is satisfied and all the pointers to the leaves L411 to L1295 in the fourth layer are movable into the blank cells in the third layer.

The optimizing unit 514 has a function of deleting from the nodes in the (i−1)th layer, the pointers to the node having stored therein the pointers that are to be moved and identified by the identifying unit 513, and moving the pointers to be moved to the nodes in the (i−1)th layer. More specifically, for example, in the above example, the optimizing unit 514 deletes from the third layer, the pointers to nodes C(4, 411) to C(4, 466) having stored therein the pointers to be moved (the pointers to the leaf L411 to the pointers to the leaf L1295 in the fourth layer), and sequentially moves the pointers to be moved from the structure cell C(3, 80) in the third layer. The structures of the leaves L411 to L1295 are promoted from the fourth layer to the third layer.

Thereby, though the compression symbol length is 16 bits for the fourth layer, the compression symbol length is reduced to 12 bits by being promoted to the third layer. Therefore, improvement of the compression rate can be facilitated. As described, by being promoted from the i-th layer to the (i−1)th layer, the compression symbol length is reduced from n×i bits to n×(i−1) bits, whereby improvement of the compression rate is facilitated.

The optimizing unit 514 updates the calculation result table 520 each time the optimization is executed. FIGS. 13A to 13C depict exemplary updating of the calculation result table 520 executed when the optimization is executed. As described, the optimization is executed from the lowest layer.

FIG. 13A is an explanatory diagram of exemplary updating of the calculation result table 520 executed when optimization from the fourth layer to the third layer is executed. FIG. 13A depicts the exemplary updating from the state depicted in FIG. 10.

FIG. 13B is an explanatory diagram of exemplary updating of the calculation result table 520 executed when optimization from the third layer to the second layer is executed. FIG. 13B depicts the exemplary updating from the state depicted in FIG. 13A.

FIG. 13C is an explanatory diagram of exemplary updating of the calculation result table 520 executed when optimization from the second layer to the first layer is executed. FIG. 13C depicts the exemplary updating from the state depicted in FIG. 13B.

FIG. 14 is an explanatory diagram of the structures of the $2^n$-branching Huffman tree H1 after the optimization. Compared to FIG. 12, in the $2^n$-branching Huffman tree H1 after the optimization, the structures of the leaves L# in the fourth layer are not present. As described, the pointers to the leaves L# in the lower layer are moved to the blank pointers in the upper layer and therefore, shortening of the compression symbols is facilitated.

FIG. 15 is an explanatory diagram of information that is stored by the structures of the leaves L# in the $2^n$-branching Huffman tree H1 after the optimization. Each record depicted in FIG. 15 corresponds to the information stored by each of the structures of the leaves L#. The compression symbol is a code string of the pointer to the lower node, to the pointer to the leaf that is the branch number from the root to the corresponding leaf L# of the $2^n$-branching Huffman tree H1.

Referring back to FIG. 5, the character structure generating unit 515 has a function of generating a character structure 530. More specifically, for example, the CPU 401 accesses the reserved word appearance frequency totaling table 700, the character appearance frequency totaling table 600, the divided character appearance frequency totaling table 901, and the $2^n$-branching Huffman tree H1 and extracts designated information and thereby, generates a reserved word structure, a higher-level character code structure, and a divided upper character code structure.

FIG. 16 is an explanatory diagram of the reserved word structure. The reserved word structure 1600 is stored in a storage medium such as the RAM 403, a magnetic disk 405, and an optical disk 407 and can be accessed by the CPU 401. The reserved word structure 1600 stores therein the total number of reserved words (15 in the example of FIG. 16), the longest bit length of the reserved words Lrmax, the reserved words r1 to r15 and bit lengths thereof, and the pointers to the leaves L#.

The CPU 401 reads from the reserved word appearance frequency totaling table 700, the total number of reserved words, the reserved words, the longest bit length of the reserved words, and the bit lengths of the reserved words. The CPU 401 identifies the upper nodes from the structures of the leaves L# of the reserved words in the $2^n$-branching Huffman tree H1, and reads the pointers to the leaves L# of the reserved words in the structure cells of the upper nodes. Thereby, the reserved word structure 1600 is generated.

FIG. 17 is an explanatory diagram of the higher-level character code structure. A higher-level character code structure 1700 is stored in a storage medium such as the RAM 403, the magnetic disk 405, and the optical disk 407 depicted in FIG. 4, and can be accessed by the CPU 401. The higher-level character code structure 1700 stores therein character codes e# and the pointers to the leaves L# thereof.

The CPU 401 reads the character codes e# from the character appearance frequency totaling table 600, identifies the upper nodes from the structures of the leaves L# that correspond to the character codes e# in the $2^n$-branching Huffman tree H1, and reads the pointers to the leaves L# that correspond to the character codes e# in the structure cells of the upper nodes. Thereby, the higher-level character code structure 1700 is generated.

FIG. 18 is an explanatory diagram of the divided character code structure. A divided character code structure 1800 is stored in a storage medium such as the RAM 403, the magnetic disk 405, and the optical disk 407 depicted in FIG. 4, and can be accessed by the CPU 401. The divided character code structure 1800 stores therein divided character codes and the pointers to the leaves L# thereof.

The CPU 401 reads the divided character codes from the divided character appearance frequency totaling table 901, identifies the upper nodes from the structures of the leaves L# that correspond to the divided character codes in the $2^n$-branching Huffman tree H1, and reads the pointers to the leaves L# that correspond to the divided character codes in the structure cells of the upper nodes. Thereby, the divided character code structure 1800 is generated.

FIG. 19 is a flowchart of a procedure of the $2^n$-branching Huffman tree generating process automatically executed by the information processing apparatus 500. As depicted in FIG. 19, the input unit 501 reads the file group Fs (step S1901). The totaling unit 503 totals the appearance frequencies of the character codes and the reserved words (step S1902). A leaf number reducing process is executed (step S1903). The classifying unit 506 classifies the character codes, etc., by layer according to corresponding appearance probabilities P (step S1904).

Thereafter, a parameter calculating process (step S1905) is executed by the calculating unit 507, and a structure cell constructing process (step S1906) and an optimizing process (step S1907) are executed by the pointer generating unit 508, the pointer storing unit 509, the leaf generating unit 510, and the character code storing unit 511. Thereby, the $2^n$-branching Huffman tree H1 is automatically generated.

Figure 20:
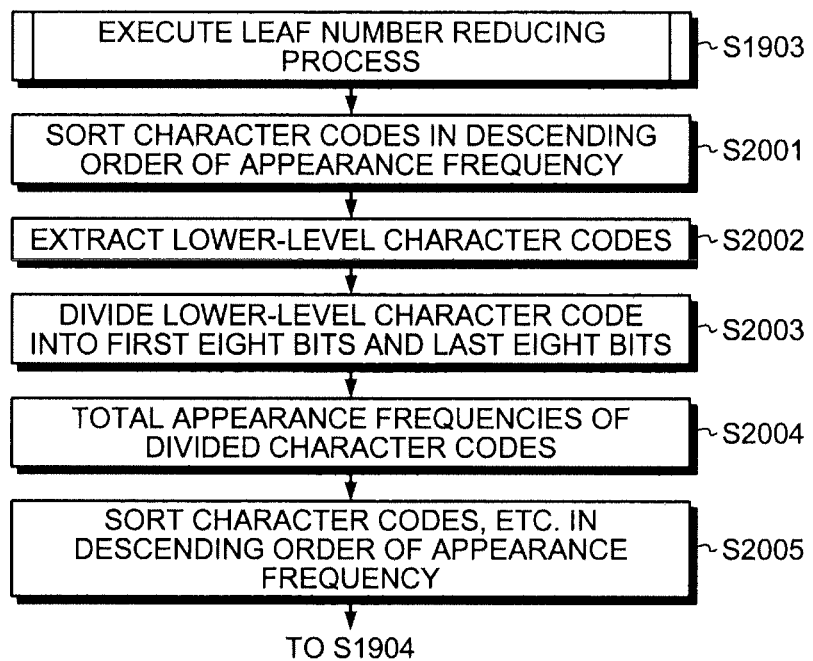
FIG. 20 is a flowchart of a leaf number reducing process (step S1903) depicted in FIG. 19.

FIG. 20 is a flowchart of the leaf number reducing process (step S1903) depicted in FIG. 19. The sorting unit 504 first sorts the 16-bit character codes and the reserved words in descending order of appearance frequency (step S2001), refers to the ranks thereof, extracts the lower-level character codes (step S2002), divides the lower-level character codes into first half and second half eight-bit divided character codes (step S2003), totals the appearance frequencies of the divided character codes (step S2004), and finally sorts the appearance frequencies including all of those of the 16-bit character codes, the divided character codes, and the reserved words in descending order of appearance frequency (step S2005). Thereafter, the procedure proceeds to step S1904.

Figure 21:
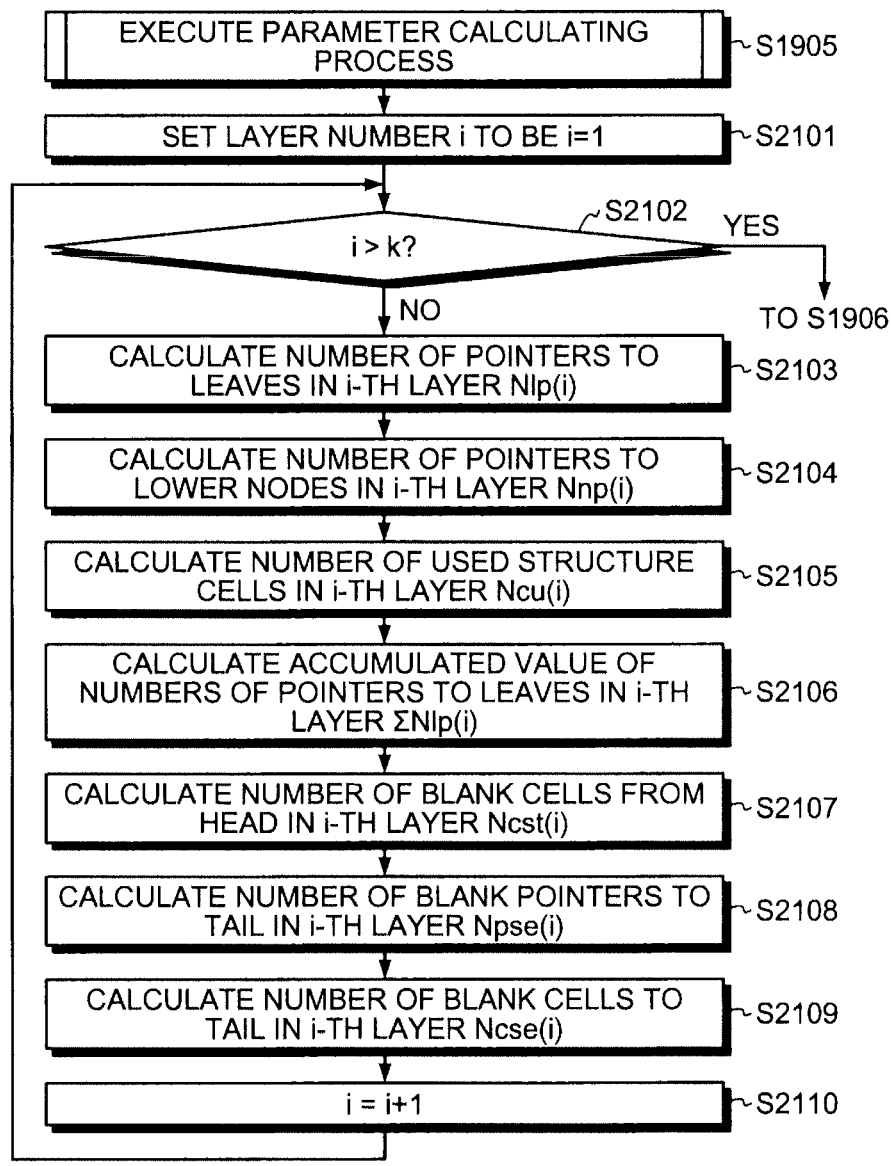
FIG. 21 is a flowchart of a parameter calculating process (step S1905) depicted in FIG. 19.

FIG. 21 is a flowchart of the parameter calculating process (step S1905) depicted in FIG. 19. The layer number i is set to be i=1 (step S2101) and whether i is i>k is determined (step S2102).

If it is determined that i is not i>k (step S2102: NO), the number of pointers to the leaves L# in the i-th layer Nlp(i), the number of pointers to the lower nodes in the i-th layer Nnp(i), the number of used structure cells C(i, j) in the i-th layer Ncu(i), the cumulative value of the numbers of pointers to leaves ΣNlp(i), the number of blank cells from the head in the i-th layer Ncst(i), the number of blank pointers up to the tail in the i-th layer Npse(i), and the number of blank cells up to the tail in the i-th layer Ncse(i) are calculated (steps S2103 to S2109).

The layer number i is incremented by one point (step S2110) and the procedure returns to step S2102. If it is determined at step S2102 that i is i>k (step S2102: YES), the procedure proceeds to step S1906.

Figure 22:
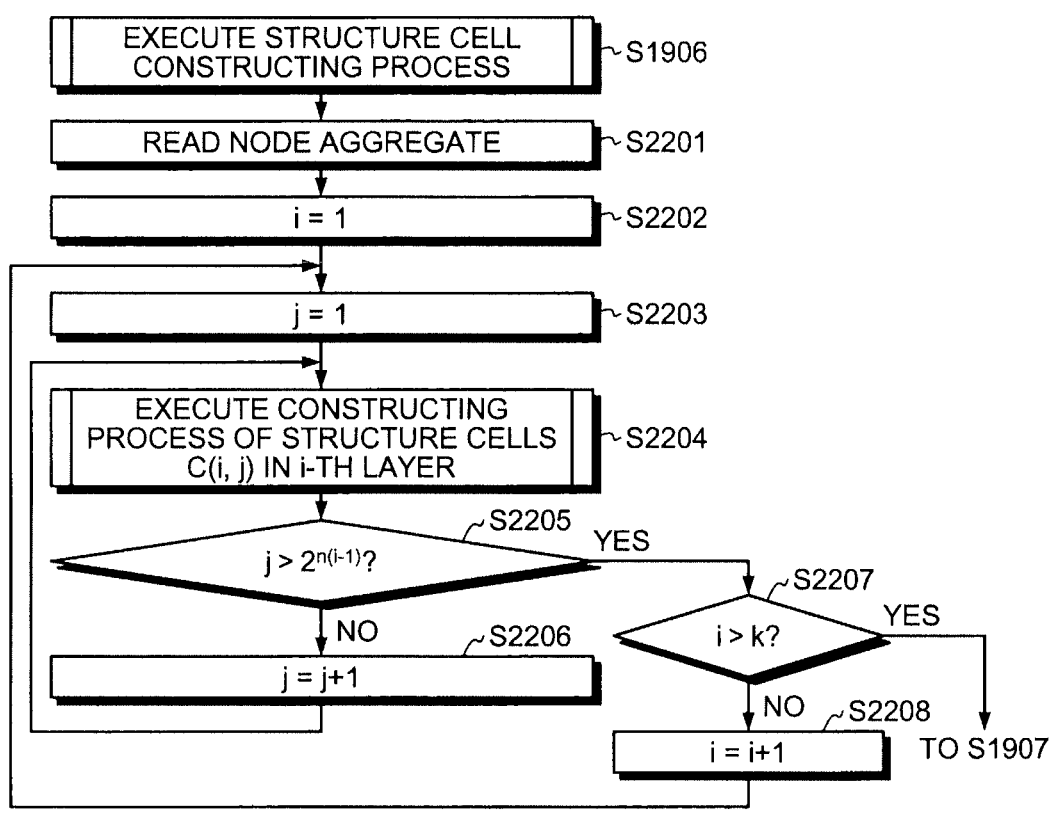
FIG. 22 is a flowchart of a structure cell constructing process (step S1906) depicted in FIG. 19.

FIG. 22 is a flowchart of the structure cell constructing process (step S1906) depicted in FIG. 19. The node aggregate 100 is read (step S2201). The layer number i is set to be i=1 (step S2202). The cell number j is set to be j=1 (step S2203). The construction process of the structure cell C(i, j) in the i-th layer is executed (step S2204).

Thereafter, whether j is j>$2^{n(i-1)}$ for the number of nodes in the i-th layer that is $2^{n(i-1)}$ is determined (step S2205). If it is determined that j is not j>$2^{n(i-1)}$ (step S2205: NO), j is incremented by one point (step S2206) and the procedure returns to step S2204. On the other hand, If it is determined that j is j>$2^{n(i-1)}$ (step S2205: YES), whether i is i>k is determined (step S2207). If it is determined that i is not i>k (step S2207: NO), is incremented by one point (step S2208) and the procedure returns to step S2203. On the other hand, if it is determined that i is i>k (step S2207: YES), the procedure proceeds to step S1907.

Figure 23:
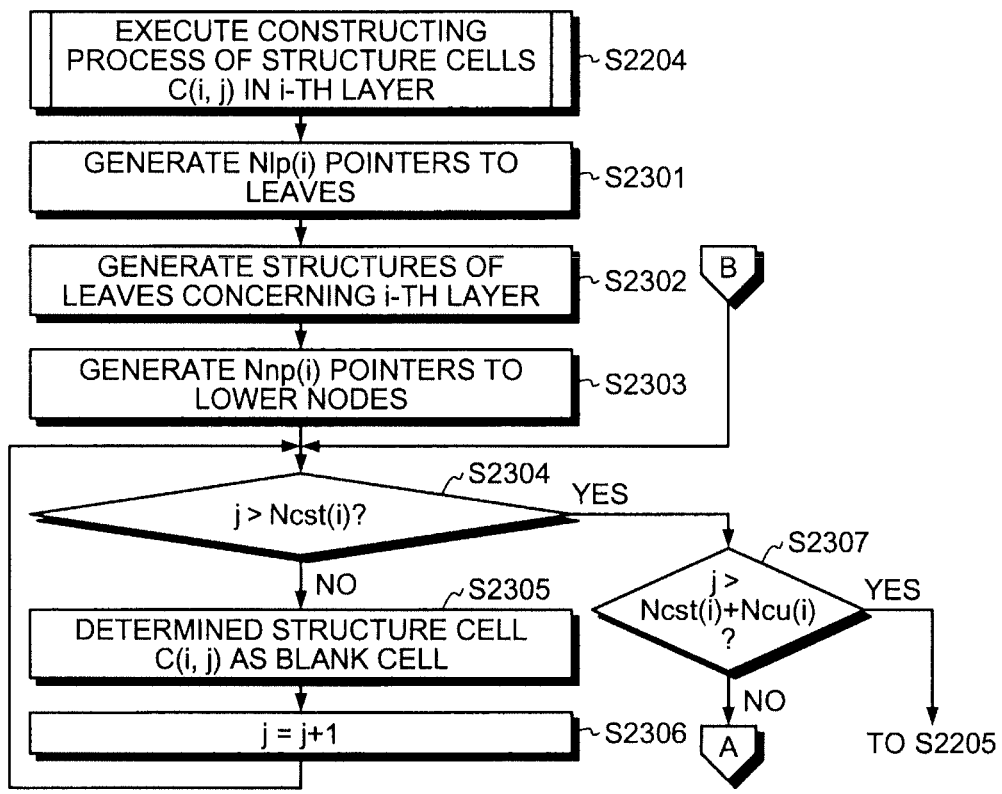
FIG. 23 is a flowchart of a constructing process (step S2204) for constructing the structure cell C(i, j) in an i-th layer depicted in FIG. 22.

FIG. 23 is a flowchart of the constructing process (step S2204) for constructing the structure cell C(i, j) in the i-th layer depicted in FIG. 22. Pointers to Nlp(i) leaves L# are generated (step S2301) and the structures of the leaves L# concerning the i-th layer are generated (step S2302). Pointers to Nnp(i) lower nodes are generated (step S2303). Thereafter, whether the cell number j is j>Ncst(i) for the number of blank cells from the head Ncst(i) is determined (step S2304).

If it is determined that the cell number j is not j>Ncst(i) (step S2304: NO), the structure cell C(i, j) is determined to be a blank cell (step S2305). The cell number j is incremented by one point (step S2306) and the procedure returns to step S2304. On the other hand, if it is determined that the cell number j is j>Ncst(i) (step S2304: YES), whether the cell number j is j>Ncst(i)+Ncu(i) is determined (step S2307). "Ncu(i)" is the number of used cells in the i-th layer.

If it is determined that the cell number j is j>Ncst(i)+Ncu(i) (step S2307: YES), the procedure proceeds to step S2205. On the other hand, if it is determined that the cell number j is not j>Ncst(i)+Ncu(i) (step S2307: NO), the procedure proceeds to step S2401.

Figure 24:
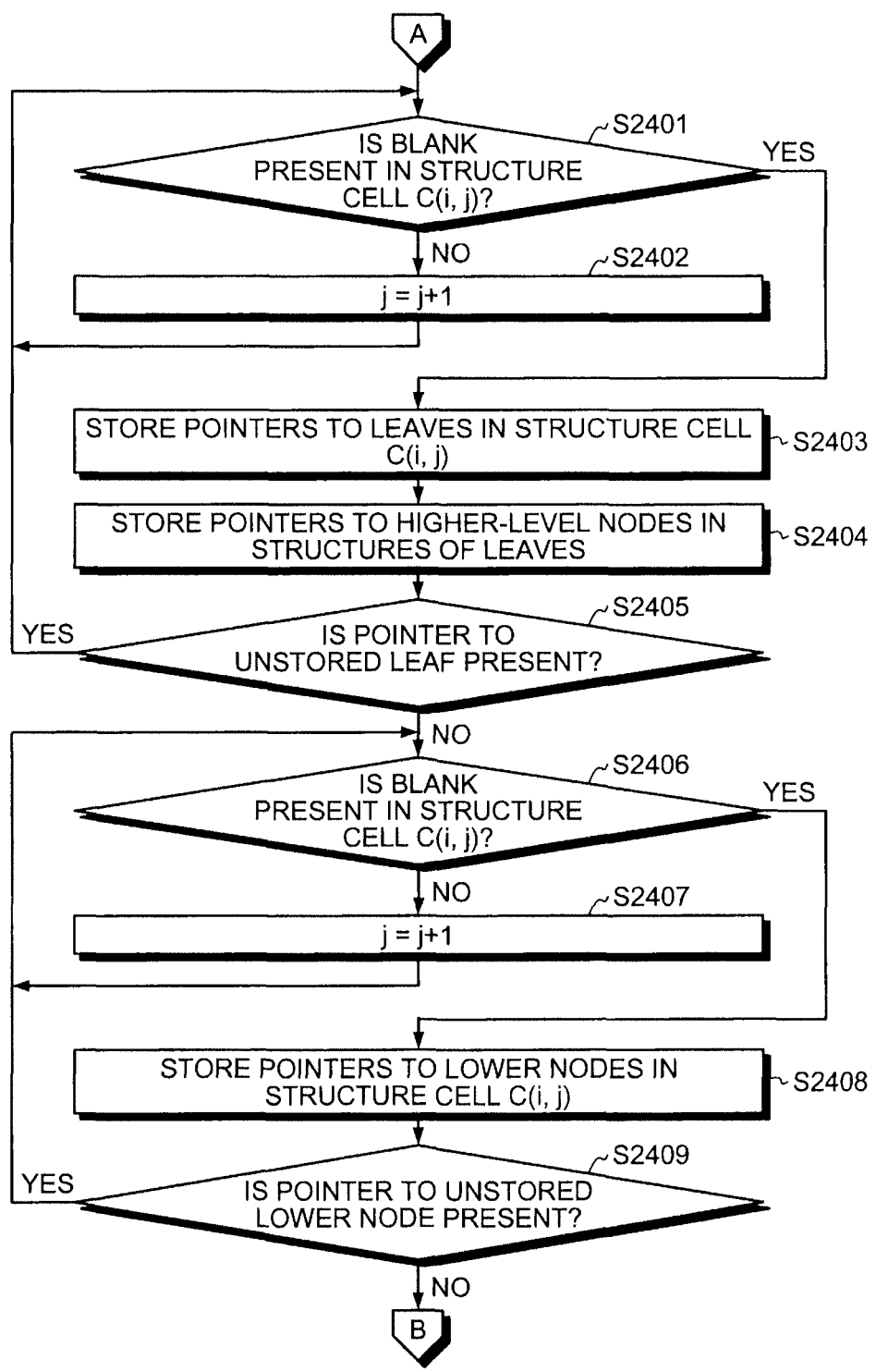
FIG. 24 is another flowchart of the constructing process (step S2204) for constructing the structure cell C(i, j) in the i-th layer depicted in FIG. 22.

FIG. 24 is another flowchart of the constructing process (step S2204) for constructing the structure cell C(i, j) in the i-th layer depicted in FIG. 22. At step S2401, whether the structure cell C(i, j) includes any blanks is determined (step S2401). If it is determined that the structure cell C(i, j) includes no blanks (step S2401: NO), j is incremented by one point (step S2402) and the procedure returns to step S2401.

On the other hand, if it is determined that the structure cell C(i, j) includes a blank (step S2401: YES), the pointers to the leaves L# are stored in the structure cell C(i, j) in ascending order of leaf number # (step S2403). Based on the pointers of the leaves L# stored, pointers to upper nodes C(i−1, j) are generated and stored to the structures of the leaves L# that are the link destinations (step S2404).

Whether any pointers to unstored leaves L# are present is determined (step S2405). If it is determined that pointers to the leaves L# not stored are present (step S2405: YES), the procedure returns to step S2401. On the other hand, if it is determined that pointers to unstored leaves L# are not present (step S2405: NO), whether the structure cell C(i, j) includes any blanks is determined (step S2406). If it is determined that the structure cell C(i, j) includes no blanks (step S2406: NO), j is incremented by one point (step S2407) and the procedure returns to step S2406.

On the other hand, if it is determined that the structure cell C(i, j) includes a blank (step S2406: YES), the pointers to the lower nodes are stored to the structure cell C(i, j) in ascending order of node number (step S2408). Whether pointers to unstored lower nodes are present is determined (step S2409). If it is determined that pointers to unstored lower nodes are present (step S2409: YES), the procedure returns to step S2406. On the other hand, if it is determined that pointers to unstored lower nodes are not present (step S2409: NO), the procedure returns to step S2304 of FIG. 23.

Figure 25:
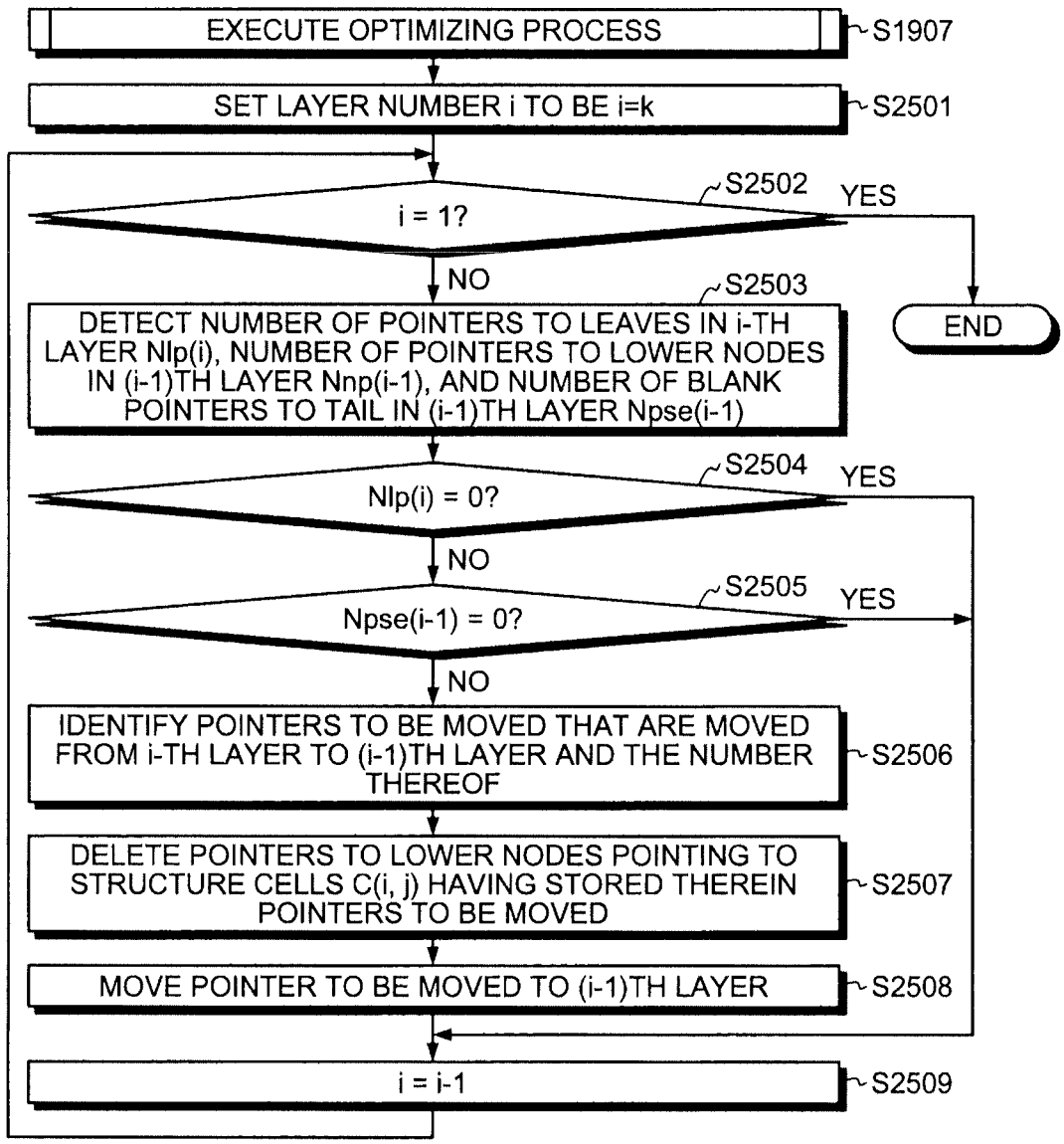
FIG. 25 is a flowchart of an optimizing process (step S1907) depicted in FIG. 19.

FIG. 25 is a flowchart of the optimizing process (step S1907) depicted in FIG. 19. The layer number i is set to be i=k (step S2501) and whether i is i=1 is determined (step S2502). If it is determined that i is not i=1 (step S2502: NO), the detecting unit 512 detects from the calculation result table 520, the number of pointers to leaves L# in the i-th layer Nlp(i), the number of pointers to lower nodes in the (i−1)th layer Nnp(i−1), and the number of blank pointers up to the tail in the (i−1)th layer Npse(i−1) (step S2503).

Whether Nlp(i) is Nlp(i)=0 is determined (step S2504). If it is determined that Nlp(i) is Nlp(i)=0 (step S2504: YES), no pointer that points to a leave L# and is to be moved is present and therefore, the procedure proceeds to step S2509. On the other hand, if it is determined that Nlp(i) is not Nlp(i)=0 (step S2504: NO), whether Npse(i−1) is Npse(i−1)=0 is determined (step S2505). If it is determined that Npse(i−1) is Npse(i−1)=0 (step S2505: YES), no blank is present and therefore, the procedure proceeds to step S2509.

On the other hand, if it is determined that Npse(i−1) is not Npse(i−1)=0 (step S2505: NO), the identifying unit 513 using Equation (6) identifies the pointers that point to the leaves L# and are to be moved from the i-th layer to the (i−1)th layer (pointers to be moved) and the number thereof (step S2506).

The pointers to the lower nodes C(i, j) in the (i−1)th layer pointing the structure cells C(i, j) having stored therein the pointers to be moved are deleted from the (i−1)th layer (step S2507). The pointers to be moved are moved into the (i−1)th layer and are stored such that the numbers # of the leaves L# are sequentially lined up (step S2508). Thereafter, at step S2509, the layer number is incremented by one point (step S2509) and the procedure returns to step S2502. If it is determined at step S2502 that the layer number i is i=1 (step S2502: YES), the series of process steps comes to an end. Thereby, the series of description sections of the procedure of the $2^n$-branching Huffman tree generating process automatically executed by the information processing apparatus 500 comes to an end.

A compressing process and an expanding process using the $2^n$-branching Huffman tree H1 will be described. In these processes, the $2^n$-branching Huffman tree H1 automatically generated by the generating process may be used and the $2^n$-branching Huffman tree H1 provided in advance may also be used. More specifically, the $2^n$-branching Huffman tree H1 is converted into a no-node Huffman tree H2 and the compressing process and the expanding process are executed using the no-node Huffman tree H2.

The no-node Huffman tree H2 will be described. The "no-node Huffman tree H2" is a Huffman tree that is configured only by a root and leaves and that has no internal node. The no-node Huffman tree H2 has an increased number of branches while each of its leaves is accessible from its root through one path. The no-node Huffman tree H2 is stored in a storage medium such as the RAM 403, the magnetic disk 405, and the optical disk 407 depicted in FIG. 4 and can be accessed by the CPU 401.

Figure 26:
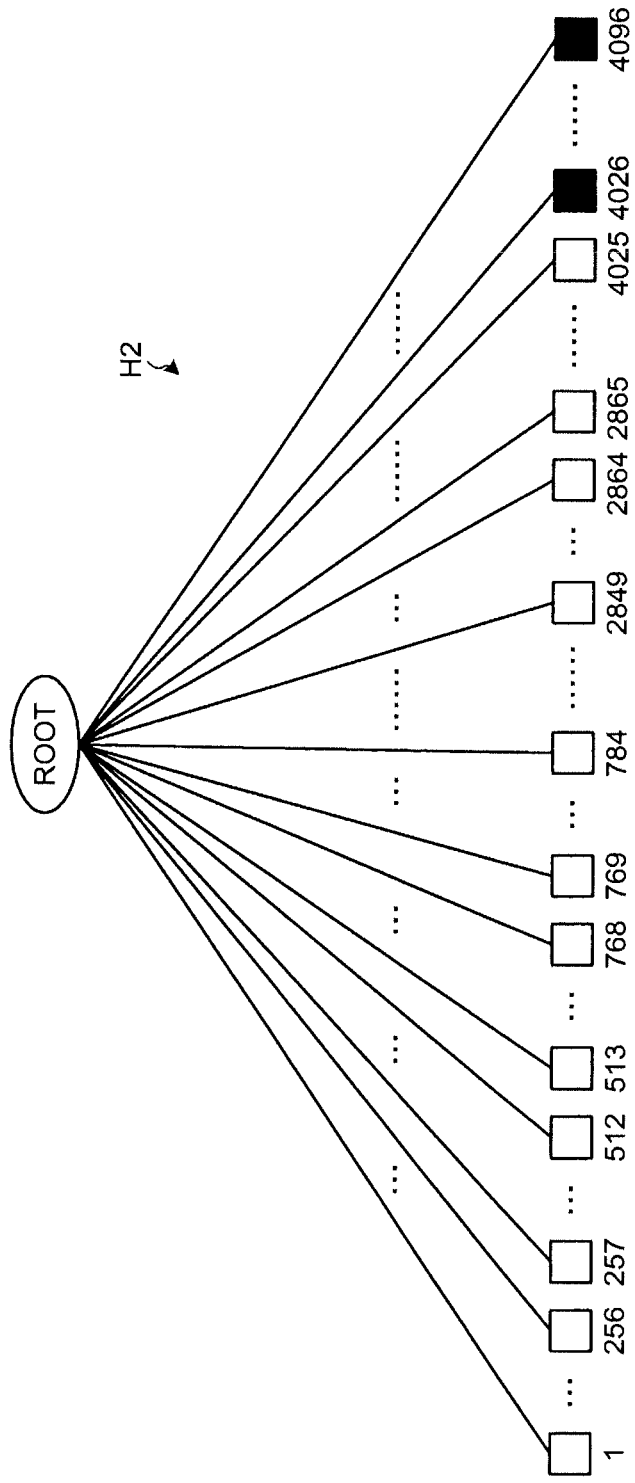
FIG. 26 is an explanatory diagram of a $2^m$-branching no-node Huffman tree.

FIG. 26 is an explanatory diagram of a $2^m$-branching no-node Huffman tree. In the $2^m$ (m=12)-branching no-node Huffman tree H2, a branch number that is a pointer from the root to a leaf is an m-bit-code address. The pointers to the leaves of leaf numbers 1 to 4096 are "000000000000" to "111111111111". A 16-bit character code is compressed to a code that is 12 bits or fewer. "m" is a value that is m<$2^n$ and, for example, the largest value that is a multiple of four, of the values that satisfy the inequality is used as "m". "m" is set in advance according to "n". For example, when n is n=4, m is set to be m=12.

Figure 27:
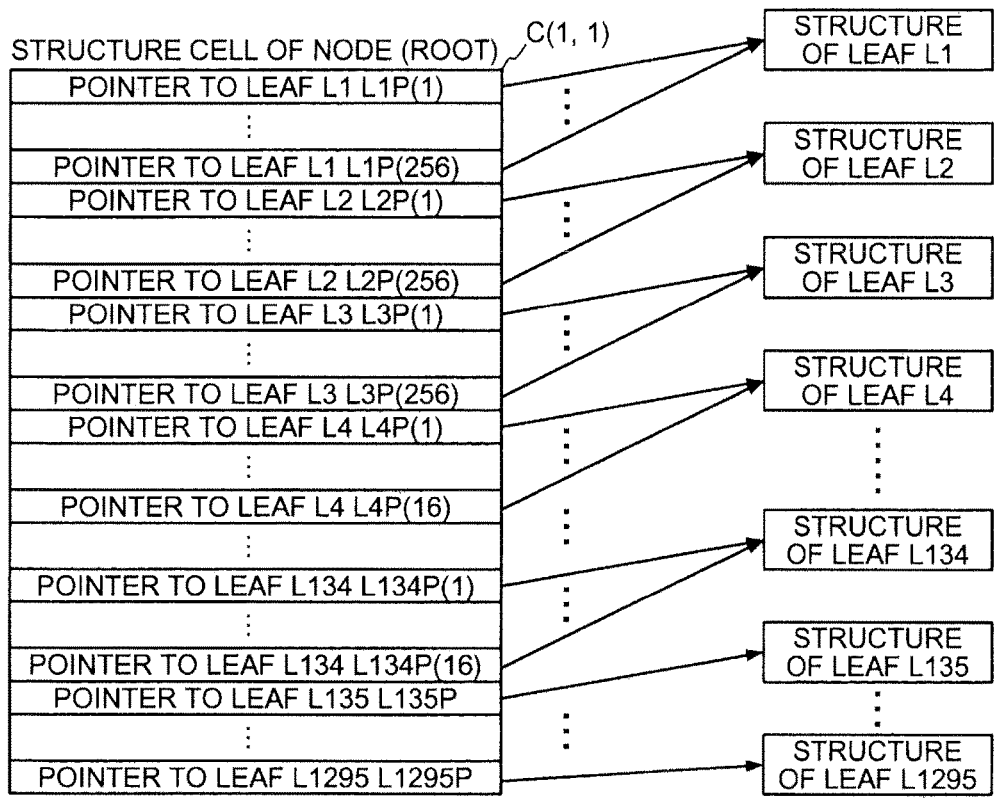
FIG. 27 is an explanatory diagram of a node (root) structure of the $2^m$-branching no-node Huffman tree.

FIG. 27 is an explanatory diagram of a node (root) structure of the $2^m$-branching no-node Huffman tree H2. Similar to the case of the $2^n$-branching Huffman tree H1, assuming that the total number of the leaves is 1,295, the number of leaves is excessive. Therefore, multiple pointers (for example, 256) are prepared for a leaf that stores therein the character codes, etc., having high appearance frequencies.

As depicted in FIG. 27, 256 pointers to leaves are allocated to each of the leaves L1 to L3 having high appearance frequencies in the first layer of the $2^n$-branching Huffman tree H1, and the pointers are stored in the root structure cell C(1, 1). 16 pointers to leaves are also allocated to each of the leaves L4 to L134 having high appearance frequencies in the second layer, and the pointers are stored in the root structure cell C(1, 1). One pointer to a leaf is allocated to each of leaves L135 to L1,295 in the third layer, and the pointers are stored in the root structure cell C(1, 1).

Figure 28:
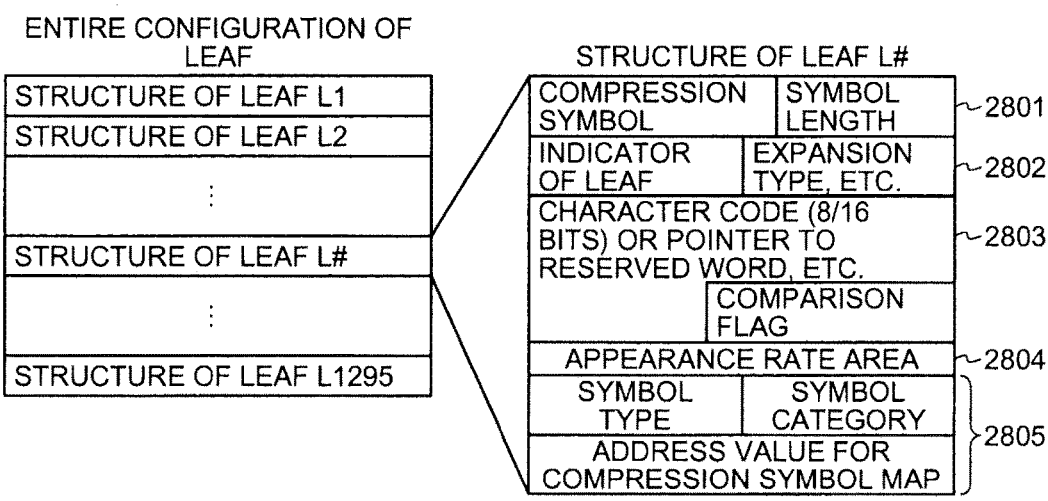
FIG. 28 is an explanatory diagram of leaf structures of the no-node Huffman tree.

FIG. 28 is an explanatory diagram of leaf structures of the no-node Huffman tree H2. The entire leaf has first to fifth areas 2801 to 2805. The leaf structures of the no-node Huffman tree H2 are structures that are duplicated from the leaf structures of the $2^n$-branching Huffman tree H1 and therefore, the first to the fourth areas 2801 to 2804 correspond to the first to the fourth areas 1131 to 1134 of FIG. 11. The first area 2801 stores therein a compression symbol and the compression symbol length thereof. The second area 2802 stores therein an indicator and an expansion type of a leaf similarly to FIG. 11. The third area 2803 stores therein a pointer to a higher-level 16-bit character code, a lower-level divided eight-bit character code, or a reserved word, depending on the expansion type, similarly to FIG. 11.

The fourth area 2804 stores therein an appearance frequency area similarly to FIG. 11. The fifth area 2805 stores therein a symbol type and a symbol category. The "symbol type" is information that identifies which among a digit, an English character, a special symbol, a katakana character, a hiragana character, and a Chinese character, a character code corresponds to, or whether the character code is a pointer to a reserved word. The "symbol category" is information that identifies whether the character code is a 16-bit code or an eight-bit code. If the character code is a 16-bit character code or a reserved word, "1" is allocated as the symbol category. If the character code is an eight-bit divided character code, "0" is allocated as the symbol category.

The fifth area 2805 stores therein an address value that constitutes a pointer to the compression symbol map group Ms. The "pointer to the compression symbol map group Ms" is a pointer that accesses a compression symbol map M# specific to a character code stored in the structure of the leaf L# of the compression symbol map group Ms. For 1,024 kinds of higher-level character codes, address values of 0001 to 1024 are respectively allocated to the 1,024 character codes.

For 15 kinds of reserved words, address values of 1025 to 1039 are respectively allocated to (the pointers of) the 15 reserved words. For the upper eight-bit divided character codes, address values of 0001 to 0256 are allocated to the upper eight-bit divided character codes. For the lower eight-bit divided character codes, address values of 0257 to 0512 are allocated to the lower eight-bit divided character codes. The pointer to the compression symbol map group Ms is configured by the symbol category and the address value of the fifth area 2805.

FIG. 29 is an explanatory diagram of information stored in the structure of the leaf L#. Each record corresponds to the structure of the leaf L#. The structure of each leaf L# includes information such as a compression symbol and the compression symbol length thereof, a leaf number, the expansion type, character codes, etc., (a pointer to a character code (16 or eight bits) or a reserved word), and a pointer to the compression symbol map. The pointer to the compression symbol map is an address formed by connecting a symbol category and an address value adr#. The pointer to the compression symbol map is, for example, an 11-bit address. The bit at the head represents the symbol category. The 10 bits following the bit at the head represent the address value. Because 1,024 types of higher-level character codes are present, each of the higher-level character codes is represented by 10 bits. 256 types of divided character codes are present that are 0x00 to 0xFF and these codes can sufficiently be represented by eight-bit codes. However, these codes are each divided into an upper code and a lower code and therefore, whether an upper code or a lower code is identified using the upper two bits of the 10 bits.

The no-node Huffman tree H2 can be generated by conversion from the $2^n$-branching Huffman tree H1. For example, the $2^m$-branching (m=n×k) no-node Huffman tree H2 can be generated from the $2^n$-branching Huffman tree H1. The functional configuration for the conversion into the $2^m$-branching no-node Huffman tree H2 will be described.

FIG. 30 is a block diagram of a second functional configuration of the information processing apparatus 500 according to the embodiment. FIG. 30 depicts a functional configuration that executes the process of (3) of the flow of the processes (1) to (6) depicted in FIG. 1. Configurations identical to those depicted in FIG. 5 are given the same reference numerals used in FIG. 5 and will not again be described.

As depicted in FIG. 30, the information processing apparatus 500 includes a determining unit 3001, a duplicating unit 3002, a root generating unit 3003, a first constructing unit 3004, a second constructing unit 3005, and a character structure generating unit 515. Respective functions of the units from the determining unit 3001 to the second constructing unit 3005 are implemented by causing the CPU 401 to execute a program stored in a storage medium such as the RAM 403, the magnetic disk 405, and the optical disk 407 depicted in FIG. 4, or via the I/F 409.

The determining unit 3001 has a function of determining for each of the leaves in the i-th layer and based on the number of layers of the $2^n$-branching Huffman tree H1 and the number of leaves in the i-th layer, the number of kinds of pointers to leaves. More specifically, for example, the CPU 401 sets, in advance, the number of kinds in the first to the third layers to be 256, 16, and 1, respectively. For example, in the $2^n$-branching Huffman tree H1, the number of leaves in the first to the third layers are 3, 131, and 1,161, respectively.

Therefore, the number of pointers to the leaves is 4,025 (=3×256 kinds+131×16 kinds+1,161×one kind) and is equal to or fewer than 4,096 ($2^m$). Thereby, the number of kinds in the first to the third layers are determined to be 256, 16, and 1, respectively. If the number of pointers exceeds 4,096, the number of pointers is optimized to be equal to or fewer than 4,096 by varying the number of kinds in the first layer to 16 or varying the number of kinds in the second layer to 1.

The duplicating unit 3002 has a function of duplicating a leaf of the $2^n$-branching Huffman tree H1. More specifically, for example, the CPU 401 duplicates the structure of the leaf L# and clears the pointer to an upper node and the compression symbol length therein.

The root generating unit 3003 has a function of generating a root that is capable storing therein pointers to $2^m$ leaves, and storing the root to a storage apparatus. More specifically, for example, when n is n=4, the root generating unit 3003 generates a root structure having the number obtained when m is m=12, that is, 4,096 blank pointers.

The first constructing unit 3004 has a function of generating, for each of the leaves duplicated by the duplicating unit 3002 and based on the number of kinds determined by the determining unit 3001, pointers to leaves and storing the pointers to the root generated by the root generating unit 3003. More specifically, if the number of kinds is determined to be, for example, 256 for the first layer, the first constructing unit 3004 generates pointers to the leaf L1 L1P(1) to L1P(256) for the leaf L1 concerning the first layer, and stores to the root structure, the pointers to the leaf L1 L1P(1) to L1P(256).

If the number of kinds is determined to be 16 for the second layer, the first constructing unit 3004 generates pointers to the leaf L4 L4P(1) to L4P(16) for the leaf L4 concerning the second layer, and stores to the root structure, the pointers to the leaf L4 L4P(1) to L4P(16). If the number of kinds is determined to be 1 for the third layer, the first constructing unit 3004 generates a pointer to the leaf L135 L135P(1) for the leaf L135 concerning the first layer, and stores to the root structure, the pointer to the leaf L135 L135P(1).

The second constructing unit 3005 has a function of generating the no-node Huffman tree H2 that is configured by the root and the leaves, by extracting for a leaf, a compression symbol that is configured by a bit string common to a group of pointers to the leaf, storing to the leaf, the compression symbol and the compression symbol length thereof, and re-constructing the leaf. More specifically, for example, when plural kinds of pointers to a leaf L# are generated for the arbitrary leaf L#, a bit string common to these pointers is identified as a compression symbol. The compression symbol length of the compression symbol is also obtained. The compression symbol and the compression symbol length thereof are stored to the structure of the leaf L#.

For example, for the leaf L1, assuming that 256 kinds of pointers to the leaf L1 L1P(1) to L1P(256) are generated, the bit strings are as follows.

pointer L1P(1): 000000000000 pointer L1P(2): 000000000001 pointer L1P(3): 000000000010 pointer L1P(4): 000000000011

⋮      ⋮ pointer L1P(256): 000011111111

For the pointers L1P(1) to L1P(256), the upper four bits "0000" become the common bit string and therefore, the upper four bits "0000" are identified as a compression symbol of the structure of the leaf L1. The compression symbol length of this is four bits and therefore, this is stored together with the compression symbol "0000" to the structure of the leaf L1. Therefore, the structure of the leaf L1 is accessed when any of the 256 kinds of pointers L1P(1) to L1P(256) to the leaf L1 is designated. Thereby, the access frequency is increased and therefore, for the character codes that are stored to the structure of the leaf L1, the access frequency to their compression symbol is also increased. The same is true for each of the leaves L2 and L3.

For the leaf L4, assuming that 16 kinds of pointers L4P(1) to L4P(16) to the leaf L4 are generated, the bit strings are as follows.

pointer L4P(1): 001100000000 pointer L4P(2): 001100000001 pointer L4P(3): 001100000010 pointer L4P(4): 001100000011

⋮      ⋮ pointer L4P(16): 001100001111

For the pointers L4P(1) to L4P(16), the upper eight bits "00110000" become the common bit string and therefore, the upper eight bits "00110000" are identified as a compression symbol of the structure of the leaf L4. The compression symbol length of this is eight bits and therefore, this is stored together with the compression symbol "00110000" to the structure of the leaf L4. Therefore, the structure of the leaf L4 is accessed when any of the 16 kinds of pointers L4P(1) to L4P(16) to the leaf L4 is designated. Thereby, the access frequency is increased (but is less than that for leaves L1 to L3) and therefore, for the character codes that are stored to the structure of the leaf L4, the access frequency to their compression symbol is also increased.

For the leaf L135, assuming that 1 kind of pointer L135P(1) to the leaf L135 is generated, the bit string is as follows.

pointer L135P(1): 101000100000

The pointer L135P(1) is only one kind and therefore, these 12 bits "101000100000" are identified as a compression symbol of the structure of the leaf L135. The compression symbol length of this is 12 bits and therefore, this is stored in the structure of the leaf L135 together with the compression symbol "101000100000". Through the construction described, the no-node Huffman tree H2 is generated. The root of the no-node Huffman tree H2 is allocated with, as branches to the leaves, the pointers to the leaves of lengths corresponding to the quantity of leaves; the number of pointers allocated corresponds to the appearance rate of the character code.

When the second constructing unit 3005 stores the compression symbol in the structure of the leaf L#, the second constructing unit 3005 stores together with the symbol category, an unused address value adr# according to the symbol category. More specifically, in the structure of the leaf L#, the second constructing unit 3005 refers to the expansion type and stores the symbol category and further stores for each symbol category, the unused address value adr#. Thereby, for each of the character codes, etc., the pointers to the compression symbol map M# can be stored to the structures of the leaves L#.

The character structure generating unit 515 refers to the no-node Huffman tree H2 newly constructed and again generates (updates) the character structure 530. The pointers to the leaves newly generated are stored to the reserved word structure 1600, the higher-level character code structure 1700, and the divided character code structure 1800.

Figure 31A:
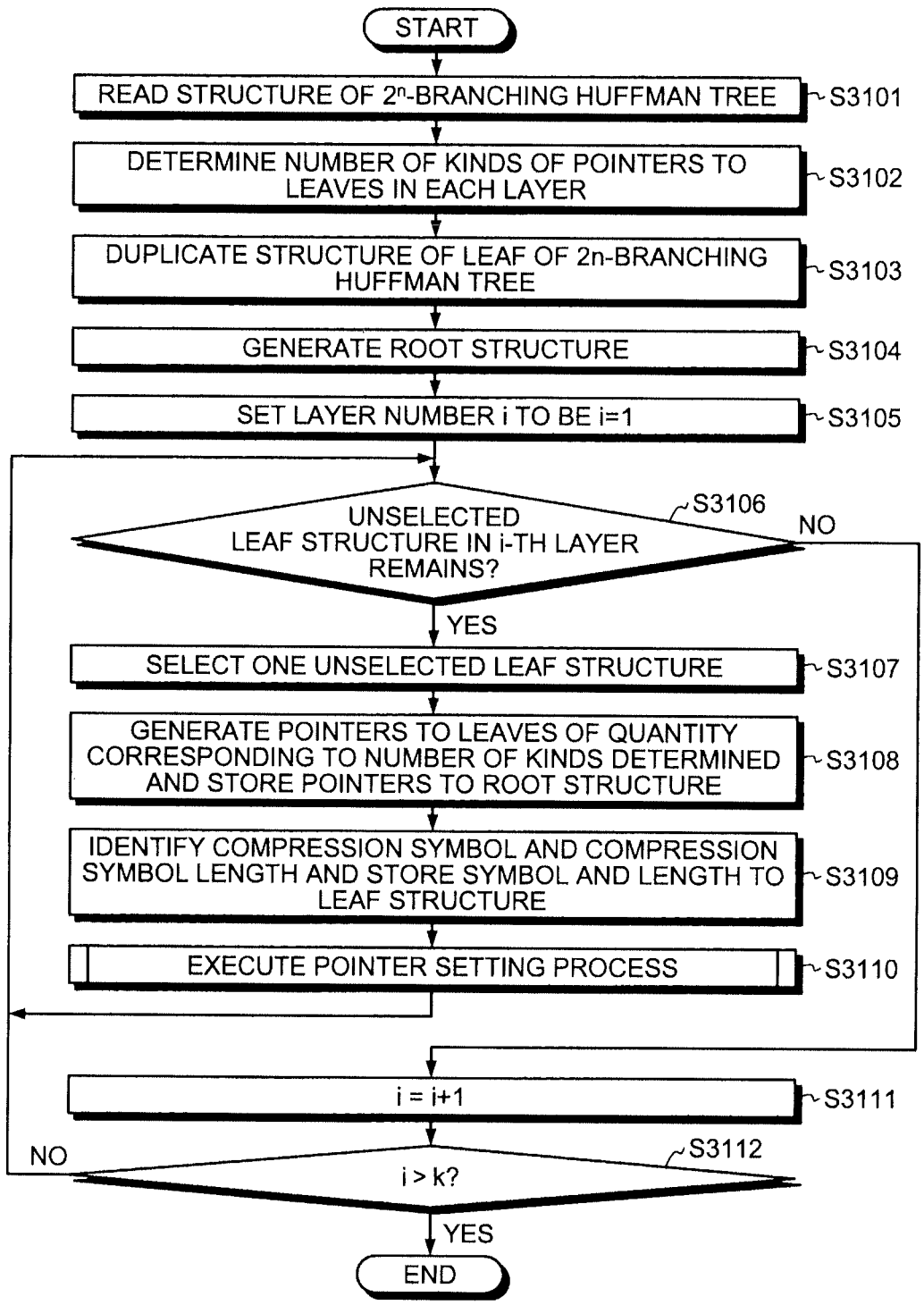
FIG. 31A is a flowchart of a process of converting from the $2^n$-branching Huffman tree to the $2^m$-branching no-node Huffman tree automatically executed by the information processing apparatus.

FIG. 31A is a flowchart of the process of converting from the $2^n$-branching Huffman tree H1 to the $2^m$-branching no-node Huffman tree automatically executed by the information processing apparatus 500. As depicted in FIG. 31A, the structure of the $2^n$-branching Huffman tree H1 is read (step S3101) and the determining unit 3001 determines the number of kinds of the pointers to the leaves for each layer (step S3102).

The duplicating unit 3002 duplicates the structures of the leaves L# of the $2^n$-branching Huffman tree H1 (step S3103) and the root generating unit 3003 generates the root structure (step S3104). The layer number i is determined to be i=1 (step S3105) and whether any unselected structure of the leaf L# in the i-th layer is present is determined (step S3106).

If it is determined that an unselected structure of a leaf L# is present (step S3106: YES), an unselected structure of a leaf L# is selected (step S3107), and pointers to the leaves of a quantity corresponding to the number of kinds determined are generated and stored to the root structure (step S3108). The compression symbol and the compression symbol length are identified, based on the pointers to the leaves of the number of kinds determined, and are stored to the structure of the leaf L# (step S3109). Thereafter, the pointer setting process of setting a pointer to the compression symbol map M# is executed (step S3110) and the procedure returns to step S3106. The pointer setting process will be described later with reference to FIG. 31B.

On the other hand, if it is determined at step S3106 that no unselected structure of the leaf L# is present (step S3106: NO), the layer number i is incremented by one point (step S3111) and whether the layer number i is i>k for the number of layers k of the $2^n$-branching Huffman tree H1 is determined (step S3112). If it is determined that the layer number i is not i>k (step S3112: NO), the procedure returns to step S3106. On the other hand, if it is determined that the layer number i is i>k (step S3112: YES), a series of converting process steps comes to an end.

Figure 31B:
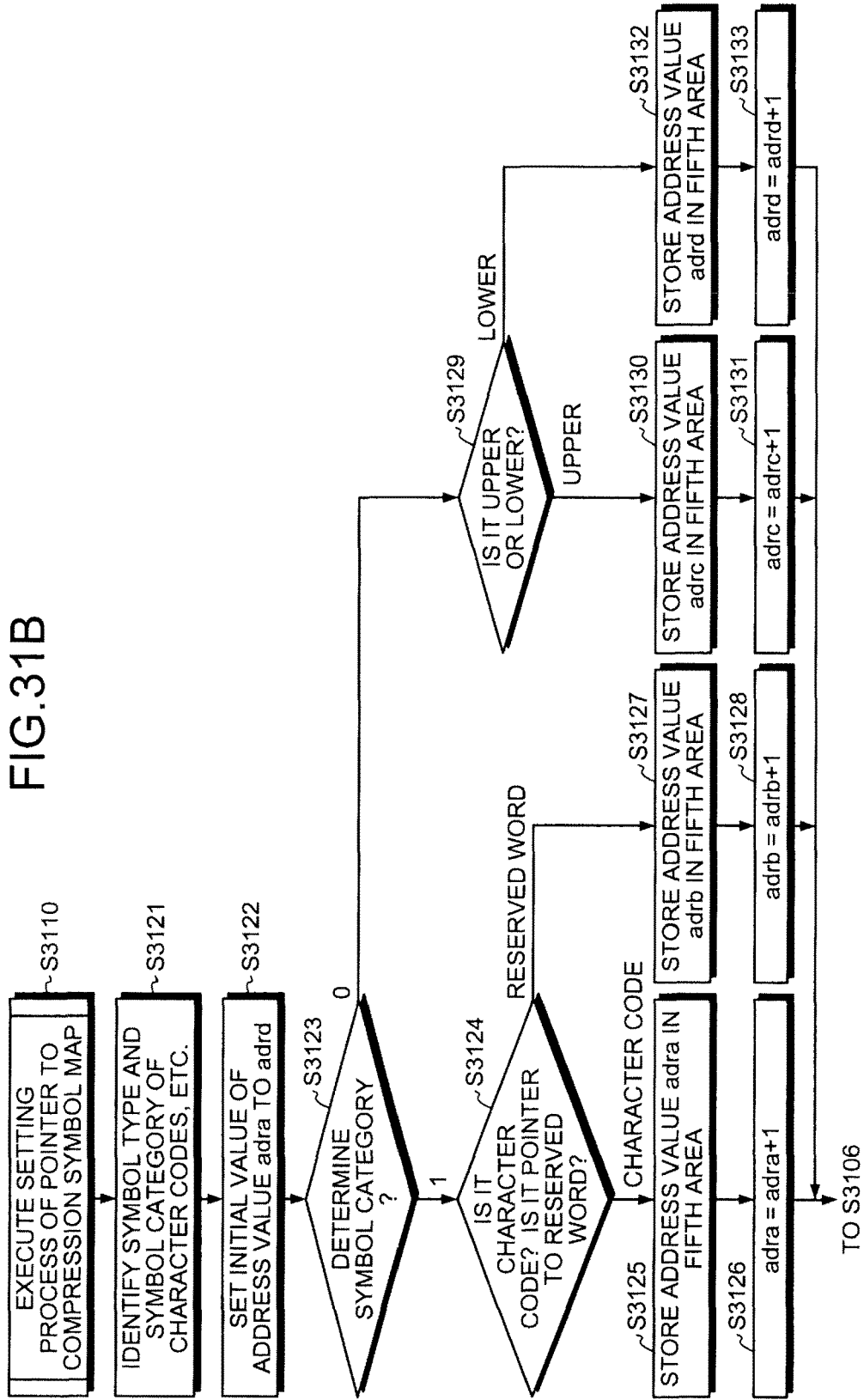
FIG. 31B is a flowchart of a pointer setting process of setting a pointer to a compression symbol map M# (step S3110) depicted in FIG. 31A.

FIG. 31B is a flowchart of the pointer setting process of setting a pointer to the compression symbol map M# (step S3110) depicted in FIG. 31A. The structure of the leaf L# selected at step S3107 is referred to, and the symbol type and the symbol category of the character codes, etc., are identified (step S3121). The initial values of the address values "adra" to "adrd" are set according to the symbol type and the symbol category identified (step S3122).

More specifically, when the symbol type is a character code such as that for a digit, an English character, a special symbol, a katakana character, a hiragana character, or a Chinese character and its symbol category is "1" for the structure of the leaf L#, the initial value of the address value adra for the 16-bit character code is set to be adra=0001.

When the symbol type is a pointer to a reserved word and the symbol category is "1" for the structure of the leaf L#, the initial value of the address value adrb for the pointer to the reserved word is set to be adrb=1025.

When the symbol type is an upper eight-bit divided character code and the symbol category is "0" for the structure of the leaf L#, the initial value of the address value adrc for the upper eight-bit divided character code is set to be adrc=0001.

When the symbol type is an lower eight-bit divided character code and the symbol category is "0" for the structure of the leaf L#, the initial value of the address value adrd for the lower eight-bit divided character code is set to be adrd=0257.

The symbol category in the structure of the leaf L# is determined (step S3123). If it is determined that the symbol category is "1" (step S3123: 1) and the symbol type is "character code" (step S3124: CHARACTER CODE), the address value adra is stored to the fifth area 2805 of the structure of the leaf L# (step S3125). Thereafter, the address value adra is incremented (step S3126) and the procedure proceeds to step S3106.

If it is determined at step S3123 that the symbol category is "1" (step S3123: 1) and the symbol type is "pointer to a reserved word" (step S3124: POINTER TO RESERVED WORD), an address value adrb is stored to the fifth area 2805 of the structure of the leaf L# (step S3127). Thereafter, the address value adrb is incremented (step S3128) and the procedure proceeds to step S3106.

If it is determined at step S3123 that the symbol category is "0" (step S3123: 0) and the symbol type is "upper eight-bit divided character code" (step S3129: UPPER), an address value adrc is stored to the fifth area 2805 of the structure of the leaf L# (step S3130). Thereafter, the address value adrc is incremented (step S3131) and the procedure proceeds to step S3106.

If it is determined at step S3123 that the symbol category is "0" (step S3123: 0) and the symbol type is "lower eight-bit divided character code" (step S3129: LOWER), an address value adrd is stored to the fifth area 2805 of the structure of the leaf L# (step S3132). Thereafter, the address value adrd is incremented (step S3133) and the procedure proceeds to step S3106. Thereby, the pointer to the compression symbol map M# is set in the structure of each leaf L#. Therefore, the compression symbol map M# can be identified when the no-node Huffman tree H2 is searched.

As described, by converting the $2^n$-branching Huffman tree H1 to the $2^m$-branching no-node Huffman tree H2, the no-node Huffman tree H2 can be used for the compression and the expansion. By using the no-node Huffman tree H2 for the compression and the expansion, improvement of the compression rate and the search speed can be facilitated compared to the $2^n$-branching Huffman tree H1.

A compressing process using the $2^m$-branching no-node Huffman tree H2 will be described. In the $2^m$-branching no-node Huffman tree H2, each leaf can be accessed through one path and therefore, an increase of the search speed can be facilitated. A functional configuration for this will be described.

Figure 32:
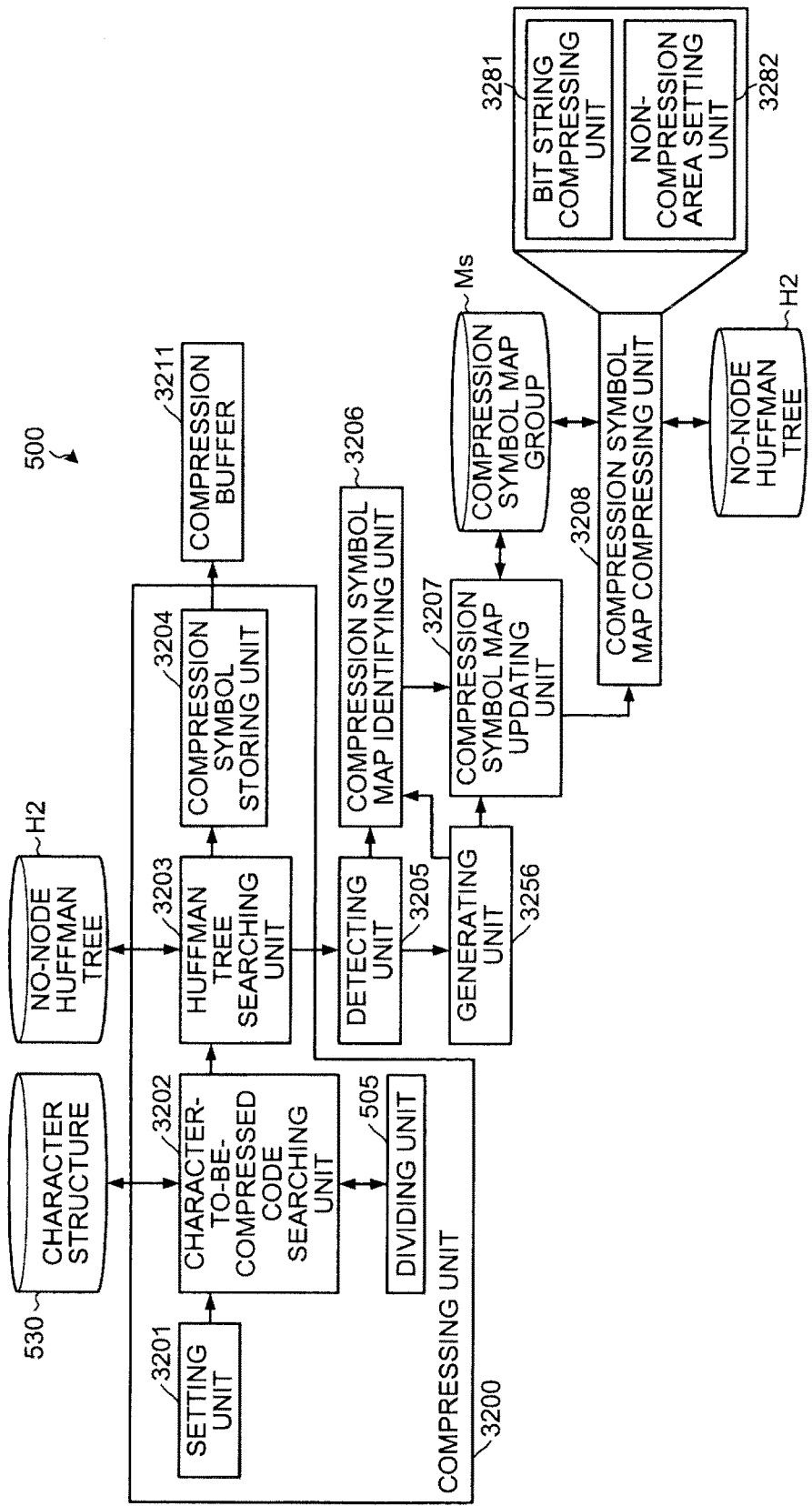
FIG. 32 is a block diagram of a third functional configuration of the information processing apparatus according to the embodiment.

FIG. 32 is a block diagram of a third functional configuration of the information processing apparatus 500 according to the embodiment. FIG. 32 depicts a functional configuration to execute the processes of (4) to (6) of the flow of processes (1) to (6) depicted in FIG. 1. Configurations identical to those depicted in FIG. 5 are given the same reference numerals used in FIG. 5 and will not again be described. As depicted in FIG. 32, the information processing apparatus 500 includes a compressing unit 3200 (the dividing unit 505, a setting unit 3201, a character-code-to-be-compressed searching unit 3202, a Huffman tree searching unit 3203, and a compression symbol storing unit 3204), a detecting unit 3205, a generating unit 3256, a compression symbol map identifying unit 3206, a compression symbol map updating unit 3207, a compression symbol map compressing unit 3208 (a bit string compressing unit 3281 and a non-compression area setting unit 3282), and a compression buffer 3211.

Functions of the setting unit 3201 to the compression symbol map compressing unit 3208 and the generating unit 3256 are implemented by causing the CPU 401 to execute a program stored in a storage medium such as the RAM 403, the magnetic disk 405, and the optical disk 407 depicted in FIG. 4, or via the I/F 409. A function of the compression buffer 3211 is implemented by a storage medium such as the RAM 403, the magnetic disk 405, and the optical disk 407 depicted in FIG. 4.

The compressing unit 3200 has a function of sequentially compressing according to the Huffman tree, the character codes to be compressed that are described in a file F selected from the file group Fs. More specifically, for example, the compressing unit 3200 executes the compression using the dividing unit 505, the setting unit 3201, the character-code-to-be-compressed searching unit 3202, the Huffman tree searching unit 3203, and the compression symbol storing unit 3204.

The setting unit 3201 has a function of setting the character codes to be compressed when the compressing process is executed. More specifically, for example, the CPU 401 writes the character codes to be compressed and the compression symbol strings input, into its internal register or an external buffer.

FIG. 33A is an explanatory diagram of an example of a character code string to be compressed. In this example, a character string "人形芝居" is the character string to be compressed and its character code string is indicated. "芝" is a lower-level character code and therefore, is divided into an upper eight bits and a lower eight bits.

FIG. 33B is an explanatory diagram of an example of a compression symbol string. In this example, a compression symbol string of the character string "人形芝居" is also indicated. Because "芝" is divided into an upper eight bits and a lower eight bits, its compression symbol is also allocated to each of its divided character codes.

The character-code-to-be-compressed searching unit 3202 has a function of searching for the character code to be compressed set by the setting unit 3201, from among the higher-level character code group. More specifically, for example, the CPU 401 searches for the character code to be compressed set in its register by scanning the character structure 530, that is, the reserved word structure 1600 and the higher-level character code structure 1700.

If no character code that coincides with the character code to be compressed is retrieved from the reserved word structure 1600 or the higher-level character code structure 1700, the CPU 401 using the dividing unit 505, divides the character code to be compressed into an upper bits and a lower bits, and searches by scanning the divided character code structure 1800 for each of the divided character codes.

The Huffman tree searching unit 3203 has a function of searching for the compression symbol of the retrieved character codes, etc. using the pointers to the leaves L# that are correlated with the retrieved character codes, etc. More specifically, for example, the CPU 401 reads from the character structure 530, the pointer to the leaf L# that is correlated with the character code, etc. that coincides, identifies the structure of the leaf L#, and extracts the compression symbol of the character code stored in the structure of the leaf L# pointed to.

For example, with reference to FIG. 26, if the character code that corresponds to the leaf L256 is retrieved as a higher-level character code, the pointer to the leaf L256 is read from the higher-level character code structure 1700 and the structure of the leaf L256 is accessed. The compression symbol of the character code stored in the structure of the leaf L256 is extracted from the structure of the leaf L256.

The compression symbol storing unit 3204 has a function of storing to a predetermined storing area, the compression symbol retrieved by the Huffman tree searching unit 3203. More specifically, for example, the CPU 401 writes the retrieved compression symbol into the compression buffer 3211.

Before describing the detecting unit 3205 to the compression symbol map compressing unit 3208, a specific example of a compressing process of the file group Fs using the $2^m$-branching no-node Huffman tree H2 will be described. In the compressing process using the $2^m$-branching no-node Huffman tree H2, in the Huffman tree search, searching toward the root is unnecessary because no internal node is present, and the character code stored in the structure of the leaf L# pointed to is extracted and is written into the compression buffer 3211. If a pointer to a reserved word is extracted, the reserved word of the pointing destination is extracted and is written into the buffer 3211. Thereby, an increase in the speed of the compressing process can be facilitated.

Figure 34:
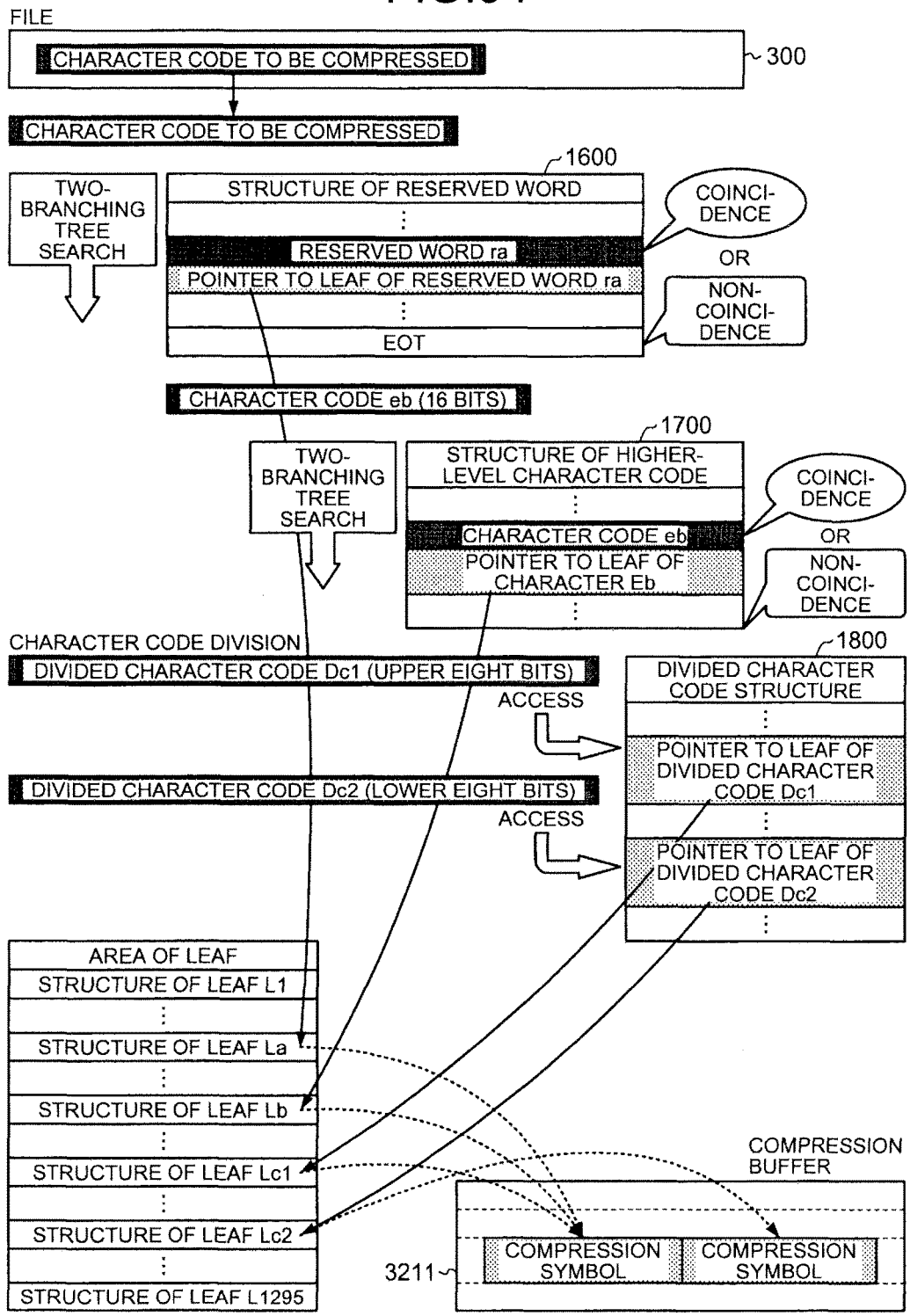
FIG. 34 is an explanatory diagram of an example of the compressing process using the $2^m$-branching no-node Huffman tree.

FIG. 34 is an explanatory diagram of an example of the compressing process using the $2^m$-branching no-node Huffman tree H2. The character code of the first character is obtained, for compression, from the file group Fs and the position in a file 300 is stored. A two-branching tree search is executed on the reserved word structure 1600. The reserved word is a character code string of two or more characters and therefore, when the character code of the first character is hit, the character code of the second character is obtained as a character code to be compressed.

The character code of the second character is searched for from the position where the character code the first character is hit. For the third and the subsequent characters, the two-branching search is repeatedly executed until a character code to be compressed that does not coincide appears. If a reserved word "ra" ("a" is the leaf number) that coincides is retrieved, the structure of the leaf La is accessed via the pointer to the leaf La. The compression symbol of the reserved word ra is retrieved using the Huffman tree search and is stored to the compression buffer 3211.

On the other hand, if a character code to be compressed that does not coincide appears, the two-branching search on the reserved word structure 1600 comes to an end (advances to End Of Transmission (EOT)), the character code to be compressed and of the first character is again set in the register, and the two-branching tree search on the higher-level character code structure 1700 is executed.

If a character code "eb" ("b" is the leaf number) that coincides is retrieved, the structure of the leaf Lb is accessed by the pointer to the leaf Lb. The compression symbol of the character code eb is retrieved by the Huffman tree search and is stored in the compression buffer 3211.

On the other hand, if no character code that coincides appears and the two-branching tree search comes to an end, the character code to be compressed is not a higher-level character code and therefore, the character code to be compressed is divided into an upper eight bits and a lower eight bits. The two-branching tree search is executed on the divided character code structure 1800 for the upper eight-bit divided character code. If a divided character code Dc1 ("c1" is the leaf number) that coincides is retrieved, the structure of the leaf Lc1 is accessed by the pointer to the leaf Lc1. The compression symbol of the divided character code Dc1 is retrieved using the Huffman tree search and is stored to the compression buffer 3211.

Continuously, the two-branching tree search is executed on the divided character code structure 1800 for the lower-eight-bit divided character code. When a divided character code Dc2 ("c2" is the leaf number) that coincides is retrieved, the structure of the leaf Lc2 is accessed by the pointer to the leaf Lc2. The compression symbol of the divided character code Dc2 is retrieved using the Huffman tree search and is stored to the compression buffer 3211 subsequently to the compression symbol of the divided character code Dc1.

Figure 35:
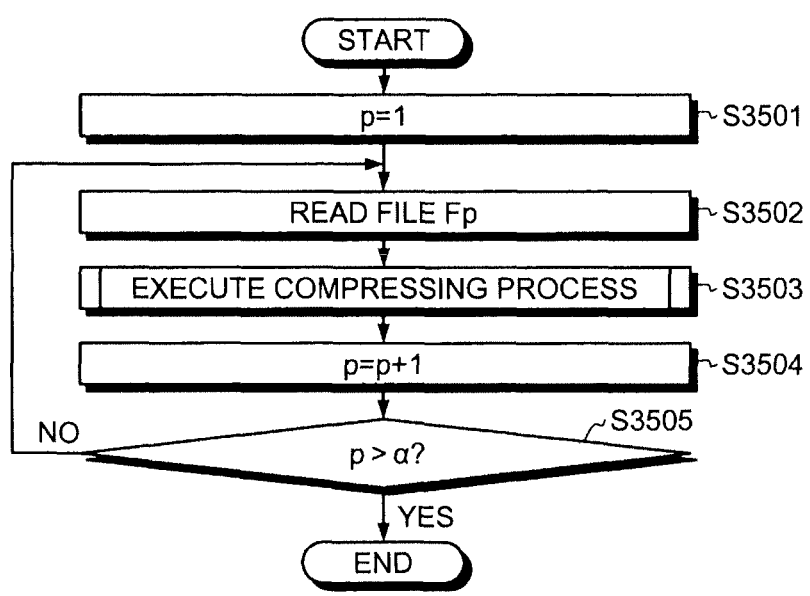
FIG. 35 is a flowchart of the file compressing process procedure using the $2^m$-branching no-node Huffman tree automatically executed by the information processing apparatus.

FIG. 35 is a flowchart of the file compressing process procedure using the $2^m$-branching no-node Huffman tree H2 automatically executed by the information processing apparatus 500. The file number: p is set to be p=1 (step S3501) and the file Fp is read (step S3502). The compressing process is executed (step S3503) and the file number: p is incremented (step S3504). Whether the file number p is p>α is determined (step S3505). "α" is the total number of the file group Fs. If it is determined that the file number p is not p>α (step S3505: NO), the procedure returns to step S3502. On the other hand, if it is determined that the file number p is p>α (step S3505: YES), the series of file compressing process steps come to an end.

Figure 36:
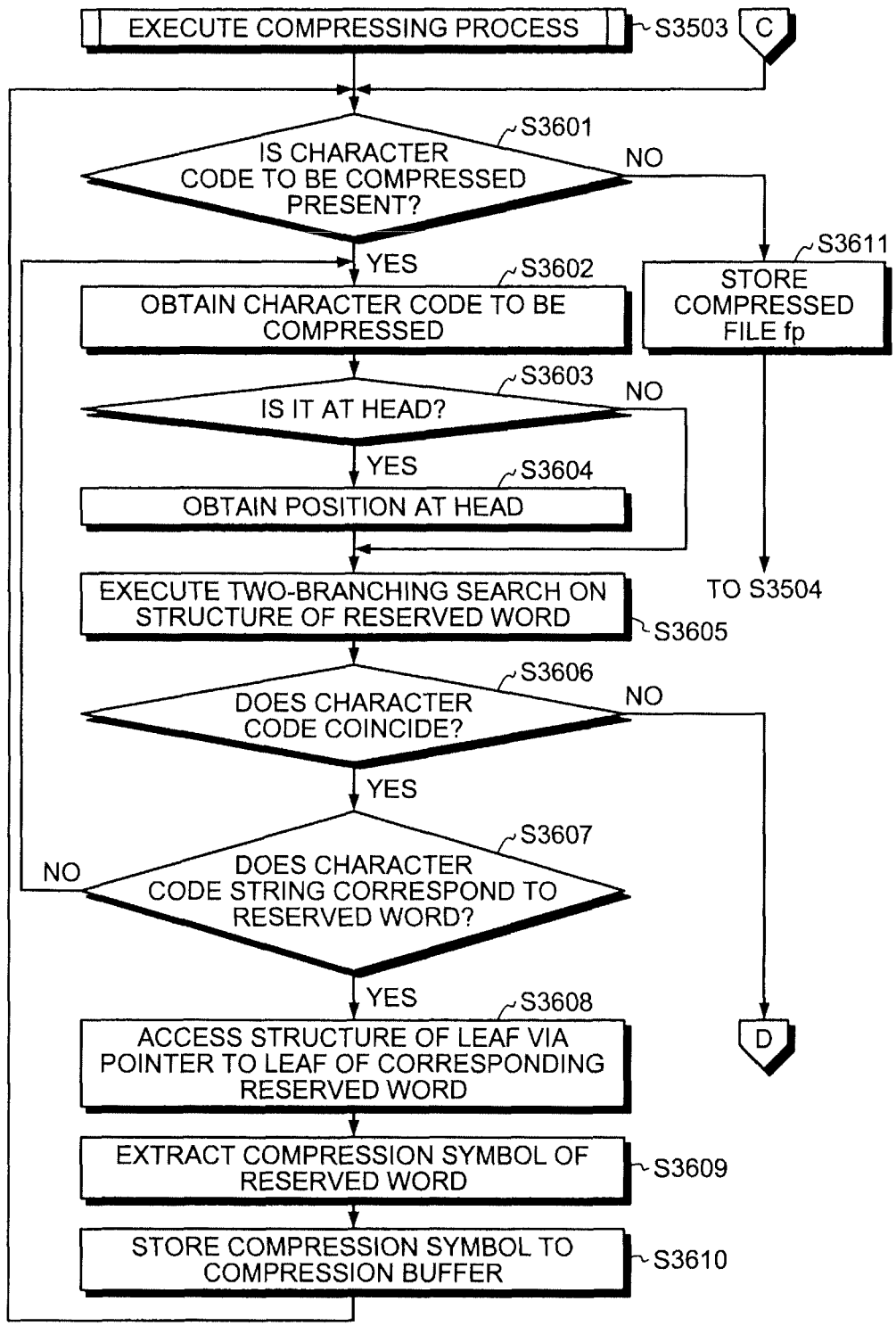
FIG. 36 is a flowchart of the compressing process (step S3503) depicted in FIG. 35.

FIG. 36 is a flowchart of the compressing process (step S3503) depicted in FIG. 35. As depicted in FIG. 36, whether any character code to be compressed is present in the file group Fs is determined (step S3601). If it is determined that a character code to be compressed is present (step S3601: YES), the character code to be compressed is obtained and is set in the register (step S3602). Whether the character code to be compressed is at the head is determined (step S3603).

The "character code to be compressed at the head" refers to the character code of the first character that is not compressed. If it is determined that the character code to be compressed is at the head (step S3603: YES), the pointer that is the position of the character code to be compressed (the head position) in the file group Fs is obtained (step S3604) and the procedure proceeds to step S3605. On the other hand, if it is determined that the character code to be compressed is not at the head (step S3603: NO), the head position is not obtained and the procedure proceeds to step S3605.

The two-branching tree search is executed on the reserved word structure 1600 (step S3605). If it is determined that the character code to be compressed coincides (step S3606: YES), it is determined whether the character code string that consecutively hits corresponds to (the character code string of) the reserved word (step S3607). If it is determined that the character code string does not correspond to the reserved word (step S3607: NO), the procedure returns to step S3602 and a subsequent character code is obtained as the character code to be compressed. In this case, the subsequent character code is not at the head and therefore, the head position is not obtained.

On the other hand, if it is determined at step S3607 that the character code string corresponds to the reserved word (step S3607: YES), the structure of the leaf L# is accessed via the pointer to the leaf L# of the corresponding reserved word (step S3608). The compression symbol is extracted of the reserved word stored in the structure of the leaf L# pointed to (step S3609).

Thereafter, the compression symbol extracted is stored to the compression buffer 3211 (step S3610) and the procedure returns to step S3601. This loop is the flow of the compressing process of the reserved word. If it is determined at step S3601 that no character code to be compressed is present (step S3601: NO), a compressed file fp formed by compression from the file Fp is output from the compression buffer 3211 and stored (step S3611). The procedure proceeds to step S3504. On the other hand, if it is determined at step S3606 that the character code to be compressed does not coincide (step S3606: NO), the procedure enters the loop of the 16-bit character code compressing process.

FIG. 37 is a flowchart of the compressing process (step S3503) depicted in FIG. 35. As depicted in FIG. 37, the pointer at the head position obtained at step S3604 is referred to and the character code to be compressed is obtained from the file group Fs and is set in the register (step S3701).

The two-branching tree search is executed on the higher-level character code structure 1700 for the character code to be compressed (step S3702). If it is determined that the character code to be compressed coincides (step S3703: YES), the structure of the leaf L# is accessed by the pointer to the leaf L# of the corresponding character (step S3704). The compression symbol of the character code to be compressed stored in the structure of the leaf L# pointed to is extracted (step S3705).

Thereafter, the retrieved compression symbol is stored to the compression buffer 3211 (step S3706) and the procedure returns to step S3601. This loop is the flow of the compressing process of the 16-bit character code. On the other hand, if it is determined at step S3703 that no character code that coincides is present (step S3703: NO), the procedure enters the loop of the compressing process of the divided character code.

FIG. 38 is a flowchart of the compressing process (step S3503) depicted in FIG. 35. As depicted in FIG. 38, the character code to be compressed is divided into an upper eight bits and a lower eight bits (step S3801) and the divided character code for the upper eight bits is extracted (step S3802). The two-branching tree search is executed on the divided character code structure 1800 (step S3803).

The structure of the leaf L# is accessed via the pointer to the leaf L# of the divided character code retrieved (step S3804). The compression symbol of the divided character code stored in the structure of the leaf L# pointed to is extracted (step S3805). Thereafter, the retrieved compression symbol is stored to the compression buffer 3211 (step S3806).

Whether the lower eight bits have been searched for is determined (step S3807). If it is determined that the lower eight bits have not been searched for (step S3807: NO), the divided character code of the lower eight bits is extracted (step S3808) and steps S3803 to S3806 are executed. On the other hand, if it is determined that the lower eight bits have been searched for (step S3807: YES), the procedure returns to step S3601 and enters the loop of the compressing process of the reserved word.

As described, in the compressing process using the $2^m$-branching no-node Huffman tree H2, searching toward the root is not necessary because no internal node is present, and the character code stored in the structure of the leaf L# pointed to alone has to be extracted and written into the compression buffer 3211. Therefore, an increase of the speed of the compressing process can be facilitated.

The structure of the leaf L# having stored therein the character code to be compressed can immediately be identified using the reserved word structure 1600, the higher-level character code structure 1700, and the divided character code structure 1800. Therefore, no leaf of the $2^m$-branching no-node Huffman tree H2 needs to be searched for and an increase of the speed of the compressing process can be facilitated. By dividing the lower-level character code into the upper-bit code and the lower-bit code, the 60,000 or more kinds of lower character codes can be compressed to compression symbols of only 256 kinds of divided character codes. Therefore, improvement of the compression rate can be facilitated.

Referring back to FIG. 32, the detecting unit 3205 to the compression symbol map compressing unit 3208 will be described. The detecting unit 3205 has a function of detecting an access to a leaf of the Huffman tree by the compressing unit 3200. More specifically, for example, access to the structure of the leaf L# by the Huffman tree searching unit 3203 is detected.

Among identification information items concerning the preceding and the succeeding character codes that constitute two-gram consecutive character code strings in a file Fp selected from the file group Fs, the generating unit 3256 has a function of dividing at least one of identification information items into two, combining the divided information item with the identification information item, and generating multiple kinds of combined identification information items.

For example, pointers to the compression symbol maps of the preceding and the succeeding character codes are used. For example, when the Huffman tree is set to be a two-branching Huffman tree, either one of these pointers is divided into upper bits and lower bits. The divided pointer is coupled with the pointer to the other compression symbol map that is not divided. Thereby, two kinds of combined pointers can be generated.

When the Huffman tree is set to be a four-branching Huffman tree, the pointers to the compression symbol maps of the preceding and the succeeding character codes are each divided into upper bits and lower bits. Two of the four divided bit strings are selected and coupled with each other. Thereby, four kinds of combined pointers can be generated.

Combined pointers are similarly generated for pointers to compression symbol maps of character codes at the head and at the tail that constitute x-gram consecutive character code strings.

The compression symbol map identifying unit 3206 has a function of identifying the compression symbol map M# that corresponds to the character codes, etc., stored in the structure of the leaf L# from among the compression symbol map group Ms. More specifically, for example, when the detecting unit 3205 detects an access to the structure of the leaf L# by the Huffman tree searching unit 3203, the pointer from the structure of the leaf L# to the compression symbol map is read. The compression symbol map M that corresponds to the character codes, etc., stored in the structure of the leaf L# is accessed by the pointer to the compression symbol map read.

FIG. 39A is an explanatory diagram of the initial state of the compression symbol map group Ms. The compression symbol map group Ms has address items and bit string items. The address and the bit string are converted into records for each structure of the leaf L#, i.e., higher-level character code, reserved word, upper-eight-bit divided character code, and lower-eight-bit divided character code.

Category items of the address item each indicate the symbol category of the structure of the leaf L#. The address value of each of the address items indicates the address value of the structure of the leaf L#. Therefore, an address formed by coupling the value of the category item and the address value with each other is pointed to by the pointer to the compression symbol map M#.

The bit string item is configured by a string of bit strings of a quantity corresponding to the quantity of the files lined up in order of file number. The character codes, etc., designated by the address are present in a file of the file number whose bit value is "1". On the other hand, no character codes, etc., designated by the address are present in a file of the file number whose bit value is "0". In FIG. 39A, the initial state is depicted and therefore, the value of each of the bit string is "0".

In FIG. 32, the compression symbol map updating unit 3207 has a function of updating the bit of the file number from "0" to "1". More specifically, the compression symbol map updating unit 3207 updates from "0" to "1", the bit of the file number of a file that is being compressing-processed, among the bit strings of the compression symbol map M# pointed to by the pointer to the compression symbol map M# of the compression symbol map group Ms.

FIG. 39B is an explanatory diagram of the compression symbol map group Ms after updating by the compression symbol map updating unit 3207. For example, FIG. 39B depicts that the character code, etc., that corresponds to the record in the first row is not present in the files F1 to F4 and is present in a file Fα.

Before describing the compression symbol map compressing unit 3208, the two-gram compression symbol map will be described. The compression symbol map that represents the presence or the absence of a single character code (including the divided character codes thereof) in the file group Fs has been described with reference to FIGS. 39A and 39B. The "two-gram compression symbol map" is a compression symbol map that represents the presence or the absence of a two-gram-character-code (two character codes) string in the file Fs.

Types of two-gram compression symbol map are a compression symbol map that represents the presence or the absence of a two-consecutive-gram character code string in the file Fs, and a compression symbol map that represents the presence or the absence of each of the head gram and the tail gram of an x-gram character code string in the file Fs. Herein, the former and the latter are respectively referred to as "consecutive-gram map" and "x-gram head-and-tail map".

For example, each of characters "東", "京", and "都" is represented by a higher-level character code. In this case, when a character string "東京都" is present in a file Fp, a consecutive-gram map of "東京", and a consecutive-gram map of "京都" are generated. A bit of the file Fp is set up for each of the consecutive-gram maps of "東京" and "京都".

Similarly, "東京都" is a three-gram character code string and therefore, a three-gram head-and-tail map is generated that has the higher-level character codes of "東" and "都" as its head gram and its tail gram, respectively. The bit of the file Fp is set up for this three-gram head-and-tail map.

The number of character codes of the higher-level character codes is, in this example, 1,024 ($=2^{10}$) and therefore, the pointer to the compression symbol map of the higher-level character codes is represented by at least 10 bits. In a consecutive-gram map having consecutive higher-level character codes, all combinations of the higher-level character code strings of the consecutive two grams need to be included. Therefore, a memory size of $2^{10} \times 2^{10}$ ($=2^{20}$) is necessary and a size explosion is caused to occur. Such a phenomenon is also caused to occur when a first gram is a higher-level character code and a second gram is an upper divided character code, when a first gram is an upper divided character code and a second gram is a lower divided character code, and when a first gram is a lower divided character code and a second gram is a higher-level character code.

Therefore, in the embodiment, the generating unit 3256 divides the pointer to the compression symbol map of the character code of at least one gram of the consecutive two grams into upper bits and lower bits and thereby, generates plural kinds of pointers. The compression symbol map identifying unit 3206 allocates to the plural kinds of pointers, α bit strings that are bit strings of a quantity corresponding to the quantity of the files. Thereby, the consecutive-gram map is divided into consecutive-gram divided maps that are designated by the plural kinds of pointers. The x-gram head-and-tail map is similarly divided into x-gram head-and-tail divided maps. Thereby, downsizing of the consecutive-gram map and the x-gram head-and-tail map is facilitated. Associated with the division, AND computation only has to be executed when screening is executed using the consecutive-gram divided map and the x-gram head-and-tail map.

FIG. 40 is an explanatory diagram of the downsizing of a two-gram compression symbol map. (A) of FIG. 40 depicts the size of the two-gram compression symbol map before the dividing. 10 bits are used as each of the pointers to the compression symbol maps of the first and the second grams. Therefore, the size of $2^{10} \times 2^{10}$ (=$2^{20}$) is necessary and the size explosion is caused to occur.

In (B) of FIG. 40, the pointer to the compression symbol map of the second gram is divided into five-bit sections. Therefore, the size becomes $2^{10} \times 2^5 \times 2$ (=$2^{16}$) and significant downsizing can be facilitated. In the case of (B), the screening can be executed by AND computation using the two divided maps.

In (C) of FIG. 40, the pointer to the compression symbol map of the first gram is divided into five-bit sections. Therefore, the size of the memory becomes $2^5 \times 2^5 \times 4$ (=$2^{12}$) and significant downsizing can further be facilitated. In the case of (C), the screening can be executed by AND computation using the four divided maps.

FIG. 41 is a chart of the sizes of the two-gram compression symbol map obtained when the symbol map is divided. When no division is executed as in (A) of FIG. 40, the total size of two-gram combinations becomes 1.64 M. On the other hand, when the division into two is executed as in (B) of FIG. 40, the total size of the two-gram combinations becomes 144,000. When the division into four is executed as in (C) of FIG. 40, the total size of the two-gram combinations becomes 10,000.

Figure 42A:
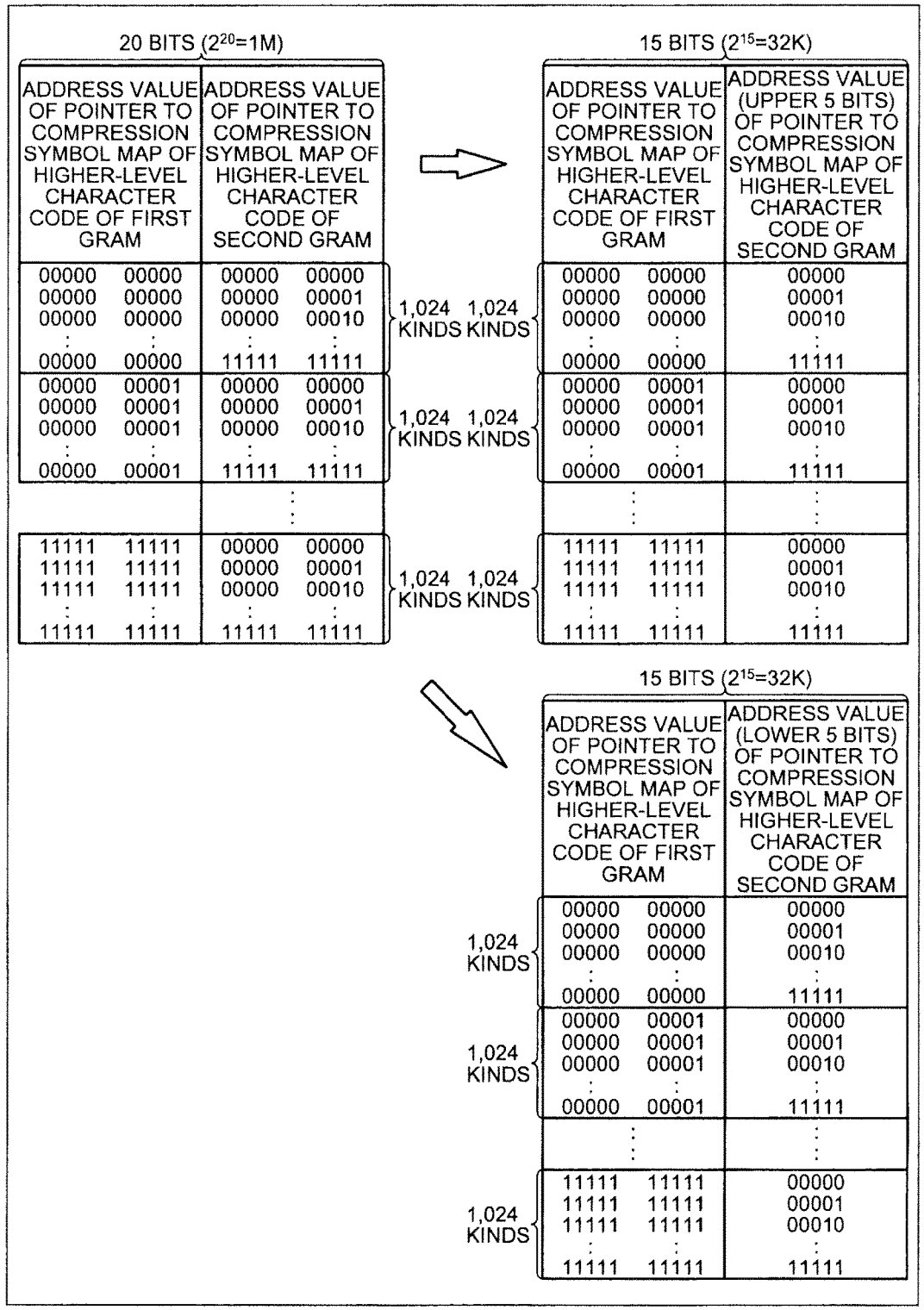
FIGS. 42A to 42O are explanatory diagrams of exemplary dividing of a pointer to a two-gram compression symbol map.
Figure 42B:
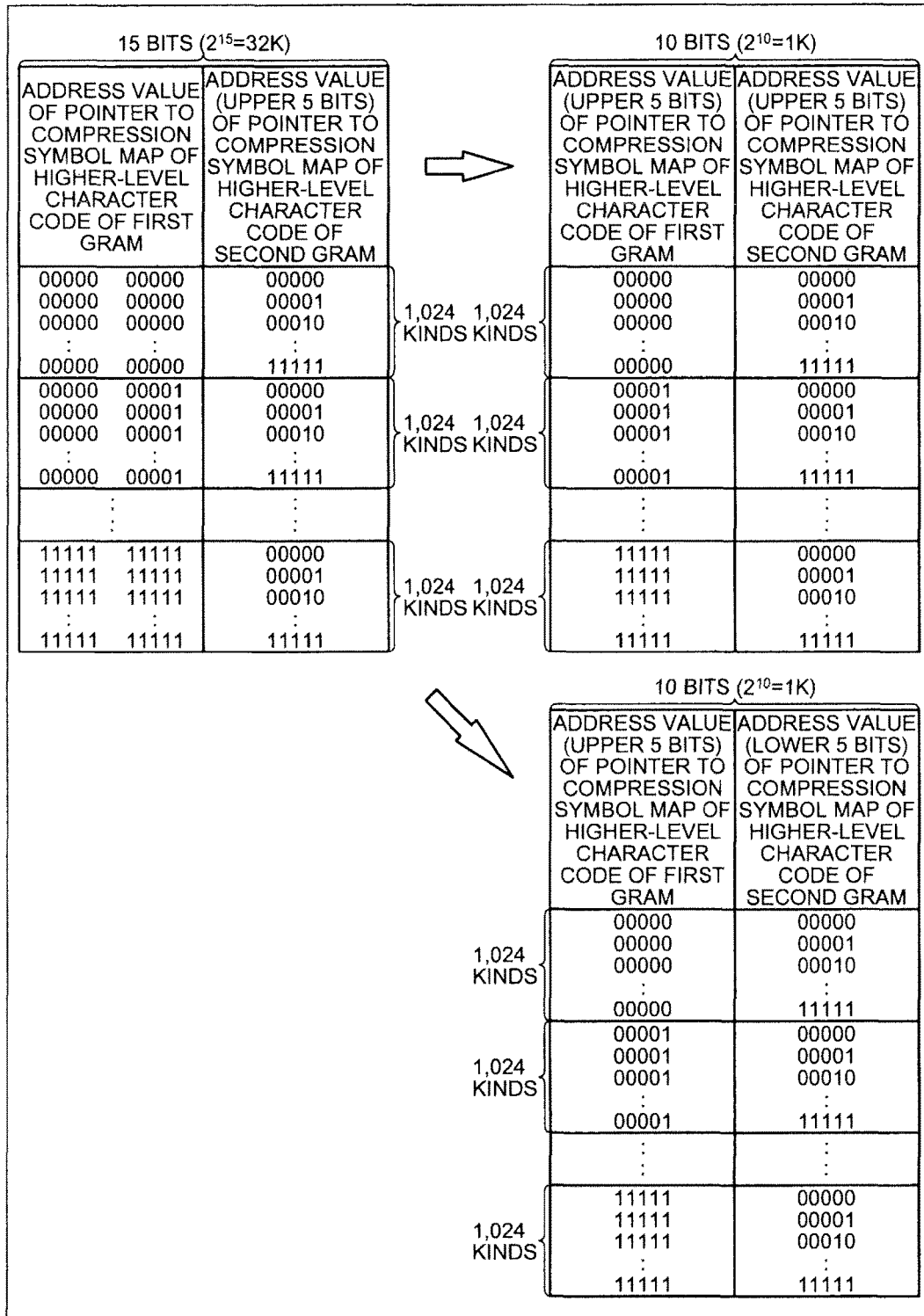
Figure 42C:
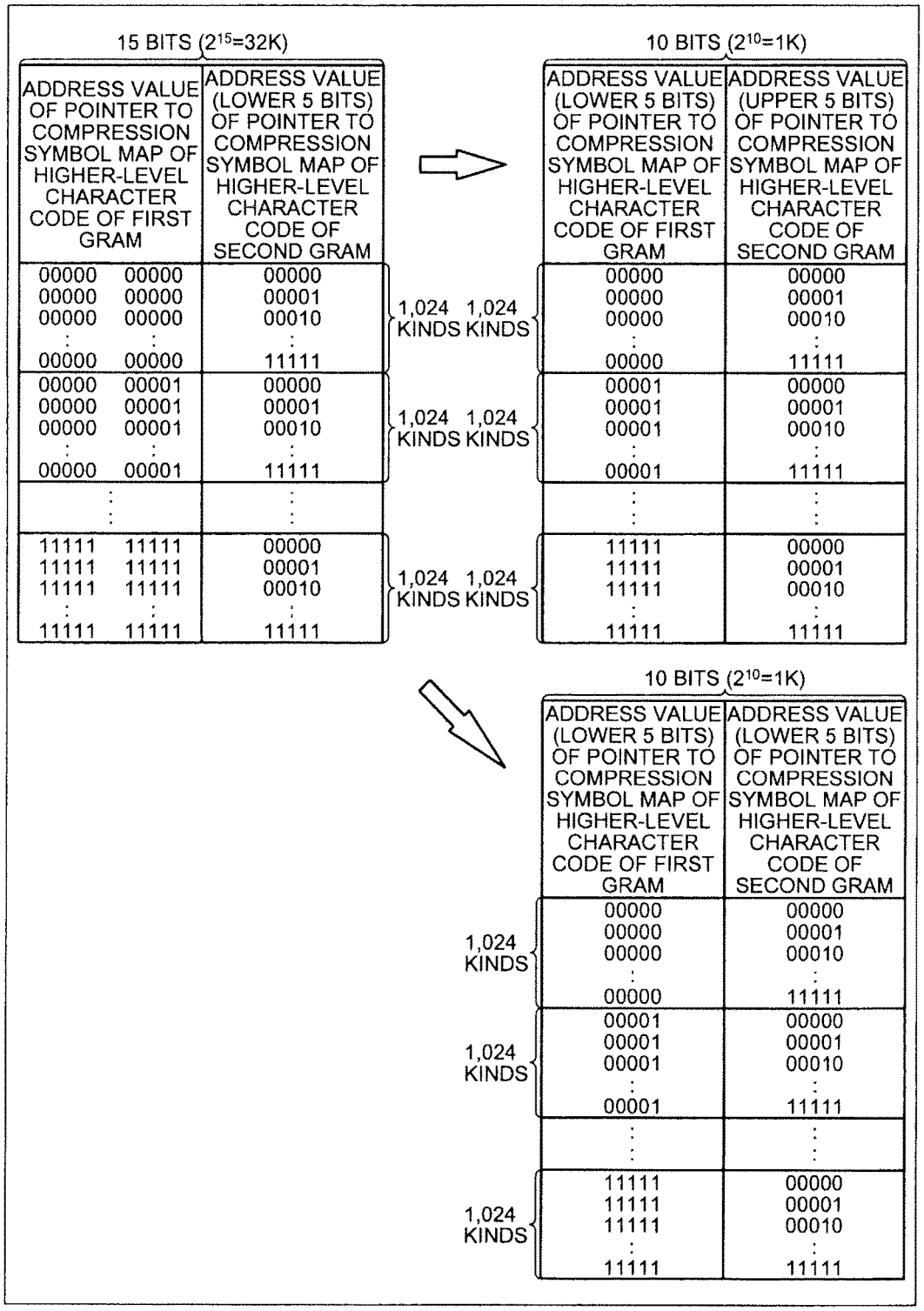
Figure 42D:
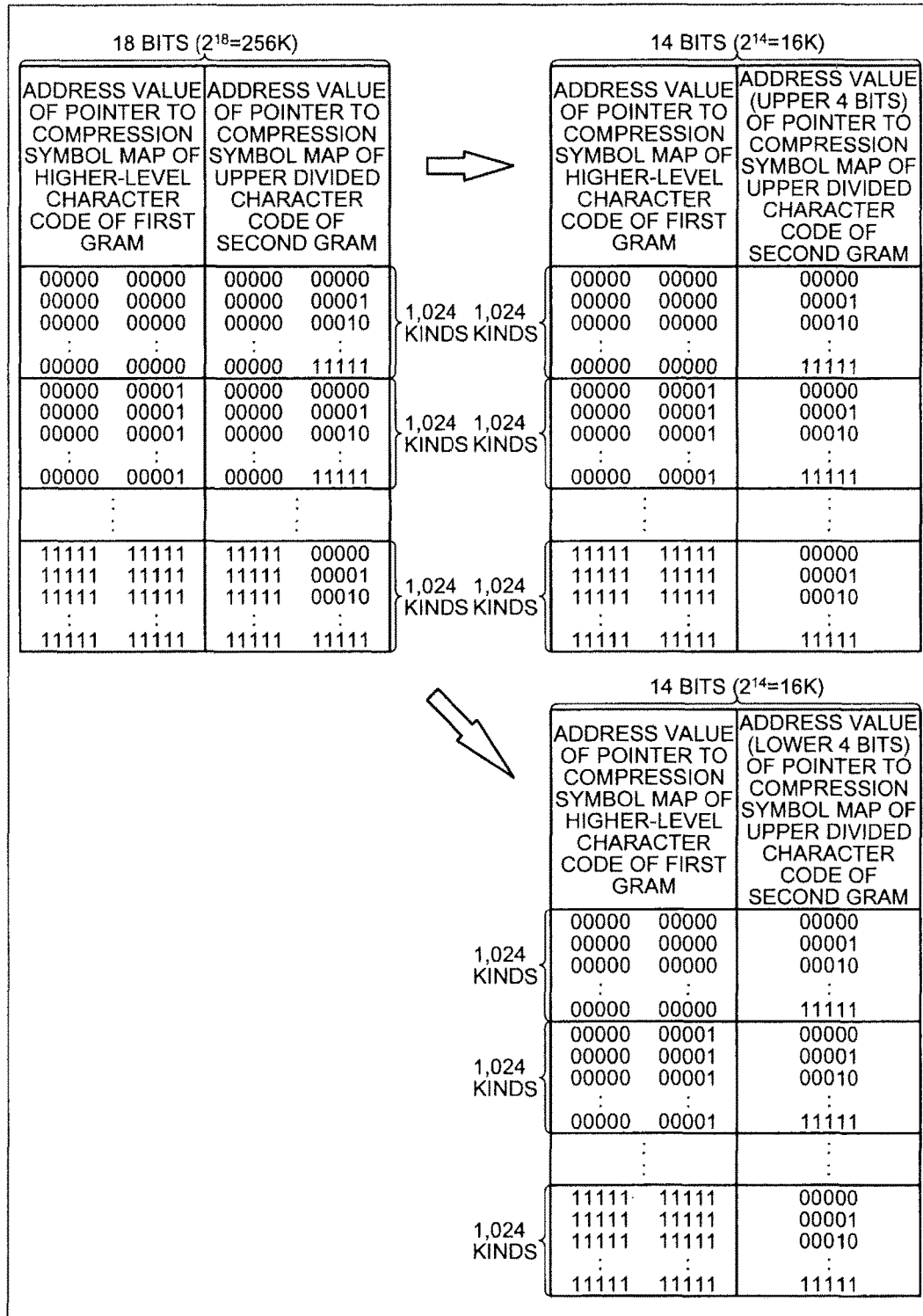
Figure 42E:
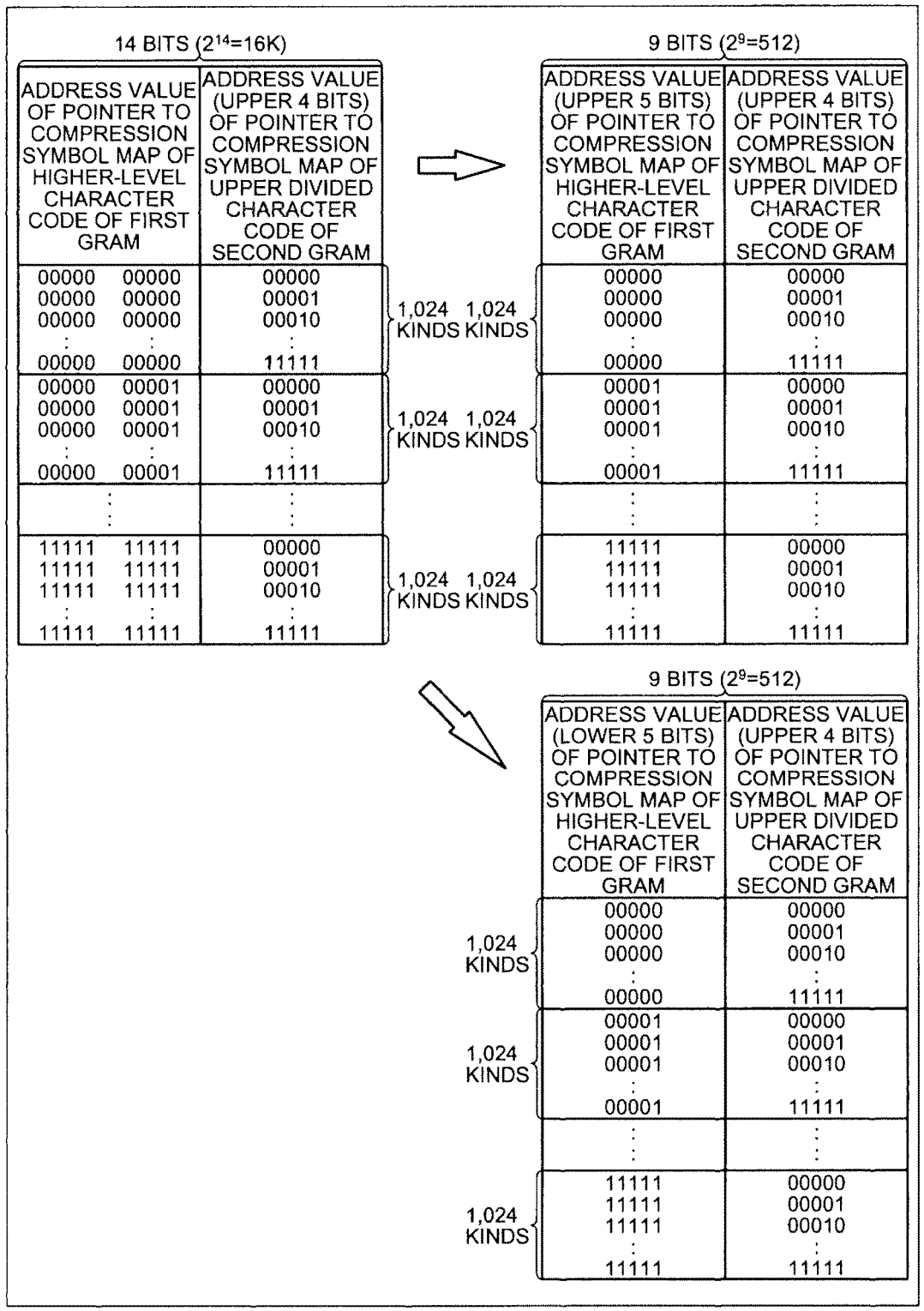
Figure 42F:
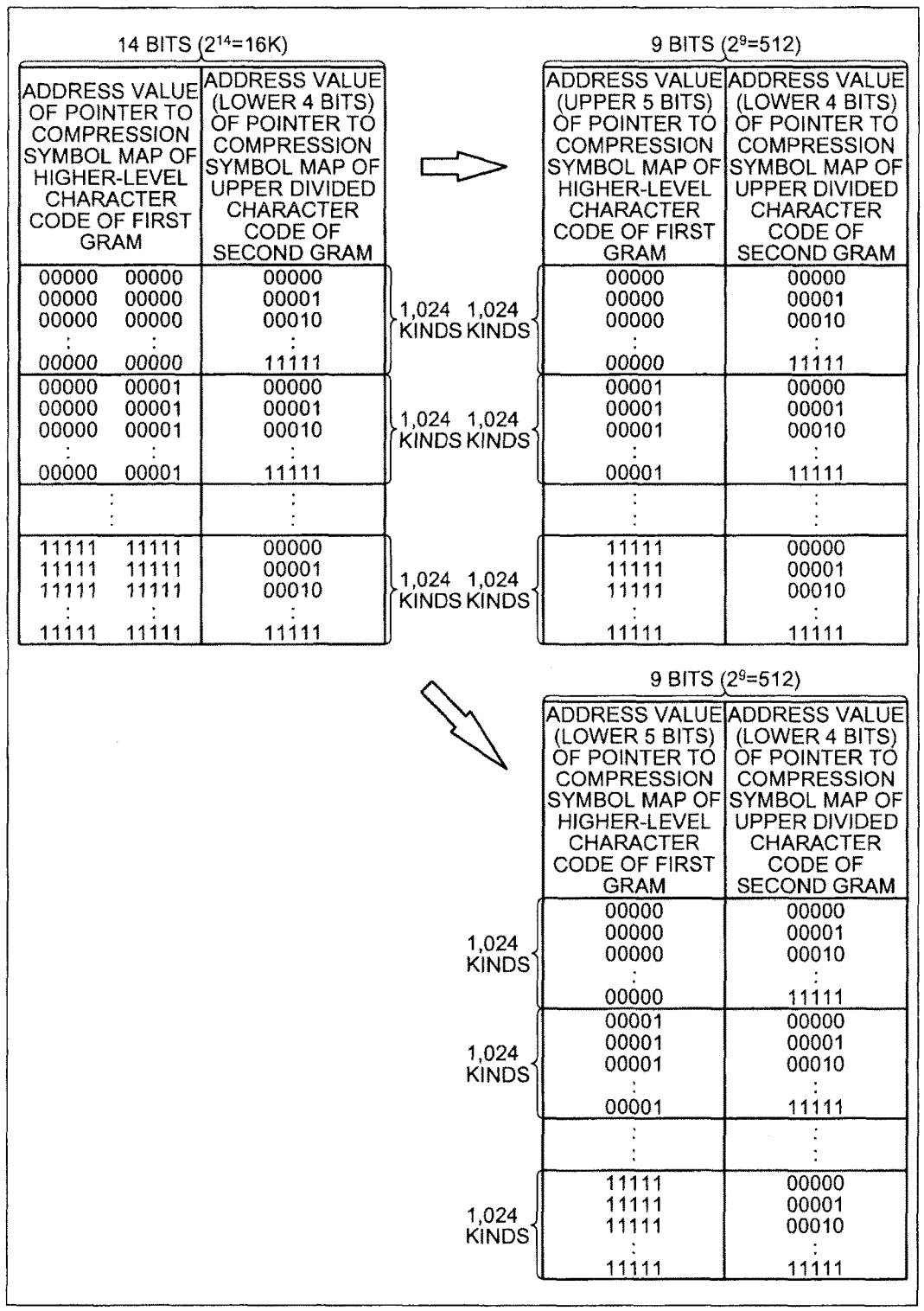
Figure 42G:
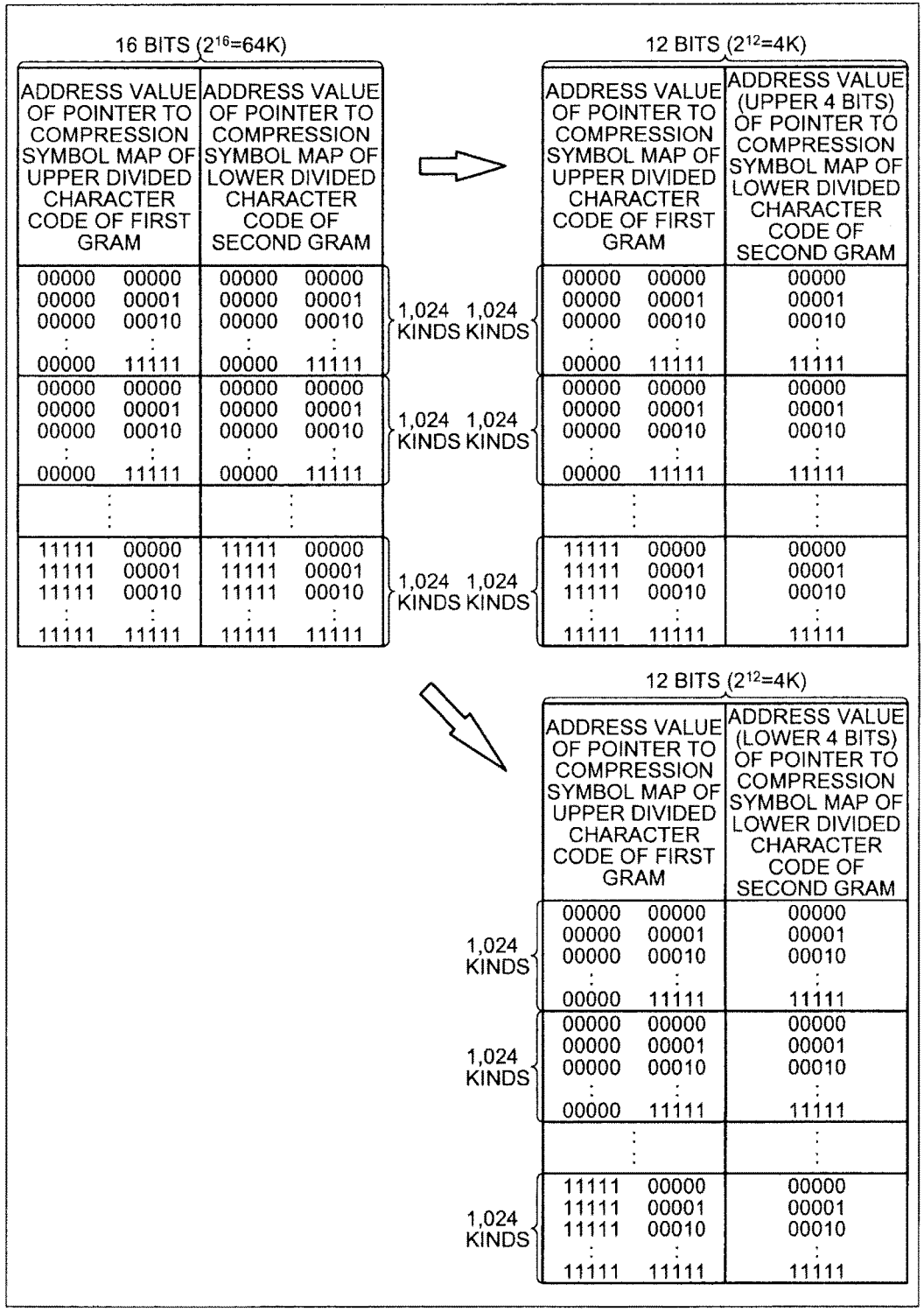
Figure 42H:
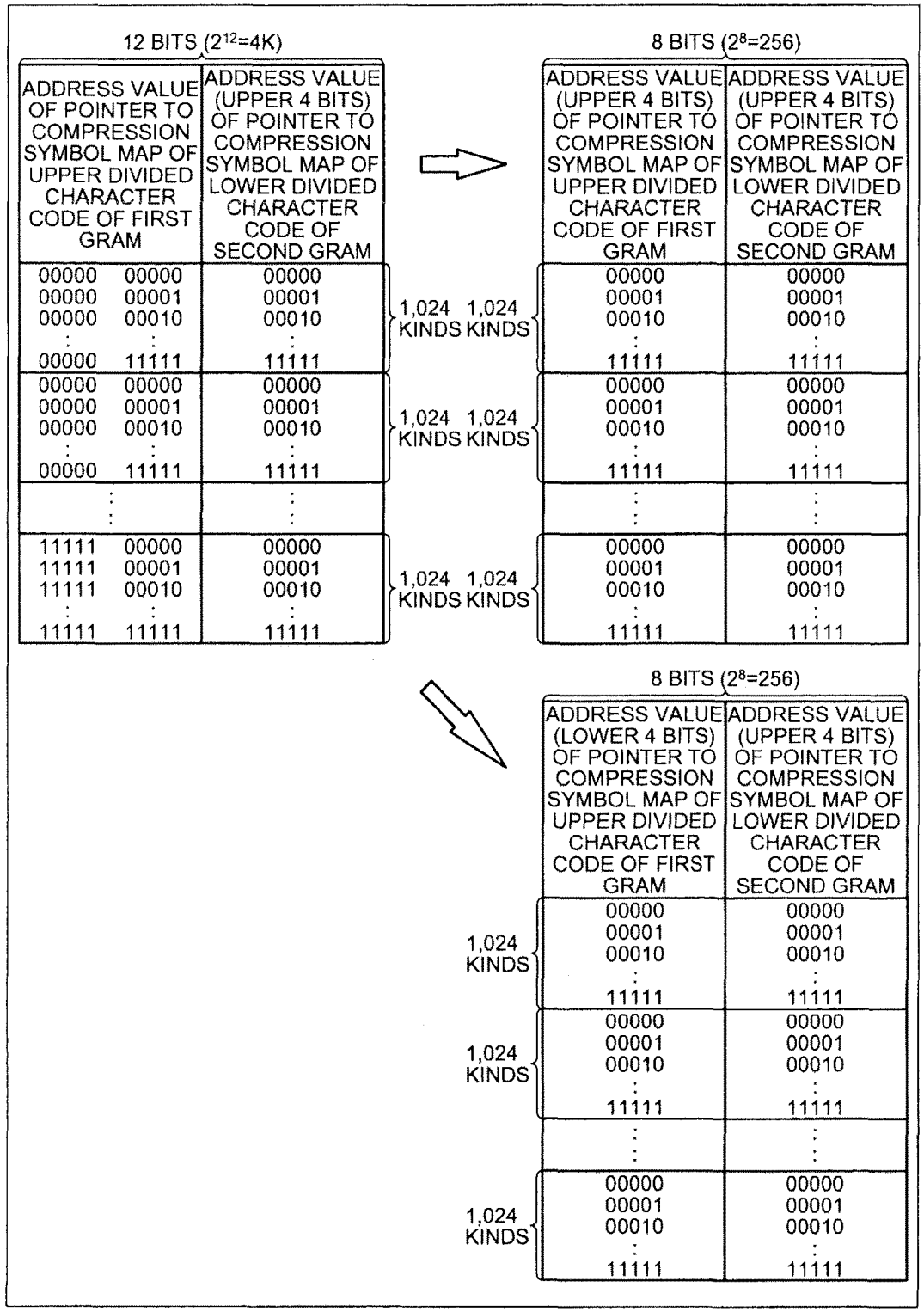
Figure 42I:
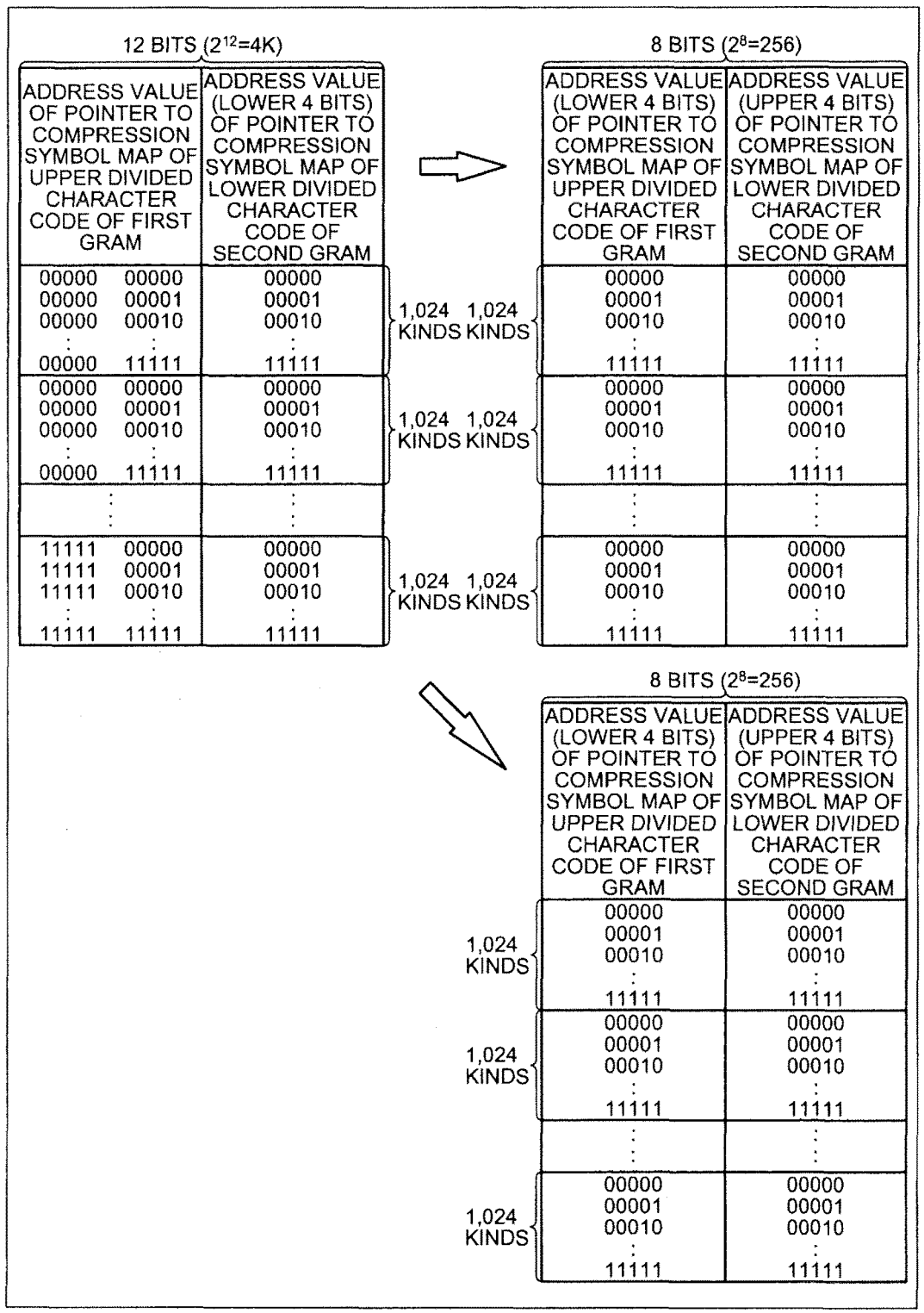
Figure 42J:
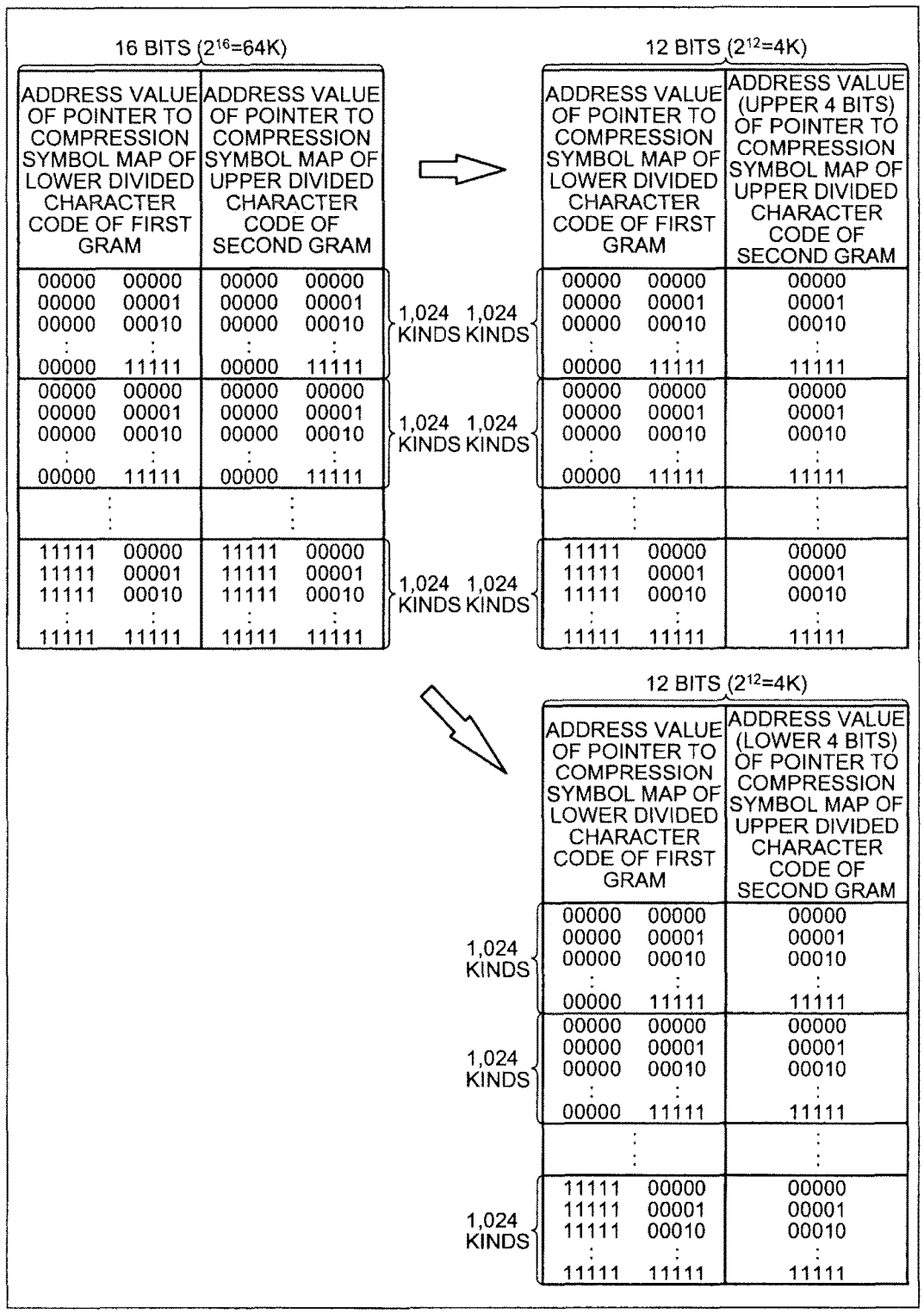
Figure 42K:
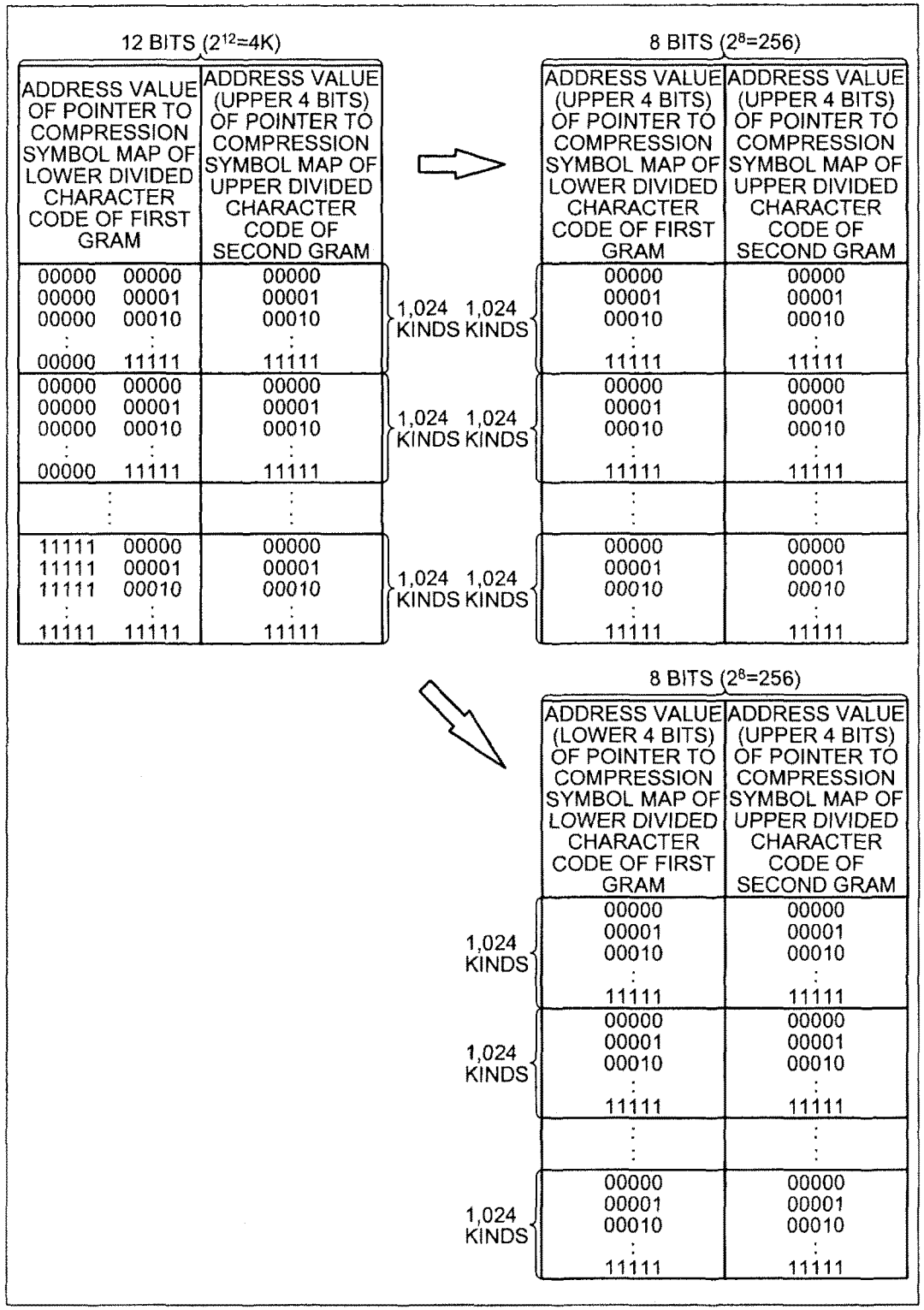
Figure 42L:
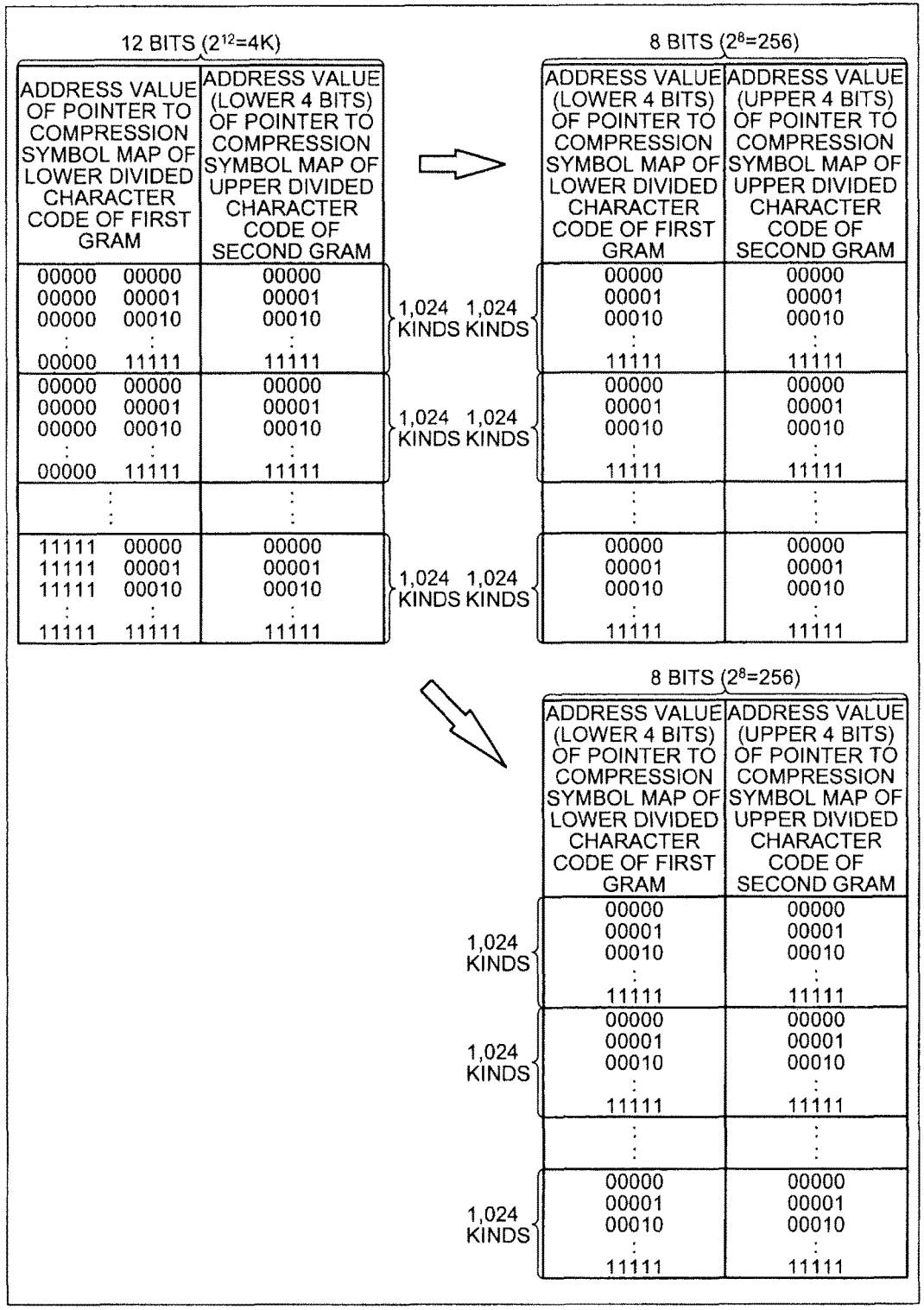
Figure 42M:
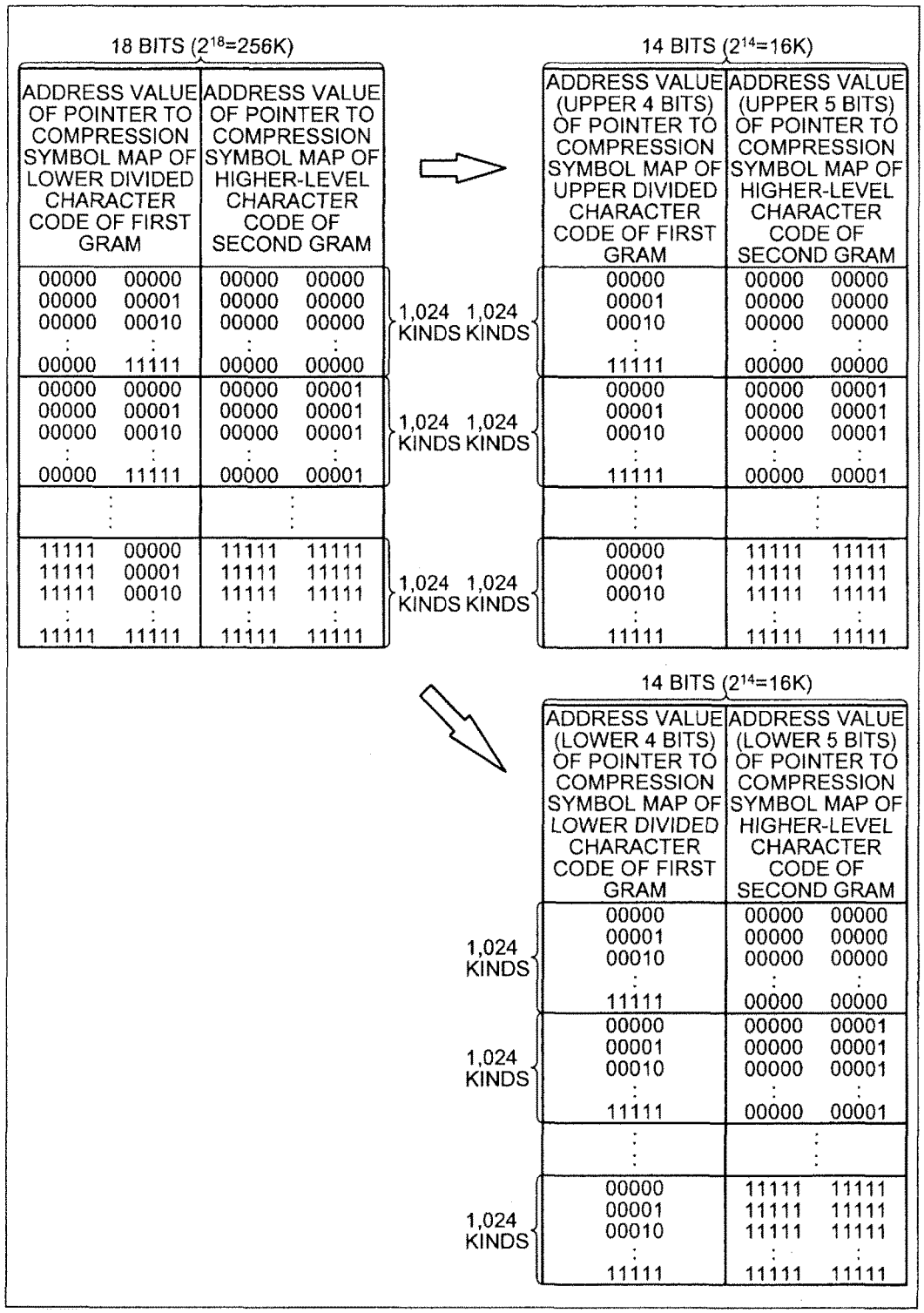
Figure 42N:
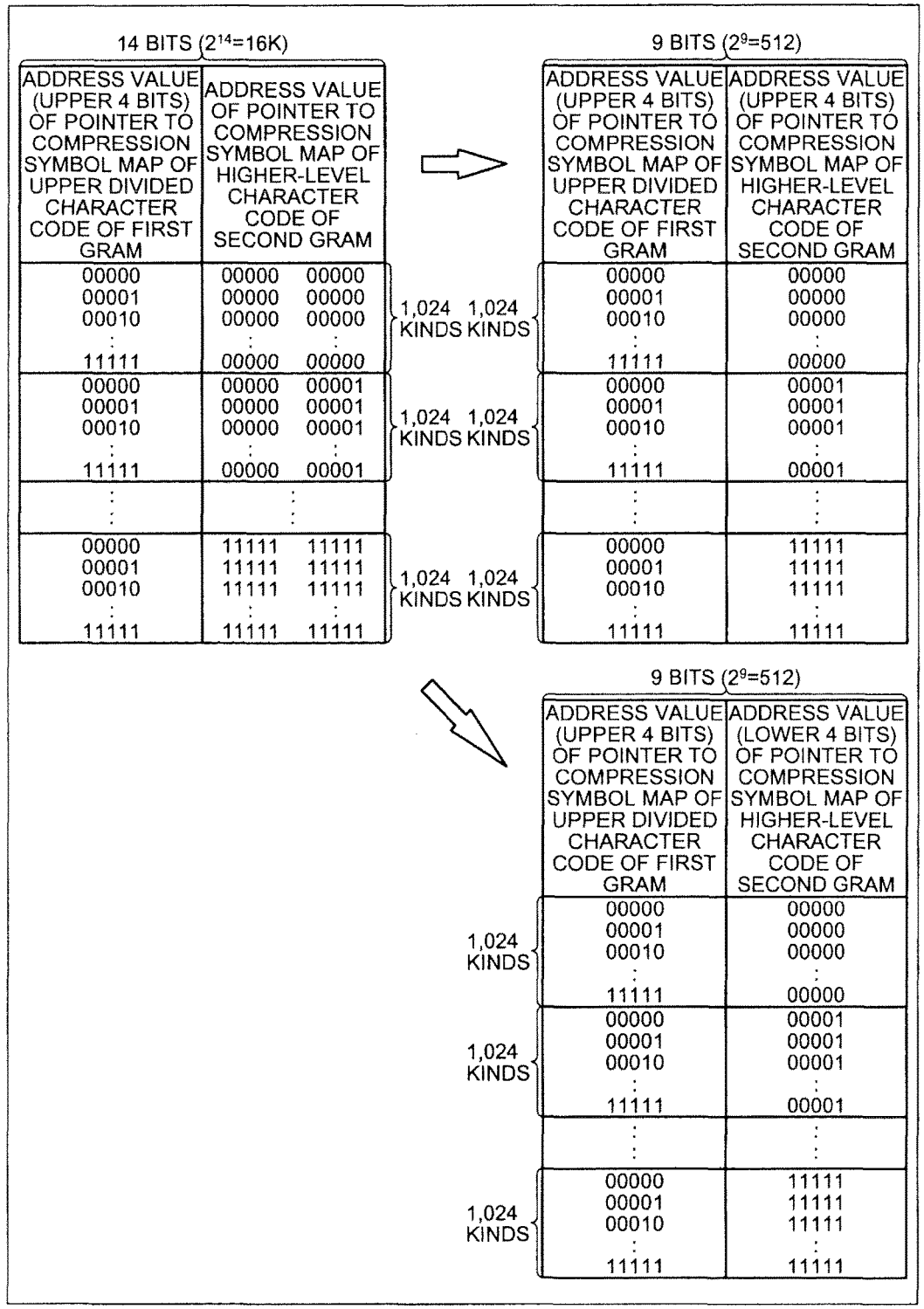
Figure 42O:
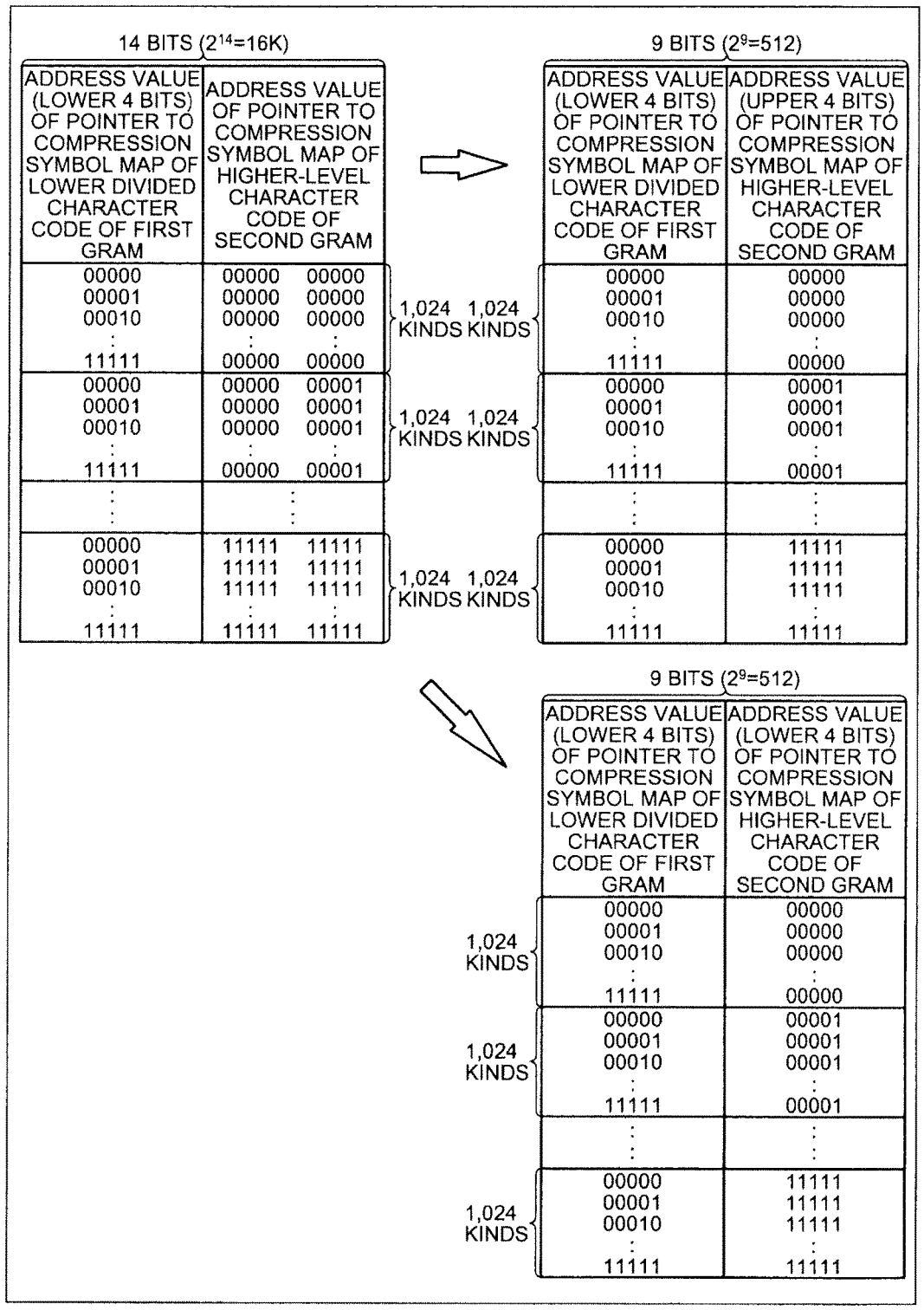

FIGS. 42A to 42O are explanatory diagrams of exemplary dividing of the pointer to the two-gram compression symbol map. FIG. 42A depicts the exemplary dividing into two of a pointer string to the compression symbol map of a two-gram higher-level character code. In FIG. 42A, an address value of the pointer to the compression symbol map of the higher-level character code of the second gram is divided into an upper five bits and a lower five bits. FIG. 42A depicts the exemplary dividing that corresponds to (B) of FIG. 40.

FIGS. 42B and 42C depict the exemplary dividing of the pointer string to the compression symbol map of the two-gram higher-level character code that is divided in FIG. 42A. FIGS. 42B and 42C depict the exemplary dividing that corresponds to (C) of FIG. 40.

FIG. 42D depicts the exemplary dividing into two of the pointer string to the compression symbol map of the higher-level character code and the upper divided character codes. In FIG. 42D, the address value of the pointer to the compression symbol map of the upper divided character code of the second gram is divided into an upper four bits and a lower four bits. FIG. 42D depicts the exemplary dividing that corresponds to (B) of FIG. 40.

FIGS. 42E and 42F depict the exemplary dividing of the pointer string to the compression symbol map of the higher-level character code and the upper divided character code that are divided as in FIG. 42D. FIGS. 42E and 42F depict the exemplary dividing that corresponds to (C) of FIG. 40.

FIG. 42G depicts the exemplary dividing into two of the pointer string to the compression symbol map of the upper divided character code and the lower divided character code. In FIG. 42G, the address value of the pointer to the compression symbol map of the lower divided character code of the second gram is divided into an upper four bits and a lower four bits. FIG. 42G depicts the exemplary dividing that corresponds to (B) of FIG. 40.

FIGS. 42H and 42I depict the exemplary dividing of the pointer string to the compression symbol map of the upper divided character code and the lower divided character code that are divided as in FIG. 42G. FIGS. 42H and 42I depict the exemplary dividing that corresponds to (C) of FIG. 40.

FIG. 42J depicts the exemplary dividing into two of the pointer string to the compression symbol map of the lower divided character code and the upper divided character code. In FIG. 42J, the address value of the pointer to the compression symbol map of the upper divided character code of the second gram is divided into an upper four bits and a lower four bits. FIG. 42J depicts the exemplary dividing that corresponds to (B) of FIG. 40.

FIGS. 42K and 42L depict the exemplary dividing of the pointer string to the compression symbol map of the lower divided character code and the upper divided character code that are divided as in FIG. 42J. FIGS. 42K and 42L depict the exemplary dividing that corresponds to (C) of FIG. 40.

FIG. 42M depicts the exemplary dividing into two of the pointer string to the compression symbol map of the lower divided character code and the higher-level character code. In FIG. 42M, the address value of the pointer to the compression symbol map of the higher-level character code of the second gram is divided into an upper five bits and a lower five bits. FIG. 42M depicts the exemplary dividing that corresponds to (B) of FIG. 40.

FIGS. 42N and 42O depict the exemplary dividing of the pointer string to the compression symbol map of the lower divided character code and the higher-level character code that are divided as in FIG. 42M. FIGS. 42N and 42O depict the exemplary dividing that corresponds to (C) of FIG. 40.

FIGS. 43A to 43AF are explanatory diagrams of specific examples of the consecutive-gram divided map. For the x-gram head-and-tail divided map, simply, the first gram is the gram at the head and the second gram is the gram at the tail. Therefore, the map configuration thereof is same and therefore, will not again be described.

FIGS. 43A to 43D are explanatory diagrams of the consecutive-gram divided map for the dividing into four obtained when the consecutive grams are all higher-level character codes. FIG. 43A depicts a case of a combination including the first and the second grams that are both the upper five bits. FIG. 43B depicts a case of the combination including the first gram that is the upper five bits and the second gram that is the lower five bits. FIG. 43C depicts a case of the combination including the first gram that is the lower five bits and the second gram that is the upper five bits. FIG. 43D depicts a case of the combination including the first gram that is the lower five bits and the second gram that is the lower five bits.

FIGS. 43E to 43H are explanatory diagrams of consecutive-gram divided maps for the dividing into four obtained when the first gram is a higher-level character code and the second gram is an upper divided character code. FIG. 43E depicts a case of the combination including the first gram that is the upper five bits and the second gram that is the upper four bits. FIG. 43F depicts a case of the combination including the first gram that is the upper five bits and the second gram that is the lower four bits. FIG. 43G depicts a case of the combination including the first gram that is the lower five bits and the second gram that is the upper four bits. FIG. 43H depicts a case of the combination including the first gram that is the lower five bits and the second gram that is the lower four bits.

FIGS. 43I to 43L are explanatory diagrams of consecutive-gram divided maps for the dividing into four obtained when the first gram is an upper divided character code and the second gram is a lower divided character code. FIG. 43I depicts a case of the combination including the first gram that is the upper four bits and the second gram that is the upper four bits. FIG. 43J depicts a case of the combination including the first gram that is the upper four bits and the second gram that is the lower four bits. FIG. 43K depicts a case of the combination including the first gram that is the lower four bits and the second gram that is the upper four bits. FIG. 43L depicts a case of the combination including the first gram that is the lower four bits and the second gram that is the lower four bits.

FIGS. 43M to 43P are explanatory diagrams of consecutive-gram divided maps for the dividing into four obtained when the first gram is a lower divided character code and the second gram is a higher-level character code. FIG. 43M depicts a case of the combination including the first gram that is the upper four bits and the second gram that is the upper five bits. FIG. 43N depicts a case of the combination including the first gram that is the upper four bits and the second gram that is the lower five bits. FIG. 43O depicts a case of the combination including the first gram that is the lower four bits and the second gram that is the upper five bits. FIG. 43P depicts a case of the combination including the first gram that is the lower four bits and the second gram that is the lower five bits.

A consecutive-gram divided map will be described that is used when a forward search or a reverse search is executed. Hereinafter, a consecutive-gram divided map used for a forward search is referred to as "forward search divided map" and that used for a reverse search is referred to as "reverse search divided map". In the file Fp, words such as those in a headline may each be marked off with a ", (comma)" or a "(space)" or the character next to ")" may be at the head. Therefore, when a forward search or a reverse search is executed, the search is executed using search keywords, each of which is appended with a special character (higher-level character code) such as a ", (comma)" or a "(space)".

FIGS. 43Q to 43X are explanatory diagrams of specific examples of the forward search divided map. When a forward search divided map is generated, the consecutive-gram divided maps, each including the first gram that is a higher-level character code of a special character are extracted from the consecutive-gram divided maps depicted in FIGS. 43A to 43P and thereby, the forward search divided map is generated.

FIGS. 43Y to 43AF are explanatory diagrams of specific examples of the reverse search divided map. When a reverse search divided map is generated, the consecutive-gram divided maps, each including the second gram that is a higher-level character code of a special character are extracted from the consecutive-gram divided maps depicted in FIGS. 43A to 43P and thereby, the reverse search divided map is generated.

A special character that discontinues the continuity of a character string such as a ", (comma)" or a "(space)" is virtually regarded as a "marking-off character" and is allocated with an extended-character code of "UTF16". The 1,024 kinds of higher-level character codes of the consecutive-gram division map are expanded and the special character is allocated to the 1,035th position of the higher-level character codes. Thereby, the forward search divided map or the reverse search divided map can be substituted (omitted).

Exemplary generation of the consecutive-gram division map and the x-gram head-and-tail divided map by the compression symbol map identifying unit 3206 and the compression symbol map updating unit 3207 will be described.

Figure 44A:
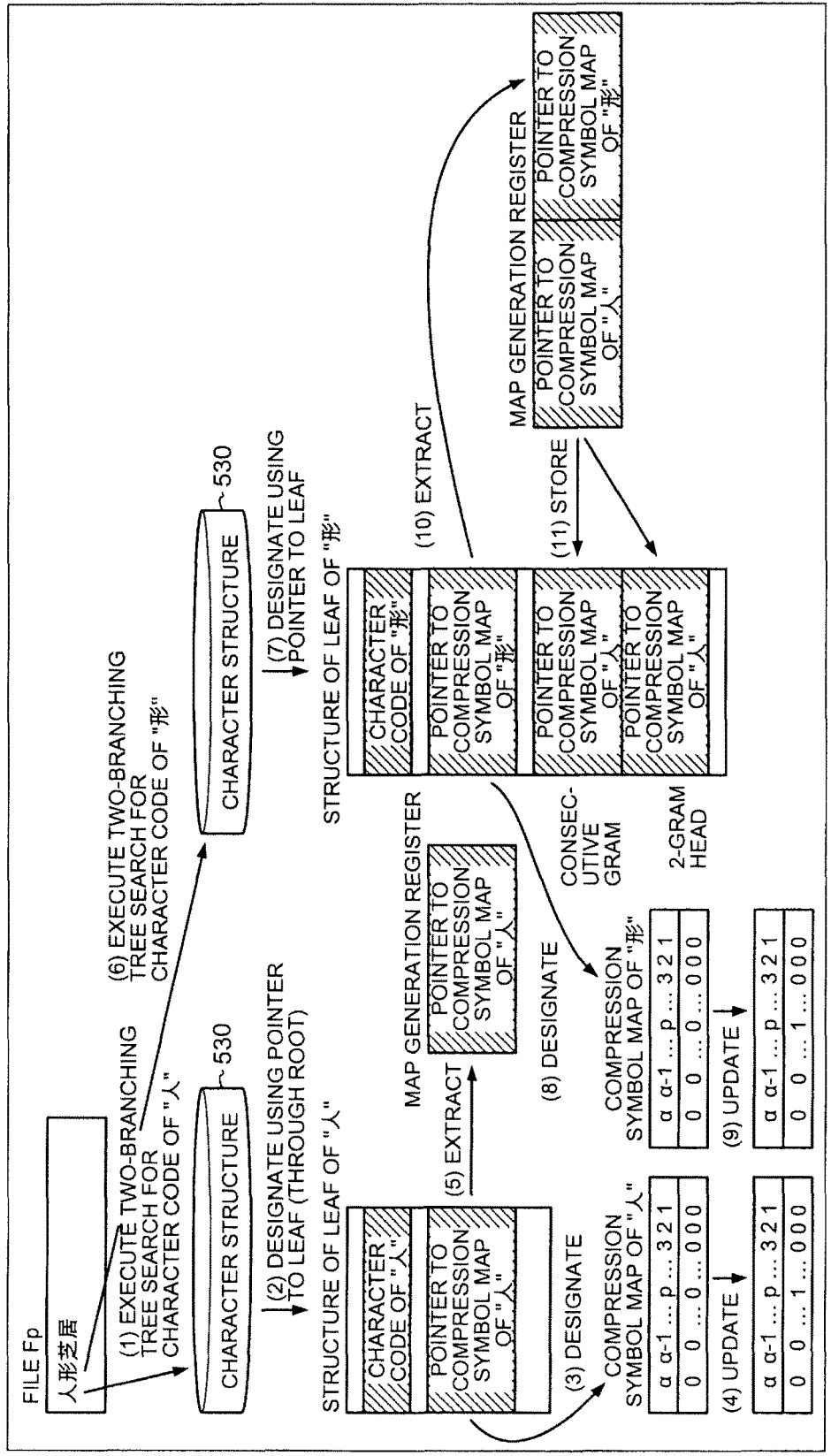

FIGS. 44A to 44I are explanatory diagrams of exemplary generation of the consecutive-gram divided map and the x-gram head-and-tail divided map. In FIG. 44A, a character string "人形芝居" is described in the file Fp. Each of "人", "形", and "居" of the character string "人形芝居" becomes a higher-level character code and "芝" becomes a divided character code and therefore, the character string "人形芝居" becomes a five-gram character code string.

(1) The two-branching tree search is executed for the character code of "人" at the head by the compressing unit 3200. (2) The character code of "人" is detected in the character structure 530, and the structure of a leaf L# that includes the character code of "人" is designated by the pointer to the leaf. (3) The compression symbol map M of "人" is designated by the pointer to the compression symbol map of "人". (4) If the bit of the file number p is "0", the bit is updated to "1".

(5) The pointer to the compression symbol map of "人" is extracted from the structure of the leaf L# that includes the character code of "人". The pointer to the compression symbol map of "人" is stored in a map generation register.

(6) Similar to the (1) above, the two-branching tree search is executed for the character codes of "形" and "人". (7) The character code of "形" is detected in the character structure 530, and the structure of a leaf L# that includes the character code of "形" is designated by the pointer to the leaf. (8) The compression symbol map M of "形" is designated by the pointer to the compression symbol map of "形". (9) If the bit of the file number p is "0", the bit is updated to "1".

(10) The pointer to the compression symbol map of "形" is extracted from the structure of the leaf L# that includes the character code of "形". The pointer to the compression symbol map of "形" is stored in the map generation register together with the pointer to the compression symbol map of "人".

(11) The pointer to the compression symbol map of "人" is stored in a blank area of the structure of the leaf L# that includes the character code of "形". More specifically, the pointer to the compression symbol map of "人" is stored in a consecutive-gram area, and is also stored in a two-gram head-and-tail area.

Figure 44B:
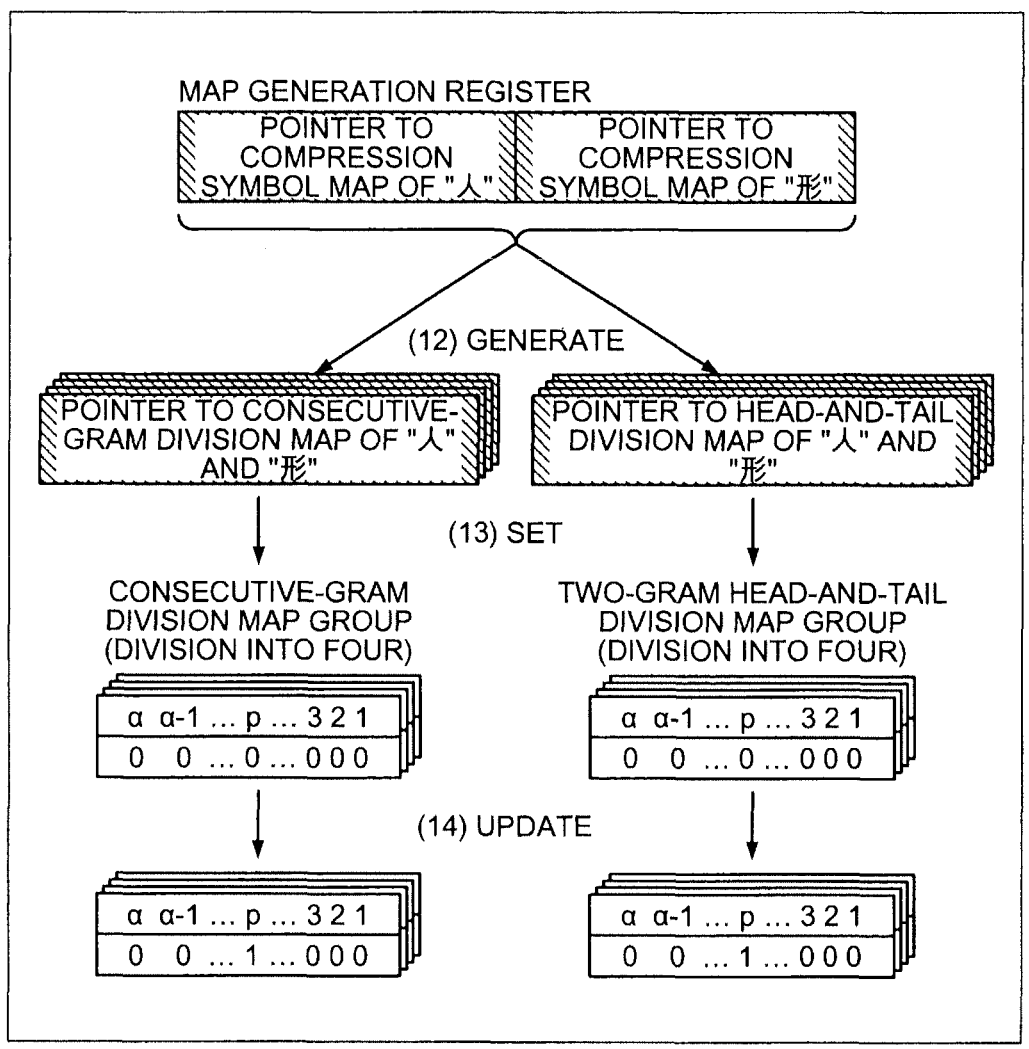

In FIG. 44B, a consecutive-gram divided map group and a two-gram head-and-tail divided map group are generated as indicated by (12) to (14).

(12) A pointer to a consecutive-gram divided map of "人" and "形" is generated using the pointers to the compression symbol maps of "人" and "形" currently stored in the map generation register. In this case, to divide into four as depicted in (C) of FIG. 40, four kinds of pointers to the consecutive-gram divided map of "人" and "形" are generated. Similarly, four kinds of pointers to the head-and-tail divided map of "人" and "形" are generated.

(13) A consecutive-gram divided map is set for each of the pointers to the consecutive-gram division map of "人" and "形". If the consecutive-gram division maps have already been set at the time of compression of another character, the corresponding consecutive-gram division map is designated by the pointer to the consecutive-gram division map. Similarly, a two-gram head-and-tail divided map is set for each of the pointers to the two-gram head-and-tail divided map of "人" and "形". If the two-gram head-and-tail divided maps have already been set at the time of compression of another character, the corresponding two-gram head-and-tail divided map is designated by the pointer to the two-gram head-and-tail divided map.

(14) If the bit of the file number p is "0" in the consecutive-gram divided map group and the two-gram head-and-tail divided map group, the bit is updated to "1".

Figure 44C:
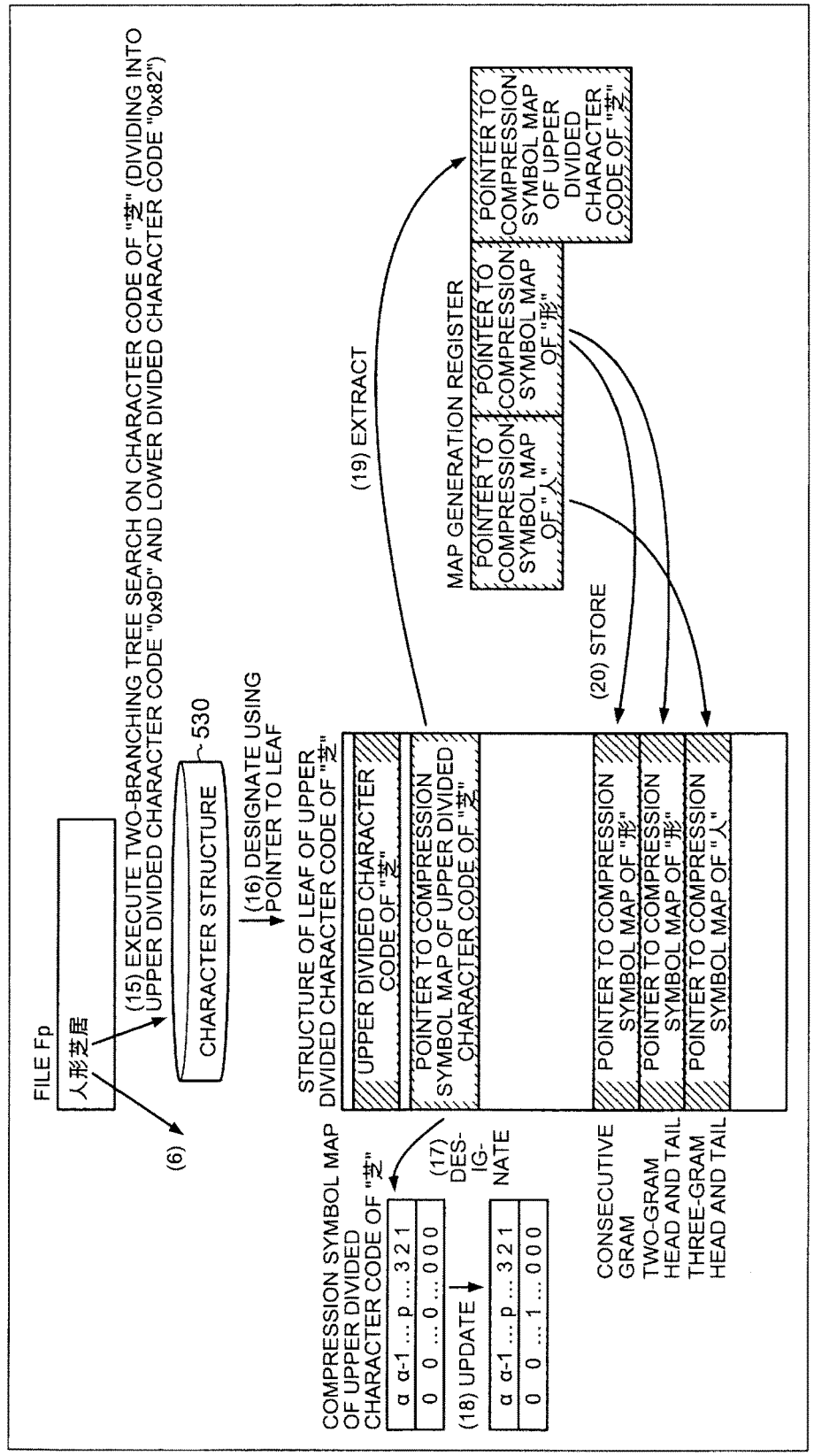

In FIG. 44C, (15) the compressing unit 3200 executes the two-branching search for the character code of "芝". The appearance frequency of "芝" is lower than 1,024 and therefore, the character code "0x9D82" of "芝" is divided into the upper divided character code "0x9D" and the upper divided character code "0x82" thereof.

(16) The upper divided character code "0x9D" is detected in the character structure 530 and the structure of the leaf L# that includes the upper divided character code "0x9D" is designated by the pointer to the leaf. (17) The compression symbol map M of the upper divided character code "0x9D" of "芝" is designated by the pointer to the compression symbol map of the upper divided character code "0x9D" of "芝". (18) If the bit of the file number p is "0", the bit is updated to "1".

(19) The pointer to the compression symbol map of the upper divided character code "0x9D" of "芝" is extracted from the structure of the leaf L# that includes the upper divided character code "0x9D" of "芝". The pointer to the compression symbol map of "芝" is stored in the map generation register.

(20) The pointer to the compression symbol map of "形" is stored in a blank area of the structure of the leaf L# that includes the character code of "形". More specifically, the pointer to the compression symbol map of "形" is stored in the consecutive-gram area, and is also stored in the two-gram head-and-tail area.

Figure 44D:
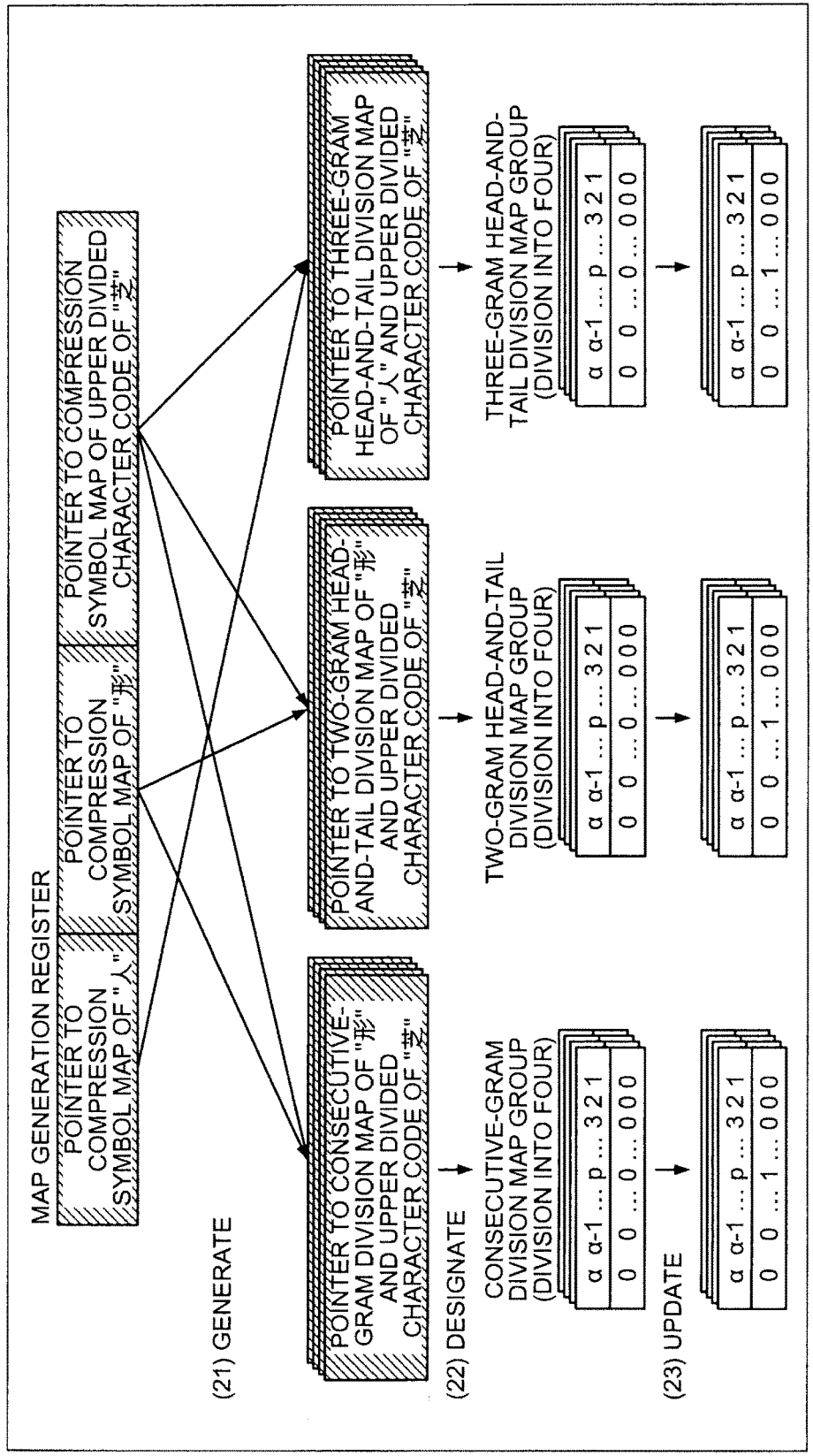

In FIG. 44D, the map generation register stores therein the pointer to the compression symbol map of "人", the pointer to the compression symbol map of "形", and the pointer to the compression symbol map of the upper divided character code "0x9D" of "芝".

(21) A pointer group to the consecutive-gram divided map, a pointer group to the two-gram head-and-tail divided map, and a pointer group to a three-gram head-and-tail divided map are generated. More specifically, a consecutive-gram division map group of "形" and the upper divided character code "0x9D" of "芝" is generated via the pointers to the compression symbol map of "形" and the pointers to the compression symbol map of the upper divided character code "0x9D" of "芝".

A two-gram head-and-tail divided map group of "形" and the upper divided character code "0x9D" of "芝" is generated via the pointer to the compression symbol map of "形" and the pointers to the compression symbol map of the upper divided character code "0x9D" of "芝". Similarly, a three-gram head-and-tail divided map group of "人" and the upper divided character code "0x9D" of "芝" is generated via the pointers to the compression symbol map of "人" and the pointers to the compression symbol map of the upper divided character code "0x9D" of "芝".

(22) Designation is executed by the pointer group to each of the divided maps generated at (21). More specifically, the consecutive-gram divided map group of "形" and the upper divided character code "0x9D" of "芝" is designated by the pointer group to the consecutive-gram divided map group of "形" and the upper divided character code "0x9D" of "芝".

The two-gram head-and-tail divided map group of "形" and the upper divided character code "0x9D" of "芝" is designated by the pointer to the two-gram head-and-tail divided map group of "形" and the upper divided character code "0x9D" of "芝". Similarly, the three-gram head-and-tail divided map group of "人" and the upper divided character code "0x9D" of "芝" is designated by the pointer to the three-gram head-and-tail divided map group of "人" and the upper divided character code "0x9D" of "芝".

(23) If the bit of the file number p for the divided map group designated at (22) is "0", the bit is updated to "1". More specifically, if the bit of the file number p is "0" in the consecutive-gram divided map group of "形" and the upper divided character code "0x9D" of "芝", the bit is updated to "1".

If the bit of the file number p is "0" in the two-gram head-and-tail divided map group of "形" and the upper divided character code "0x9D" of "芝", the bit is updated to "1". Similarly, if the bit of the file number p is "0" in the three-gram head-and-tail divided map group of "人" and the upper divided character code "0x9D" of "芝", the bit is updated to "1".

Figure 44E:
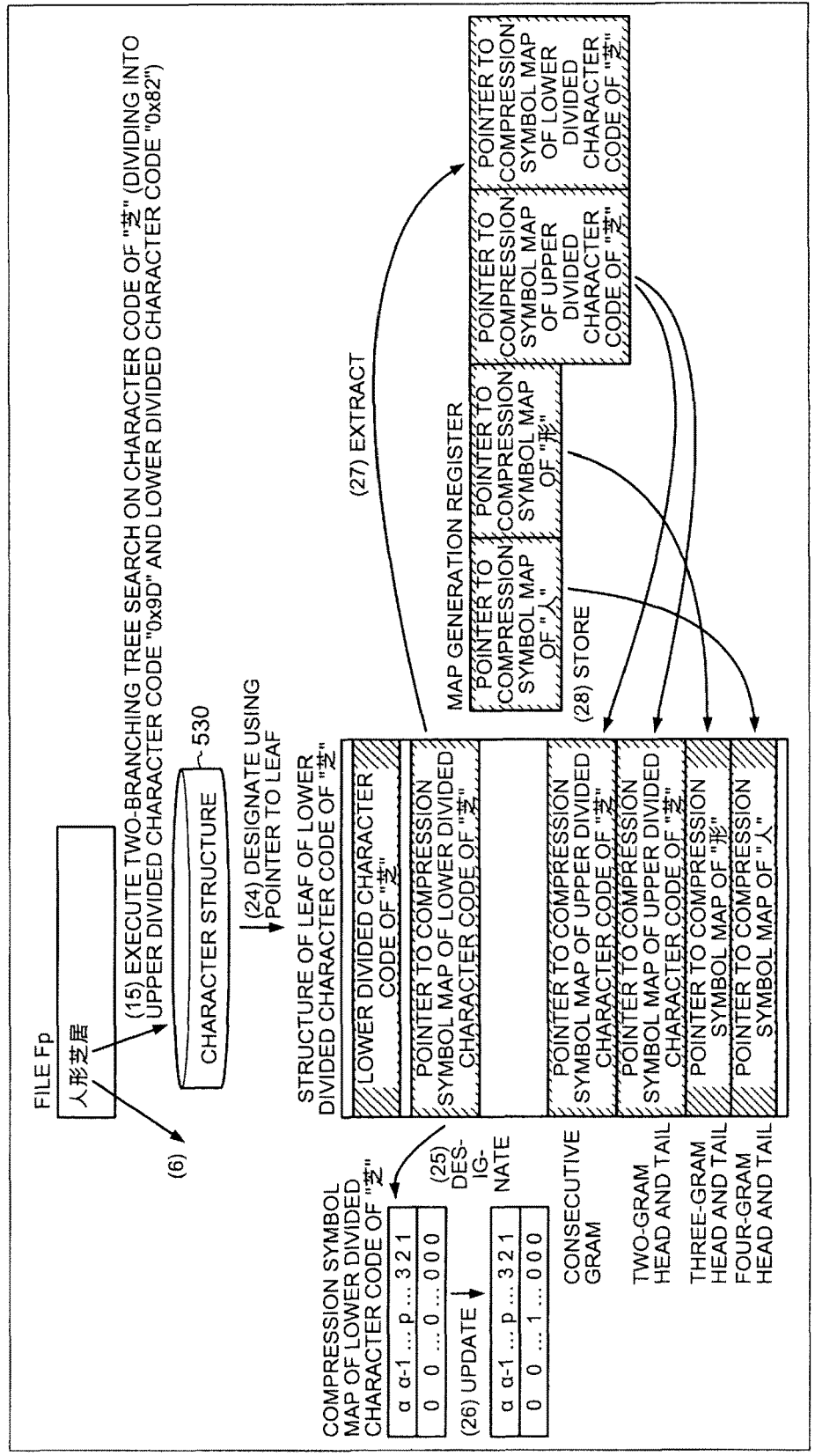

In FIG. 44E, after the detection of the upper divided character code "0x9D", (24) the lower divided character code "0x82" is detected in the character structure 530 and the structure of the leaf L# that includes the lower divided character code "0x82" is designated by the pointer to the leaf.

(25) A compression symbol map M of the lower divided character code "0x82" of "芝" is designated by the pointer to the compression symbol map of the lower divided character code "0x82" of "芝". (26) If the bit of the file number p is "0", the bit is updated to "1".

(27) The pointer to the compression symbol map of the lower divided character code "0x92" of "芝" is extracted from the structure of the leaf L# that includes the lower divided character code "0x82" of "芝". The pointer to the compression symbol map of "人" is stored in the map generation register.

(28) The pointers stored in the map generation register are stored in a blank area of the structure of the leaf L# that includes the lower divided character code "0x82" of "芝". More specifically, the pointers to the compression symbol map of the lower divided character code "0x82" of "芝" are stored in the consecutive-gram area. The pointers to the compression symbol map of the lower divided character code "0x82" of "芝" are stored in the two-gram head-and-tail area. The pointers to the compression symbol map of "形" are stored in the three-gram head-and-tail area. The pointers to the compression symbol map of "人" are stored in a four-gram head-and-tail area.

In FIG. 44F, the map generation register stores therein the pointers to the compression symbol maps of "人", the upper divided character code "0x9D" of "芝", and the lower divided character code "0x82" of "芝".

(29) Pointer groups to the consecutive-gram division map, the two-gram head-and-tail division map, the three-gram head-and-tail division map, and the four-gram head-and-tail division map are generated.

More specifically, a consecutive-gram division map group is generated of the upper divided character code "0x9D" and the lower divided character code "0x82" of "芝" via the pointers to the compression symbol maps of the upper divided character code "0x9D" and the lower divided character code "0x82" of "芝".

A two-gram head-and-tail division map group is generated of the upper divided character code "0x9D" and the lower divided character code "0x82" of "芝" via the pointers to the compression symbol maps of the upper divided character code "0x9D" and the lower divided character code "0x82" of "芝".

Similarly, a three-gram head-and-tail divided map group is generated of "形" and the lower divided character code "0x82" of "芝" via the pointers to the compression symbol maps of "形" and the lower divided character code "0x82" of "芝".

Further, a four-gram head-and-tail divided map group is generated of "人" and the lower divided character code "0x82" of "芝" via the pointers to the compression symbol maps of "人" and the lower divided character code "0x82" of "芝".

(30) Designation is executed by the pointer groups to the division maps generated at (29). More specifically, the consecutive-gram divided map group of the upper divided character code "0x9D" and the lower divided character code "0x82" of "芝" is designated by the pointers to the consecutive-gram divided map group of the upper divided character code "0x9D" and the lower divided character code "0x82" of "芝".

The two-gram head-and-tail divided map group of the upper divided character code "0x9D" and the lower divided character code "0x82" of "芝" is designated by the pointers to the two-gram head-and-tail divided map group of the upper divided character code "0x9D" and the lower divided character code "0x82" of "芝".

Similarly, the three-gram head-and-tail divided map group of "形" and the lower divided character code "0x82" of "芝" is designated by the pointers to the three-gram head-and-tail divided map group of "形" and the lower divided character code "0x82" of "芝".

Further, the four-gram head-and-tail divided map group of "人" and the lower divided character code "0x82" of "芝" is designated by the pointers to the three-gram head-and-tail divided map group of "人" and the lower divided character code "0x82" of "芝".

(31) If the bit of the file number p for the divided map group designated at (30) is "0", the bit is updated to "1". More specifically, if the bit of the file number p is "0" in the consecutive-gram divided map group of the upper divided character code "0x9D" and the lower divided character code "0x82" of "芝", the bit is updated to "1".

If the bit of the file number p is "0" in the two-gram head-and-tail divided map group of the upper divided character code "0x9D" and the lower divided character code "0x82" of "芝", the bit is updated to "1".

Similarly, if the bit of the file number p is "0" in the three-gram head-and-tail divided map group of "形" and the lower divided character code "0x82" of "芝", the bit is updated to "1"; and if the bit of the file number p is "0" in the four-gram head-and-tail divided map group of the lower divided character code "0x82" of "人" and "芝", the bit is updated to "1".

In FIG. 44G, (32) the compression unit 3200 executes the two-branching tree search for the character code of "居". (33) The character code of "居" is detected in the character structure 530, and the structure of the leaf L# that includes the character code of "居" is designated by the pointer to the leaf. (34) The compression symbol map M of "居" is designated by the pointer to the compression symbol map of "居". (35) If the bit of the file number p is "0", the bit is updated to "1".

(36) The pointer to the compression symbol map of "居" is extracted from the structure of the leaf L# of "居". The pointer to the compression symbol map of "居" is stored in the map generation register.

(37) The pointers stored in the map generation register are stored to a blank area of the structure of the leaf L# of "居". More specifically, the pointers to the compression symbol map of the lower divided character code "0x82" of "芝" are stored in the consecutive-gram area. The pointers to the compression symbol map of the lower divided character code "0x82" of "芝" are stored in the two-gram head-and-tail area. The pointers to the compression symbol map of the upper divided character code "0x9D" of "芝" are stored in the three-gram head-and-tail area. The pointers to the compression symbol map of "形" are stored in the four-gram head-and-tail area. The pointers to the compression symbol map of "人" are stored in a five-gram head-and-tail area.

In FIG. 44H, the map generation register stores therein the pointers to the compression symbol maps of "人", "形", the upper divided character code "0x9D" of "芝", the lower divided character code "0x82" of "芝", and "居".

(38) Pointer groups to the consecutive-gram divided map, the two-gram head-and-tail divided map, the three-gram head-and-tail divided map, the four-gram head-and-tail divided map, and the five-gram head-and-tail divided map are generated. The pointer groups to the four-gram head-and-tail divided map and the five-gram head-and-tail divided map will be described later with reference to FIG. 44I.

More specifically, a consecutive gram divided map group is generated of the lower divided character code "0x82" of "芝" and "居" via the pointer to the compression symbol map of the lower divided character code "0x82" of "芝" and the pointer to the compression symbol map of "居".

Further, a two-gram head-and-tail map divided map group is generated of the lower divided character code "0x82" of "芝" and "居" via the pointer to the compression symbol map of the lower divided character code "0x82" of "芝" and the pointer to the compression symbol map of "居".

Similarly, a three-gram head-and-tail map divided map group is generated of the upper divided character code "0x9D" of "芝" and "居" via the pointer to the compression symbol map of the upper divided character code "0x9D" of "芝" and the pointer to the compression symbol map of "居".

(39) Designation is executed by the pointer group to each of the division maps generated at (38). More specifically, the consecutive-gram divided map group of the upper divided character code "0x9D" of "芝" and "居" is designated by the pointers to the consecutive-gram divided map group of the upper divided character code "0x9D" of "芝" and "居".

The two-gram head-and-tail divided map group of the lower divided character code "0x82" of "芝" and "居" is designated by the pointers to the two-gram head-and-tail divided map group of the lower divided character code "0x82" of "芝" and "居".

Similarly, the three-gram head-and-tail divided map group of the upper divided character code "0x9D" of "芝" and "居" is designated by the pointers to the three-gram head-and-tail divided map group of the upper divided character code "0x9D" of "芝" and "居".

(40) If the bit of the file number p for the divided map group designated at (39) is "0", the bit is updated to "1". More specifically, if the bit of the file number p is "0" in the consecutive-gram divided map group of the upper divided character code "0x9D" of "芝" and "居", the bit is updated to "1".

If the bit of the file number p is "0" in the two-gram head-and-tail divided map group of the lower divided character code "0x82" of "芝" and "居", the bit is updated to "1". Similarly, if the bit of the file number p is "0" in the tree-gram head-and-tail divided map group of the upper divided character code "0x9D" of "芝" and "居", the bit is updated to "1".

In FIG. 44I, (41) pointer groups to the four-gram head-and-tail divided map and the five-gram head-and-tail divided map are generated. More specifically, the four-gram head-and-tail divided map group of "形" and "居" is generated via the pointers to the compression symbol maps of "形" and "居". Similarly, the five-gram head-and-tail divided map group of "人" and "居" is generated via the pointers to the compression symbol maps of "人" and "居".

Designation is executed by the pointer groups to the division maps generated at (41). More specifically, the four-gram head-and-tail divided map group of "形" and "居" is designated by the pointers to the four-gram head-and-tail divided map group of "形" and "居". The five-gram head-and-tail divided map group of "人" and "居" is designated by the pointers to the five-gram head-and-tail divided map group of "人" and "居".

(43) If the bit of the file number p for the division map group designated at (42) is "0", the bit is updated to "1". More specifically, if the bit of the file number p is "0" in the four-gram head-and-tail divided map group of "形" and "居", the bit is updated to "1". If the bit of the file number p is "0" in the five-gram head-and-tail divided map group of "人" and "居", the bit is updated to "1".

As described, for the consecutive grams, the pointer to the compression symbol map of the preceding gram is stored in the structure of the leaf L# of the succeeding gram. The pointer to the compression symbol map of the head gram that is at the head with respect to a given tail gram is stored in the structure of the leaf L# that is the given tail gram. Thereby, in executing the searching process, the pointer to the consecutive-gram divided map can be generated by extracting the pointers to the compression symbol maps of the preceding gram and the succeeding gram from the structure of the leaf L#. Therefore, the consecutive-gram divided map can be accessed by the pointer.

Similarly, in executing the searching process, the pointer to the x-gram head-and-tail divided map can be generated by extracting the pointers to the compression symbol maps of the head gram and the tail gram from the structure of the leaf L#. Therefore, the x-gram head-and-tail divided map can be accessed via the pointer. The state of the storage of the pointers in the map generation register in FIGS. 44A to 44I will be described.

Figure 44J:
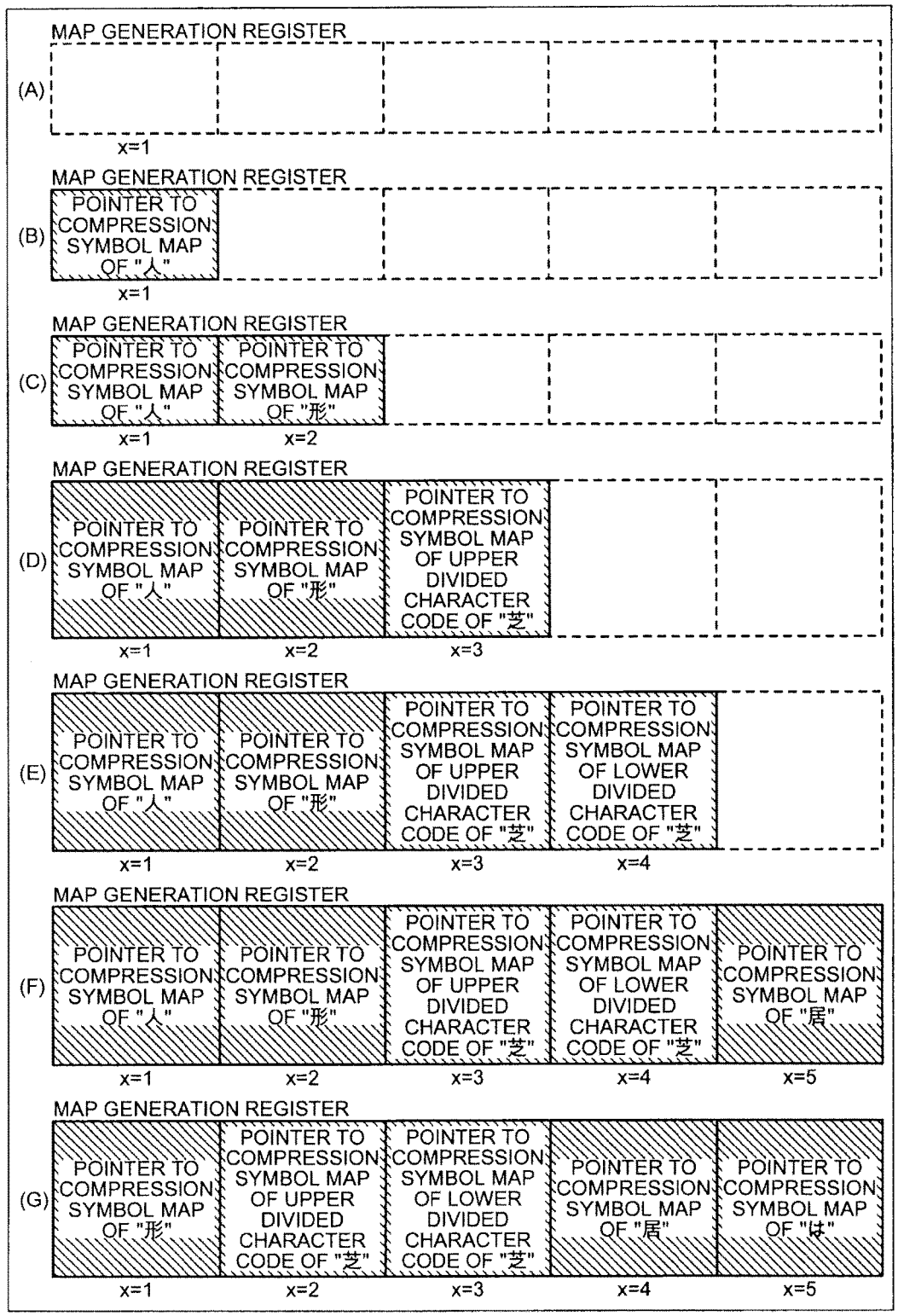
FIG. 44J is an explanatory diagram of the state of the storage of the pointers in the map generation register in FIGS. 44A to 44I.

FIG. 44J is an explanatory diagram of the state of the storage of the pointers in the map generation register in FIGS. 44A to 44I. Areas corresponding to x grams are set in the map generation register. The example adopts "x", where x=5. (A) of FIG. 44J depicts the initial state of the register and the register is empty.

In (B), the pointer to the compression symbol map of "人" is stored to an area whose x is x=1. In (C), the pointer to the compression symbol map of "形" is stored in an area whose x is x=2. In (D), the pointer to the compression symbol map of the upper divided character code "0x9D" of "芝" is stored to an area whose x is x=3.

In (E), the pointer to the compression symbol map of the lower divided character code "0x82" of "芝" is stored to an area whose x is x=4. In (F), the pointer to the compression symbol map of "居" is stored to an area whose x is x=5. If a higher-level character code of a character "は" is present after "人形芝居", the pointer to the compression symbol map of "人" at the head is pushed out and the value of x is sequentially shifted to another area whose x is smaller by one. In (G), a pointer to the compression symbol map of "は" is stored in an area that becomes empty and whose x is x=5.

Exemplary generation of the pointer to the consecutive-gram divided map depicted in each of FIGS. 44A to 44I will be described for each combination of the consecutive grams. The pointer to the x-gram head-and-tail division map has the same data structure and therefore, will not again be described.

FIG. 45A is an explanatory diagram of exemplary generation of the pointer to the consecutive-gram divided map that includes higher-level character codes. (A) of FIG. 45A depicts a pointer string to the compression symbol map of "人" and "形". The "symbol category" is an identifier that identifies whether a character code is a higher-level character code or a divided character code. "1" of the symbol category indicates that the character code is a higher-level character code and "0" thereof indicates that the character code is a divided character code.

(B) depicts a pointer to the consecutive-gram divided map that is formed by combining the upper five-bits of each address value of the pointers to the compression symbol maps. (C) depicts a pointer to the consecutive-gram divided map that is formed by combining the upper five bits of the address value of the pointer to the compression symbol map of "人" with the lower five bits of the address value of the pointer to the compression symbol map of "形". (D) depicts a pointer to the consecutive-gram divided map that is formed by combining the lower five bits of the address value of the pointer to the compression symbol map of "人" with the upper five bits of the address value of the pointer to the compression symbol map of "形". (E) depicts a pointer to the consecutive-gram divided map that is formed by combining the lower five bits of each address value of the pointers to the compression symbol maps.

FIG. 45B is an explanatory diagram of exemplary generation of the pointer to the consecutive-gram divided map of a higher-level character code and an upper divided character code. (A) in FIG. 45B depicts an exemplary pointer to the compression symbol map of "形" and the upper divided character code "0x9D" of "芝". An "upper/lower category" is an identifier that identifies an upper divided character code or a lower divided character code when a character code is a divided character code, i.e., when the symbol category is "0". The upper/lower category is allocated with the upper two bits of an address value of 10 bits. An upper/lower category that is "00" indicates an upper character code and "01" indicates a lower character code. Because the upper two bits of the address value are allocated to the upper/lower category, the remaining eight bits of the address value are divided into the upper four bits and the lower four bits.

(B) depicts a pointer to the consecutive-gram divided map, that is formed by combining the upper five bits of the address value of the pointer to the compression symbol map of "形" with the upper four bits of the remaining bits of the address value of the pointer to the compression symbol map of the upper divided character code "0x9D" of "芝".

(C) depicts a pointer to the consecutive-gram divided map, that is formed by combining the upper five bits of the address value of the pointer to the compression symbol map of "彤" with the lower four bits of the remaining bits of the address value of the pointer to the compression symbol map of the upper divided character code "0x9D" of "芝".

(D) depicts a pointer to the consecutive-gram divided map, that is formed by combining the lower five bits of the address value of the pointer to the compression symbol map of "彤" with the lower four bits of the remaining bits of the address value of the pointer to the compression symbol map of the upper divided character code "0x9D" of "芝".

(E) depicts a pointer to the consecutive-gram divided map that is formed by combining the lower five bits of the address value of the pointer to the compression symbol map of "彤" with the lower four bits of the remaining bits of the address value of the pointer to the compression symbol map of the upper divided character code "0x9D" of "芝".

FIG. 45C is an explanatory diagram of exemplary generation of the pointer to the consecutive-gram divided map of an upper divided character code and a lower divided character code. The generation approach of exemplary generation of the pointer to the consecutive-gram map of a lower divided character code and an upper divided character code is same as above and therefore, will not again be described.

In FIG. 45C, (A) depicts a pointer string to the compression symbol map of the upper divided character code "0x9D" and the lower divided character code "0x82" of "芝". (B) depicts a pointer to the consecutive-gram divided map that is formed by combining the upper four bits of the remaining bits of the address value of the pointer to the compression symbol map of the upper divided character code "0x9D" of "芝" with the upper four bits of the remaining bits of the address value of the pointer to the compression symbol map of the lower divided character code "0x82" of "芝".

(C) depicts a pointer to the consecutive-gram divided map that is formed by combining the upper four bits of the remaining bits of the address value of the pointer to the compression symbol map of the upper divided character code "0x9D" of "芝" with the lower four bits of the remaining bits of the address value of the pointer to the compression symbol map of the lower divided character code "0x82" of "芝".

(D) depicts a pointer to the consecutive-gram divided map that is formed by combining the lower four bits of the remaining bits of the address value of the pointer to the compression symbol map of the upper divided character code "0x9D" of "芝" with the upper four bits of the remaining bits of the address value of the pointer to the compression symbol map of the lower divided character code "0x82" of "芝".

(E) depicts a pointer to the consecutive-gram divided map that is formed by combining the lower four bits of the remaining bits of the address value of the pointer to the compression symbol map of the upper divided character code "0x9D" of "芝" with the lower four bits of the remaining bits of the address value of the pointer to the compression symbol map of the lower divided character code "0x82" of "芝".

FIG. 45D is an explanatory diagram of exemplary generation of the pointer to the consecutive-gram divided map of a lower divided character code and a higher-level character code. In FIG. 45D, (A) depicts a pointer string to the compression symbol map of the lower divided character code "0x82" of "芝" and "居".

(B) depicts a pointer to the consecutive-gram divided map that is formed by combining the upper four bits of the remaining bits of the address value of the pointer to the compression symbol map of the lower divided character code "0x82" of "芝" with the upper five bits of the address value of the pointer to the compression symbol map of "居".

(C) depicts a pointer to the consecutive-gram divided map that is formed by combining the upper four bits of the remaining bits of the address value of the pointer to the compression symbol map of the lower divided character code "0x82" of "芝" with the lower five bits of the address value of the pointer to the compression symbol map of "居".

(D) depicts a pointer to the consecutive-gram divided map that is formed by combining the lower four bits of the remaining bits of the address value of the pointer to the compression symbol map of the lower divided character code "0x82" of "芝" with the upper five bits of the address value of the pointer to the compression symbol map of "居".

(E) depicts a pointer to the consecutive-gram divided map that is formed by combining the lower four bits of the remaining bits of the address value of the pointer to the compression symbol map of the lower divided character code "0x82" of "芝" with the lower five bits of the address value of the pointer to the compression symbol map of "居".

As described, for the pointer to each of the consecutive-gram compression symbol maps, the pointers to the four kinds of divided map can be generated by combining the upper bits of the preceding gram with the lower bit of the succeeding gram. When division into two is executed, the address value of the preceding (or the succeeding) gram is not divided while only the address value of the succeeding (or the preceding) gram only has to be divided into upper bits and lower bits and combined.

The compression symbol map generating process is a process that is executed in parallel with the file compressing process depicted in FIGS. 34 and 35. More specifically, with reference to FIG. 34, when the CPU 401 compresses the character code to be compressed, the CPU 401 accesses the structure of the leaf L#. The compression symbol map generating process is executed each time access is made to the structure of the leaf L# during the file compressing process. Thereby, by only scanning the files F once, the compression of the files F and generation of the compression symbol map M of the characters that are present in the file F can simultaneously be executed. Therefore, an increase of the speed of the process can be facilitated. The initial state of the compression symbol map group Ms is as depicted in FIG. 39A.

Figure 46A:
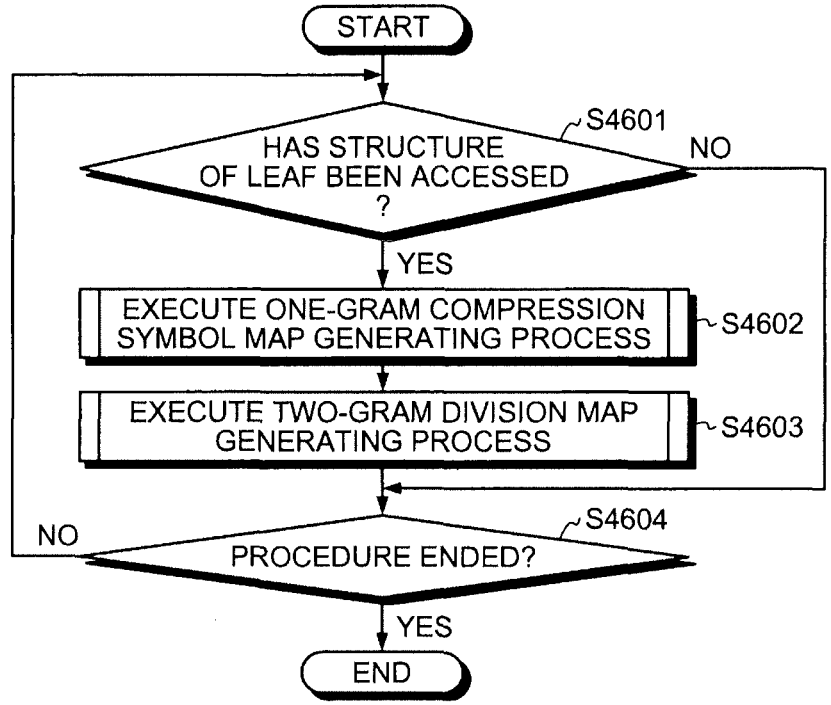
FIG. 46A is a flowchart of the compression symbol map generating process by a compression symbol map identifying unit and a compression symbol map updating unit depicted in FIG. 32.

FIG. 46A is a flowchart of the compression symbol map generating process by the compression symbol map identifying unit 3206 and the compression symbol map updating unit 3207 depicted in FIG. 32. It is determined whether the structure of the leaf L# in the compressing process depicted in FIG. 34 has been accessed (step S4601).

If it is determined that the structure of the leaf L# has not been accessed (step S4601: NO), the procedure proceeds to step S4604. On the other hand, if it is determined that the structure of the leaf L# has been accessed (step S4601: YES), a one-gram compression symbol map generating process is executed (step S4602) and a two-gram divided map generating process is executed (step S4603). Whether the compressing process of the file Fp has come to an end is determined (step S4604). If it is determined that the compressing process has not yet come to an end (step S4604: NO), the procedure returns to step S4601. On the other hand, if it is determined that the compressing process has come to an end (step S4604: YES), the compression symbol map generating process comes to an end.

Figure 46B:
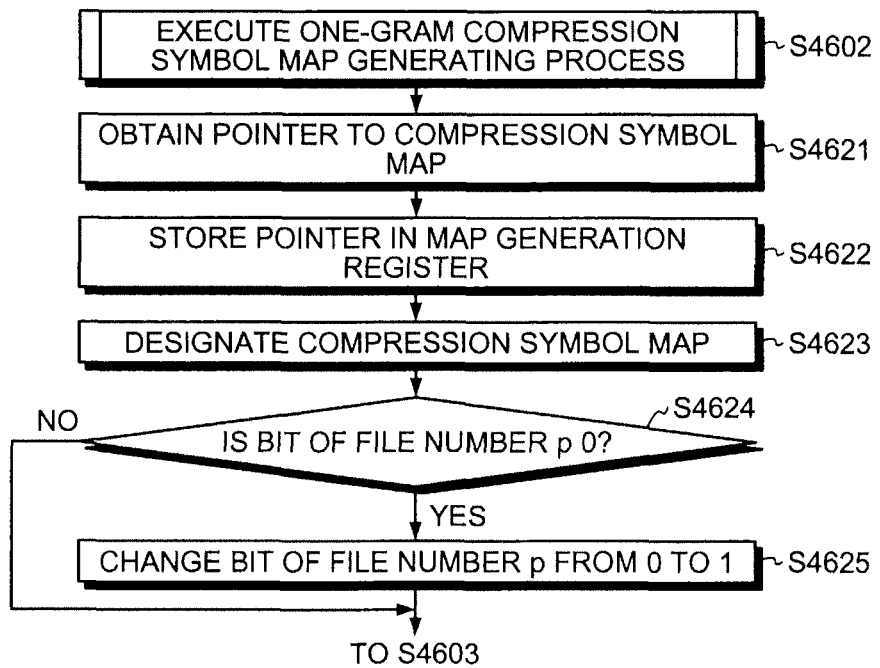
FIG. 46B is a flowchart of the one-gram compression symbol map generating process depicted in FIG. 46A.

FIG. 46B is a flowchart of the one-gram compression symbol map generating process depicted in FIG. 46A. If it is determined that the structure of the leaf L# has been accessed (step S4601: YES), the pointer to the compression symbol map is obtained from the structure of the leaf L# that has been accessed (step S4621). The obtained pointer to the compression symbol map is stored in the map generating register (step S4622).

The obtained pointer to the compression symbol map designates the compression symbol map (step S4623). Whether the bit of the file number p is "0" in the designated compression symbol map is determined (step S4624). If the bit is "1", this indicates that the character code stored in the structure of the leaf L# accessed has already appeared in the file Fp and if the bit is "0", this indicates that the character code has not yet appeared.

If it is determined that the bit is "1" (step S4624: NO), no updating is necessary and therefore, the procedure proceeds to step S4603. On the other hand, if it is determined that the bit is "0" (step S4624: YES), the bit of the file number p is updated to "1" (step S4625) and the procedure proceeds to step S4603.

FIG. 46C is a flowchart of the two-gram divided map generating process (step S4603) depicted in FIG. 46A. A variable "y" is set to be y=1 (step S4631). It is determined whether the pointer to the compression symbol map of the (x-y)th gram is present in the map generation register (step S4632).

The value of "x" takes a value that is $1 \leq x \leq X$ (where "X" is the maximal value of x), and defines the number of grams. The initial value of x is x=1. The maximal value X is arbitrarily set. For example, when a head-and-tail divided map is desired to be generated for a character code string for grams up to five grams, X is set to be X=5. Changing of the gram number x will be described with reference to FIG. 46E.

In FIG. 46C, if it is determined that the pointer to the compression symbol map of the (x-y)th gram is not present in the map generation register (step S4632: NO), the procedure proceeds to step S4604. On the other hand, if it is determined that the pointer to the compression symbol map of the (x-y)th gram is present in the map generation register (step S4632: YES), whether the pointer to the compression symbol map of the (x-y)th gram is present in the consecutive-gram area of the structure of the leaf L# accessed is determined (step S4633). If it is determined that the pointer is not present in the consecutive-gram area (step S4633: NO), the pointer to the compression symbol map of the (x-y)th gram is stored in the consecutive-gram area of the structure of the leaf L# accessed (step S4634).

A pointer dividing process is executed (step S4635). In the pointer dividing process, a pointer to the consecutive-gram divided map and a pointer to the x-gram head-and-tail divided map are generated using the pointer to the compression symbol map of the (x-y)th gram and the pointer to the compression symbol map stored in the structure of the leaf L# accessed. The details of the pointer dividing process will be described with reference to FIG. 46D.

A pointer group to the consecutive-gram divided map is generated by the pointer dividing process (step S4635) and therefore, the number α that is the total number of files of bit strings each including bits that are all 0 are allocated to each pointer to the consecutive-gram division map. The bit of the file number p of the file Fp that is currently compressed is updated from "0" to "1" (step S4636). The procedure proceeds to step S4640.

If it is determined at step S4633 that the pointer to the compression symbol map of the (x-y)th gram is present in the consecutive-gram area of the structure of the leaf L# accessed (step S4633: YES), a pointer dividing process is executed (step S4637). This pointer dividing process (step S4637) is a same process as the pointer dividing process at step S4635.

A pointer group to the consecutive-gram divided map is generated by the pointer dividing process (step S4637) and therefore, each of the consecutive-gram divided maps is designated by the generated pointer group to the consecutive-gram divided map (step S4638). In each of the consecutive-gram divided maps designated, the bit of the file number p of the file Fp that is currently compressed is updated from "0" to "1" (step S4639) and the procedure proceeds to step S4640. In this manner, the generation and updating of the consecutive-gram divided map can be executed by the processes at steps S4633 to S4639.

At step S4640, it is determined whether the pointer to the compression symbol map of the (x-y)th gram is present in an x-gram head-and-tail area of the structure of the leaf L# accessed (step S4640). If it is determined that the pointer is not present in the x-gram head-and-tail area (step S4640: NO), the pointer to the compression symbol map of the (x-y)th gram is stored in the x-gram head-and-tail area of the leaf L# accessed (step S4641).

The pointer dividing process is executed (step S4642). This pointer dividing process (step S4642) is also a same process as the pointer dividing processes at steps S4635 and S4637.

A pointer group to the x-gram head-and-tail divided map is generated by the pointer dividing process (step S4642) and therefore, the number α that is the total number of files of bit strings each including bits that are all 0 are allocated to each pointer to the x-gram head-and-tail division map. The bit of the file number p of the file Fp that is currently compressed is updated from "0" to "1" (step S4643). The procedure proceeds to step S4647.

If it is determined at step S4640 that the pointer to the compression symbol map of the (x-y)th gram is present in the x-gram head-and-tail area of the structure of the leaf L# accessed (step S4640: YES), the pointer dividing process is executed (step S4644). This pointer dividing process (step S4644) is also a same process as the pointer dividing processes at steps S4635, S4637, and S4642.

A pointer group to the x-gram head-and-tail divided map is generated by the pointer dividing process (step S4644) and therefore, each x-gram head-and-tail divided map is designated by the generated pointer group to the x-gram head-and-tail divided map (step S4645).

The bit of the file number p of the file Fp that is currently compressed is updated from "0" to "1" in the x-gram head-and-tail divided map designated (step S4646) and the procedure proceeds to step S4647. In this manner, the generation and updating of the x-gram head-and-tail divided map can be executed by the processes at steps S4640 to S4646.

The variable y is incremented at step S4647 (step S4647) and whether the pointer to the compression symbol map of the (x-y)th gram is present in the map generation register is determined (step S4648). If it is determined that the pointer to the compression symbol map of the (x-y)th gram is present in the map generation register (step S4648: YES), the procedure returns to step S4640.

On the other hand, if it is determined that the pointer to the compression symbol map of the (x-y)th gram is not present in the map generation register (step S4648: NO), the procedure proceeds to step S4604. In this manner, the map groups up to the two-gram head-and-tail divided map group can be generated at steps S4647 and S4648: NO.

Figure 46D:
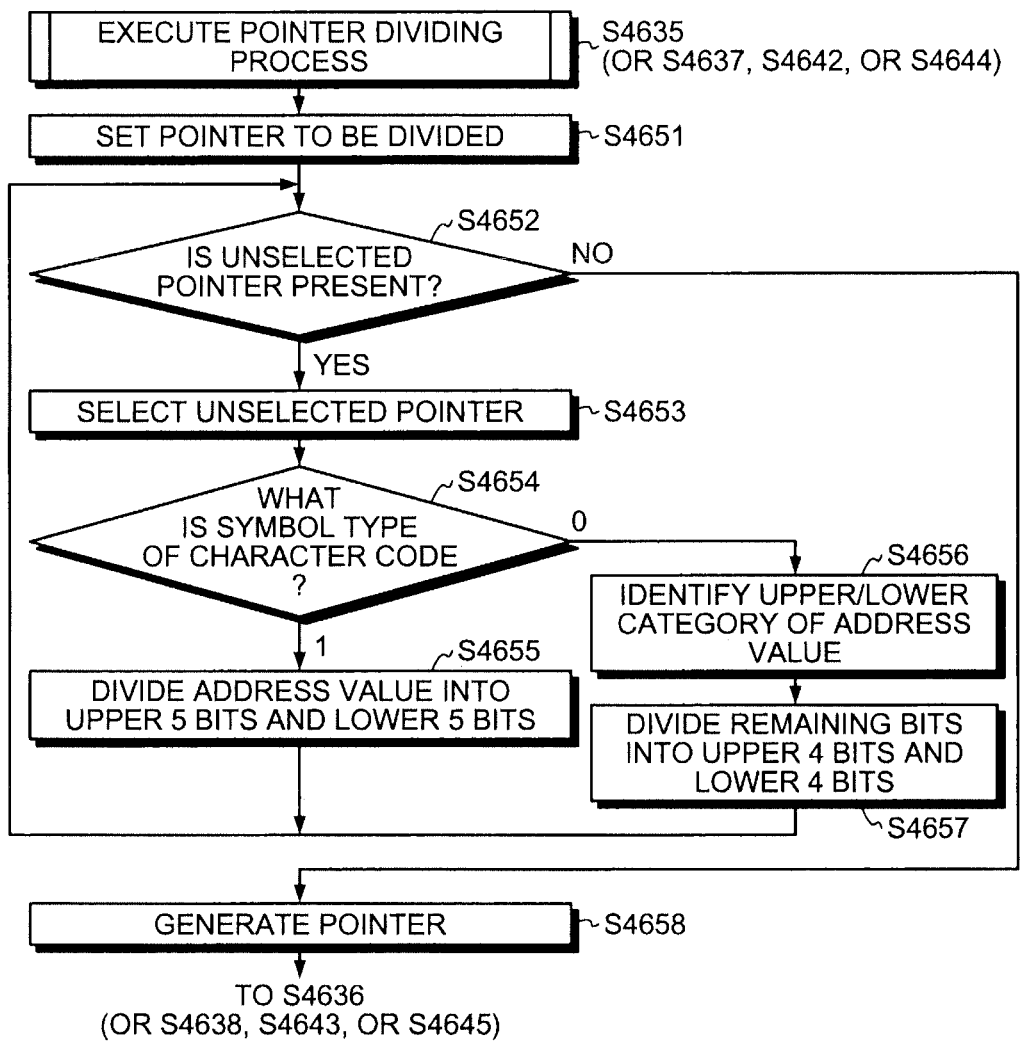
FIG. 46D is a flowchart of the pointer dividing process (steps S4635, S4637, S4642, and S4644) depicted in FIG. 46C.

FIG. 46D is a flowchart of the pointer dividing process (steps S4635, S4637, S4642, and S4644) depicted in FIG. 46C. A pointer to be divided is set (step S4651). For example, if the pointer is set to be divided into two, the pointer set to be divided is the pointer to the compression symbol map of the (x-y)th gram or the pointer to the compression symbol map stored in the structure of the leaf L# accessed. If the pointer is set to be divided into four, both of those pointers are set to be the pointers to be divided.

Whether any unselected pointer to be divided is present is determined (step S4652). If it is determined that an unselected pointer to be divided is present (step S4652: YES), one unselected pointer to be divided is selected (step S4653). The selected pointer to be divided is referred to and whether the symbol type is "1" or "0" is determined (step S4654).

If it is determined that the symbol type is "1" (step S4654: 1), the address value included in the selected pointer to be divided is divided into an upper five bits and a lower five bits (step S4655) and the procedure returns to step S4652. On the other hand, if it is determined at step S4654 that the symbol type is "0" (step S4654: 0), the upper/lower category (the two bits from the head) is identified from the address value that is included in the selected pointer to be divided (step S4656). The remaining bits are divided into an upper four bits and a lower four bits (step S4657) and the procedure returns to step S4652.

If it is determined at step S4652 that no unselected pointers to be divided are present (step S4652: NO), a pointer to the two-gram divided map is generated (step S4658). More specifically, if the pointer is to be divided into two, two kinds of pointers to the division map can be generated by combining a pointer not to be divided and the divided upper bits and combining a pointer not to be divided and the divided lower bits.

If the pointer is to be divided into four, four kinds of pointers to the division map can be generated by combining the upper bits and the lower bits that are divided from one pointer to be divided and the upper bits and the lower bits that are divided from the other pointer to be divided.

Figure 46E:
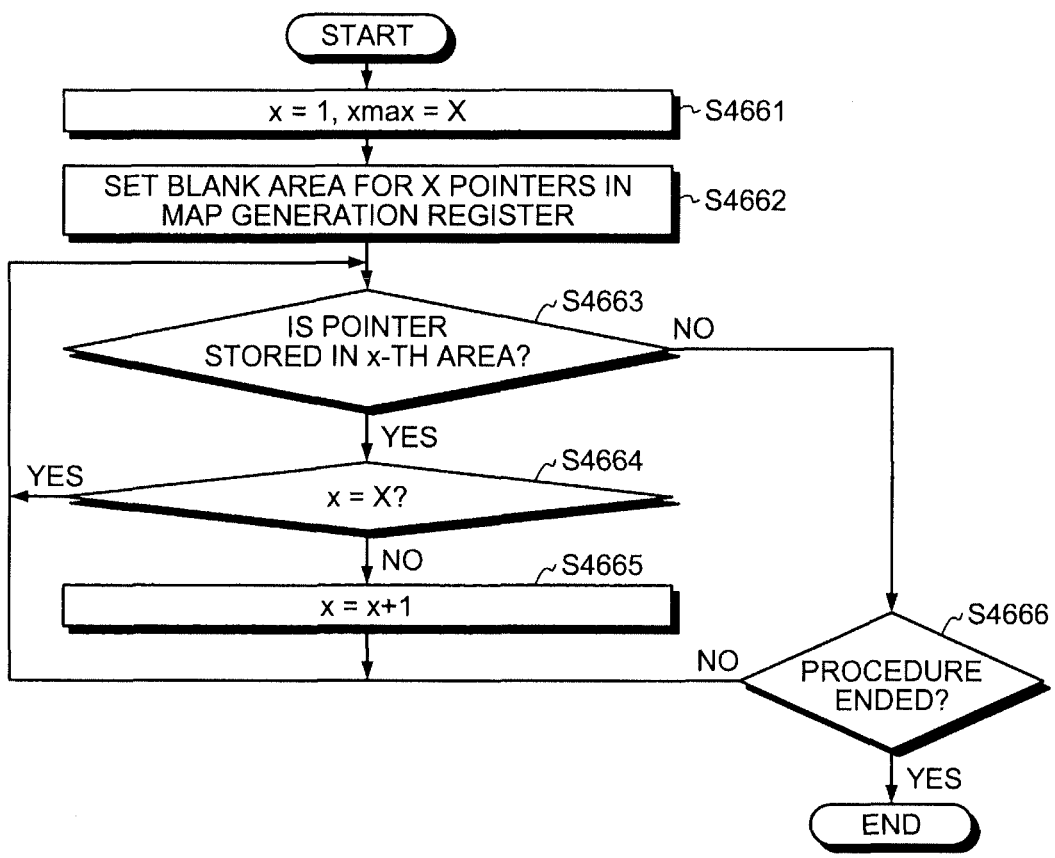
FIG. 46E is a flowchart of a changing process of the gram number "x".

FIG. 46E is a flowchart of a changing process of the gram number "x". Prior to the two-gram division map generating process (step S4603) of FIG. 46C, the gram number x is set to be x=1 and the maximal value "xmax" is set to be xmax=X (step S4661). Blank areas for the x pointers are set in the map generation register (step S4662).

Whether a pointer is stored in an x-th area in the map generation register is determined (step S4663). If it is determined that the pointer is stored in the x-th area (step S4663: YES), whether x is x=X is determined (step S4664). If it is determined that x is x=X (step S4664: YES), the procedure returns to step S4663. If it is determined that x is not x=X (step S4664: NO), x is incremented (step S4665) and the procedure returns to step S4663. Thereby, whether the pointers are stored in areas up to the X-th area can be determined.

On the other hand, if it is determined at step S4663 that no pointer is stored in the x-th area (step S4663: NO), whether the compressing process of the file Fp has come to an end is determined (step S4666). If it is determined that the compression process has not yet come to an end (step S4666: NO), the procedure returns to step S4663. On the other hand, if it is determined that the compression process has come to an end (step S4666: YES), the changing process of the gram number x comes to an end.

Referring back to FIG. 32, the compression symbol map compressing unit 3208 has a function of compressing the compression symbol map group Ms after the updating depicted in FIG. 39B. The compression symbol map compressing unit 3208 has a bit string compressing unit 3281 and a non-compression area setting unit 3282. The bit string compressing unit 3281 compresses each bit string of the compression symbol map group Ms. If the total number α of files is huge (for example, α is α=10,000), sections having consecutive "0s" in the bit strings become many. In contrast, for the characters having high appearance frequencies, sections having consecutive "1s" become many. Therefore, an appearance rate area that corresponds to the appearance rate of the character is set. The "appearance rate area" is a range of the appearance rate. A Huffman tree for compressing the compression symbol map group Ms is allocated corresponding to the appearance rate area.

FIG. 47A is an explanatory diagram of the relation between the appearance rate and the appearance rate area. Assuming that the appearance rate is within a range of 0 to 100%, as depicted in FIG. 47A, the area can be divided into A to E and A' to E' areas. Therefore, Huffman trees for the compression of the compression symbol map group Ms are allocated as compression patterns corresponding to appearance rate areas identified by the A to E and A' to E' areas.

FIG. 47B is an explanatory diagram of a compression pattern table having compression patterns by appearance rate area. The appearance rate areas are stored in the fourth area 2804 of the structure of the leaf L# as depicted in FIG. 28 and therefore, by designating the structure of the leaf L#, the compression pattern table is referred to and the compression pattern is identified. The A and A' areas are not compressed and therefore, no Huffman tree that is the compression pattern is present therein.

FIG. 48A is an explanatory diagram of the compression pattern for B and B' areas. 16 kinds of Huffman trees become a compression pattern 4201.

FIG. 48B is an explanatory diagram of the compression pattern for C and C' areas. 16+1 kinds of Huffman trees become a compression pattern 4202. Compared to the B and B' areas, in the compression pattern 4202, sections having consecutive "0s" or sections having consecutive "is" are more in view of probability. Therefore, a symbol word "00" is allocated to each of the bit strings having 16 bits of consecutive "0s".

FIG. 48C is an explanatory diagram of the compression pattern for D and D' areas. 16+1 kinds of Huffman trees become a compression pattern 4203. Compared to the C and C' areas, in the compression pattern 4203, sections having consecutive "0s" or sections having consecutive "1s" are more in view of probability. Therefore, a symbol word "00" is allocated to each of the bit strings having 32 bits of consecutive "0s".

FIG. 48D is an explanatory diagram of the compression pattern for E and E' areas. 16+1 kinds of Huffman trees become a compression pattern 4204. Compared to the D and D' areas, in the compression pattern 4204, sections having consecutive "0s" or sections having consecutive "1s" are more in view of probability. Therefore, a symbol word "00" is allocated to each of the bit strings having 64 bits of consecutive "0s". As described, the number of consecutive "0s" each meaning that no character code is present is increased corresponding to the appearance rate area and therefore, improvement of the compression efficiency of the compression symbol map Ms can be facilitated corresponding to the appearance rate of a character code.

Figure 49:
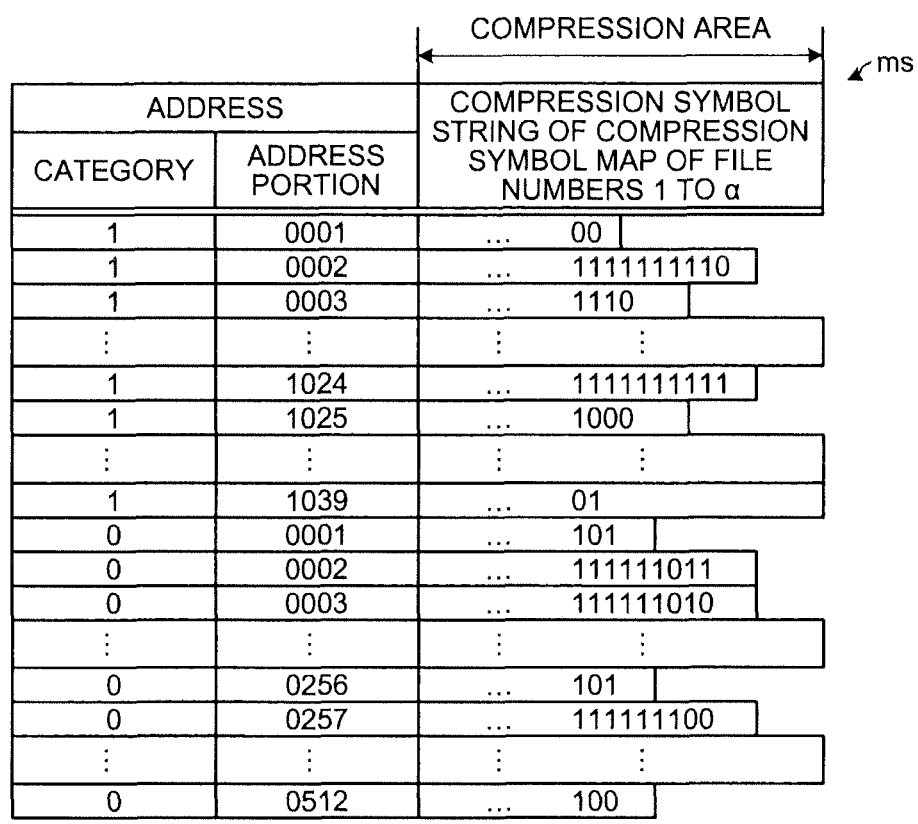
FIG. 49 is an explanatory diagram of a compression symbol map group "ms" after compression.

FIG. 49 is an explanatory diagram of the compression symbol map group "ms" after compression. In the compression symbol map group ms, the bit strings are compressed using compression patterns 4201 to 4204 depicted in FIGS. 48A to 48D for each record that corresponds to the structure of the leaf L#.

In FIG. 32, the non-compression area setting unit 3282 has a function of setting the non-compression area in the compression symbol map group Ms. More specifically, if addition of a file F is detected, the number is taken such that the file numbers p are sequentially lined up. The non-compression area is set having the bit strings that each indicate the presence or the absence of a character code in the added file for each character code, and that are arranged such that the bit strings are sequentially lined up according to the file numbers p of the file group Fs.

For example, in a case where the file F is later added, a bit string indicating the presence or the absence of the character needs to be also added to the compression symbol map group Ms when the file Fβ added is compressed. In the compression symbol map group Ms before the compression, the bit strings of the file number 1 to α are compressed by the compression patterns 4201 to 4204 and their symbol lengths differ according to record. The symbol lengths are variable and therefore, become the compression areas.

Therefore, as depicted in FIG. 49, the heads of the compression symbol strings (on the side of the file number α) are lined up while the tails are not. When the lining up of the bit strings are allocated from the side of the address item in order of file number 1 to α, the bit string of the added file is inserted on the tail side of the compression symbol string and therefore, the compression symbol string and the bit string of the added file are not sequential. Therefore, the bit strings in the compression area of the compression symbol map group Ms are arranged in advance in descending order of file number p in the file group Fs from the head position up to the tail position. The non-compression area setting unit 3282 sets a non-compression area between the pointer to the compression symbol map and the compression area in the compression symbol map group Ms.

FIG. 50 is an explanatory diagram of the addition of a bit string to the compression symbol map group ms compressed. As depicted in FIG. 50, the bit of the file number α is allocated on the side on which the compression symbol strings are lined up, among the file numbers 1 to α. Thereby, even in the case where the bit strings of the file numbers 1 to α are compressed, even when the bit strings of the file numbers α+1 to β that are not compressed are inserted, the bit strings can be lined up in order of file number. Thereby, even when the bit strings of the file numbers 1 to α are compressed, no difference is present between the file number of the file added and its bits. Therefore, screening of the files can be executed accurately. The addition of the bit string of the file added is executed by the compression symbol map updating unit 3207.

FIG. 51 is an explanatory diagram of a deletion map. Some files are partially deleted in the file group Fs (the files F1 to Fβ). Obtaining a deleted file F by screening is useless and therefore, a deletion map Md is prepared. The deletion map Md is a bit string of bits of the total number α of files (when addition is executed, β) and in the initial state, all these bits are set to be "1".

If a deleted file is present, the value of the bit of the file number d of the deleted file in the deletion map Md is changed from "1" to "0". The deletion map Md is used only when the files are screened. Therefore, even in a case where the bit of a file F is "1" for a character code in the compression symbol map group Ms, if the bit is "0" in the deletion map Md, the file F is not to be retrieved. Updating of the deletion map Md is executed by the compression symbol map updating unit 3207.

As depicted in FIG. 39B, the compression symbol map compressing process is a process of compressing the bit strings of the file numbers 1 to α that are the compression areas of the compression symbol map group Ms generated by the compression symbol map generating process. More specifically, the bit strings of the compression area of the compression symbol map group Ms are compressed using the compression pattern table depicted in FIG. 52 and the compression patterns (the Huffman trees for compression symbol map) depicted in FIGS. 48A to 48D. Thereby, the compression symbol map group Ms after the compression as depicted in FIG. 49 can be obtained. The procedure of the compression symbol map compressing process procedure will be described.

Figure 52:
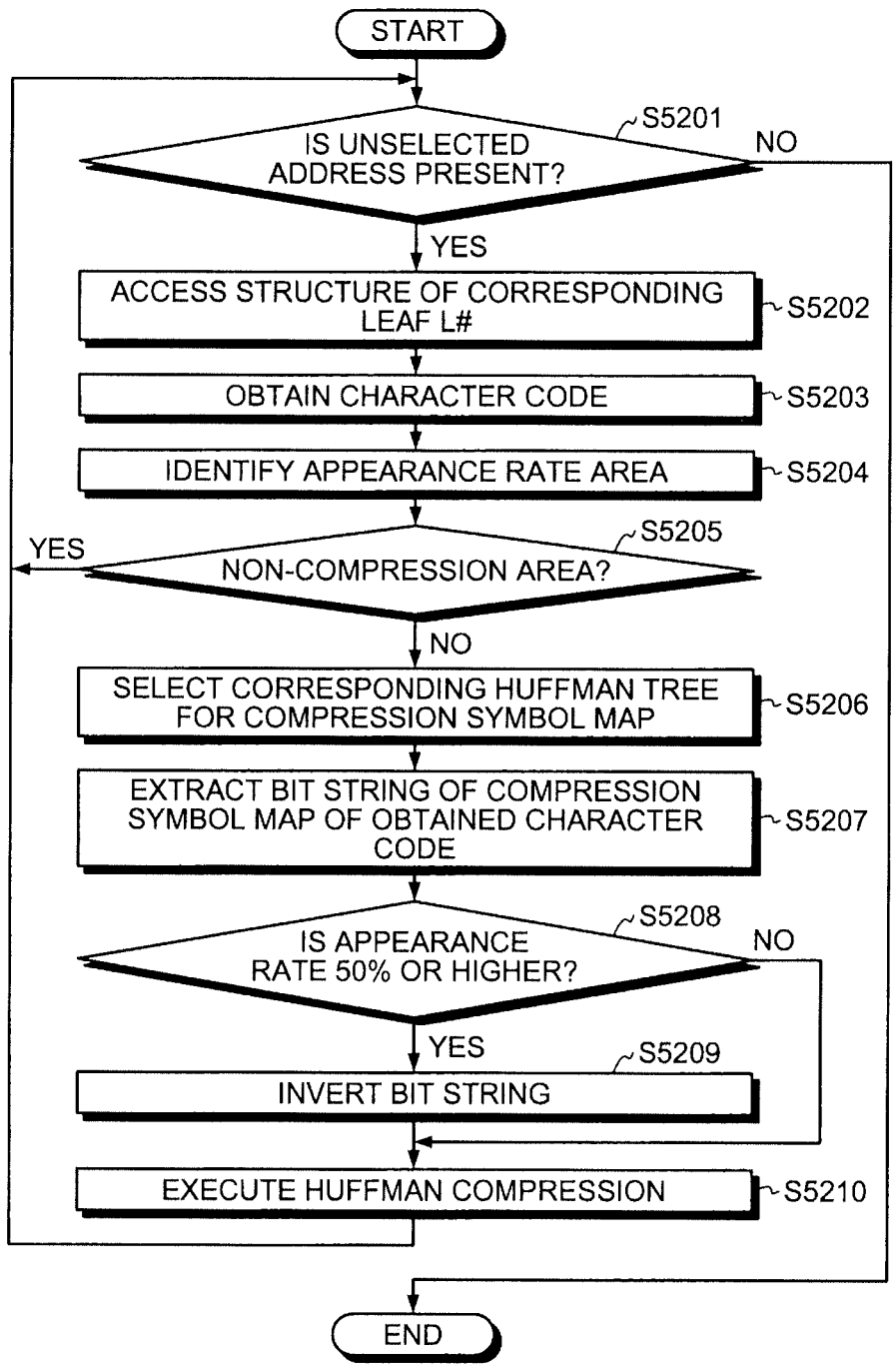
FIG. 52 is a flowchart of the compression symbol map compressing process.

FIG. 52 is a flowchart of the compression symbol map compressing process. As depicted in FIG. 52, whether an unselected address (pointer to the compression symbol map) is present in the compression symbol map group Ms is determined (step S5201). If it is determined that an unselected address is present (step S5201: YES), the unselected address is selected and the structure of the leaf L# is accessed (step S5202), and the character code is obtained from the first area 2801 of the structure of the leaf L# (step S5203). The appearance rate area is obtained from the fourth area 2804 of the structure of the leaf L# accessed and thereby, the appearance rate area of the character code obtained is identified (step S5204).

Thereafter, the compression pattern table of FIG. 47B is referred to and whether the appearance rate area identified is a non-compression area (for example, the appearance rate area A or A') is determined (step S5205). If it is determined that the appearance rate area is a non-compression area (step S5205: YES), the procedure returns to step S5201 and the next address is selected.

On the other hand, if it is determined that the appearance rate area is not a non-compression area (step S5205: NO), the corresponding Huffman tree for the compression symbol map is selected from among the Huffman trees for the compression symbol map depicted in FIGS. 48A to 48D, by the appearance rate area identified (step S5206). A bit string of the compression area in the compression symbol map M of the character code obtained to be compressed, is extracted (step S5207).

Whether the appearance rate of the character code obtained is at least 50% is determined (step S5208). The "appearance rate" is a value obtained by using the number of all files in the file group Fs as the population (denominator) and the number of files each having the corresponding character code or reserved word present therein as the numerator. The appearance rate area is determined according to the appearance rate (see FIG. 47A) and therefore, if the appearance rate areas are A to E, it is determined that the appearance rate of the character code obtained is not 50% or higher. On the other hand, if the appearance rate areas are A' to E', it is determined that the appearance rate of the character code obtained is 50% or higher.

If it is determined that the appearance rate is 50% or higher (step S5208: YES), the bit string extracted at step S5206 is inverted to improve the effect of the compression (step S5209). For example, if the bit string extracted is "1110", the number of "0s" is increased by inverting "1110"

into "0001". The inverted bit string is compressed using the Huffman tree selected at step S5206 (step S5210) and the procedure returns to step S5201. As described, by inverting the bit string, the Huffman tree for the compression symbol map of the appearance rate areas A' to E' does not need to be prepared and therefore, saving of the memory can be facilitated.

On the other hand, if it is determined at step S5208 that the appearance rate is not 50% or higher (step S5208: NO), the bit string extracted at step S5207 is compressed using the Huffman tree selected at step S5206 (step S5210) without executing the bit string inversion (at step S5209) and the procedure returns to step S5201. If it is determined at step S5201 that no unselected address is present (step S5201: NO), the compression symbol map compressing process comes to an end.

According to the procedure of the compression symbol map compressing process, for each address, the bit strings of the file numbers 1 to $\alpha$ are compressed corresponding to their appearance rates and the compression symbol map group Ms after the compression as depicted in FIG. 49 can be obtained.

The procedure of the compression symbol map compressing process is also applicable to the consecutive-gram divided map group and x-gram head-and-tail divided map group. Though each of the consecutive-gram divided map group and the x-gram head-and-tail divided map group is identified by two character codes, these map groups are compressed using, alone, the appearance rate of the character code of, for example, the second gram when these map groups are applied to the compression symbol map compressing process. The rest of the content of the compressing process is same and therefore, will not again be described. Thereby, the bit strings of the consecutive-gram divided map group or the x-gram head-and-tail divided map group can be compressed and the saving of the memory can be facilitated.

The added-file compressing process is a process of, when files F are added later, adding bit strings of the added files for each character code (strictly, an address that is the pointer to the compression symbol map) for the added files. More specifically, by adding the bit strings of the file numbers $\alpha+1$ to $\beta$, the compression symbol map group Ms as depicted in FIG. 50 can be obtained. Taking an example of the compression symbol map group Ms after the compression, the procedure of the added-file compressing process will be described. The file numbers $\alpha+1$ to $\beta$ are given to the added $\beta$ files.

Figure 53:
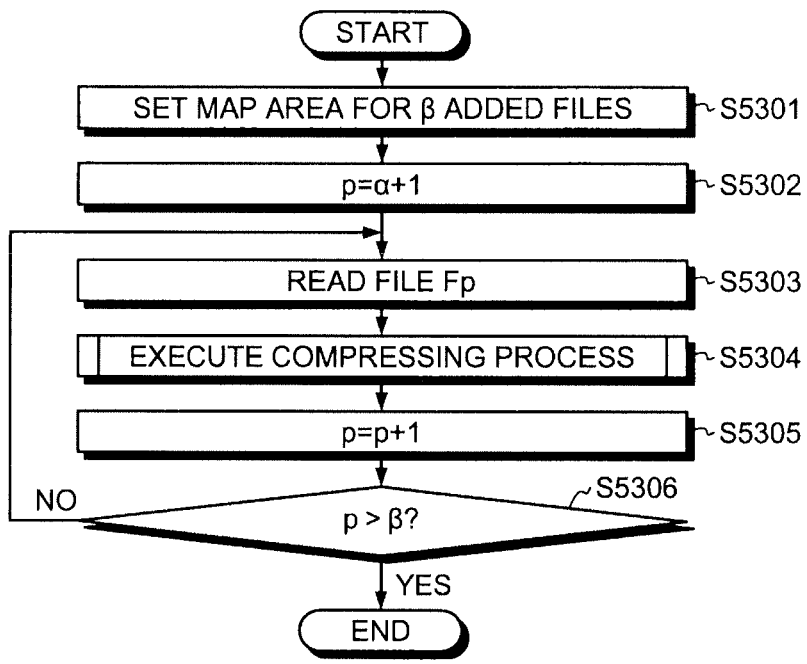
FIG. 53 is a flowchart of an added-file compressing process.

FIG. 53 is a flowchart of the added-file compressing process. Map areas of a quantity corresponding to the quantity of the $\beta$ added files are set (step S5301). More specifically, the bit strings of the added files (whose initial values each are "0") are set between the address of the compression symbol map group Ms and the compression symbol strings of the file numbers 1 to $\alpha$.

The file number p is changed to p=$\alpha$+1 (step S5302) and the file Fp is read (step S5303). The compressing process is executed (step S5304). The compressing process (step S5304) is a same process as the compressing process at step S3503 depicted in FIGS. 35 and 36. After the compressing process (step S5304), the file number p is incremented (step S5305) and whether the file number p is p>$\beta$ is determined (step S5306). If it is determined that the file number p is not p>$\beta$ (step S5306: NO), the procedure returns to step S5303. On the other hand, if it is determined that the file number p is p>$\beta$ (step S5306: YES), the added-file compressing process comes to an end.

The deletion map updating process is a process of updating the bit selected in the deletion map Md depicted in FIG. 51.

Figure 54:
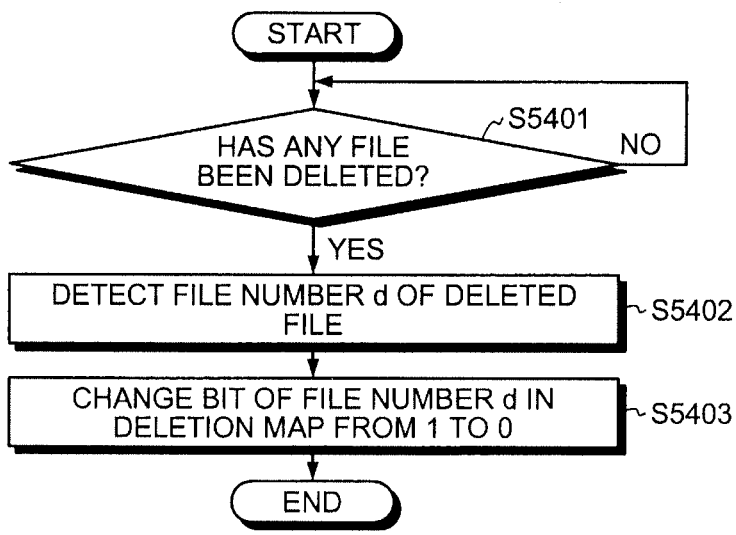
FIG. 54 is a flowchart of a deletion map updating process.

FIG. 54 is a flowchart of the deletion map updating process. File deletion is waited for (step S5401: NO). When the file deletion is executed (step S5401: YES), the file number "d" of the file deleted is detected (step S5402). The bit of the file number d in the deletion map Md is updated from "1" to "0" (step S5403). Thereby, the deletion map updating process comes to an end. The deletion map Md is used for screening the files. Therefore, even in a case where the bit of a file for a character is "1" in the compression symbol map group Ms, the file is not to be retrieved if the bit is "0" in the deletion map Md.

Figure 55:
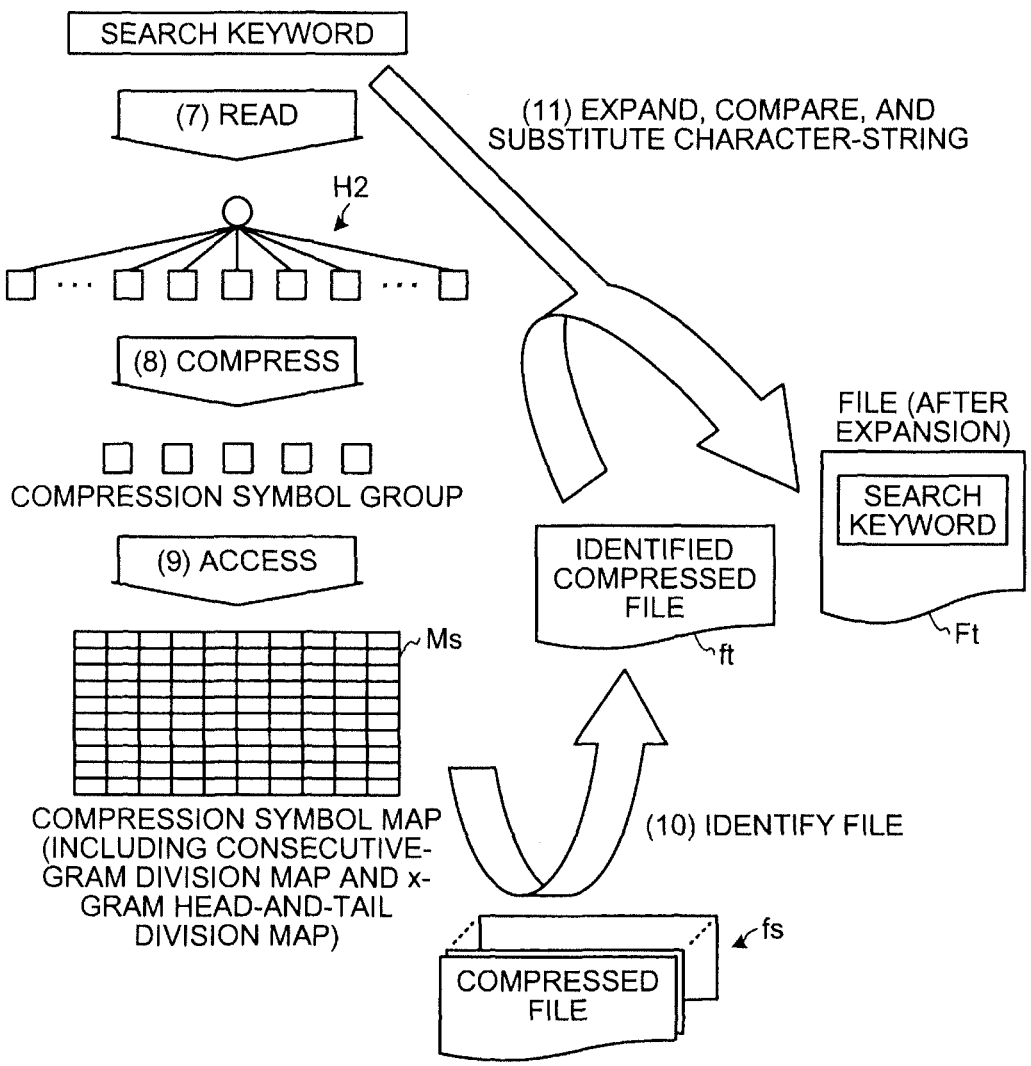
FIG. 55 is an explanatory diagram of the flow of the process for the search of the compressed file f and expansion to the file F.

FIG. 55 is an explanatory diagram of the flow of the process for the search of the compressed file f and expansion to the file F. In FIG. 55, (7) the information search apparatus accepts and reads an input of search keywords, (8) the compression symbol group is obtained by compressing the character codes of the characters that constitute the search keywords by the no-node Huffman tree H2, and (9) the pointer to the compression symbol map is obtained from the structure of the leaf L# that corresponds to each compression symbol and the compression symbol map group Ms is accessed.

For the compression symbol map group Ms, (7) triggered by the reading of the search keywords, the compression symbol map group Ms is expanded by the Huffman tree for the compression symbol map and the compression symbol map group Ms is generated.

(10) By AND-computing for each file number p the bit string of the compression symbol map M of each character code, the compressed file f (identified compressed file ft) including all the characters constituting the search keywords is identified. Thereby, file screening for the search keywords can be executed on the compressed file group fs as it is.

(11) Finally, the identified compressed file ft is expanded at (9) using the no-node Huffman tree H2 and the character strings in the file F expanded (expanded file Ft) and the search keywords are compared with each other, and the character strings that are hit are character-string-substituted such as highlighted displaying. Thereby, the expansion of the compressed file f and the determination of the coincidence (comparison) of the search keywords can be executed at the series of process steps.

Figure 56:
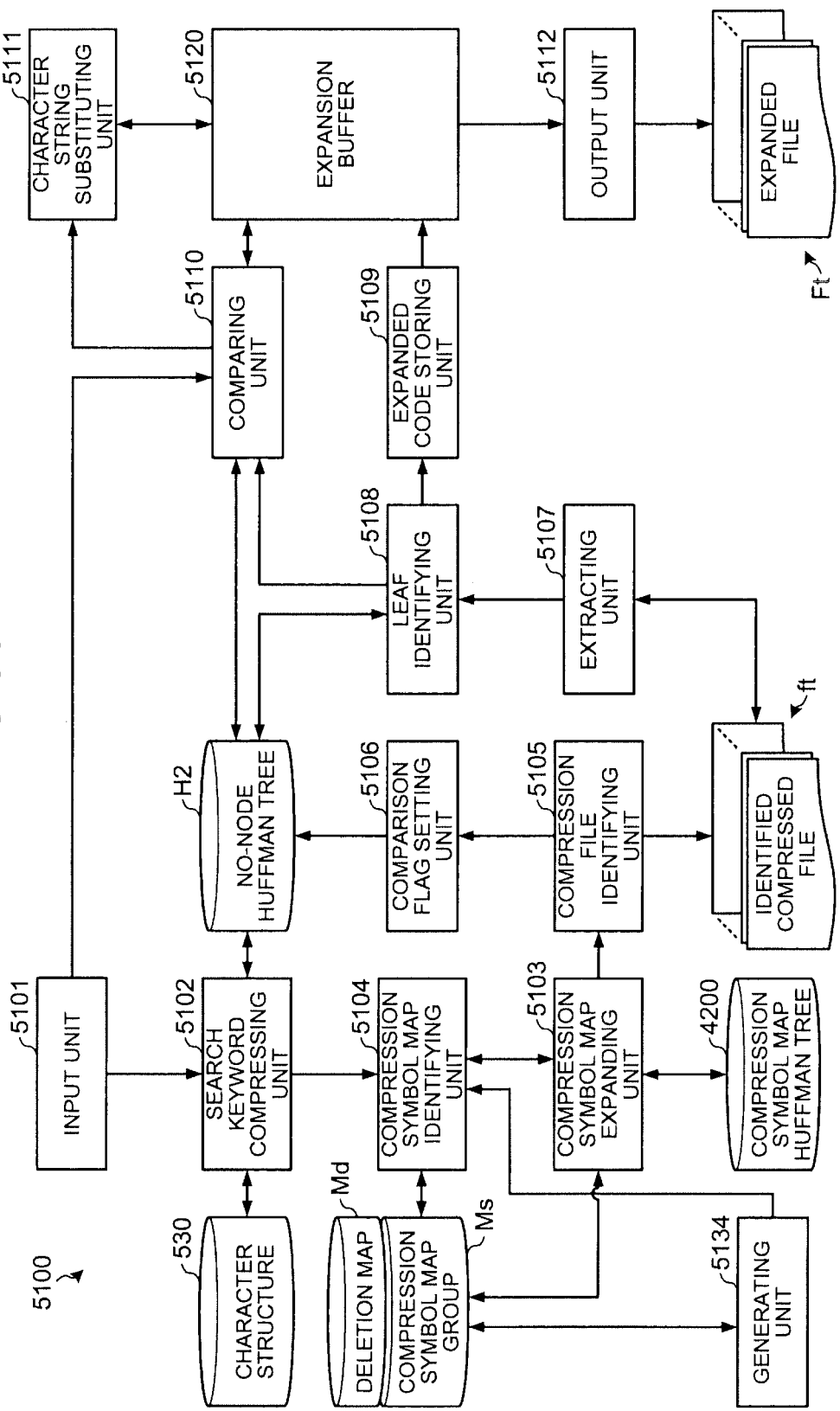
FIG. 56 is a block diagram of a fourth functional configuration of the information search apparatus according to the embodiment.

FIG. 56 is a block diagram of a fourth functional configuration of the information search apparatus according to the embodiment. FIG. 56 depicts the functional configuration to execute the processes (7) to (11) depicted in FIG. 55. As depicted in FIG. 56, the information search apparatus 5100 includes an input unit 5101, a search keyword compressing unit 5102, a compression symbol map expanding unit 5103, a compression symbol map identifying unit 5104, a compressed file identifying unit 5105, a comparison flag setting unit 5106, an extracting unit 5107, a leaf identifying unit 5108, an expansion code storing unit 5109, a comparing unit 5110, a character string substituting unit 5111, an output unit 5112, and a generating unit 5134.

Functions of the units from the input unit 5101 to the output unit 5112 and the generating unit 5134 are implemented by causing the CPU 401 to execute a program stored in a storage medium such as the RAM 403, the magnetic disk 405, and the optical disk 407 depicted in FIG. 4, or via the I/F 409. A function of an expansion buffer 5120 is implemented by a storage medium such as the RAM 403, the magnetic disk 405, and the optical disk 407 depicted in FIG. 4. The information search apparatus 5100 may be the same apparatus as the information processing apparatus 500 and may be a different apparatus therefrom.

The input unit 5101 has a function of receiving an input of the search keywords. The input unit 5101 is the function that corresponds to (7) depicted in FIG. 55. The input unit 5101 receives search conditions such as a forward search and a reverse search in addition to the search keywords.

FIG. 57 is an explanatory diagram of exemplary description in the file Fp. In FIG. 57, (A) depicts heading data in the file Fp. In (A) of FIG. 57, a heading word of "国際通貨基金" is shown as an example. For the heading data, it is a rule to mark off a character string with commas. (B) depicts text data in the file Fp. Words of the text data are marked off by brackets and periods. The character that discontinues the continuity of a character string such as a comma, a bracket, a period, or a space as above is referred to as "special character". The forward search and the reverse search can be executed efficiently by using the special character in the consecutive-gram divided map group.

When a forward search is designated in addition to a search keyword, the input unit 5101 automatically gives a character code of a special character at the head of the search keyword. For example, in the example of (A), when the search keyword is "国際通貨基金", improvement of the efficiency of the forward search can be facilitated by setting the search keyword to be "国際通貨基金" by automatically inserting a comma at the head thereof. In the example of (B), when the search keyword is "国際通貨基金", improvement of the efficiency of the forward search can be facilitated by setting the search keyword to be "国際通貨基金" by automatically inserting a closing bracket at the head thereof.

Similarly, when a reverse search is designated in addition to a search keyword, the input unit 5101 automatically gives a character code of a special character at the tail of the search keyword. For example, in the example of (A), when the search keyword is "国際通貨基金", improvement of the efficiency of the reverse search can be facilitated by setting the search keyword to be "国際通貨基金" by automatically inserting a comma at the tail thereof. In the example of (B), when the search keyword is "国際通貨基金", improvement of the efficiency of the reverse search can be facilitated by setting the search keyword to be "国際通貨基金" by automatically inserting a period at the tail thereof.

Though plural kinds of special characters are present, which special character may be used merely has to be set automatically according to the type of the search. For example, the special character may be limited to only a comma for searching for a heading word, and may be limited to a bracket, a period, a space, or a bold bracket for searching for a full text. The forward search and the reverse search can efficiently be realized by regarding the special character as a virtual "marking-off character", allocating an extended character code of "UTF16" thereto, adding this code to the higher-level character codes of the consecutive-gram division map, and giving a "marking-off character" at the head or tail of the character string of the search keyword.

FIG. 58 is an explanatory diagram of the result of the automatic insertion of the special character to the search keyword when the search conditions are designated. In this case, the search keyword is set to be "人形芝居" and the special character is set to be a comma. (A) in FIG. 58 depicts the automatic insertion for the forward search and (B) thereof depicts the automatic insertion for the reverse search.

The search keyword compressing unit 5102 has a function of compressing the search keywords. The search keyword compressing unit 5102 is the function that corresponds to (8) depicted in FIG. 55. More specifically, as depicted in FIG. 34, the search keyword compressing unit 5102 sequentially compresses the search keywords (character code strings to be compressed). The search keyword compressing unit 5102 refers to the character structure 530, identifies a pointer to the leaf L# for each character code that constitutes the search keyword input by the input unit 5101, accesses the structure of the leaf L# using the pointer to the leaf L# identified, and extracts the compression symbol stored in the structure of the leaf L# accessed. The compression symbol group of the search keyword compressed is stored in the compression buffer.

The compression symbol map expanding unit 5103 has a function of expanding the compression symbol map group Ms that is applied with the compressing process. More specifically, triggered by the inputting of a search keyword, the compression symbol map expanding unit 5103 Huffman-expands the compression symbol strings (see FIGS. 49 and 50) of the compression symbol map of the file numbers 1 to α in the compression symbol map group Ms using the Huffman tree for the compression symbol map used for the compression. Thereby, the compression symbol map group Ms can be restored. If the consecutive-gram division map or the x-gram head-and-tail division map is also compressed, this map can similarly be expanded.

The generating unit 5134 has a function of generating plural kinds of combined identification information by dividing into two at least one among identification information of the preceding character code and that the succeeding character code that are sequential in the x-gram search keyword and by combining the divided identification information with the non-divided identification information.

For example, the pointer to the compression symbol map of the preceding character code and the pointer to the compression symbol map of the succeeding character code are used. If the dividing into two is set, either one of the pointers is divided into upper bits and lower bits. Each of the divided pointers is coupled with the other non-divided pointer to the compression symbol map. Thereby, two kinds of combined pointers can be generated.

If the dividing into four is set, each of the pointers to the compression symbol maps of the preceding character code and the succeeding character code is divided into upper bits and lower bits. Four kinds of combined pointers can be generated by selecting two divided bit strings from the divided four bit strings and coupling the selected two bit strings with each other.

For example, in a case where a pointer to the compression symbol map is stored in the consecutive-gram area of the structure of the leaf L# accessed when the search keyword is compressed, a pointer group to the consecutive-gram divided map is generated as a combined pointer by combining the pointer to the compression symbol map and the pointer to the compression symbol map of the structure of the leaf L#. The generating process is the same process as the pointer dividing process depicted in FIG. 46D.

The combined pointer is also generated using the pointers to the compression symbol maps of the character codes at the head and at the tail that constitute the search keyword.

For example, in a case where the pointer to the compression symbol map is stored in a g-gram head-and-tail area (where "g" is the number of grams of the search keyword) of the structure of the leaf L# that is accessed when the search keyword is compressed, the pointer group to the g-gram head-and-tail divided map is generated by combining the pointer to the compression symbol map and the pointer to the compression symbol map of the structure of the leaf L#. The generating process is the same process as the pointer dividing process depicted in FIG. 46D.

The compression symbol map identifying unit 5104 has a function of identifying the compression symbol map M that corresponds to the character codes of the characters constituting the search keyword of the compression symbol map group Ms. The compression symbol map identifying unit 5104 is a function that corresponds to (9) depicted in FIG. 55. The compression symbol map identifying unit 5104 obtains the pointer to the compression symbol map stored in the structure of the leaf L# accessed when the search keywords are compressed, and the corresponding compression symbol map M is accessed by the pointer to the compression symbol map obtained.

The compression symbol map identifying unit 5104 identifies a two-gram division map group that corresponds to the character codes of the characters constituting the search keyword, among the two-gram divided map group (the consecutive-gram divided map group and the x-gram head-and-tail divided map group). More specifically, the compression symbol map identifying unit 5104 identifies the two-gram divided map group by designating the two-gram divided map group using the combined pointer generated by the generating unit 5134. The consecutive-gram divided map group and the g-gram head-and-tail divided map group can be identified by designating the consecutive-gram divided map group and the g-gram head-and-tail divided map group.

The compressed file identifying unit 5105 has a function of identifying the compressed file that includes all the compression symbol groups compressed by the search keyword compressing unit 5102 from the compressed file group, by referring to the compression symbol map M identified by the compression symbol map identifying unit 5104. The compressed file identifying unit 5105 has a function that corresponds to (10) depicted in FIG. 55. The compressed file identifying unit 5105 AND-computes the bit of each of the character codes that constitute the search keyword for each compressed file. If the result of the AND-computation is "1", this means that all the characters constituting the search keyword are included in the compressed file fp of the file number p. Thereby, screening of the compressed file group Fs can be executed.

FIG. 59 is an explanatory diagram of exemplary identification by the compressed file identifying unit 5105. In FIG. 59, a search keyword is "人形芝居" as an example and the compression symbol maps M identified by the compression symbol map identifying unit 5104 are compression symbol maps M1 to M4. In FIG. 59, to facilitate understanding, the number of files α is set to be α=4 and the number of added files β is set to be β=0.

The bit strings of the compression symbol maps M1 to M4 and the deletion map Md are AND-computed for the row of each file number. In the row of the file number 1, none of "人", "形", "芝", and "居" are present and therefore, the result of the AND-computation is "0". In the row of the file number 2, though all of "人", "形", "芝", and "居" are present, the file F2 has been deleted and therefore, the bit of the deletion map Md is "0". Therefore, the result of the AND-computation is "0".

In the row of the file number 3, all of "人", "居", "芝", and "居" are present and the bit of the deletion map Md is "1". Therefore, the result of the AND-computation is "1". In the row of the file number 4, "形", "芝", and "居" are not present and therefore, the result of the AND-computation is "0". Thereby, in the example of FIG. 59, the compressed file f3 of the file number 3 is finally selected, of the compressed files f1 to f4. The compressed symbol string in the compressed file f identified by the compressed file identifying unit 5105 is written by the CPU 401 into an internal register thereof or an external buffer.

The compressed file identifying unit 5105 identifies, from the compressed file group, the compressed file that includes all of the compression symbol groups compressed by the search keyword compressing unit 5102, by referring to the division map group identified by the compression symbol map identifying unit 5104. More specifically, for example, the compression symbol map identifying unit 5104 identifies the consecutive-gram divided map group for the consecutive grams that constitute the g-gram search keyword, and identifies the g-gram head-and-tail divided map group for the grams at the head and at the tail of the g-gram search keyword.

Therefore, the compressed file identifying unit 5105 executes AND-computation on the consecutive-gram divided map group and the g-gram head-and-tail divided map group. If the result of the AND-computation is "1", this means that the compressed file fp of the file number p includes the consecutive-two-gram character code strings (i.e., the character code strings for the two-consecutive grams) constituting the g-gram search keyword and the character code strings that satisfy the combination of the character codes at the head and at the tail.

FIGS. 60A to 60C are explanatory diagrams of exemplary identification of the compressed file f using the consecutive-gram divided map group and a five-gram head-and-tail divided map group for the five-gram search keyword "人形芝居". FIG. 60A depicts the screening executed for a partial-coincidence search without designating any search condition. In FIG. 60A, it can be seen that the compressed file f3 of the file number 3 includes a two-gram character code having "人" and "形" sequentially lined up therein, a two-gram character code having the upper divided character codes of "形" and "芝" sequentially lined up therein, the character code of "芝", a two-gram character code having the lower divided character code of "芝" and the character code of "居" sequentially lined up therein, and a five-gram character code having "人" at the head and "居" at the tail.

Therefore, the character string "人形芝居" is highly likely to be described compared to the screening by one gram depicted in FIG. 9. Though the screening for the partial-coincidence search has been described with reference to FIG. 60A, FIG. 60B depicts an example of screening for a forward search using a comma as the special character, and FIG. 60C depicts an example of screening for a reverse search using a comma as the special character.

Referring back to FIG. 56, the comparison flag setting unit 5106 has a function of setting a comparison flag in the structure of the leaf L# to be "ON" if the structure of the leaf L# is accessed by the compressed file identifying unit 5105. The "comparison flag" is a flag that, if a character code that corresponds to the structure of the leaf L# is stored in the expansion buffer 5120, determines whether the character code is to be compared to the character codes in the search keywords to be compared. If the comparison flag is ON, the comparison is executed and, if the comparison flag is OFF, no comparison is executed. The default is OFF and, when the search result is obtained, the flag is reset to OFF. Thereby, the comparison can be executed only with the character code of the structure of the leaf L# whose comparison flag is ON. Therefore, useless comparison can be prevented.

The extracting unit 5107 has a function of extracting from the compressed file f identified by the compressed file identifying unit 5105, a compression symbol string having the same length as that of the pointer to the leaf L#. The extracted compression symbol string coincides with any of the pointers of the pointer group to the leaf L# stored in the root structure cell C(1, 1).

The leaf identifying unit 5108 has a function of identifying the structure of the leaf L# by the no-node Huffman tree H2 based on the compression symbol string extracted by the extracting unit 5107. More specifically, for example, the leaf identifying unit 5108 searches for the pointer to the leaf L# that coincides with the branch number including the compression symbol extracted, in the root structure cell C(1, 1) of the no-node Huffman tree H2 and, when the pointer is retrieved, accesses through one path, the structure of the leaf L# that is pointed to.

For example, the compression symbol included in the structure of the leaf L1 is "0000" and the pointers L1P(1) to L1P(256) to the leaf L1 that point the leaf L1 are "000000000000" to "000011111111". Therefore, when the pointers to the leaf L# including the compression symbol "0000" extracted are "000000000000" to "000011111111", the leaf identifying unit 5108 accesses the structure of the leaf L1 that is pointed to.

The expansion code storing unit 5109 has a function of extracting the character codes, etc. that are stored in the structure of the leaf L# accessed by the leaf identifying unit 5108 and storing the character codes, etc., in the expansion buffer 5120 as expansion codes. More specifically, for example, in the above example, the structure of the leaf L1 is accessed and therefore, a character code e1 stored in the third area 2803 of the structure of the leaf L1 is extracted as the expansion code. The expansion code extracted is written into the expansion buffer 5120. A specific example of the storage of the expansion code will be described.

FIGS. 61A to 61E are explanatory diagrams of the specific example of the expanding process by the extracting unit 5107, the leaf identifying unit 5108, and the expansion code storing unit 5109 executed using the $2^m$-branching no-node Huffman tree H2. FIGS. 61A to 61E depict the example of expanding the compression symbol string depicted in FIG. 33B. In the expanding process, the compression symbol string is set in the register and the compression symbol is extracted by the master pattern. The compression symbol extracted is searched for from the root of the $2^m$-branching no-node Huffman tree H2 through one path (an access equivalent to one branch). The character code stored in the structure of the leaf L# accessed is read and is stored in the expansion buffer 5120.

The mask position of the mask pattern is off-set to extract the compression symbol. The initial value of the mask pattern is set to be "0xFFF00000". The mask pattern is a bit string whose 12 bits from the head are each "1" and whose 20 bits subsequent thereto are each "0".

The CPU 401 calculates a bit address "abi", a byte offset "byos", and a bit offset "bios". The bit address abi is a value that indicates the bit position of the compression symbol extracted and the bit address abi used in this session is a value obtained by adding a compression symbol length "leg" of the compression symbol extracted in the previous session to the bit address abi used in the previous session. In the initial state, the bit address abi is abi=0.

The byte offset byos is a value that indicates a byte border of the compression symbol string retained in the memory and is obtained as the quotient of bit address abi/8. For example, when the byte offset byos is byos=0, the compression symbol string from the head stored in the memory is set in the register and when the byte offset byos is byos=1, the compression symbol string from the first byte at the head stored in the memory is set in the register.

The bit offset bios is a value to offset the mask position ("FFF") of the mask pattern and is the remainder of bit address abi/8. For example, when the bit offset bios is bios=0, the mask position is not shifted and the mask pattern is "0xFFF00000". On the other hand, when the bit offset bios is bios=4, the mask position is shifted by four bits toward the tail and the mask pattern is "0x0FFF0000".

The number "rs" of register shifts is the number of bits by which the compression symbol string in the register after the AND-computation with the mask pattern is shifted toward the tail, and is obtained according to rs=32−12−bios. Due to this shifting, the bit string of m bits from the tail of the register after the shifting is extracted as an object bit string. After the object bit string is extracted, the register is cleared.

In FIGS. 61A to 61E, it is assumed that the memory retains the compression symbol string depicted in FIG. 34. Blocks in the memory of FIGS. 61A to 61E each represent a bit string of one byte and a digit therein indicates the byte position that is the byte border.

FIG. 61A depicts the initial state (the state of (A)). In (A), since the bit address abi is abi=0, the byte offset byos is byos=0 and the bit offset bios is bios=0. Since the byte offset byos is byos=0, a compression symbol string of four bytes (highlighted in FIG. 61A) from the head of the compression symbol string retained in the memory is set in the register.

Since the bit offset bios is bios=0, the mask pattern is "0xFFF00000". Therefore, an AND result is obtained by logical-product (AND) computing the compression symbol string set in the register and the mask pattern "0xFFF00000".

Since the bit offset bios is bios=0, the number of register shifts rs is rs=32−m−bios=32−12−0=20. Therefore, the AND result in the register is shifted by 20 bits toward the tail. Due to this shifting, "110001001100" is left in the register and therefore, the 12 bits from the tail are extracted as the object bit string. In this case, "110001001100" is extracted as the object bit string. After the extraction, the register is cleared.

As depicted in FIG. 27, the pointers to the leaves L1 to L1295 are stored in the root structure cell C(1, 1) of the no-node Huffman tree H2. Therefore, a pointer (the branch number) to the leaf L# that coincides with the object bit string "110001001100" extracted is searched for in the root structure cell C(1, 1) of the no-node Huffman tree H2. In this case, one pointer in the pointer group to the leaf L691 coincides and therefore, the corresponding pointer to the leaf L691 is read and the structure of the leaf L691 is accessed.

A character code "0xBA4E" (that corresponds to the character: "人") is stored in the structure of the leaf L3421 and therefore, the character code "0xBA4E" is extracted and is stored in the expansion buffer 5120. The compression symbol length "leg" (=12 bits) of the character code "0xBA4E" is also stored in the structure of the leaf L691 and therefore, the compression symbol length leg of the character code "0xBA4E" is also extracted. The bit address abi is updated using the extracted compression symbol length leg. In this case, the bit address abi after the updating is abi=0+12=12.

FIG. 61B depicts the expanding process (the state of (B)) executed when the register is shifted by the bits of the byte offset bios from the state of (A) depicted in FIG. 61A. The bit address abi of (A), which is the previous session, is abi=0 and the compression symbol length leg thereof is 12 bits and therefore, the bit address abi in (B) is abi=12 bits.

Since this bit address abi is abi=12, the byte offset byos is byos=1 and the bit offset bios is bios=4. Since the byte offset byos is byos=1, the compressed symbol string of four bytes from the first byte at the head (that is the meshed portion in FIG. 61B) is set in the register, of the compression symbol string that is retained in the memory.

Since the bit offset bios is bios=4, the mask pattern is "0x0FFF0000". Therefore, the AND result is obtained by logical-product (AND) computing the compression symbol string set in the register and the mask pattern "0x0FFF0000".

Since the bit offset bios that is bios=4, the number of register shifts rs is rs=32−m−bios=32−12−4=16. Therefore, the AND result in the register is shifted by 16 bits toward the tail. Since this shifting, "0000010001001010" is left in the register and therefore, the 12 bits from the tail are extracted as the object bit string. In this case, "010001001010" is extracted as the object bit string. After the extraction, the register is cleared.

As depicted in FIG. 27, the pointers to the leaves L1 to L1295 are stored in the root structure cell C(1, 1) of the no-node Huffman tree H2. Therefore, a pointer (the branch number) to the leaf L# that coincides with the object bit string "010001001010" extracted is searched for in the root structure cell C(1, 1) of the no-node Huffman tree H2. In this case, one pointer in the pointer group to the leaf L24 coincides and therefore, the corresponding pointer to the leaf L24 is read and the structure of the leaf L24 is accessed.

A character code "0x625F" (that corresponds to the character: "彟") is stored in the structure of the leaf L24 and therefore, the character code "0x625F" is extracted and is stored in the expansion buffer 5120. The compression symbol length "leg" (=8 bits) of the character code "0x625F" is also stored in the structure of the leaf L24 and therefore, the compression symbol length leg of the character code "0x625F" is also extracted. The bit address abi is updated using the extracted compression symbol length leg. In this case, the bit address abi after the updating is abi=12+8=20.

FIG. 61C depicts the expanding process (the state of (C)) executed when the register is shifted by the bits of the byte offset bios from the state of (B) depicted in FIG. 61B. The bit address abi of (B), which is the previous session, is abi=12 and the compression symbol length leg thereof is 8 bits and therefore, the bit address abi in (C) is abi=20 bits.

Since this bit address abi is abi=20, the byte offset byos is byos=2 and the bit offset bios is bios=4. Since the byte offset byos is byos=2, the compressed symbol string of 2 bytes from the first byte at the head (that is the meshed portion in FIG. 61C) is set in the register, of the compression symbol string that is retained in the memory.

Since the bit offset bios is bios=4, the mask pattern is "0x0FFF0000". Therefore, the AND result is obtained by logical-product (AND) computing the compression symbol string set in the register and the mask pattern "0x0FFF0000".

Since the bit offset bios that is bios=4, the number of register shifts rs is rs=32−m−bios=32−12−4=16. Therefore, the AND result in the register is shifted by 16 bits toward the tail. Since this shifting, "0000101001000000" is left in the register and therefore, the 12 bits from the tail are extracted as the object bit string. In this case, "101001000000" is extracted as the object bit string. After the extraction, the register is cleared.

As depicted in FIG. 27, the pointers to the leaves L1 to L1295 are stored in the root structure cell C(1, 1) of the no-node Huffman tree H2. Therefore, a pointer (the branch number) to the leaf L# that coincides with the object bit string "101001000000" extracted is searched for in the root structure cell C(1, 1) of the no-node Huffman tree H2. In this case, one pointer in the pointer group to the leaf L167 coincides and therefore, the corresponding pointer to the leaf L167 is read and the structure of the leaf L167 is accessed.

A divided character code "0x9D" is stored in the structure of the leaf L167 and therefore, the character code "0x9D" is extracted and is stored in the expansion buffer 5120. The compression symbol length "leg" (=12 bits) of the character code "0x9D" is also stored in the structure of the leaf L167 and therefore, the compression symbol length leg of the character code "0x625F" is also extracted. The bit address abi is updated using the extracted compression symbol length leg. In this case, the bit address abi after the updating is abi=20+12=32.

Figure 61D:
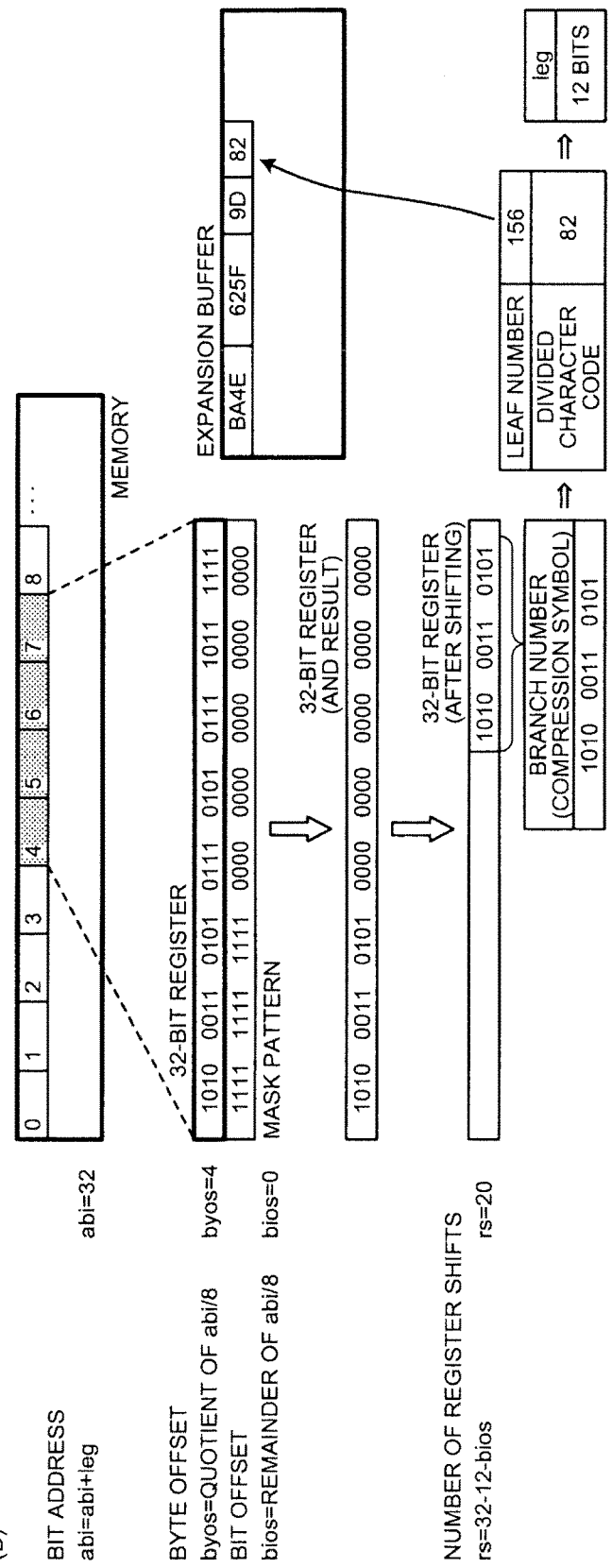

FIG. 61D depicts the expanding process (the state of (D)) executed when the register is shifted by the bits of the byte offset bios from the state of (C) depicted in FIG. 61C. The bit address abi of (C), which is the previous session, is abi=20 and the compression symbol length leg thereof is 12 bits and therefore, the bit address abi in (D) is abi=32 bits.

Since this bit address abi is abi=32, the byte offset byos is byos=4 and the bit offset bios is bios=0. Since the byte offset byos is byos=4, the compressed symbol string of 4 bytes from the first byte at the head (that is the meshed portion in FIG. 61D) is set in the register, of the compression symbol string that is retained in the memory.

Since the bit offset bios is bios=0, the mask pattern is "0xFFF00000". Therefore, the AND result is obtained by logical-product (AND) computing the compression symbol string set in the register and the mask pattern "0xFFF00000".

Since the bit offset bios that is bios=0, the number of register shifts rs is rs=32−m−bios=32−12−0=20. Therefore, the AND result in the register is shifted by 20 bits toward the tail. Since this shifting, "00001010010000000" is left in the register and therefore, the 12 bits from the tail are extracted as the object bit string. In this case, "101001000000" is extracted as the object bit string. After the extraction, the register is cleared.

As depicted in FIG. 27, the pointers to the leaves L1 to L1295 are stored in the root structure cell C(1, 1) of the no-node Huffman tree H2. Therefore, a pointer (the branch number) to the leaf L# that coincides with the object bit string "101001000000" extracted is searched for in the root structure cell C(1, 1) of the no-node Huffman tree H2. In this case, one pointer in the pointer group to the leaf L156 coincides and therefore, the corresponding pointer to the leaf L156 is read and the structure of the leaf L156 is accessed.

A character code "0x82" is stored in the structure of the leaf L156 and therefore, the character code "0x82" is extracted and is stored in the expansion buffer 5120. The compression symbol length "leg" (=12 bits) of the character code "0x82" is also stored in the structure of the leaf L156 and therefore, the compression symbol length leg of the character code "0x82" is also extracted. The bit address abi is updated using the extracted compression symbol length leg. In this case, the bit address abi after the updating is abi=32+12=44.

FIG. 61E depicts the expanding process (the state of (E)) executed when the register is shifted by the bits of the byte offset bios from the state of (D) depicted in FIG. 61C. The bit address abi of (D), which is the previous session, is abi=32 and the compression symbol length leg thereof is 12 bits and therefore, the bit address abi in (E) is abi=44 bits.

Since this bit address abi is abi=44, the byte offset byos is byos=5 and the bit offset bios is bios=4. Since the byte offset byos is byos=5, the compressed symbol string of 5 bytes from the first byte at the head (that is the meshed portion in FIG. 61E) is set in the register, of the compression symbol string that is retained in the memory.

Since the bit offset bios is bios=4, the mask pattern is "0x0FFF0000". Therefore, the AND result is obtained by logical-product (AND) computing the compression symbol string set in the register and the mask pattern "0x0FFF0000".

Since the bit offset bios that is bios=4, the number of register shifts rs is rs=32−m−bios=32−12−4=16. Therefore, the AND result in the register is shifted by 16 bits toward the tail. Since this shifting, "0000011110111111" is left in the register and therefore, the 12 bits from the tail are extracted as the object bit string. In this case, "011110111111" is extracted as the object bit string. After the extraction, the register is cleared.

As depicted in FIG. 27, the pointers to the leaves L1 to L1295 are stored in the root structure cell C(1, 1) of the no-node Huffman tree H2. Therefore, a pointer (the branch number) to the leaf L# that coincides with the object bit string "011110111111" extracted is searched for in the root structure cell C(1, 1) of the no-node Huffman tree H2. In this case, one pointer in the pointer group to the leaf L79 coincides and therefore, the corresponding pointer to the leaf L79 is read and the structure of the leaf L79 is accessed.

A character code "0x455C" is stored in the structure of the leaf L79 and therefore, the character code "0x6F30" is extracted and is stored in the expansion buffer 5120. The compression symbol length "leg" (=8 bits) of the character code "0x455C" is also stored in the structure of the leaf L79 and therefore, the compression symbol length leg of the character code "0x455C" is also extracted. The bit address abi is updated using the extracted compression symbol length leg. In this case, the bit address abi after the updating is abi=44+8=52.

In FIG. 56, the comparing unit 5110 has a function of comparing the character code string of the search keyword with the expanded code string stored in the expansion buffer 5120. The comparing unit 5110 compares with the expanded code every time the expanded code storing unit 5109 sequentially stores the expanded codes in the expansion buffer 5120. Thereby, the comparison with the search keywords can be executed simultaneously with the expanding process. Therefore, high-speed processing can be realized.

For example, the comparing unit 5110 executes the comparison on the expanded code whose comparison flag is ON, of the expanded codes sequentially stored in the expansion buffer 5120. The character codes to be compared are the character codes in the search keywords. The character codes to be compared with the expanded codes are determined based on the expanded code lengths of the expanded codes. For example, when the expanded code length of an expanded code is 16 bits, the 16-bit character code is to be compared. On the other hand, when the expanded code length is eight bits, the eight-bit character code (the divided character code) is to be compared. The starting position of the character code to be compared is at the head of the search key word.

The comparing unit 5110 shifts the character code to be compared to the subsequent character code each time coincidence is obtained in the comparison. During the comparison, if an expanded code that results in non-coincidence in the comparison appears or if an expanded code whose comparison flag is OFF appears, the comparison is again executed from the head of the search keyword.

The character string substituting unit 5111 has a function of, when the comparing unit 5110 compares the character string that coincides with the search keyword, substituting the character string such that the compared character string is displayed highlighted. More specifically, for example, the character string substituting unit 5111 sandwiches the expanded code string that results in coincidence in the comparison, using tags to display the expanded code string highlighted. Thereby, when the search result is displayed, the character string is displayed highlighted that corresponds to the expanded code string that results in coincidence in the comparison.

The output unit 5112 converts the expanded code string stored in the expansion buffer 5120 into a file and outputs the file as a file after the expansion (expanded file). The expanded file output is stored in a storage apparatus or is displayed on a display. If the expanded file output is displayed on the display, the expanded code string that coincides with the search keyword is sandwiched by the tags by the character string substituting unit 5111 to display the expanded code string highlighted and therefore, the expanded code string is displayed highlighted when the expanded code string is displayed on the display.

Figure 62A:
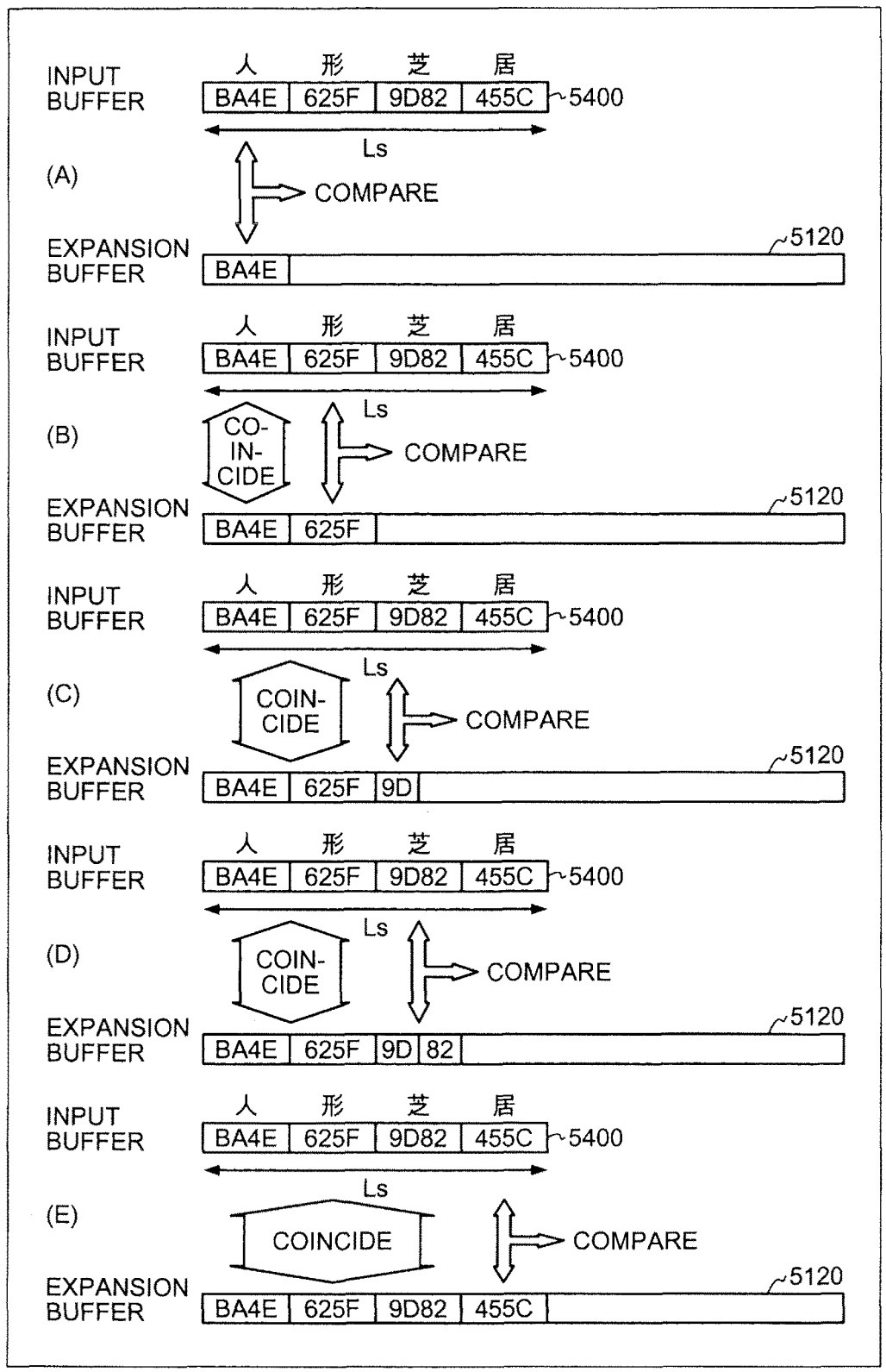
FIGS. 62A to 62C are explanatory diagrams of a specific example of a comparing process.
Figure 62B:
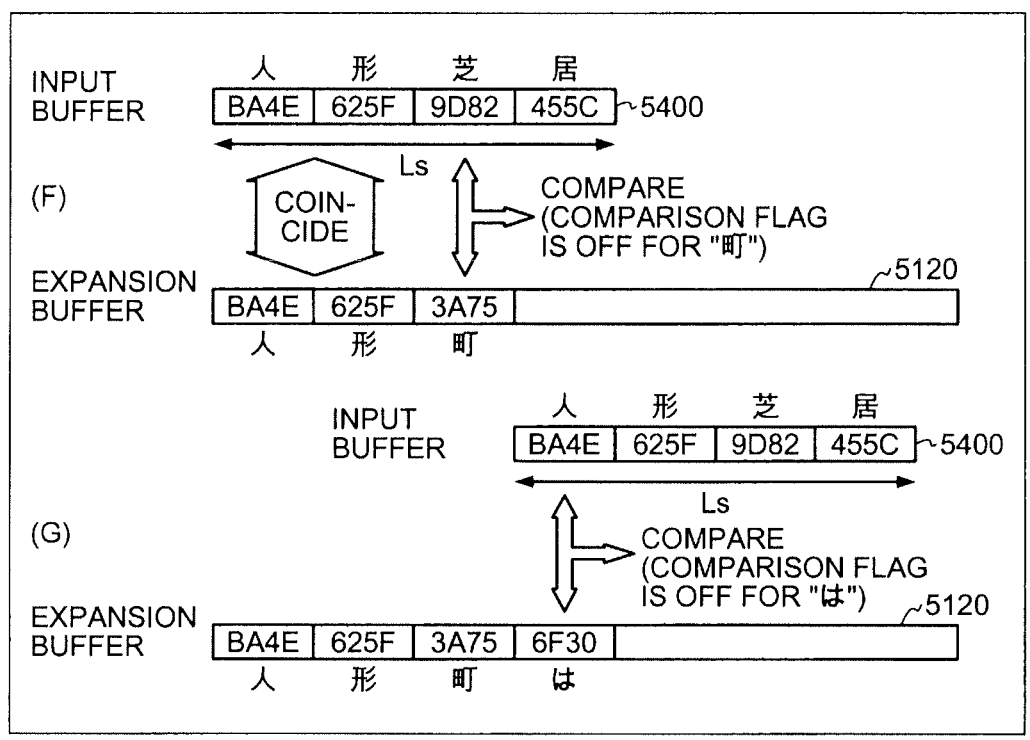
Figure 62C:
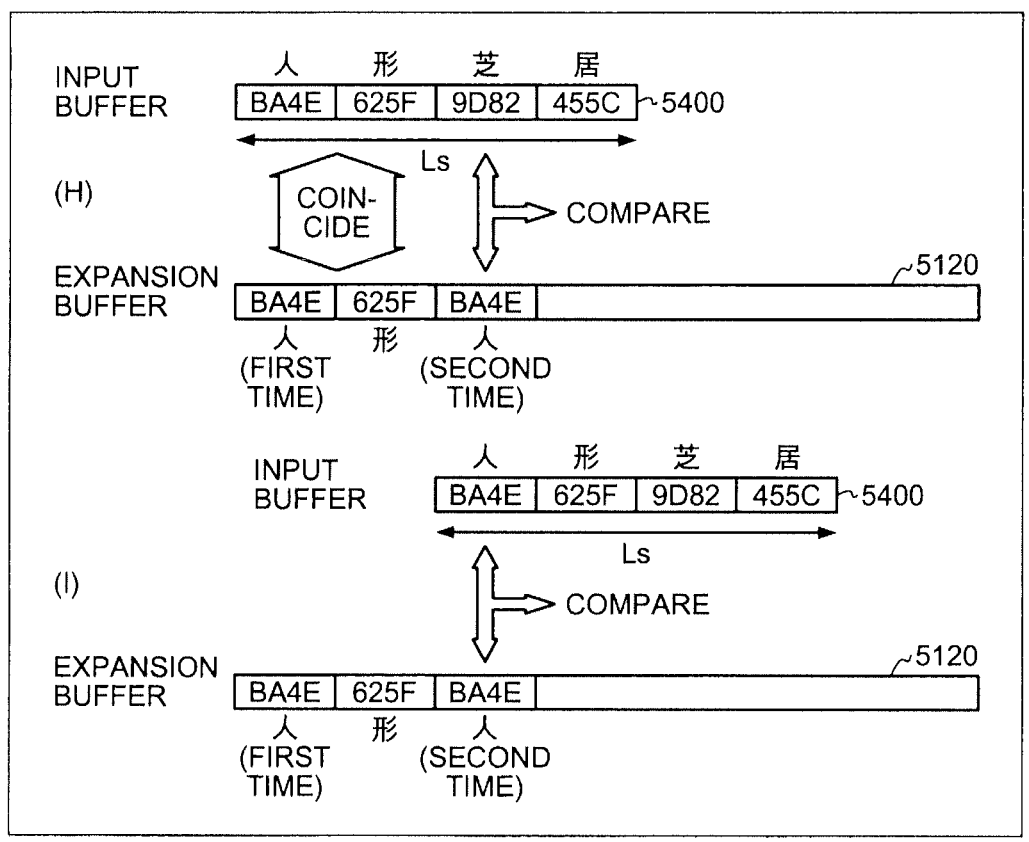

FIGS. 62A to 62C are explanatory diagrams of a specific example of the comparing process. It is assumed that the input buffer 5400 stores therein "BA4E625F9D82455C" that is the character code string of the search keyword "人形芝居".

In (A) of FIG. 62A, when the character code "0xBA4E" of the character "人" is stored as an expanded code in the expansion buffer 5120, ON or OFF is determined of the comparison flag of the structure of the leaf L# that stores therein the expanded code "0xBA4E". In this case, the comparison flag is ON and therefore, the comparison is executed on the expanded code "0xBA4E".

The expanded code "0xBA4E" is a 16-bit character code and therefore, the character code to be compared is the character code of 16 bits from the head. In the example, the character code is the character code "0xBA4E" of the character "人". In this case, the expanded code and the character code to be compared coincide with each other and therefore, a same comparing process is executed on the expanded code to subsequently be stored in the expansion buffer 5120.

In (B) of FIG. 62A, when the character code "0x625F" of the character "形" is stored as an expanded code in the expansion buffer 5120, ON or OFF is determined of the comparison flag of the structure of the leaf L# that stores therein the expanded code "0x625F". In this case, the comparison flag is ON and therefore, the comparison is executed on the expanded code "0x625F".

The expanded code "0x625F" is a 16-bit character code and therefore, the character code to be compared is a character code obtained by shifting by 16 bits from the character code "0xBA4E" and in this example, is the character code "0x625F" of the character "形". In this case, the expanded code and the character code to be compared coincide with each other and therefore, the same comparing process is executed on the expanded code that is subsequently stored in the expansion buffer 5120.

In (C) of FIG. 62A, when the divided character code "0x9D" of the character "芝" is stored as an expanded code in the expansion buffer 5120, ON or OFF is determined of the comparison flag of the structure of the leaf L# that stores therein the expanded code "0x9D". In this case, the comparison flag is ON and therefore, the comparison is executed on the expanded code "0x9D".

The expanded code "0x9D" is a 8-bit character code and therefore, the character code to be compared is a character code obtained by shifting by 8 bits from the character code "0x625F" and in this example, is the divided character code "0x9D" of the character "芝". In this case, the expanded code and the character code to be compared coincide with each other and therefore, the same comparing process is executed on the expanded code that is subsequently stored in the expansion buffer 5120.

In (D) of FIG. 62A, when the divided character code "0x82" of the character "芝" is stored as an expanded code in the expansion buffer 5120, ON or OFF is determined of the comparison flag of the structure of the leaf L# that stores therein the expanded code "0x82". In this case, the comparison flag is ON and therefore, the comparison is executed on the expanded code "0x82".

The expanded code "0x82" is a 8-bit character code and therefore, the character code to be compared is a character code obtained by shifting by 8 bits from the character code "0x9D" and in this example, is the divided character code "0x82" of the character "形". In this case, the expanded code and the character code to be compared coincide with each other and therefore, the same comparing process is executed on the expanded code that is subsequently stored in the expansion buffer 5120.

In (E) of FIG. 62A, when the character code "0x455C" of the character "居" is stored as an expanded code in the expansion buffer 5120, ON or OFF is determined of the comparison flag of the structure of the leaf L# that stores therein the expanded code "0x455C". In this case, the comparison flag is ON and therefore, the comparison is executed on the expanded code "0x455C".

The expanded code "0x455C" is a 16-bit character code and therefore, the character code to be compared is a character code obtained by shifting by 16 bits from the character code "0x82" and in this example, is the character code "0x455C" of the character "居".

All the character code strings in the search keyword are compared and as a result, coincidence is obtained. Therefore, the expanded code string "BA4E625F9D82455C" in the expansion buffer 5120 is sandwiched by the tags for displaying highlighted. Thereby, when the search result is displayed, the expanded code string can be displayed highlighted as the character string that coincides with search keyword.

FIG. 62B depicts a first example of the appearance of a character code that does not coincide during the comparison for coincidence. In (F), as (A) and (B) of FIG. 62A, it is assumed that the expanded codes "BA4E" and "625F" coincide in the comparison.

In (F), when the character code "0x6F30" of the character "町" is stored in the expansion buffer 5120 as the expanded code, ON or OFF of the comparison flag of the structure of the leaf L# that stores therein the expanded code "0x3A75" is determined. In this case, the comparison flag is OFF and therefore, no comparison is executed on the expanded code "0x3A75". Because the comparison flag is OFF, the character code to be compared is returned to the head.

In (G), when the character code "0x6F30" of the character "は" is stored in the expansion buffer 5120 as the expanded code, ON or OFF of the comparison flag of the structure of the leaf L# that stores therein the expanded code "0x6F30" is determined. In this case, the comparison flag is OFF and therefore, no comparison is executed on the expanded code "0x6F30". Because the comparison flag is OFF, the character code to be compared is returned to the head. As described, no comparison is executed on the expanded code whose comparison flag is OFF and therefore, useless comparison can be prevented and an increase of the speed of the comparing process can be realized.

FIG. 62C depicts a second example of the appearance of a character code that does not coincide during the comparison for coincidence. In (H), as (A) and (B) of FIG. 62A, it is assumed that the expanded codes "BA4E" and "625F" coincide with each other in the comparison.

In (H), when the character code "0xBA4E" of the character "人" is stored in the expansion buffer 5120 as the expanded code, ON or OFF of the comparison flag of the structure of the leaf L# that stores therein the expanded code "0xBA4E" is determined. In this case, the comparison flag is ON and therefore, a comparison is executed on the expanded code "0xBA4E".

The expanded code "0xBA4E" (in its second session) is a 16-bit character code and therefore, the character code to be compared is a character code obtained by shifting by 16 bits from the character code "0x625F" and in this example, is the character code "0x625F" of the character "形". In this case, though the expanded code and the character code to be compared do not coincide with each other, the comparison flag of the expanded code "0xBA4E" (in its second session) is ON and the expanded code is a 16-bit character code.

Therefore, in (I), the character code to be compared is compared with the character code "0xBA4E" that is 16 bits from the head of the search keyword. In this case, coincidence is obtained and therefore, the comparing process is executed on the expanded code that is to be stored next in the expansion buffer 5120.

FIG. 63 is a flowchart of the procedure of a search keyword compressing process. The input unit 5101 waits for a search keyword to be input (step S6301: NO). When the search keyword is input (step S6301: YES), the input unit 5101 disassembles the search keyword into single characters (step S6302) and whether the input unit 5101 designates any search condition is determined (step S6303).

If it is determined that no search condition has been designated (step S6303: NO), a partial-coincidence search is to be executed and therefore, the procedure proceeds to step S6307. On the other hand, if it is determined that a search condition is designated (step S6303: YES), whether the search condition designated is a forward search or a reverse search is determined (step S6304). If it is determined that the search condition designated is a forward search (step S6304: FORWARD SEARCH), a special character is added to the search keyword at its head (step S6305) and the procedure proceeds to step S6307. On the other hand, if it is determined that the search condition designated is a reverse search (step S6304: REVERSE SEARCH), a special character is added to the search keyword at its tail (step S6306) and the procedure proceeds to step S6307.

At step S6307, the search keyword compressing unit 5102 executes the compressing process of Huffman-compressing on each of the characters that constitute the search keyword using the no-node Huffman tree H2 (step S6307). This compressing process (step S6307) is the same process as the process depicted in FIGS. 34 and 36 to 38 and therefore, will not again be described. Thereby, the search keyword compressing process comes to an end.

Figure 64A:
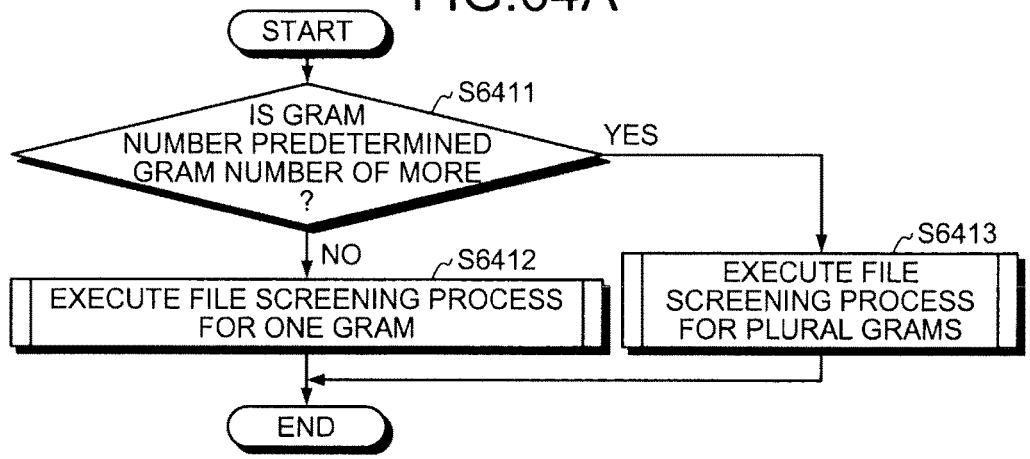
FIG. 64A is a flowchart of a procedure of a file screening process by a compressed file identifying unit.

FIG. 64A is a flowchart of the procedure of a file screening process by the compressed file identifying unit 5105. Whether the number of grams of the search keyword is at least a predetermined number is determined (step S6411). The predetermined number of grams is set in advance. If it is determined that the number of grams of the search keyword is not the predetermined number or more (step S6411: NO), a file screening process for one gram is executed (step S6412). On the other hand, if it is determined that the number of grams of the search keyword is the predetermined number or more (step S6411: YES), a file screening process for plural grams is executed (step S6413).

Figure 64B:
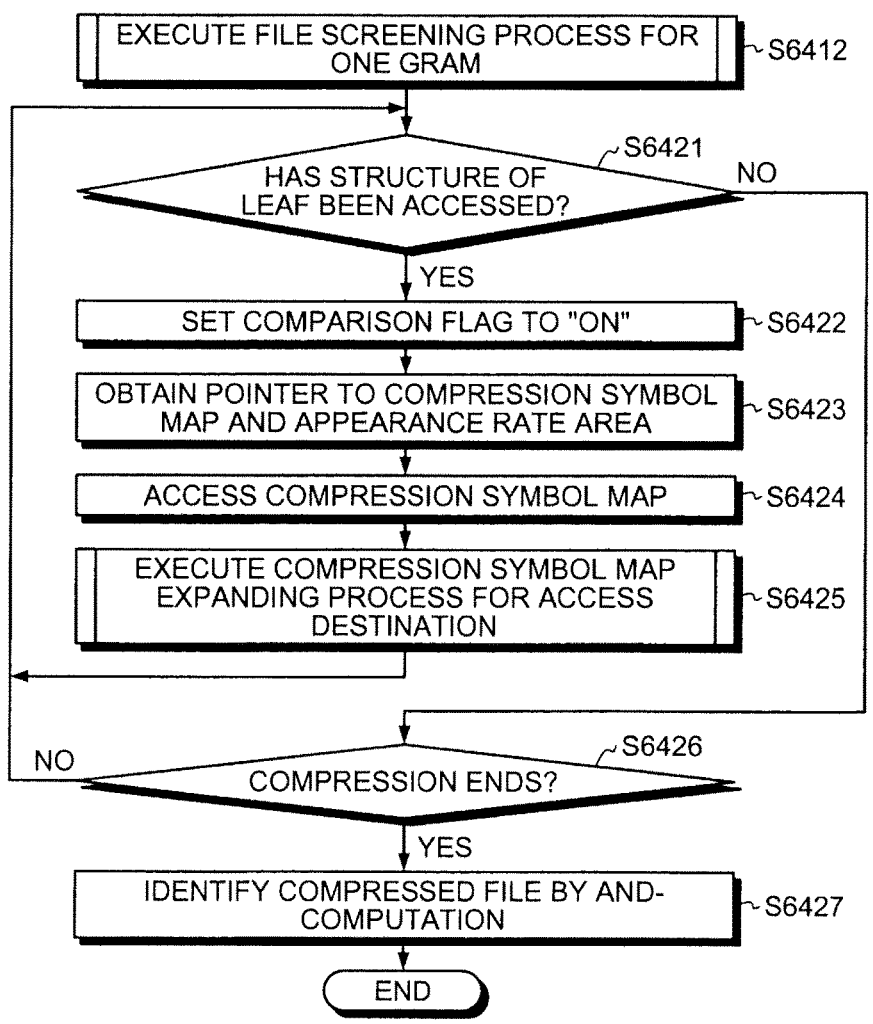
FIG. 64B is a flowchart of a file screening process (step S6412) for one gram depicted in FIG. 64A.

FIG. 64B is a flowchart of the file screening process (step S6412) for one gram depicted in FIG. 64A. In the compressing process (step S6307) depicted in FIG. 63, whether the structure of the leaf L# is accessed has been determined (step S6421). If it is determined that the structure of the leaf L# has been accessed (step S6421: YES), the comparison flag of the structure of the leaf L# is set to be ON (step S6422). The pointer from the structure of the leaf L# to the compression symbol map and the appearance rate area are obtained (step S6423).

The compression symbol map is accessed via the pointer to the compression symbol map obtained (step S6424), the compression symbol map expanding process for the access destination is executed (step S6425) and the procedure returns to step S6421. The compression symbol map expanding process for the access destination (step S6425) will be described later. If it is determined at step S6421 that the structure of the leaf L# has not been accessed (step S6421: NO), whether the search keyword compressing process depicted in FIG. 63 has come to an end is determined (step S6426).

If it is determined that the search keyword compressing process has not yet come to an end (step S6426: NO), the procedure returns to step S6421. On the other hand, if it is determined that the search keyword compressing process has come to an end (step S6426: YES), identification of the compressed file by the AND-computation is executed as depicted in FIG. 59 (step S6427). The compressed file identified in this manner is referred to as "identified compressed file". Thereby, the file screening process for one gram comes to an end.

Figure 64C:
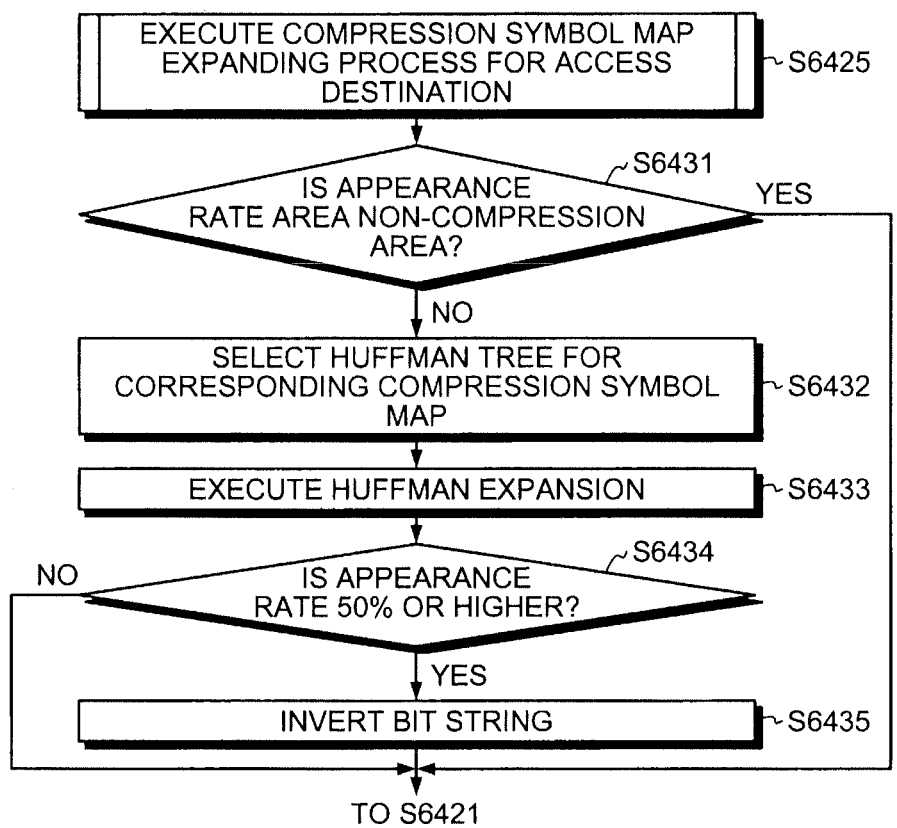
FIG. 64C is a flowchart of a compression symbol map expanding process for the access destination (step S6425) depicted in FIG. 64B.

FIG. 64C is a flowchart of the compression symbol map expanding process for the access destination (step S6425) depicted in FIG. 64B. The compression pattern table depicted in FIG. 52B is referred to and whether the appearance rate area obtained at step S6423 is a non-compression area is determined (step S6431). If it is determined that the appearance rate area is a non-compression area (step S6431: YES), the expanding process is not executed and the procedure returns to step S6421.

On the other hand, if it is determined that the appearance rate area is not a non-compression area (step S6431: NO), a Huffman tree for the compression symbol map that corresponds to the appearance rate area is selected (step S6432). The compression symbol map M at the destination of the access by the pointer to the compression symbol map obtained at step S6423 is Huffman-expanded by the selected Huffman tree for the compression symbol map (step S6433). Whether the appearance rate is at least 50% is determined (step S6434).

More specifically, the appearance rate area is determined according to the appearance rate (see FIG. 52A) and therefore, when the appearance rate areas are A to E, it is determined that the appearance rate of the character code obtained is not 50% or higher. On the other hand, when the appearance rate areas are A' to E', it is determined that the appearance rate of the character code obtained is 50% or higher.

If it is determined that the appearance rate is 50% or higher (step S6434: YES), the inversion has been executed at step S5209 and therefore, the bit string expanded at step S6433 is inverted (step S6435). Thereby, the bit string returns to its original bit string.

On the other hand, if it is determined at step S6434 that the appearance rate is not 50% or higher (step S6434: NO), the bit string inversion (step S6435) is not executed and the procedure returns to step S6421.

By the compression symbol map expanding process for the access destination (step S6425), only the compression symbol strings in the compression symbol map for the characters constituting the search keywords can be expanded and therefore, the expansion of the compression symbol strings that are necessary for the search alone are executed. Therefore, improvement of the expansion efficiency can be facilitated.

Figure 64D:
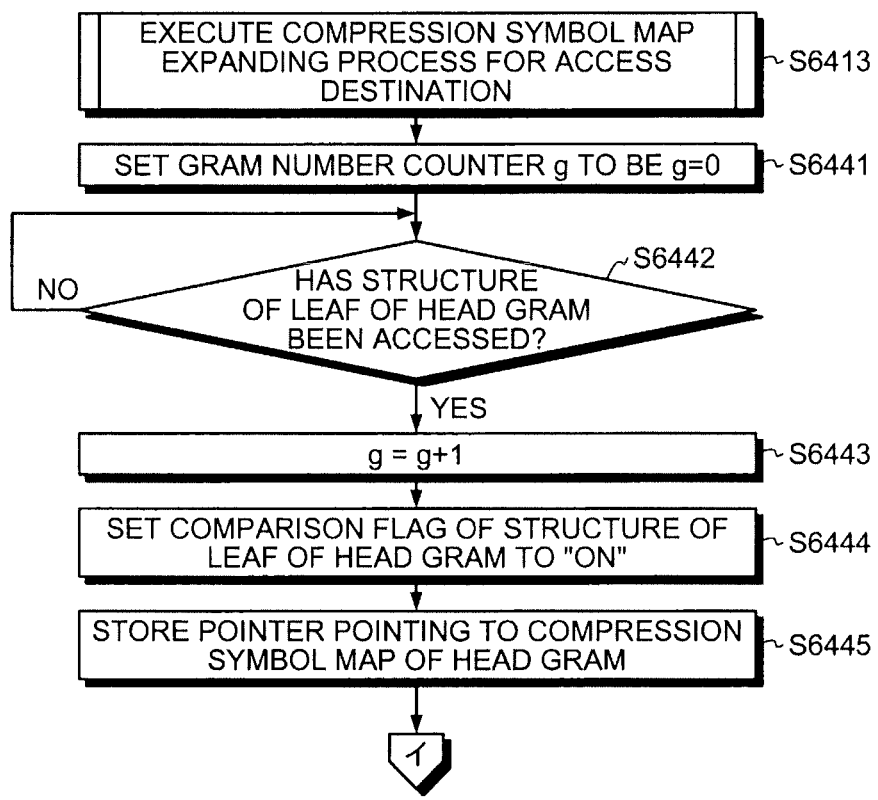
Figure 64E:
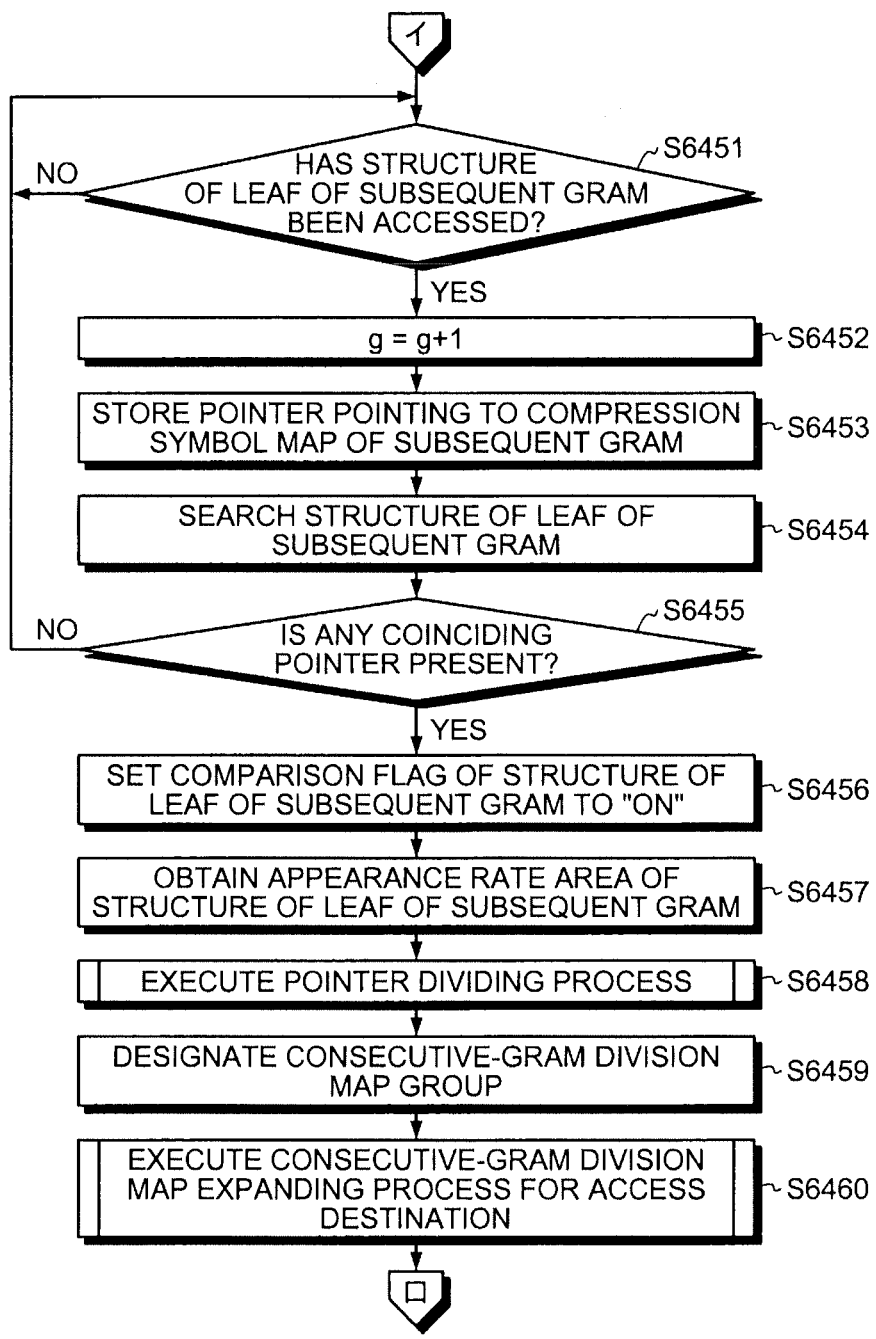

FIGS. 64D to 64F are flowcharts of the file screening process for plural grams (step S6413) depicted in FIG. 64A. As depicted in FIG. 64A, a gram number counter "g" is set to be g=0 (step S6441) and in the compressing process (step S6307) depicted in FIG. 63, access to the structure of the leaf L# that is the gram at the head of the search keyword is awaited (step S6442: NO).

When an access is made to the structure of the leaf L# (step S6442: YES), the gram number counter g is incremented (step S6443) and the comparison flag of the structure of the leaf L# of the gram at the head is set to be ON (step S6444). The pointer to the compression symbol map is extracted from the structure of the leaf L# of the gram at the head, and is stored in the map generation register (step S6445).

As depicted in FIG. 64E, access to the structure of the leaf L# of the succeeding gram is awaited (step S6451: NO). When an access is made to the structure of the leaf L# of the succeeding gram (step S6451: YES), the gram number counter g is incremented (step S6452) and the pointer to the compression symbol map of the succeeding gram is extracted from the structure of the leaf L# of the succeeding gram and is stored in the map generation register (step S6453).

A pointer that coincides with the pointer to the compression symbol map of the preceding gram, that is, the pointer to the compression symbol map that is stored previously in the map generation register is searched for in the consecutive-gram area of the structure of the leaf L# of the succeeding gram (step S6454). If no pointer that coincides is present in the consecutive-gram area of the structure of the leaf L# of the succeeding gram (step S6455: NO), the procedure returns to step S6451. On the other hand, if a pointer that coincides is present (step S6455: YES), the comparison flag of the structure of the leaf L# of the succeeding gram is set to be ON (step S6456). The appearance rate area of the structure of the leaf L# of the succeeding gram is obtained (step S6457) and the pointer dividing process is executed (step S6458).

This pointer dividing process (step S6458) is the same process as the pointer dividing process depicted in FIG. 46D and therefore, will not again be described. As the result of the pointer dividing process (step S6458), a pointer group to the consecutive-gram divided map is generated from the pointers to the compression symbol maps of the preceding gram and the succeeding gram. Therefore, the corresponding consecutive-gram division map group is designated by the generated pointer group to the consecutive-gram divided map (step S6459).

The consecutive-gram divided map expanding process for the access destination is executed using the appearance rate area of the structure of the leaf L# of the succeeding gram that is obtained at step S6457 (step S6460). The details of the consecutive-gram divided map expanding process for the access destination (step S6460) are the same as those of the process procedure depicted in FIG. 64C and therefore, will not again be described.

As the result of the consecutive-gram divided map expanding process for the access destination (step S6460), only the compression symbol string in the consecutive-gram divided map can be expanded for the characters that constitute the search keyword and therefore, the expansion of the compression symbol strings necessary for the search alone are executed. Therefore, improvement of the expansion efficiency can be facilitated.

As depicted in FIG. 64F, whether the succeeding gram is the gram at the tail of the search keyword is determined (step S6461). If it is determined that the succeeding gram is not the gram at the tail (step S6461: NO), the procedure returns to step S6451 of FIG. 64E. Thereby, until the gram at the tail appears, the pointer group to the consecutive-gram divided map can be generated for two consecutive grams in the search keyword.

When it is determined at step S6461 that the succeeding gram is the gram at the tail (step S6461: YES), the g-gram head-and-tail area of the structure of the leaf L# of the succeeding gram that is at the tail is searched (step S6462). It is determined whether a pointer to the compression symbol map is present in the g-gram head-and-tail area of the structure of the leaf L# of the succeeding gram that is at the tail (step S6463). If it is determined that no pointer to the compression symbol map is present in the g-gram head-and-tail area of the structure of the leaf L# of the succeeding gram that is at the tail (step S6463: NO), the procedure proceeds to step S6469. In this case, no pointer group to the g-gram head-and-tail divided map is generated and therefore, no screening using the g-gram head-and-tail divided map can be executed and therefore, screening using the consecutive-gram divided map is executed.

If it is determined that a pointer to the compression symbol map is present in the g-gram head-and-tail area of the structure of the leaf L# of the succeeding gram that is at the tail (step S6463: YES), it is determined whether the pointer to the compression symbol map and the pointer to the compression symbol map of the gram at the head of the search keyword coincide with each other (step S6464). If it is determined that the pointers do not coincide with each other (step S6464: NO), the procedure proceeds to step S6469. In this case, no pointer group to the g-gram head-and-tail divided map is generated and therefore, no screening using the g-gram head-and-tail divided map can be executed and therefore, screening using the consecutive-gram divided map is executed.

On the other hand, if it is determined that the pointers coincide with each other (step S6464: YES), the appearance rate area is obtained from the structure of the leaf L# of the succeeding gram that is at the tail (step S6465) and the pointer dividing process is executed (step S6466).

This pointer dividing process (step S6466) is the same process as the pointer dividing process depicted in FIG. 46D and therefore, will not again be described. As a result of the pointer dividing process (step S6466), a pointer group to the g-gram head-and-tail divided map is generated from the pointers to the compression symbol maps of the grams at the head and that at the tail. Therefore, the corresponding g-gram head-and-tail divided map group is designated by the generated pointer group to the g-gram head-and-tail divided map (step S6467).

The g-gram head-and-tail divided map expanding process for the access destination is executed using the appearance rate area of the structure of the leaf L# of the succeeding gram that is obtained at step S6465 (step S6468). The details of the g-gram head-and-tail divided map expanding process for the access destination (step S6468) are the same as those of the process procedure depicted in FIG. 64C and will not again be described.

As depicted in FIGS. 61A to 61C, by finally executing an AND-computation process of the consecutive-gram divided map group obtained at step S6460 and the g-gram head-and-tail divided map group obtained at step S6468, the compressed file is identified (step S6469). The compressed file identified in this manner is also the "identified compressed file ft". Thereby, the file screening process for the plural grams comes to an end.

Figure 65:
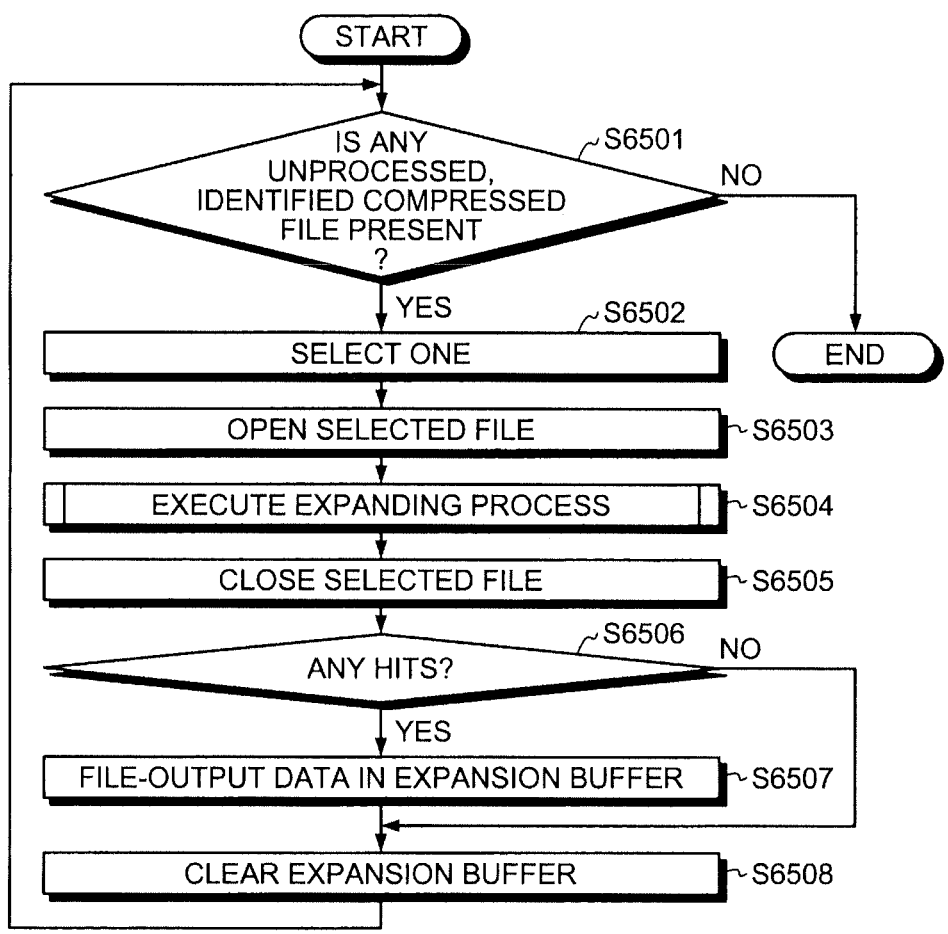
FIG. 65 is a flowchart of the procedure of an identified compressed file expanding process.

FIG. 65 is a flowchart of the procedure of an identified compressed file expanding process. Whether an unprocessed identified compressed file is present is determined (step S6501). If it is determined that an unprocessed identified compressed files is present (step S6501: YES), one unprocessed identified compressed file ft is selected (step S6502) and opened (step S6503). The expanding process is executed (step S6504). The details of the expanding process (step S6504) will be described later. The identified compressed file ft selected is closed (step S6505).

Whether any hit is present in the identified compressed file ft selected is determined (step S6506). More specifically, whether any character code string that coincides with the search keyword is present is determined. If it is determined that a hit is present (step S6506: YES), the character code string that coincides with the search keyword is present in the file F obtained by expanding the identified compressed file ft, and the data in the expansion buffer 5120 is file-output (step S6507). If it is determined that no hit is present (step S6506: NO), the procedure proceeds to step S6508.

Thereby, the expanded file F can be obtained from the identified compressed file ft. Thereafter, the expansion buffer 5120 is cleared (step S6508) and the procedure returns to step S6501. On the other hand, if it is determined at step S6501 that no unprocessed identified compressed file ft is present (step S6501: NO), the identified compressed file expanding process comes to an end.

Figure 66A:
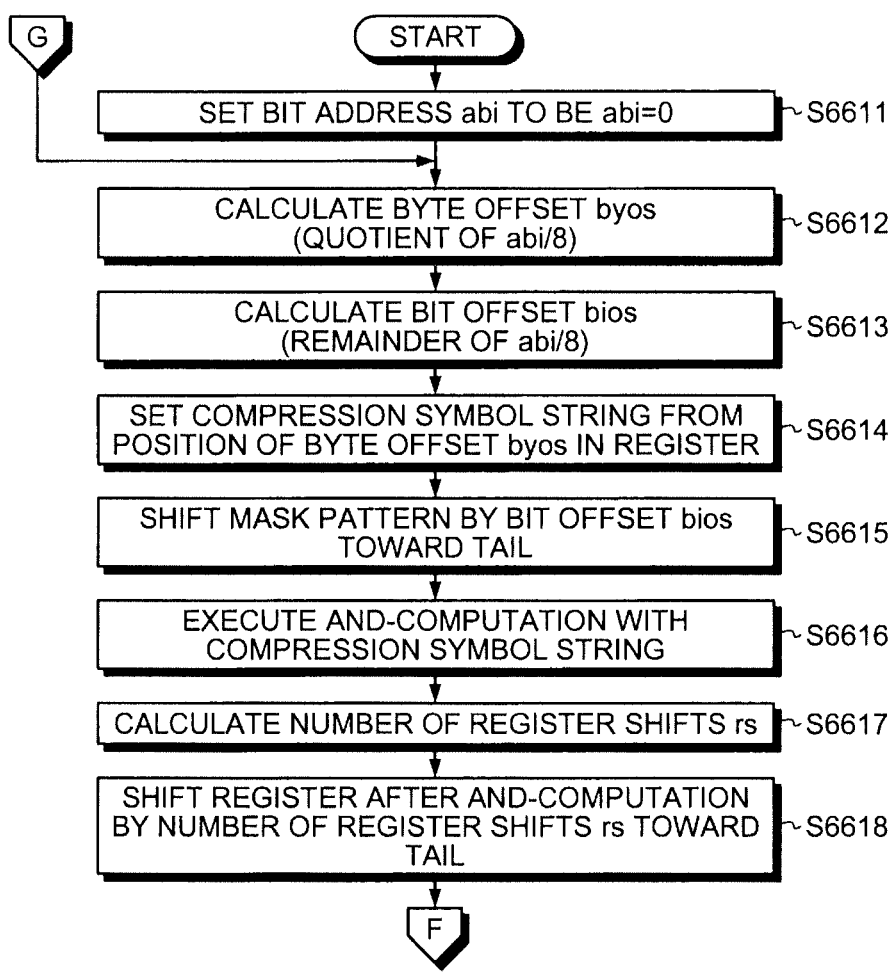

FIGS. 66A and 66B are flowcharts of the procedure of the expanding process using the no-node Huffman tree H2. As depicted in FIG. 66A, the bit address abi is set to be abi=0 (step S6611); the byte offset byos is calculated (step S6612); and the bit offset bios is calculated (step S6613). The compression symbol string from the position of the byte offset byos is set in the register (step S6614).

The mask pattern "0xFFF00000" is shifted by the bits of the bit offset bios toward the tail (step S6615) and AND-computation of the shifted mask pattern and the compression symbol string set in the register is executed (step S6616). Thereafter, the number of register shifts rs is calculated (step S6617) and the register after the AND-computation is shifted by the number of register shifts rs toward the tail (step S6618).

After step S6618, as depicted in FIG. 66B, m (m=12) bits from the tail are extracted as an object bit string from the register after the shifting (step S6621). A pointer to the leaf L# that is the branch number is identified from the root structure cell C(1, 1) of the no-node Huffman tree H2 (step S6622) and the structure of the leaf L# that is pointed to is accessed through one path (step S6623). The character code is extracted from the structure of the leaf L# of the access destination (step S6624) and the character code extracted is written into the expansion buffer 5120 (step S6625).

The compression symbol length leg is extracted from the structure of the leaf L# (step S6626) and the bit address abi is updated (step S6627). Thereafter, it is determined whether any compression symbol string is present or, more specifically, whether a compression symbol string to which no masking process using the mask pattern is applied is present, in the memory (step S6628). This is determined by, for example, determining whether a byte position that corresponds to the byte offset byos is present. If it is determined that a compression symbol string is present (step S6628: YES), the procedure returns to step S6612 of FIG. 66A. On the other hand, if it is determined that a compression symbol string is not present (step S6628: NO), the series of expanding process steps comes to an end.

By executing the expanding process, the compression symbol can be extracted by m bits as a unit from the compression symbol string and by accessing the root structure cell C(1, 1) of the no-node Huffman tree H2, the pointer to the leaf L# that is the corresponding branch number can be identified. The compression symbol is expanded by extracting the character code from the structure of the leaf L# that is pointed to. In this manner, the no-node Huffman tree H2 has no internal node and therefore, when the pointer to the leaf L# is identified, the structure of the leaf L# can be accessed through one path. Therefore, an increase of the speed of the expansion can be facilitated.

Figure 67B:
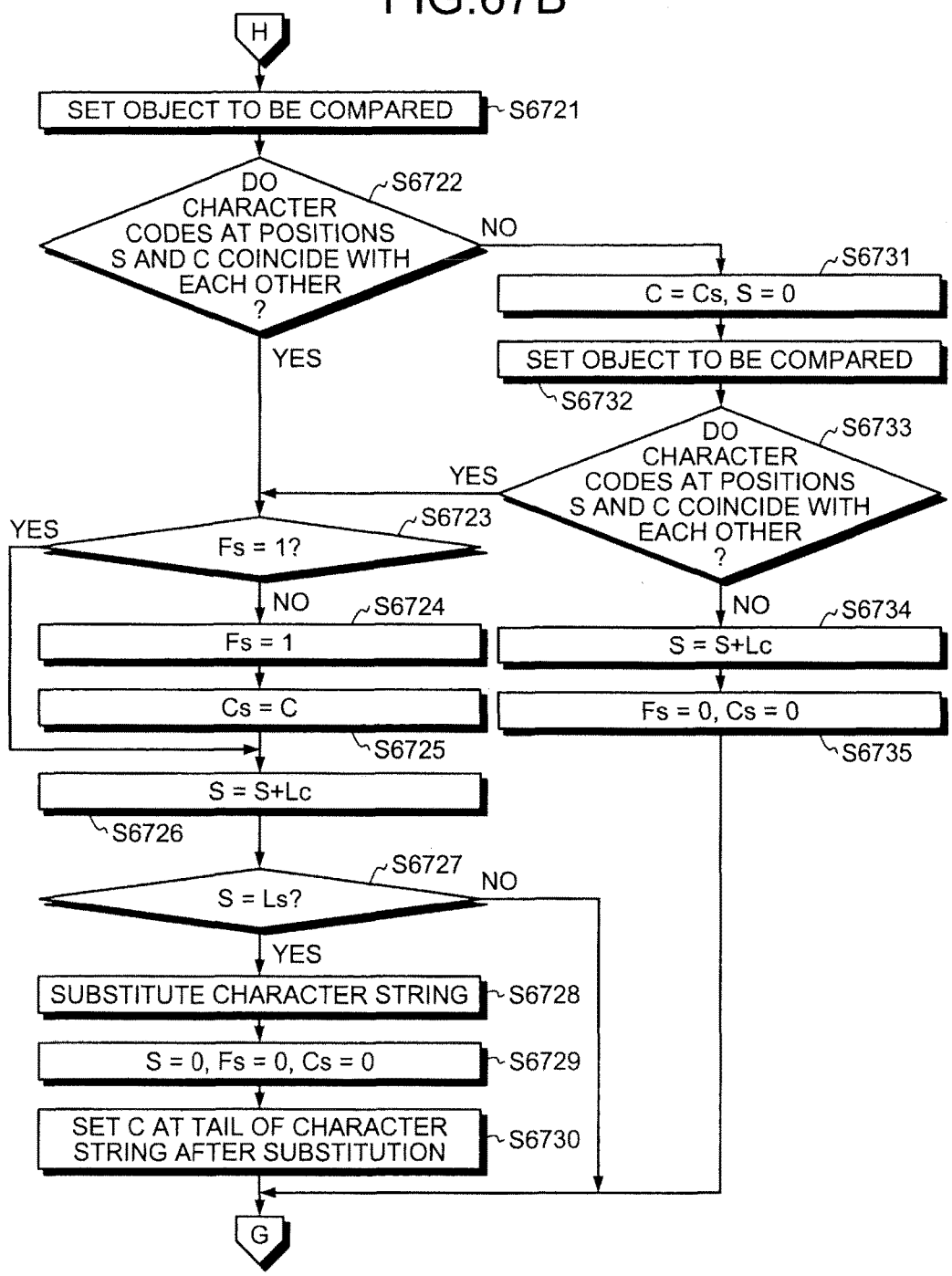

FIGS. 67A and 67B are flowcharts of the procedure of the comparing process. As depicted in FIG. 67A, detection of an opening of the identified compressed file ft at step S6503 of FIG. 65 is awaited (step S6711: NO). When the opening of the identified compressed file ft is detected (step S6711: YES), "C" is set to be C=0 and "S" is set to be S=0 (step S6712). "C" is the current position in the expansion buffer 5120. "S" is the current position in the input buffer 5400 that retains the search keyword.

Whether the structure of the leaf L# that is pointed to at step S6623 of FIG. 66B has been accessed is determined (step S6713). If it is determined that the structure has not been accessed (step S6713: NO), whether the identified compressed file has been closed at step S6505 of FIG. 65 is determined (step S6714). If it is determined that the identified compressed file is not closed (step S6714: NO), the procedure returns to step S6713. If it is determined that the identified compressed file is closed (step S6714: YES), the comparing process comes to an end.

On the other hand, if it is determined that the structure of the leaf L# has been accessed (step S6713: YES), it is determined whether the comparison flag in the structure of the leaf L# of the access destination is ON (step S6715). If it is determined that the comparison flag is not ON (step S6715: NO), no comparison is executed with the expanded code stored at this session to the expansion buffer 5120 (that coincides with the character code in the structure of the leaf L# of the access destination) and therefore, the current position C is updated by adding the expanded code length Lc of the expanded code stored at this session to the expansion buffer 5120 to the current position C in the expansion buffer 5120 (step S6716). Thereby, the comparison can again be executed from the current position C.

Thereafter, the current position S in the input buffer 5400 is set to be S=0, a start flag Fs is set to be Fs=0, and the current position Cs of the expansion buffer 5120 obtained when the start flag Fs is Fs=1 is set to be Cs=0 (step S6717) and the procedure returns to step S6713. The "start flag Fs" is a flag that is set up (set to be Fs=1) if the character code of the character at the head of the search keyword coincides, and "Cs" is the current position C at this time. Thereby, the comparing process as depicted in FIG. 62B can be executed. On the other hand, if it is determined at step S6715 that the comparison flag is ON (step S6715: YES), the procedure proceeds to step S6721 of FIG. 67B.

As depicted in FIG. 67B, an object to be compared is set (step S6721). More specifically, a character code having the character code length of the expanded code stored at this session from the current position C of the character code string of the search keyword is set as the object to be compared with the expanded code.

The expanded code from the position S and the character code from the position C to be compared are compared with each other (to determine coincidence) (step S6722). If it is determined that the expanded code and the character code coincide with each other (step S6722: YES), whether the start flag Fs is Fs=1 is determined (step S6723). If it is determined that the start flag Fs is Fs=1 (step S6723: YES), the procedure proceeds to step S6726. On the other hand, if it is determined that the start flag Fs is not Fs=1 (step S6723: NO), the start flag Fs is set to be Fs=1 (step S6724) and Cs is set to be Cs=C (step S6725). Thereby, the position can be stored of the expanded code that coincides with the character code at the head of the search keyword.

The current position S is updated by adding the expanded code length Lc of the expanded code stored in this session in the expansion buffer 5120 to the current position S in the input buffer 5400 (step S6726). Whether the current position S is S=Ls is determined (step S6727). "Ls" is the character code length of the search keyword. Whether the current position S is at the tail of the search keyword is determined. If it is determined that the current position S is S=Ls (step S6727: YES), the character string that coincides with the search keyword is obtained from the expansion buffer 5120 and therefore, the expanded code string is character-string-substituted (step S6728).

Thereafter, the current position S in the input buffer 5400 is set to be S=0, the start flag Fs is set to be Fs=0, and the current position Cs of the expansion buffer 5120 obtained when the start flag Fs is Fs=1 is set to be Cs=0 (step S6729). The current position C in the expansion buffer 5120 is set to be at the tail of the character string after the substitution (step S6730). Thereby, the comparing process as depicted in FIG. 62A can be executed. Thereafter, the procedure returns to step S6713.

If it is determined at step S6727 that the current position S is not S=Ls (step S6727: NO), the length of the expanded code string does not reach the character code length of the search keyword and therefore, the steps S6728 to 6730 are not executed and the procedure returns to step S6713.

If it is determined at step S6722 that the expanded code from the position S and the character code to be compared from the position C do not coincide with each other (step S6722: NO), the current position C in the expansion buffer 5120 is set to be C=Cs and the current position S in the input buffer 5400 is set to be S=0 (step S6731). Similarly to step S6722, an object to be compared is set (step S6732). More specifically, a character code having the character code length of the expanded code stored in this session from the current position C (C=Cs) of the character code strings of the search keyword is set as the object to be compared with the expanded code. Thereby, the comparing process as depicted in FIG. 62C can be executed.

Thereafter, similarly to step S6722, the expanded code from the position S and the character code from the position C to be compared are compared with each other (to determine their coincidence) (step S6733). If it is determined that the expanded code and the character code coincide with each other (step S6733: YES), the procedure proceeds to step S6723.

On the other hand, if it is determined that the expanded code and the character code do not coincide with each other (step S6733: NO), the current position S is updated by adding the expanded code length Lc of the expanded code stored at this session to the expansion buffer 5120 and the current position S (S=0) in the input buffer 5400 (step S6734). Thereafter, the start flag Fs is set to be Fs=0 and Cs is set to be Cs=0 (step S6735), and the procedure proceeds to step S6713.

By executing the comparing process, rather than executing the comparison after the expanding process comes to an end, the comparison can be executed concurrently with the expanding process. Therefore, an increase of the speed of the comparing process can be realized.

Although the x-gram head-and-tail divided map group is generated for each gram number in the embodiment, a head-and-tail divided map group that includes the gram numbers from two to X may be generated. In this case, the number of head-and-tail divided map group can be reduced and therefore, saving of the memory can be facilitated.

In this case, screening using the head-and-tail divided map group can not be executed for each gram number of the search keyword. For example, in the case where consecutive-characters such as "東京", "京都", and "東都" are present in a file Fp for a search keyword "東京都", the file Fp is an identified compressed file ft even when "東京都" is not present in the file Fp, based on the consecutive-gram divided map group of each of consecutive-characters and the head-and-tail divided map group of "東都". To avoid such search noise, a culling process is executed.

FIG. 68 is an explanatory diagram of the culling process. In the culling process, address values of pointers to the compression symbol map of the character codes are culled in the pointer dividing process and are coupled with each other. When pointers to the compression symbol maps of two-gram higher-level character codes are coupled with each other, the address value obtained by the coupling is 20 bits. In the culling process, for three or more grams, the address values of the pointers to the compression symbol maps of the characters are culled and are set to be 20 bits in total.

In FIG. 68, (A) depicts the state of the three-gram character code string "東京都" before culling and (B) depicts the state thereof after the culling. In FIG. 68, "東" at the head is culled by its upper three bits, "京" in the middle is culled by its upper four bits, and "都" at the tail is culled by its upper three bits and therefore, the pointers are set to be 20 bits. Thereafter, as described above, for the pointer string after the culling, division is executed for the upper-five-bit sections, the upper five bits and the lower five bits, the lower five bits and the upper five bits, and the lower-five-bits. Thereby, a culled division map group that covers "東", "京", and "都" is generated.

FIG. 69 is an explanatory diagram of exemplary identification of the compressed file using the culled divided map group. By generating the culled divided map group as in FIG. 69, reduction of the search noise can be facilitated.

As described, according to the embodiment, downsizing of the map can be facilitated by reducing the number of kinds of the characters to about 1,300. As a result of the reduction of the kinds of characters, the no-node Huffman tree H2 can be generated. By executing the compression and expansion using the no-node Huffman tree H2, 12 bits (that is, one character) can collectively be determined at one time, and an increase of the speed of each of the compressing process and the expanding process can be realized.

By making the compressing process and the compression symbol map generating process common to each other using the Huffman tree search, the generation of the compression symbol map group Ms can be executed associated with and in parallel to the compressing process. Therefore, reduction of program steps and running steps can be facilitated, and an increase of the speed can be facilitated of each of the compressing process of the file Fs and the generating process of the compression symbol map group Ms. The lower-level character codes, each having a low appearance frequency, are divided respectively into eight-bit divided character codes and the compressing process is executed. Therefore, for the divided character codes, the compression symbol map group Ms can also be generated associated with the compressing process.

The generation of the consecutive-gram divided map group or that of the x-gram head-and-tail divided map group is executed associated with and in parallel to the compressing process of the file group Fs in addition to the compression symbol map group Ms and therefore, reduction of program steps and running steps can be facilitated. Therefore, an increase of the speed can be facilitated for the compressing process of the file Fs, the generating process of the consecutive-gram divided map group, and the x-gram head-and-tail divided map group.

By generating the consecutive-gram divided map group for each consecutive-gram section, significant reduction of the map size can be facilitated and compared to the use of a hash function, the search noise can be reduced. Similarly, by generating the x-gram head-and-tail divided map group for each combination of the grams at the head and tail, significant reduction of the map size can be facilitated and the search noise can be reduced.

By compressing the bit string that is the compression area of the compression symbol map group Ms at the compression rate that corresponds to the appearance rate of the corresponding character, improvement of the compression efficiency can be facilitated and downsizing can also be facilitated. In a Huffman tree 4200 for the compression symbol map, the number of consecutive "0s" meaning that no character code is present is increased corresponding to the appearance rate area. Therefore, improvement of the compression efficiency of the compression symbol map Ms can be facilitated corresponding to the appearance rate of the character code.

By configuring the arrangement of the bit strings that are the compression areas to be in descending order of file number p from the head, the bit strings that are the compression areas can be compressed maintaining the sequence of the file numbers even when a file is added. Thereby, to select the adding function of the file F or the compressing function of the compression symbol map group Ms is not necessary and both of the functions can be implemented. Therefore, improvement of the degree of freedom that is the addition of files, and downsizing that is the compression of the compression symbol map group Ms can be realized.

By using the deletion map Md that represents the presence or the absence of deletion of the file F, deleted files can be excluded from the screening when the compressed files are screened using the compression symbol map group. Thereby, improvement of the precision of the screening of the compressed files can be facilitated and an increase of the speed of the expanding process can be realized.

By executing the identification (screening) of the compressed file using the consecutive-gram divided map group and the x-gram head-and-tail divided map group, reduction of the search noise can be facilitated. For example, when consecutive-grams such as "東京" and "京都" are present in a file Fp for the search keyword "東京都", the compressed file fp is the identified compressed file ft in the compression symbol map M while the compressed file fp is not the identified compressed file ft as far as any three-gram character string such as "東*都" ("*" is a character other than "京") is not present. Therefore, reduction of the identification (screening) of the compressed file can be facilitated.

By executing the comparison with the search keyword associated with and in parallel to the expanding process, an increase of the speed of the determination of coincidence with the search keyword can be realized. The determination of the coincidence with the search keyword is executed during the expansion of the compressed file f and therefore, whether any expanded code string that coincides with the search keyword is present can be known at the time when the compressed file is expanded.

By setting the comparison flag to be ON of the structure of the leaf L# that stores therein the character codes constituting the search keyword prior to the comparison, comparison can be avoided with the expanded code obtained from the structure of the leaf L# whose comparison flag is ON when the comparing process is executed. Therefore, comparison with the expanded code whose non-coincidence is known does not need to be executed and therefore, an increase of the speed of the comparing process can be realized.

Although the screening of the compressed file fs that is formed by compressing the file group Fs has been described in the embodiment, the present invention is further applicable to screening of the file group Fs that is not compressed.

The information processing method described in the present embodiment may be implemented by executing a prepared program on a computer such as a personal computer and a workstation. The program is stored on a non-transitory computer-readable recording medium such as a hard disk, a flexible disk, a CD-ROM, an MO, and a DVD, read out from the recording medium, and executed by the computer. The program may be a transmission medium that can be distributed through a network such as the Internet.

The embodiments disclosed herein facilitate reductions in the file size of data and search noise.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium storing therein an information processing program that causes a computer to execute a process comprising:
   extracting a plurality of x-gram character strings from a plurality of files, where x is a natural number larger than 1;
   generating, for each x-gram character string, n×m divided maps that correspond to n×m combinations of n codes and m codes, respectively, and represent a presence or an absence of the n×m combinations in the files,
   wherein the n codes are obtained by dividing a code representing a first gram of the x-gram character string into n parts, and
   the m codes are obtained by dividing a code representing a second gram of the x-gram character string into m parts, where n and m are natural numbers, and at least one of n and m is larger than 1.

2. The recording medium according to claim 1, wherein the x is 2, and
   the first gram is a preceding character code of the x-gram character string and the second gram is a succeeding character code of the x-gram character string.

3. The recording medium according to claim 1, wherein the x is larger than 2, and
   the first gram is a head character code of the x-gram character string and the second gram is a tail character code of the x-gram character string.

4. The recording medium according to claim 1, wherein the n is 2 and the m is 1, and
   the generating the n×m divided maps includes:
   dividing the code representing the first gram of the x-gram character string into a first-gram upper code and a first-gram lower code;
   generating a first divided map corresponding to a concatenated code obtained by concatenating the first-gram upper code and the code representing the second gram of the x-gram character string; and
   generating a second divided map corresponding to a concatenated code obtained by concatenating the first-gram lower code and the code representing the second gram of the x-gram character string.

5. The recording medium according to claim 1, wherein the n is 1 and the m is 2, and
   the generating the n×m divided maps includes:
   dividing the code representing the second gram of the x-gram character string into a second-gram upper code and a second-gram lower code;
   generating a first divided map corresponding to a concatenated code obtained by concatenating the code representing the first gram of the x-gram character string and the second-gram upper code; and
   generating a second divided map corresponding to a concatenated code obtained by concatenating the code representing the first gram of the x-gram character string and the second-gram lower code.

6. The recording medium according to claim 1, wherein the n is 2 and the m is 2, and
   the generating the n×m divided maps includes:
   dividing the code representing the first gram of the x-gram character string into a first-gram upper code and a first-gram lower code;
   dividing the code representing the second gram of the x-gram character string into a second-gram upper code and a second-gram lower code;
   generating a first divided map corresponding to a concatenated code obtained by concatenating the first-gram upper code and the second-gram upper code;
   generating a second divided map corresponding to a concatenated code obtained by concatenating the first-gram upper code and the second-gram lower code;

generating a third divided map corresponding to a concatenated code obtained by concatenating the first-gram lower code and the second-gram upper code; and generating a fourth divided map corresponding to a concatenated code obtained by concatenating the first-gram lower code and the second-gram lower code.

7. A non-transitory computer-readable recording medium storing therein an information search program that causes a computer to execute:

extracting from a plurality of files, at least one file including a retrieval character string by an AND operation of n×m divided maps generated for each x-gram character string extracted from the files, where x is a natural number larger than 1, wherein the n×m divided maps correspond to n×m combinations of n codes and m codes, respectively, and represent a presence or an absence of the n×m combinations in the files, the n codes are obtained by dividing a code representing a first gram of the x-gram character string into n parts, and wherein the m codes are obtained by dividing a code representing a second gram of the x-gram character string into m parts, where n and m are natural numbers, and at least one of n and m is larger than 1.

8. The recording medium according to claim 7, wherein the information search program causes the computer to execute the process comprising:

appending a given character code to a head of the retrieval character string in a forward search, wherein the extracting includes extracting the file including the retrieval character string to which the given character code has been appended.

9. The recording medium according to claim 7, wherein the information search program causes the computer to execute the process comprising:

appending a given character code to a tail of the retrieval character string in a reverse search, wherein the extracting includes extracting the file including the retrieval character string to which the given character code has been appended.

* * * * *